US011543621B2

(12) United States Patent
Fukuyama et al.

(10) Patent No.: US 11,543,621 B2
(45) Date of Patent: Jan. 3, 2023

(54) AF MODULE, CAMERA MODULE, AND ELECTRONIC APPARATUS

(71) Applicant: SONY SEMICONDUCTOR SOLUTIONS CORPORATION, Kanagawa (JP)

(72) Inventors: Munekatsu Fukuyama, Tokyo (JP); Hiroyasu Matsugai, Kanagawa (JP); Hiroyuki Itou, Kanagawa (JP); Suguru Saito, Kanagawa (JP); Keiji Ohshima, Tokyo (JP); Masanori Iwasaki, Kanagawa (JP); Toshihiko Hayashi, Kanagawa (JP); Shuzo Sato, Kanagawa (JP); Nobutoshi Fujii, Kanagawa (JP); Hiroshi Tazawa, Kanagawa (JP); Toshiaki Shiraiwa, Kanagawa (JP); Yusuke Moriya, Nagasaki (JP); Minoru Ishida, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 676 days.

(21) Appl. No.: 16/478,090

(22) PCT Filed: Jan. 16, 2018

(86) PCT No.: PCT/JP2018/000936
§ 371 (c)(1),
(2) Date: Jul. 15, 2019

(87) PCT Pub. No.: WO2018/139255
PCT Pub. Date: Aug. 2, 2018

(65) Prior Publication Data
US 2019/0369355 A1 Dec. 5, 2019

(30) Foreign Application Priority Data
Jan. 26, 2017 (JP) .............................. JP2017-011993

(51) Int. Cl.
*G02B 7/09* (2021.01)
*G02B 3/00* (2006.01)
(Continued)

(52) U.S. Cl.
CPC ............. *G02B 7/09* (2013.01); *G02B 3/0068* (2013.01); *G02B 7/023* (2013.01);
(Continued)

(58) Field of Classification Search
CPC ........ G02B 7/09; G02B 3/0068; G02B 7/023; G02B 13/0085; G02B 7/04; G02B 27/04;
(Continued)

(56) References Cited

U.S. PATENT DOCUMENTS

2007/0171535 A1  7/2007 Shyu et al.
2007/0251272 A1  11/2007 Shyu et al.
(Continued)

FOREIGN PATENT DOCUMENTS

CN   1601752     3/2005
CN   102314046   1/2012
(Continued)

OTHER PUBLICATIONS

International Search Report and Written Opinion prepared by the European Patent Office dated Mar. 26, 2018, for International Application No. PCT/JP2018/000936.
Official Action (with English translation) for Japanese Patent Application No. 2017-011993, dated Dec. 1, 2020, 8 pages.

*Primary Examiner* — James C. Jones
(74) *Attorney, Agent, or Firm* — Sheridan Ross P.C.

(57) ABSTRACT

There is provided a camera module including a stacked lens structure including a plurality of lens substrates. The plurality of lens substrates includes a first lens substrate including a first lens that is disposed at an inner side of a through-hole formed in the first lens substrate, and a second
(Continued)

lens substrate including a second lens that is disposed at an inner side of a through-hole formed in the second lens substrate, wherein the first lens substrate is directly bonded to the second lens substrate. The camera module further includes an electromagnetic drive unit configured to adjust a distance between the stacked lens structure and a light-receiving element.

10 Claims, 127 Drawing Sheets

(51) Int. Cl.
| | |
|---|---|
| *G02B 7/02* | (2021.01) |
| *G02B 13/00* | (2006.01) |
| *G03B 3/10* | (2021.01) |
| *H01L 27/146* | (2006.01) |
| *H04N 5/225* | (2006.01) |

(52) U.S. Cl.
CPC ........... *G02B 13/0085* (2013.01); *G03B 3/10* (2013.01); *H01L 27/146* (2013.01); *H04N 5/2254* (2013.01); *H04N 5/2257* (2013.01); *G03B 2205/0069* (2013.01)

(58) Field of Classification Search
CPC .............. G03B 3/10; G03B 2205/0069; G03B 30/00; H01L 27/146; H04N 5/2254; H04N 5/2257
See application file for complete search history.

(56) References Cited

U.S. PATENT DOCUMENTS

| | | |
|---|---|---|
| 2009/0015706 A1 | 1/2009 | Singh |
| 2010/0283113 A1 | 11/2010 | Kang et al. |
| 2012/0002102 A1* | 1/2012 | Sekimoto ............... G02B 7/022 348/374 |
| 2015/0195438 A1 | 7/2015 | Park |
| 2017/0134629 A1 | 5/2017 | Park et al. |

FOREIGN PATENT DOCUMENTS

| | | |
|---|---|---|
| CN | 102408091 | 4/2012 |
| CN | 105319799 | 2/2016 |
| JP | 2004-087718 | 3/2004 |
| JP | 2005-539276 | 12/2005 |
| JP | 2009-279790 | 12/2009 |
| JP | 2012-032778 | 2/2012 |
| JP | 2012-037549 | 2/2012 |

\* cited by examiner

FIG.19
A
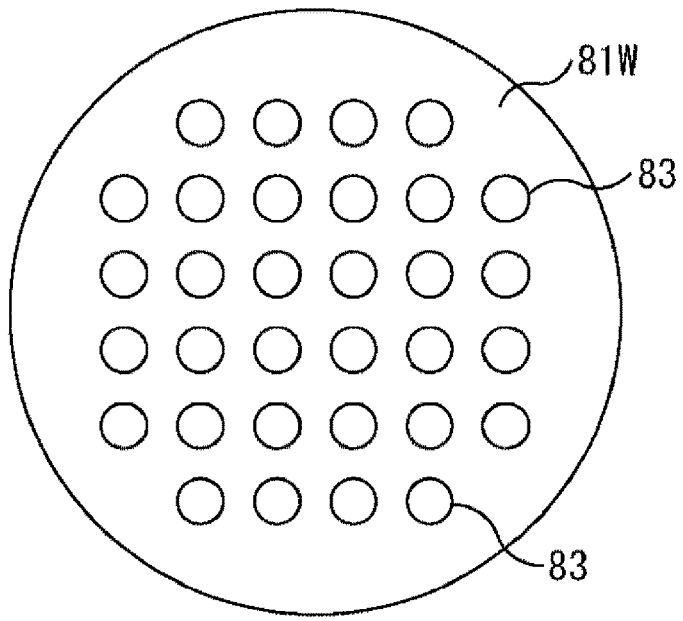
B
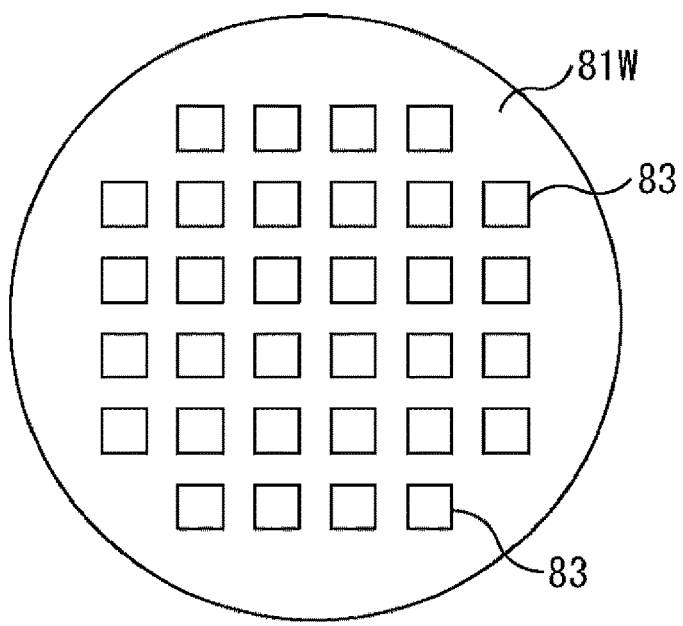

AF MODULE, CAMERA MODULE, AND ELECTRONIC APPARATUS

CROSS REFERENCE TO RELATED APPLICATIONS

This application is a national stage application under 35 U.S.C. 371 and claims the benefit of PCT Application No. PCT/JP2018/000936 having an international filing date of 16 Jan. 2018, which designated the United States, which PCT application claimed the benefit of Japanese Priority Patent Application No. 2017-011993 filed on 26 Jan. 2017, the disclosures of each of which are incorporated herein by reference.

TECHNICAL FIELD

The present technique relates to an AF module, a camera module, and an electronic apparatus, and more particularly, to an AF module, a camera module, and an electronic apparatus that allow a camera module to be used for various purposes.

BACKGROUND ART

In a wafer-level lens process in which a plurality of lenses is arranged in a plane direction of a wafer substrate, it is difficult to obtain the shape accuracy or the position accuracy when the lenses are formed. In particular, it is very difficult to perform a process in which wafer substrates are stacked to manufacture a stacked lens structure, and stacking of three layers or more is not realized in mass production level.

Various techniques related to the wafer-level lens process have been devised and proposed. For example, PTL 1 proposes a method in which when a lens material is filled into through-holes formed in a substrate to form a lens, the lens material itself is used as an adhesive to stack wafer substrates.

CITATION LIST

Patent Literature

PTL 1: Japanese Patent Application Laid-open No. 2009-279790

SUMMARY OF INVENTION

Technical Problem

In recent years, investigations on the possibility of employing stacked lenses manufactured by the wafer-level lens process as an optical unit in a camera module for various purposes have been conducted.

In view of such circumstances, there is a need to provide a camera module that is usable for various purposes.

Solution to Problem

According to a first embodiment of the present technique, there is provided an AF module, including:
a stacked lens structure including a plurality of substrates with lenses, the plurality of substrates with lenses being respectively provided with through-holes in which lenses are disposed, and being stacked and bonded to each other by direct bonding; and a first drive unit configured to adjust a distance between the stacked lens structure and a light receiving element.

According to a second embodiment of the present technique, there is provided a camera module, including:
a stacked lens structure including a plurality of substrates with lenses, the plurality of substrates with lenses being respectively provided with through-holes in which lenses are disposed, and being stacked and bonded to each other by direct bonding;
a light receiving element configured to receive incident light converged by the lenses;
and
a drive unit configured to adjust a distance between the stacked lens structure and the light receiving element.

According to a third embodiment of the present technique, there is provided an electronic apparatus including a camera module, the camera module including,
a stacked lens structure including a plurality of substrates with lenses, the plurality of substrates with lenses being respectively provided with through-holes in which lenses are disposed, and being stacked and bonded to each other by direct bonding,
a light receiving element configured to receive incident light converged by the lenses, and
a drive unit configured to adjust a distance between the stacked lens structure and the light receiving element.

According to the first embodiment to the third embodiment of the present technique, the distance between the stacked lens structure and the light receiving element is adjusted, the stacked lens structure including the plurality of substrates with lenses, the plurality of substrates with lenses being respectively provided with through-holes in which lenses are disposed, and being stacked and bonded to each other by direct bonding.

In accordance with embodiments of the present disclosure, there is provided a camera module including a stacked lens structure including a plurality of lens substrates, the plurality of lens substrates including a first lens substrate including a first lens that is disposed at an inner side of a through-hole formed in the first lens substrate, and a second lens substrate including a second lens that is disposed at an inner side of a through-hole formed in the second lens substrate, wherein the first lens substrate is directly bonded to the second lens substrate. The camera module may further include an electromagnetic drive unit configured to adjust a distance between the stacked lens structure and a light-receiving element.

In accordance with embodiments of the present disclosure, there is provided an electronic apparatus comprising a camera module, the camera module including a stacked lens structure including a plurality of lens substrates, the plurality of lens substrates including a first lens substrate including a first lens that is disposed at an inner side of a through-hole formed in the first lens substrate, and a second lens substrate including a second lens that is disposed at an inner side of a through-hole formed in the second lens substrate, wherein the first lens substrate is directly bonded to the second lens substrate; and an electromagnetic drive unit configured to adjust a distance between the stacked lens structure and a light-receiving element.

In accordance with embodiments of the present disclosure, there is provided a camera module comprising a stacked lens structure including a plurality of lens substrates, the plurality of lens substrates including a first lens substrate including a first lens that is disposed at an inner side of a through-hole formed in the first lens substrate, and a second lens substrate including a second lens that is disposed at an inner side of a through-hole formed in the second lens substrate, wherein the first lens substrate is directly bonded to the second lens substrate, and an actuator configured to adjust a distance between the stacked lens structure and a light-receiving element.

The AF module, the camera module, and the electronic apparatus may be apparatuses that are independent of each other, or may be incorporated into other apparatuses.

Advantageous Effects of Invention

According to the first embodiment to the third embodiment of the present technique, a camera module that is usable for various purposes can be provided.

The advantageous effects described herein are not necessarily presented in a limiting sense, but any one of the advantageous effects disclosed in the present technique may be exhibited.

BRIEF DESCRIPTION OF DRAWINGS

FIG. 19 is a diagram illustrating a method of manufacturing the substrate with lenses.

FIG. 120 is a cross-sectional view illustrating a main configuration example of a stacked lens structure.

FIG. 121 is a cross-sectional view illustrating a main configuration example of a stacked lens structure.

FIG. 122 is a block diagram illustrating a configuration example of an imaging apparatus as an electronic apparatus to which the present technique is applied.

FIG. 123 is a block diagram illustrating an example of a schematic configuration of an internal information acquisition system.

FIG. 124 is a diagram illustrating an example of a schematic configuration of an endoscopy surgery system.

FIG. 125 is a block diagram illustrating an example of a functional configuration of a camera head and a CCU.

FIG. 126 is a block diagram illustrating an example of a schematic configuration of a vehicle control system.

FIG. 127 is a diagram illustrating examples of mounting positions of an environment information detection unit and image capture units.

DESCRIPTION OF EMBODIMENTS

Hereinafter, modes (hereinafter referred to as embodiments) for carrying out the present technique will be described. The description will be given in the following order:

1. First Embodiment of Camera Module
2. Second Embodiment of Camera Module
3. Third Embodiment of Camera Module
4. Fourth Embodiment of Camera Module
5. Fifth Embodiment of Camera Module
6. Detailed Configuration of Camera Module of Fourth Embodiment
7. Sixth Embodiment of Camera Module
8. Seventh Embodiment of Camera Module
9. Detailed Configuration of Substrate with Lenses
10. Method of Manufacturing Substrate with Lenses
11. Direct Bonding of Substrates with Lenses
12. Eighth and Ninth Embodiments of Camera Module
13. Tenth Embodiment of Camera Module
14. Eleventh Embodiment of Camera Module
15. Advantages of Present Structure compared to Other Structures
16. Various Modifications
17. Pixel Arrangement of Light Receiving Element and Structure and Use of Diaphragm Plate
18. Twelfth Embodiment of Camera Module
19. Thirteenth Embodiment of Camera Module
20. Fourteenth Embodiment of Camera Module
21. Example of Stacked Lens Structure including Deformable Lens
22. Fifteenth Embodiment of Camera Module
23. Sixteenth Embodiment of Camera Module
24. Seventeenth Embodiment of Camera Module
25. Modifications of Seventeenth Embodiment of Camera Module
26. Eighteenth Embodiment of Camera Module
27. Nineteenth Embodiment of Camera Module
28. Twentieth Embodiment of Camera Module
29. Twenty-First Embodiment of Camera Module
30. Twenty-Second Embodiment of Camera Module
31. Twenty-Third Embodiment of Camera Module
32. Twenty-Fourth Embodiment of Camera Module
33. Twenty-Fifth Embodiment of Camera Module
34. Twenty-Sixth Embodiment of Camera Module
35. Outline of Stacked Lens Structure
36. Example of Shape of Side Wall
37. Example of Application to Electronic Apparatuses
38. Example of Application to Internal Information Acquisition System
39. Example of Application to Endoscopic Operation System
40. Example of Application to Movable Body <1. First Embodiment of Camera Module>

Figure 1:
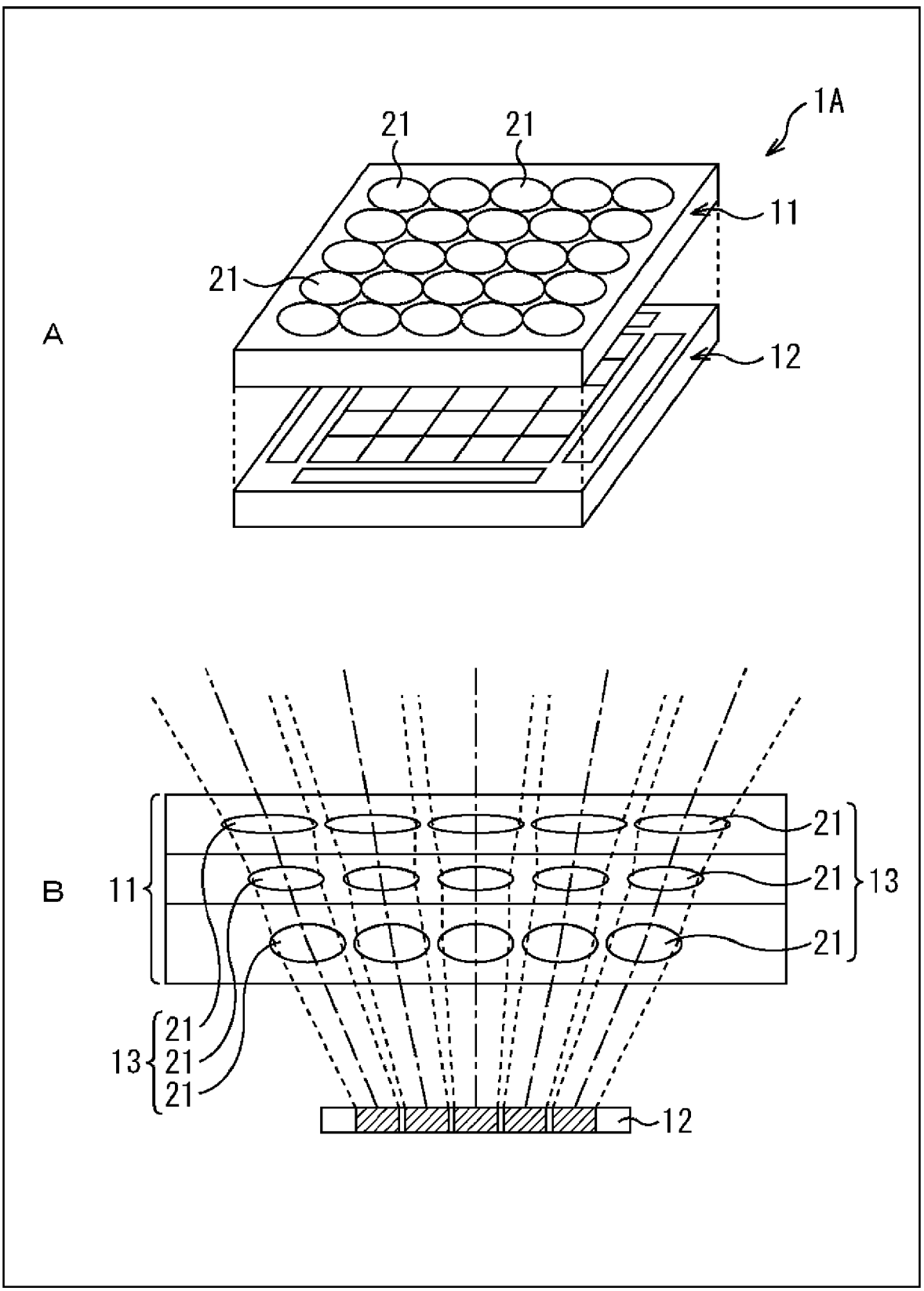
FIG. 1 is a diagram illustrating a first embodiment of a camera module which uses a stacked lens structure to which the present technique is applied.

A and B of FIG. 1 are diagrams illustrating a first embodiment of a camera module which uses a stacked lens structure to which the present technique is applied.

A of FIG. 1 is a schematic diagram illustrating a configuration of a camera module 1A as a first embodiment of a camera module 1. B of FIG. 1 is a schematic cross-sectional view of the camera module 1A.

The camera module 1A includes a stacked lens structure 11 and a light receiving element 12. The stacked lens structure 11 includes twenty five optical units 13 in total, five optical units in the vertical and horizontal directions each. The light receiving element 12 is a solid-state imaging apparatus including a plurality of light receiving areas (pixel arrays) corresponding to the optical units 13. The optical units 13 each include a plurality of lenses 21 in one optical axis direction such that rays of incident light are converged onto corresponding ones of light receiving areas of the light receiving element 12. The camera module 1A is a multi-ocular camera module including a plurality of optical units 13.

The optical axes of the plurality of optical units 13 included in the camera module 1A are disposed so as to spread toward the outer side of the module as illustrated in B of FIG. 1. Due to this, it is possible to photograph a wide-angle image.

Although the stacked lens structure 11 illustrated in B of FIG. 1 has a structure in which the lenses 21 are stacked in three layers only for the sake of simplicity, a larger number of lenses 21 may naturally be stacked.

The camera module 1A illustrated in A and B of FIG. 1 can stitch a plurality of images photographed by the plurality of optical units 13 together to create one wide-angle image. In order to stitch the plurality of images together, high accuracy is demanded in the formation and the arrangement of the optical units 13 photographing the images. Moreover, since the optical units 13 particularly on the wide-angle side have a small incidence angle of light incident on the lenses 21, high accuracy is demanded in the positional relation and the arrangement of the lenses 21 in the optical unit 13.

Figure 2:
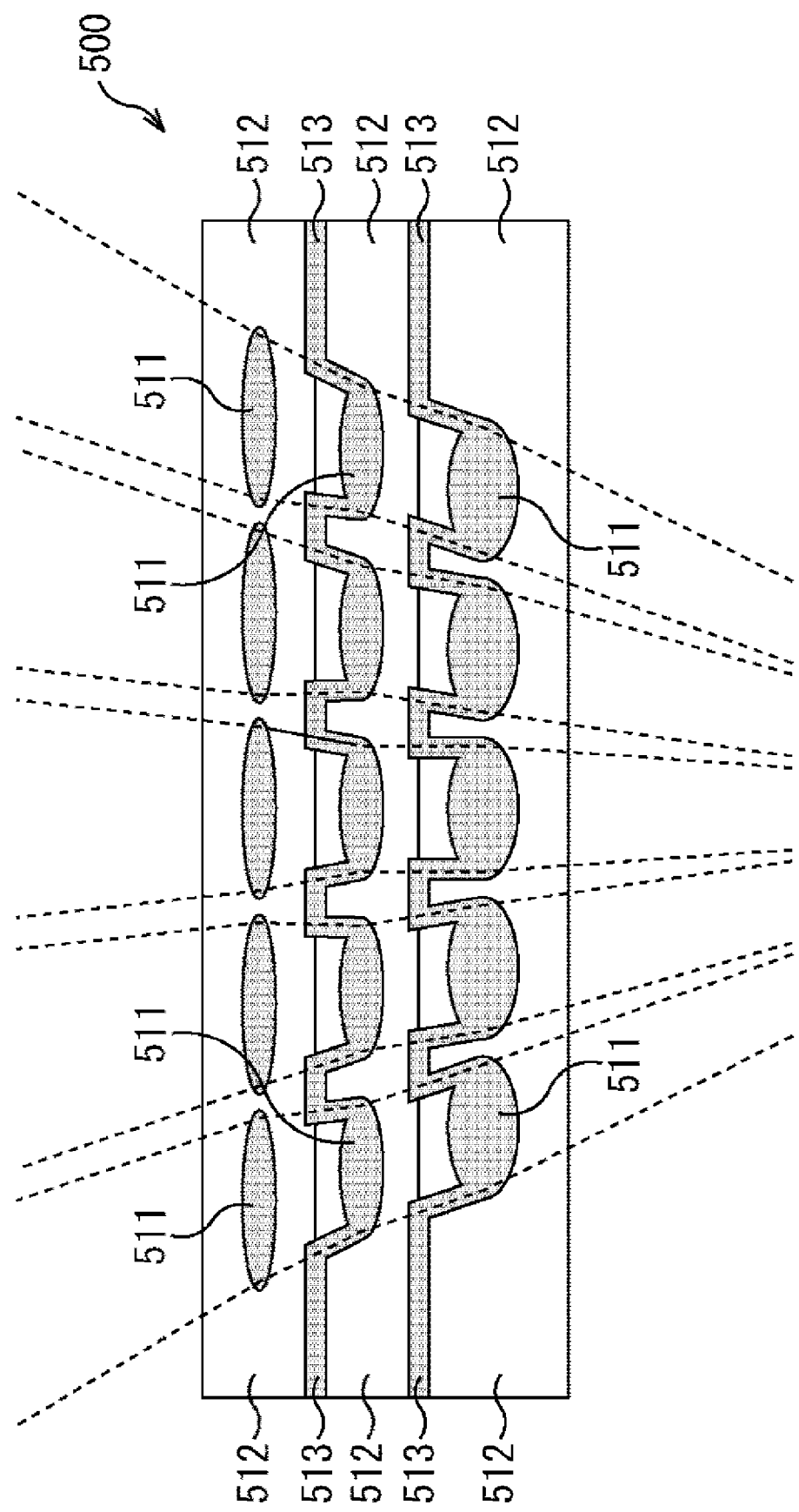
FIG. 2 is a diagram illustrating a cross-sectional structure of the stacked lens structure disclosed in Patent Literature 1.

FIG. 2 is a diagram illustrating a cross-sectional structure of a stacked lens structure which uses a resin-based fixing technique, disclosed in Patent Literature 1.

In a stacked lens structure 500 illustrated in FIG. 2, a resin 513 is used as a unit for fixing substrates 512 each having lenses 511. The resin 513 is an energy-curable resin such as an UV-curable resin.

Before the substrates 512 are attached together, a layer of the resin 513 is formed on an entire surface of the substrate 512. After that, the substrates 512 are attached together, and the resin 513 is cured. In this way, the attached substrates 512 are fixed together.

However, when the resin 513 is cured, the resin 513 experiences curing shrinkage. In the case of the structure illustrated in FIG. 2, since the resin 513 is cured after the layer of the resin 513 is formed on the entire substrate 512, the amount of displacement of the resin 513 increases.

Moreover, even after the stacked lens structure 500 formed by attaching the substrates 512 together is divided into individual imaging elements and the imaging elements are combined to form a camera module, the stacked lens structure 500 provided in the camera module has the resin 513 entirely between the substrates 512 having lenses 511 as illustrated in FIG. 2. Due to this, when the camera module is mounted into the housing of a camera and is used actually, the resin between the substrates of the stacked lens structure 500 may experience thermal expansion due to an increase in the temperature caused by the heat generated by the apparatus.

Figure 3:
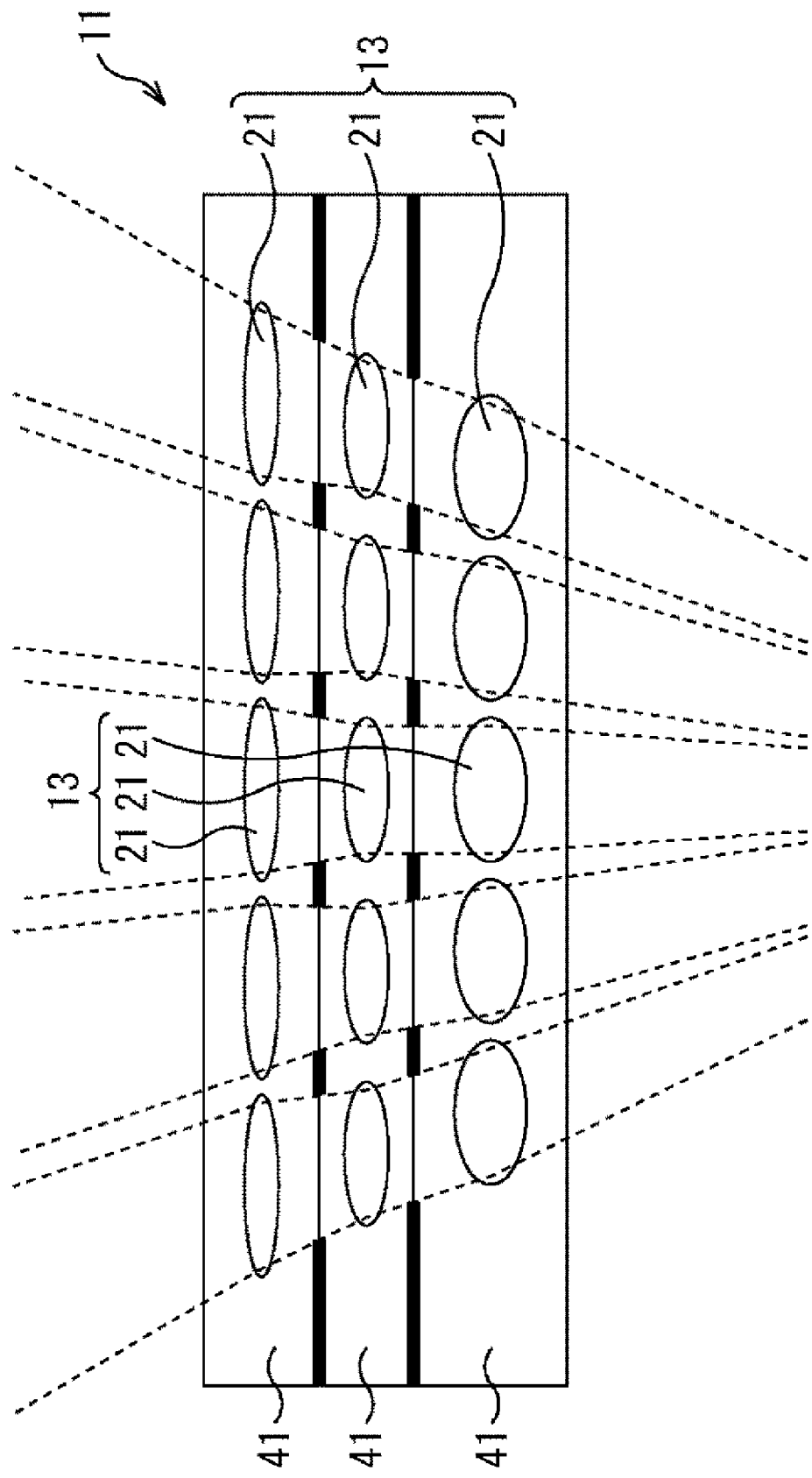
FIG. 3 is a diagram illustrating a cross-sectional structure of the stacked lens structure of the camera module illustrated in FIG. 1.

FIG. 3 is a diagram illustrating a cross-sectional structure of the stacked lens structure 11 only of the camera module 1A illustrated in A and B of FIG. 1.

The stacked lens structure 11 of the camera module 1A is also formed by stacking a plurality of substrates with lenses 41 having the lenses 21.

In the stacked lens structure 11 of the camera module 1A, a fixing unit which is completely different from that used in the stacked lens structure 500 illustrated in FIG. 2 or that disclosed in the related art is used as a unit for fixing the substrates with lenses 41 having the lenses 21 together.

Figure 4:
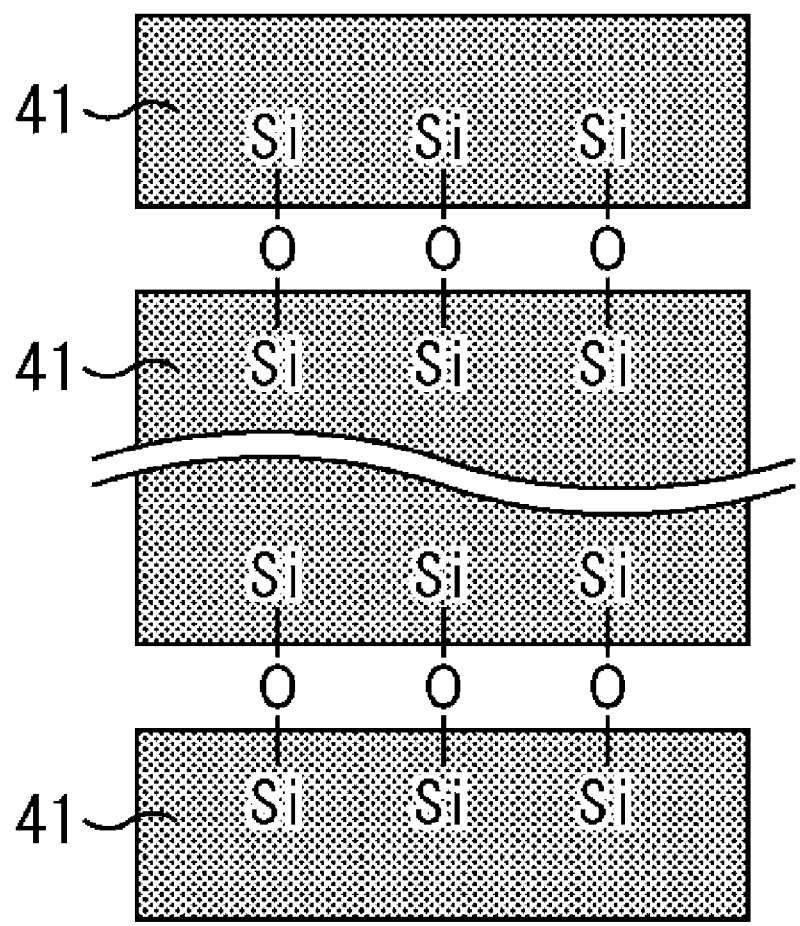
FIG. 4 is a diagram illustrating direct bonding of a substrate with lenses.

That is, two substrates with lenses 41 to be stacked are directly bonded by a covalent bond between an oxide or nitride-based surface layer formed on the surface of one substrate and an oxide or nitride-based surface layer formed on the surface of the other substrate. As a specific example, as illustrated in FIG. 4, a silicon oxide film or a silicon nitride film is formed on the surfaces of the two substrates with lenses 41 to be stacked as a surface layer, and a hydroxyl radical is combined with the film. After that, the two substrates with lenses 41 are attached together and are heated and subjected to dehydration condensation. As a result, a silicon-oxygen covalent bond is formed between the surface layers of the two substrates with lenses 41. In this way, the two substrates with lenses 41 are directly bonded. As the result of condensation, atoms included in the two surface layers may directly form a covalent bond.

In the present specification, direct bonding means fixing the two substrates with lenses 41 by the layer of an inorganic material disposed between the two substrates with lenses 41. Alternatively, direct bonding means fixing the two substrates with lenses 41 by chemically combining the layers of an inorganic material disposed on the surfaces of the two substrates with lenses 41. Alternatively, direct bonding means fixing the two substrates with lenses 41 by forming a dehydration condensation-based bond between the layers of an inorganic material disposed on the surfaces of the two substrates with lenses 41. Alternatively, direct bonding means fixing the two substrates with lenses 41 by forming an oxygen-based covalent bond between the layers of an inorganic material disposed on the surfaces of the two substrates with lenses 41 or a covalent bond between atoms included in the layers of the inorganic material. Alternatively, direct bonding means fixing the two substrates with lenses 41 by forming a silicon-oxygen covalent bond or a silicon-silicon covalent bond between silicon oxide layers or silicon nitride layers disposed on the surfaces of the two substrates with lenses 41. Alternatively, or in addition, direct bonding may refer to substrates being directly bonded.

In order to realize dehydration condensation based on attachment and heating, in the present embodiment, lenses are formed in a substrate state using a substrate used in the field of manufacturing semiconductor devices and flat-panel display devices, dehydration condensation based on attachment and heating is realized in a substrate state, and bonding based on a covalent bond is realized in a substrate state. The structure in which the layers of an inorganic material formed between the surfaces of the two substrates with lenses 41 are bonded by a covalent bond has an effect or an advantage that the structure suppresses a deformation caused by curing shrinkage of the resin 513 in the entire substrate and a deformation caused by thermal expansion of the resin 513 during actual use, which may occur when the technique described in FIG. 2, disclosed in Patent Literature 1 is used.

Figure 5:
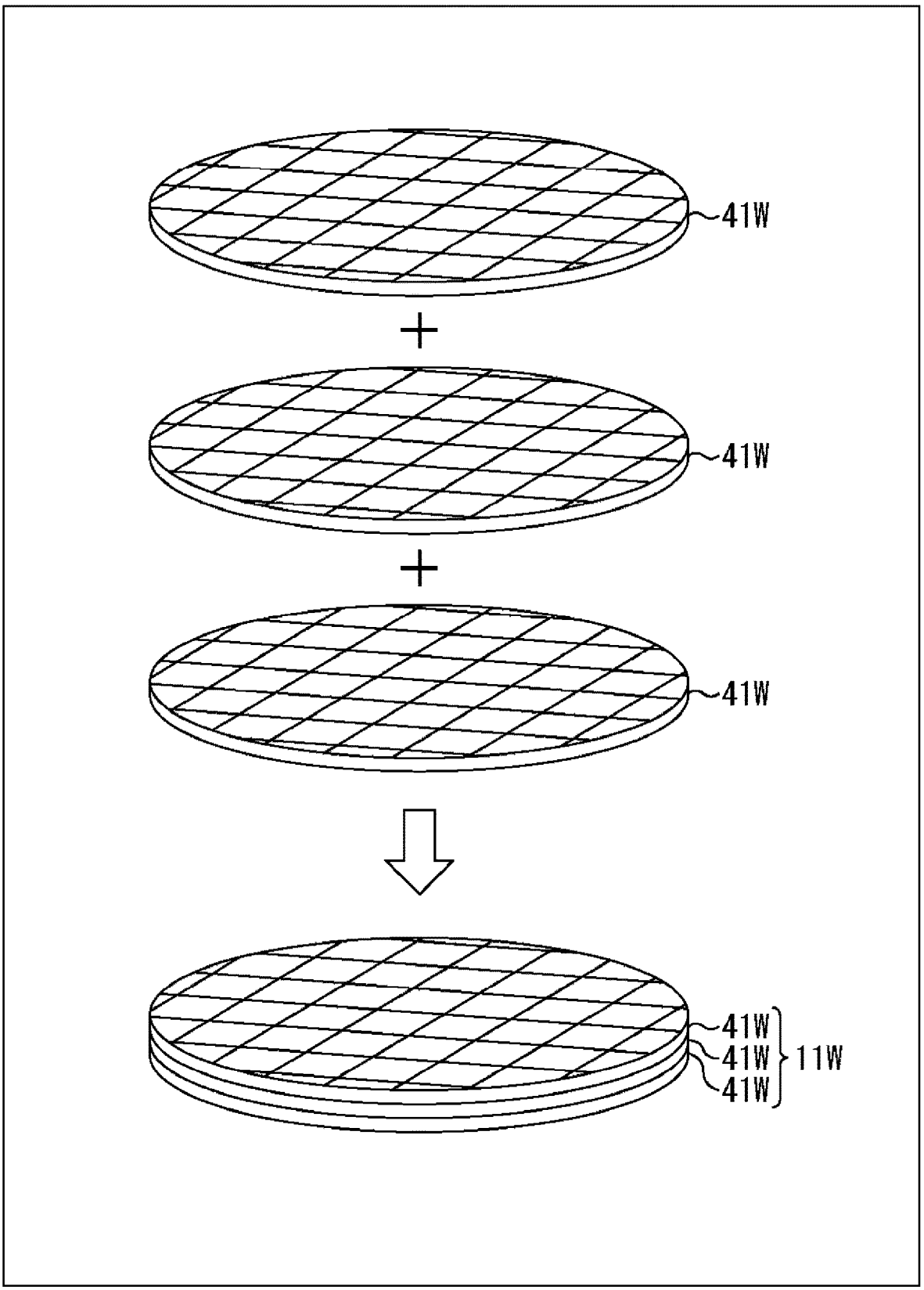
FIG. 5 is a diagram illustrating a step of forming the camera module illustrated in FIG. 1.
Figure 6:
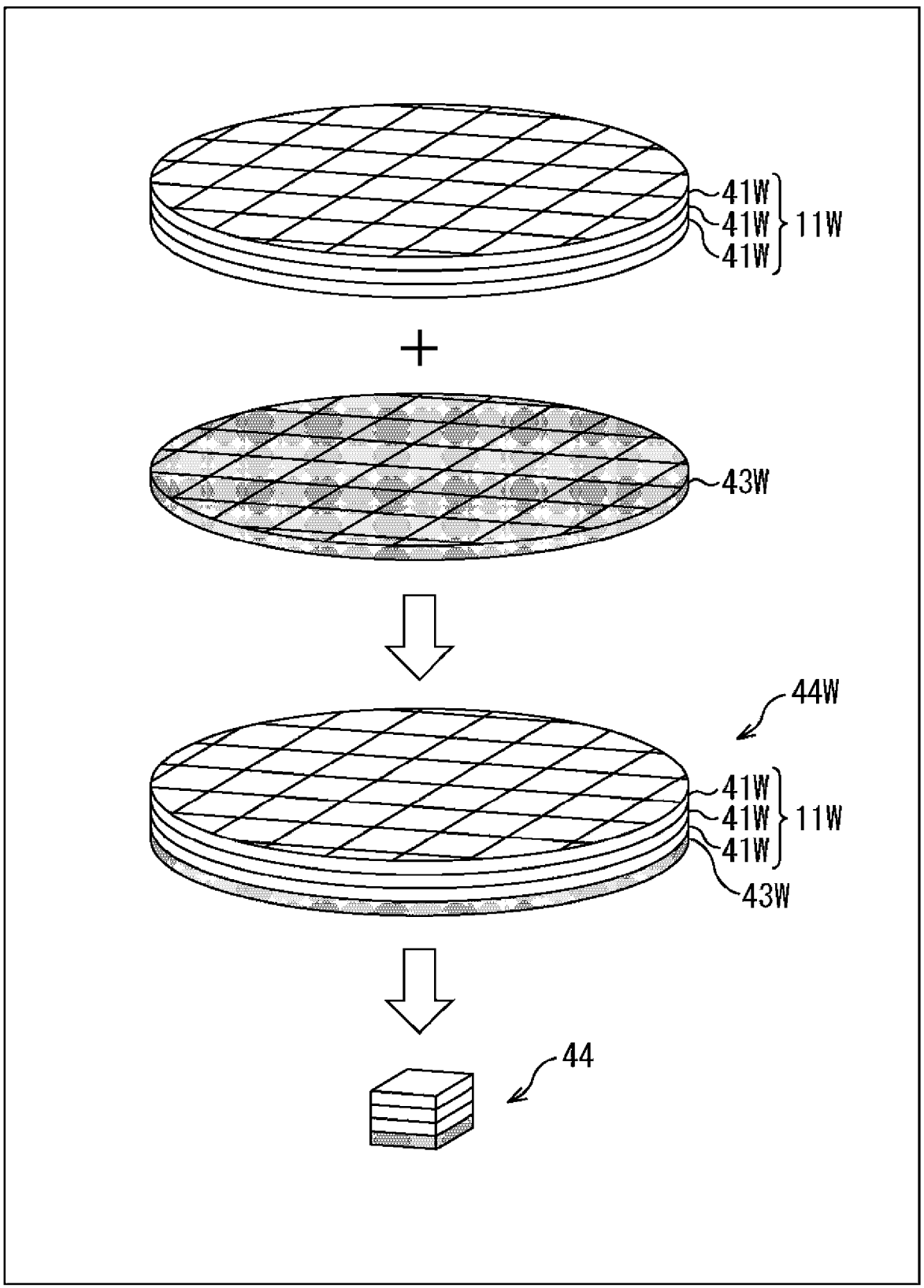
FIG. 6 is a diagram illustrating a step of forming the camera module illustrated in FIG. 1.

FIGS. 5 and 6 are diagrams illustrating a step of combining the stacked lens structure 11 and the light receiving elements 12 to form the camera module 1A illustrated in A and B of FIG. 1.

First, as illustrated in FIG. 5, a plurality of substrates with lenses 41W on which a plurality of lenses 21 (not illustrated) is formed in a plane direction are prepared and are stacked together. In this way, a stacked lens structure 11W in a substrate state in which a plurality of substrates with lenses 41W in a substrate state is stacked is obtained.

Subsequently, as illustrated in FIG. 6, a sensor substrate 43W in a substrate state in which a plurality of light receiving elements 12 is formed in a plane direction is manufactured and prepared separately from the stacked lens structure 11W in the substrate state illustrated in FIG. 5.

Moreover, the sensor substrate 43W in the substrate state and the stacked lens structure 11W in the substrate state are stacked and attached together, and external terminals are attached to respective modules of the attached substrates to obtain a camera module 44W in a substrate state.

Finally, the camera module 44W in the substrate state is divided into respective modules or chips. The divided camera module 44 is enclosed in a housing (not illustrated) prepared separately whereby a final camera module 44 is obtained.

In the present specification and the drawings, for example, components denoted by reference numerals with "W" added thereto like the substrate with lenses 41W, for example, indicate that the components are in a substrate state (wafer state), and components denoted by reference numerals without "W" like the substrate with lenses 41, for example, indicate that the components are divided into respective modules or chips. The same is applied for the sensor substrate 43W, the camera module 44W, and the like.

Figure 7:
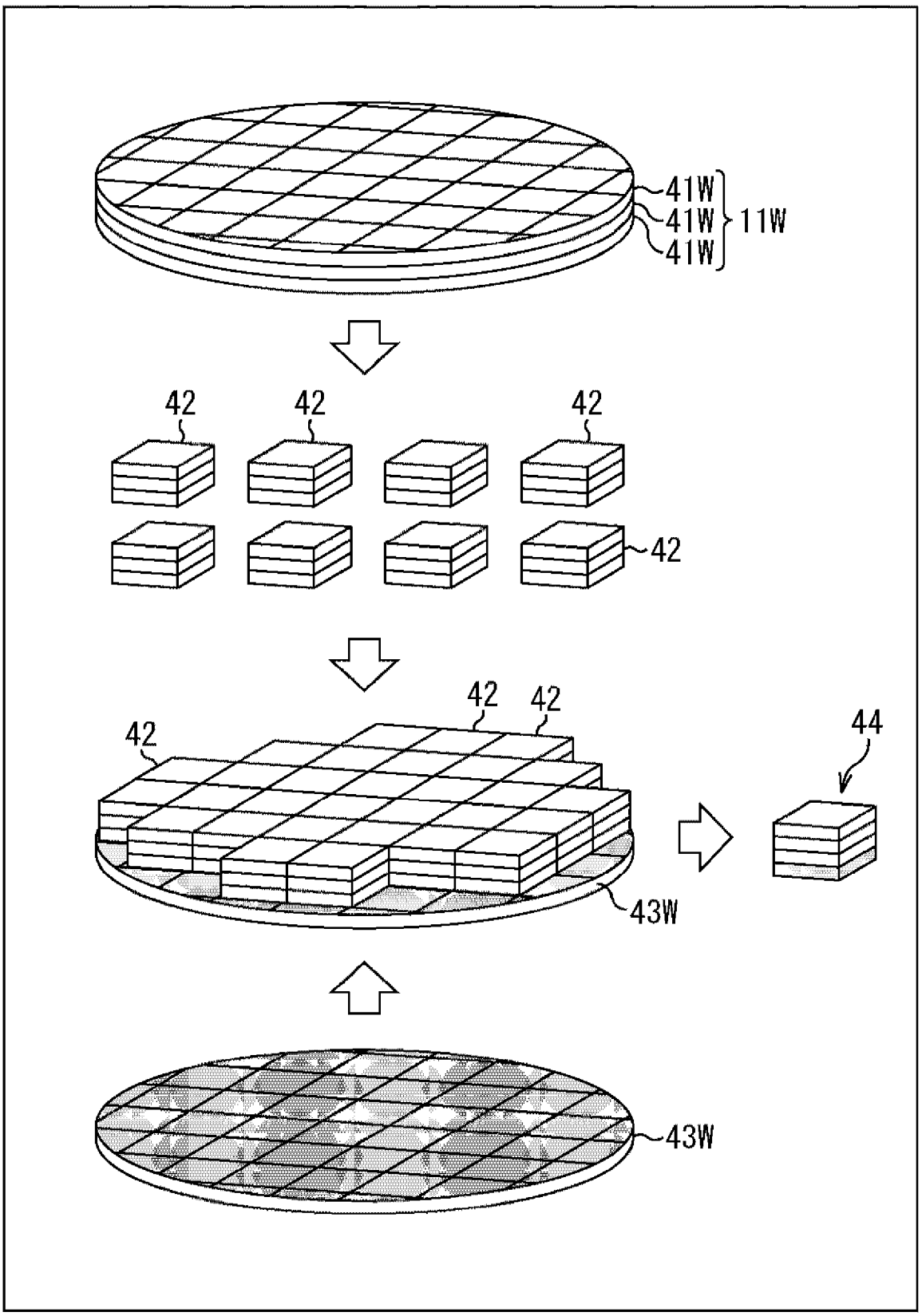
FIG. 7 is a diagram illustrating another step of forming the camera module illustrated in FIG. 1.

FIG. 7 is a diagram illustrating another step of combining the stacked lens structure 11 and the light receiving elements 12 to form the camera module 1A illustrated in A and B of FIG. 1.

First, similarly to the above-described step, a stacked lens structure 11W in a substrate state on which a plurality of substrates with lenses 41W in a substrate state are stacked is manufactured.

Subsequently, the stacked lens structure 11W in the substrate state is divided into individual pieces.

Moreover, a sensor substrate 43W in a substrate state is manufactured and prepared separately from the stacked lens structure 11W in the substrate state.

Moreover, the divided stacked lens structures 11 are mounted one by one on the respective light receiving elements 12 of the sensor substrate 43W in the substrate state.

Finally, the sensor substrate 43W in the substrate state on which the divided stacked lens structures 11 are mounted is divided into respective modules or chips. The divided sensor substrate 43 on which the stacked lens structure 11 is mounted is enclosed in a housing (not illustrated) prepared separately and external terminals are attached thereto to obtain a final camera module 44.

Further, as another example of the step of combining the stacked lens structure 11 and the light receiving elements 12 to form the camera module 1A illustrated in A and B of FIG. 1, a sensor substrate 43W in a substrate state illustrated in FIG. 7 may be divided into individual light receiving elements 12, and the divided stacked lens structures 11 may be mounted on the individual light receiving elements 12 to obtain a divided camera module 44.

Figure 8:
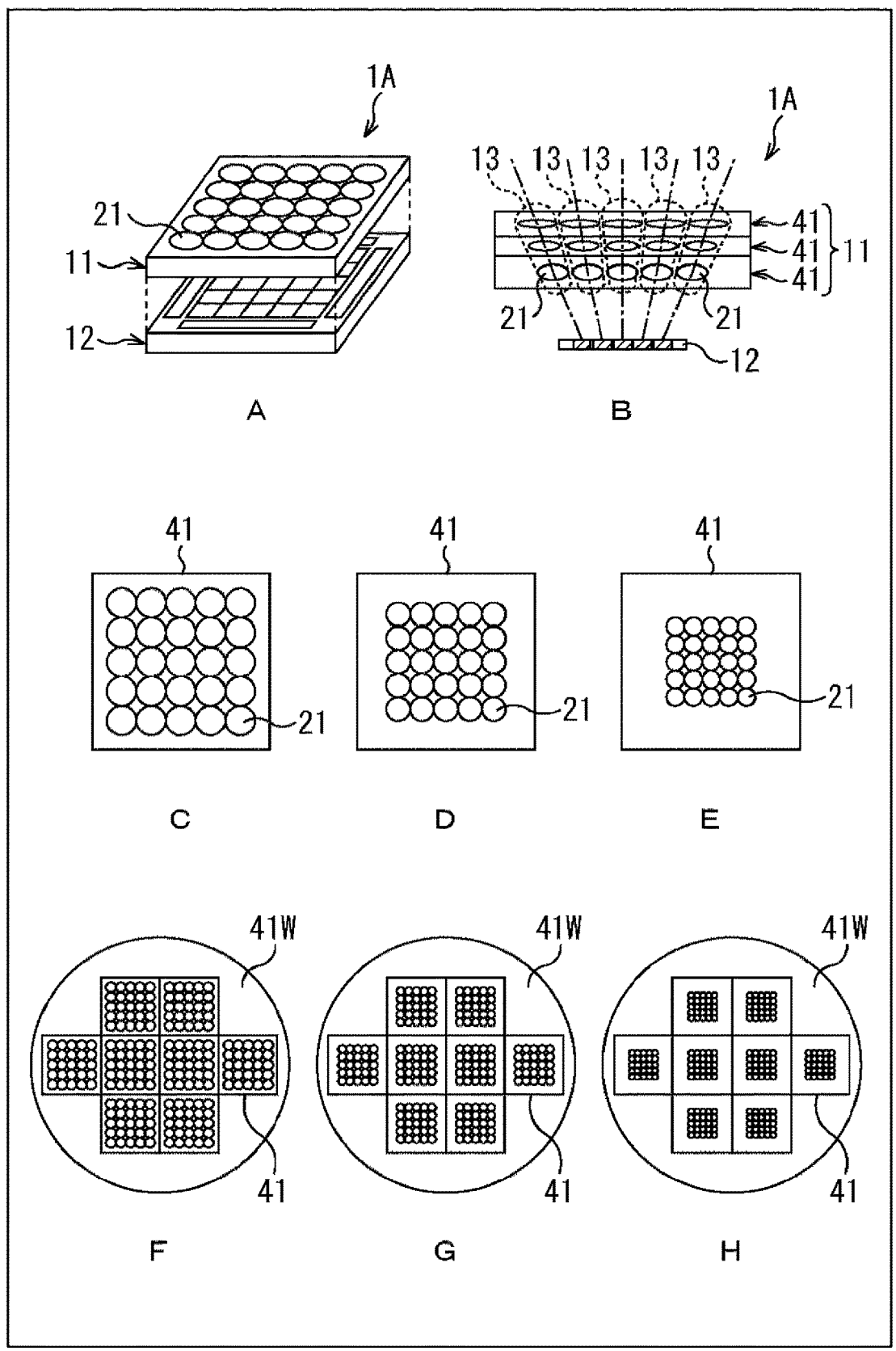
FIG. 8 is a diagram illustrating a configuration of a substrate with lenses.

A to H of FIG. 8 are diagrams illustrating a configuration of the substrate with lenses 41 of the camera module 1A.

A of FIG. 8 is the same schematic diagram as A of FIG. 1, illustrating a configuration of the camera module 1A.

B of FIG. 8 is the same schematic cross-sectional view as B of FIG. 1, of the camera module 1A.

As illustrated in B of FIG. 8, the camera module 1A is a multi-ocular camera module including a plurality of optical units 13 having one optical axis, formed by combining a plurality of lenses 21. The stacked lens structure 11 includes twenty five optical units 13 in total, five optical units in vertical and horizontal directions each.

In the camera module 1A, the optical axes of the plurality of optical units 13 are disposed so as to spread toward the outer side of the module. Due to this, it is possible to photograph a wide-angle image. Although the stacked lens structure 11 illustrated in B of FIG. 8 has a structure in which only three substrates with lenses 41 are stacked for the sake of simplicity, a larger number of substrates with lenses 41 may naturally be stacked.

C to E of FIG. 8 are diagrams illustrating planar shapes of the three substrates with lenses 41 that form the stacked lens structure 11.

C of FIG. 8 is a plan view of the substrate with lenses 41 on the top layer among the three layers, D of FIG. 8 is a plan view of the substrate with lenses 41 on the middle layer, and E of FIG. 8 is a plan view of the substrate with lenses 41 on the bottom layer. Since the camera module 1 is a multi-ocular wide-angle camera module, the diameter of the lens 21 and the lens-to-lens pitch increase as it ascends from the bottom layer to the top layer.

F to H of FIG. 8 are plan views of the substrates with lenses 41W in the substrate state, for obtaining the substrates with lenses 41 illustrated in C to E of FIG. 8, respectively.

The substrate with lenses 41W illustrated in F of FIG. 8 illustrates the substrate state corresponding to the substrate with lenses 41 illustrated in C of FIG. 8, the substrate with lenses 41W illustrated in G of FIG. 8 illustrates the substrate state corresponding to the substrate with lenses 41 illustrated in D of FIG. 8, and the substrate with lenses 41W illustrated in H of FIG. 8 illustrates the substrate state corresponding to the substrate with lenses 41 illustrated in E of FIG. 8.

The substrates with lenses 41W in the substrate state, illustrated in F to H of FIG. 8 are configured to obtain eight camera modules 1A illustrated in A of FIG. 8 for one substrate.

It can be understood that between the substrates with lenses 41W of F of FIGS. 8 to 8H, the lens-to-lens pitch of the substrate with lenses 41W on the top layer, in the substrates with lenses 41 of respective modules is different from that of the substrate with lenses 41W on the bottom layer, and that in each substrate with lenses 41W, the arrangement pitch of the substrates with lenses 41 of the respective modules is constant from the substrate with lenses 41W on the top layer to the substrate with lenses 41W on the bottom layer.

<2. Second Embodiment of Camera Module>

Figure 9:
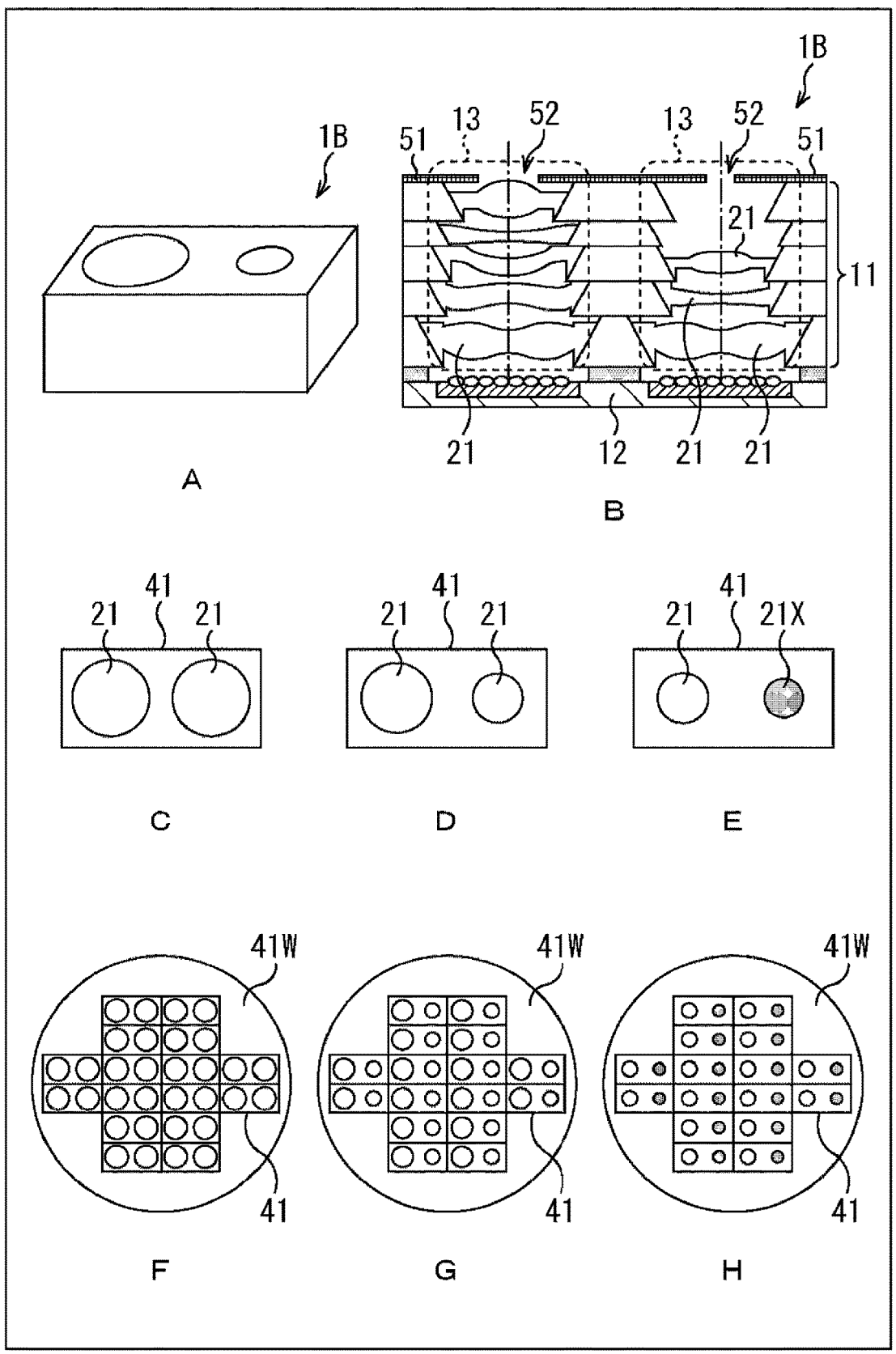
FIG. 9 is a diagram illustrating a second embodiment of a camera module which uses a stacked lens structure to which the present technique is applied.

A to H of FIG. 9 are diagrams illustrating a second embodiment of a camera module which uses a stacked lens structure to which the present technique is applied.

A of FIG. 9 is a schematic diagram illustrating an appearance of a camera module 1B as the second embodiment of the camera module 1. B of FIG. 9 is a schematic cross-sectional view of the camera module 1B.

The camera module 1B includes two optical units 13. The two optical units 13 include a diaphragm plate 51 on the top layer of the stacked lens structure 11. An opening 52 is formed in the diaphragm plate 51.

Although the camera module 1B includes two optical units 13, the two optical units 13 have different optical parameters. That is, the camera module 1B includes two optical units 13 having different optical performances. The two types of optical units 13 may include an optical unit 13 having a short focal distance for photographing a close-range view and an optical unit 13 having a long focal distance for photographing a distant view.

In the camera module 1B, since the optical parameters of the two optical units 13 are different, the numbers of lenses 21 of the two optical units 13 are different as illustrated in B of FIG. 9. Moreover, in the lenses 21 on the same layer of the stacked lens structure 11 included in the two optical units 13, at least one of the diameter, the thickness, the surface shape, the volume, and the distance between adjacent lenses may be different. Due to this, for example, the lenses 21 of the camera module 1B may have such a planar shape that the two optical units 13 may have lenses 21 having the same diameter as illustrated in C of FIG. 9 and may have lenses 21 having different shapes as illustrated in D of FIG. 9, and one of the two optical units 13 may have a void 21X without having the lens 21 as illustrated in E of FIG. 9.

F to H of FIG. 9 are plan views of the substrates with lenses 41W in a substrate state, for obtaining the substrates with lenses 41 illustrated in C to E of FIG. 9, respectively.

The substrate with lenses 41W illustrated in F of FIG. 9 illustrates the substrate state corresponding to the substrate with lenses 41 illustrated in C of FIG. 9, the substrate with lenses 41W illustrated in G of FIG. 9 illustrates the substrate state corresponding to the substrate with lenses 41 illustrated in D of FIG. 9, and the substrate with lenses 41W illustrated in H of FIG. 9 illustrates the substrate state corresponding to the substrate with lenses 41 illustrated in E of FIG. 9.

The substrates with lenses 41W in the substrate state illustrated in F to H of FIG. 9 are configured to obtain sixteen camera modules 1B illustrated in A of FIG. 9 for one substrate.

As illustrated in F to H of FIG. 9, in order to form the camera module 1B, lenses having the same shape or lenses having different shapes may be formed on the entire surface of the substrate with lenses 41W in the substrate state and lenses may be formed or not.

<3. Third Embodiment of Camera Module>

Figure 10:
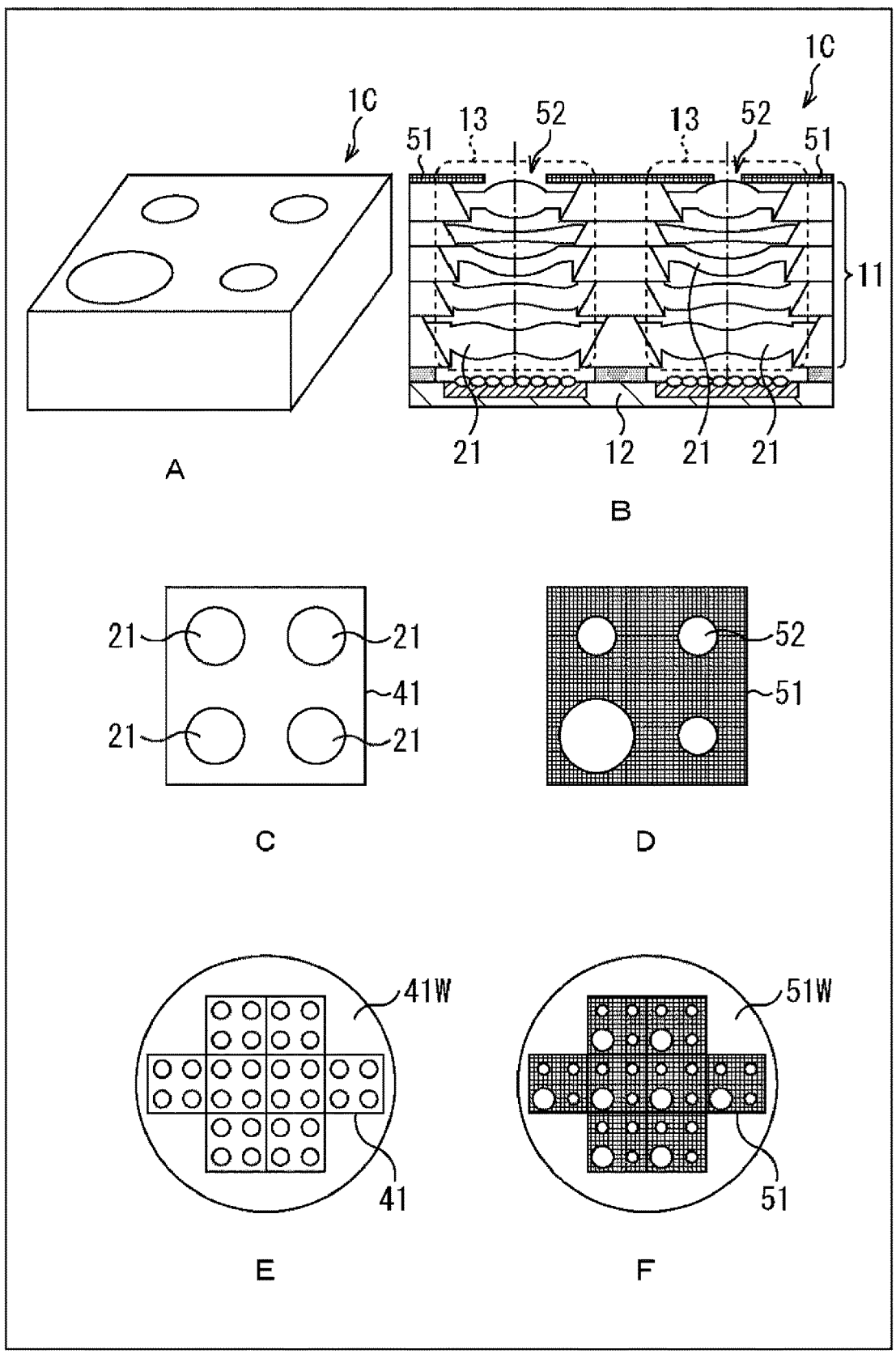
FIG. 10 is a diagram illustrating a third embodiment of a camera module which uses a stacked lens structure to which the present technique is applied.

A to F of FIG. 10 are diagrams illustrating a third embodiment of a camera module which uses a stacked lens structure to which the present technique is applied.

A of FIG. 10 is a schematic diagram illustrating an appearance of a camera module 1C as the third embodiment of the camera module 1. B of FIG. 10 is a schematic cross-sectional view of the camera module 1C.

The camera module 1C includes four optical units 13 in total, two in vertical and horizontal directions each, on a light incidence surface. The lenses 21 have the same shape in the four optical units 13.

Although the four optical units 13 include a diaphragm plate 51 on the top layer of the stacked lens structure 11, the sizes of the openings 52 of the diaphragm plates 51 are different among the four optical units 13. Due to this, the camera module 1C can realize the following camera module 1C, for example. That is, in an anti-crime surveillance camera, for example, in the camera module 1C which uses light receiving elements 12 including a light receiving pixel that includes three types of RGB color filters and receives three types of RGB light beams for the purpose of monitoring color images in the day time and a light receiving pixel that does not include RGB color filters for the purpose of monitoring monochrome images in the night time, it is possible to increase the size of the openings of the diaphragms of pixels for photographing monochrome images in the night time where the illuminance is low. Due to this, for example, the lenses 21 of one camera module 1C have such a planar shape that the lenses 21 included in the four optical units 13 have the same diameter as illustrated in C of FIG. 10, and the size of the opening 52 of the diaphragm plate 51 is different depending on the optical unit 13 as illustrated in D of FIG. 10.

E of FIG. 10 is a plan view of the substrate with lenses 41W in the substrate state, for obtaining the substrate with lenses 41 illustrated in C of FIG. 10. F of FIG. 10 is a plan view of the diaphragm plate 51W in the substrate state, for obtaining the diaphragm plate 51 illustrated in D of FIG. 10.

The substrate with lenses 41W in the substrate state illustrated in E of FIG. 10 and the diaphragm plate 51W in the substrate state illustrated in F of FIG. 10 are configured to obtain eight camera modules 1C illustrated in A of FIG. 10 for one substrate.

As illustrated in F of FIG. 10, in the diaphragm plate 51W in the substrate state, in order to form the camera module 1C, the sizes of the openings 52 can be set to be different for the respective optical units 13 included in the camera module 1C.

<4. Fourth Embodiment of Camera Module>

Figure 11:
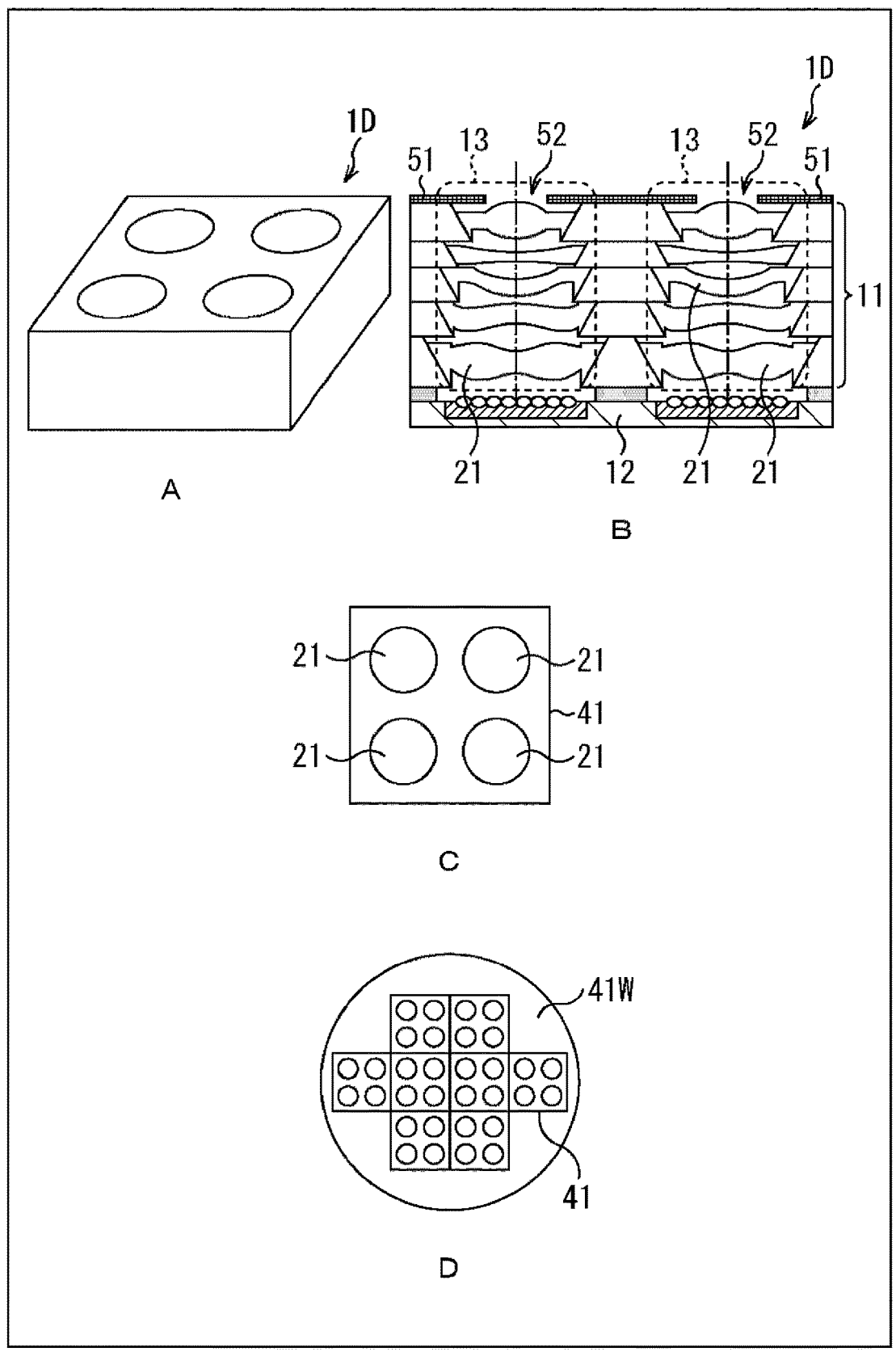
FIG. 11 is a diagram illustrating a fourth embodiment of a camera module which uses a stacked lens structure to which the present technique is applied.

A to D of FIG. 11 are diagrams illustrating a fourth embodiment of a camera module which uses a stacked lens structure to which the present technique is applied.

A of FIG. 11 is a schematic diagram illustrating an appearance of a camera module 1D as the fourth embodiment of the camera module 1. B of FIG. 11 is a schematic cross-sectional view of the camera module 1D.

The camera module 1D includes four optical units 13 in total, two in vertical and horizontal directions each, on a light incidence surface similarly to the camera module 1C. The lenses 21 have the same shape and the openings 52 of the diaphragm plates 51 have the same size in the four optical units 13.

In the camera module 1D, the optical axes of the two sets of optical units 13 disposed in the vertical and horizontal directions of the light incidence surface extend in the same direction. One-dot chain line illustrated in B of FIG. 11 indicates the optical axis of each of the optical units 13. The camera module 1D having such a structure is ideal for photographing a higher resolution image using a super-resolution technique than photographing using one optical unit 13.

In the camera module 1D, it is possible to obtain a plurality of images which are not necessarily identical while the optical axes being directed in the same direction by photographing images using a plurality of light receiving elements 12 disposed at different positions while the optical axes in each of the vertical and horizontal directions being directed in the same direction or by photographing images using light receiving pixels in different regions of one light receiving element 12. By combining image data of respective places, of the plurality of non-identical images, it is possible to obtain a high resolution image. Due to this, the lenses 21 of one camera module 1D preferably have the same planar shape in the four optical units 13 as illustrated in C of FIG. 11.

D of FIG. 11 is a plan view of the substrate with lenses 41W in the substrate state, for obtaining the substrate with lenses 41 illustrated in C of FIG. 11. The substrate with lenses 41W in the substrate state is configured to obtain eight camera modules 1D illustrated in A of FIG. 11 for one substrate.

As illustrated in D of FIG. 11, in the substrate with lenses 41W in the substrate state, in order to form the camera module 1D, the camera module 1D includes a plurality of lenses 21 and a plurality of module lens groups is disposed on the substrate at a fixed pitch.

<5. Fifth Embodiment of Camera Module>

Figure 12:
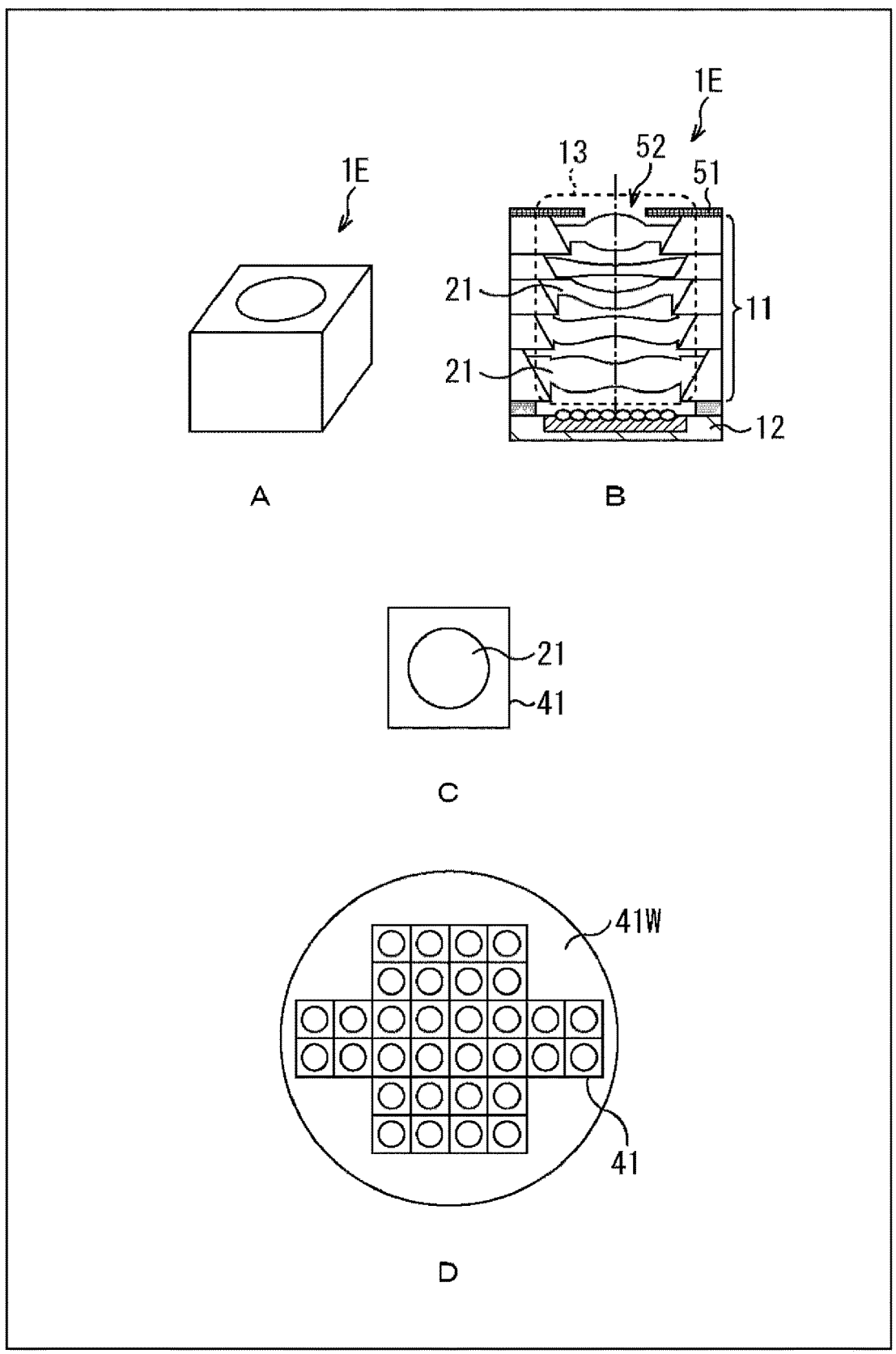
FIG. 12 is a diagram illustrating a fifth embodiment of a camera module which uses a stacked lens structure to which the present technique is applied.

A to D of FIG. 12 are diagrams illustrating a fifth embodiment of a camera module which uses a stacked lens structure to which the present technique is applied.

A of FIG. 12 is a schematic diagram illustrating an appearance of a camera module 1E as a fifth embodiment of the camera module 1. B of FIG. 12 is a schematic cross-sectional view of the camera module 1E.

The camera module 1E is a monocular camera module in which one optical unit 13 having one optical axis is provided in the camera module 1E.

C of FIG. 12 is a plan view of the substrate with lenses 41, illustrating a planar shape of the lenses 21 of the camera module 1E. The camera module 1E includes one optical unit 13.

D of FIG. 12 is a plan view of the substrate with lenses 41W in the substrate state, for obtaining the substrate with lenses 41 illustrated in C of FIG. 12. The substrate with lenses 41W in the substrate state is configured to obtain thirty two camera modules 1E illustrated in A of FIG. 12 for one substrate.

As illustrated in D of FIG. 12, in the substrate with lenses 41W in the substrate state, a plurality of lenses 21 for the camera module 1E is disposed on the substrate at a fixed pitch.

<6. Detailed Configuration of Camera Module of Fourth Embodiment>

Next, a detailed configuration of the camera module 1D according to the fourth embodiment illustrated in A to D of FIG. 11 will be described with reference to FIG. 13.

Figure 13:
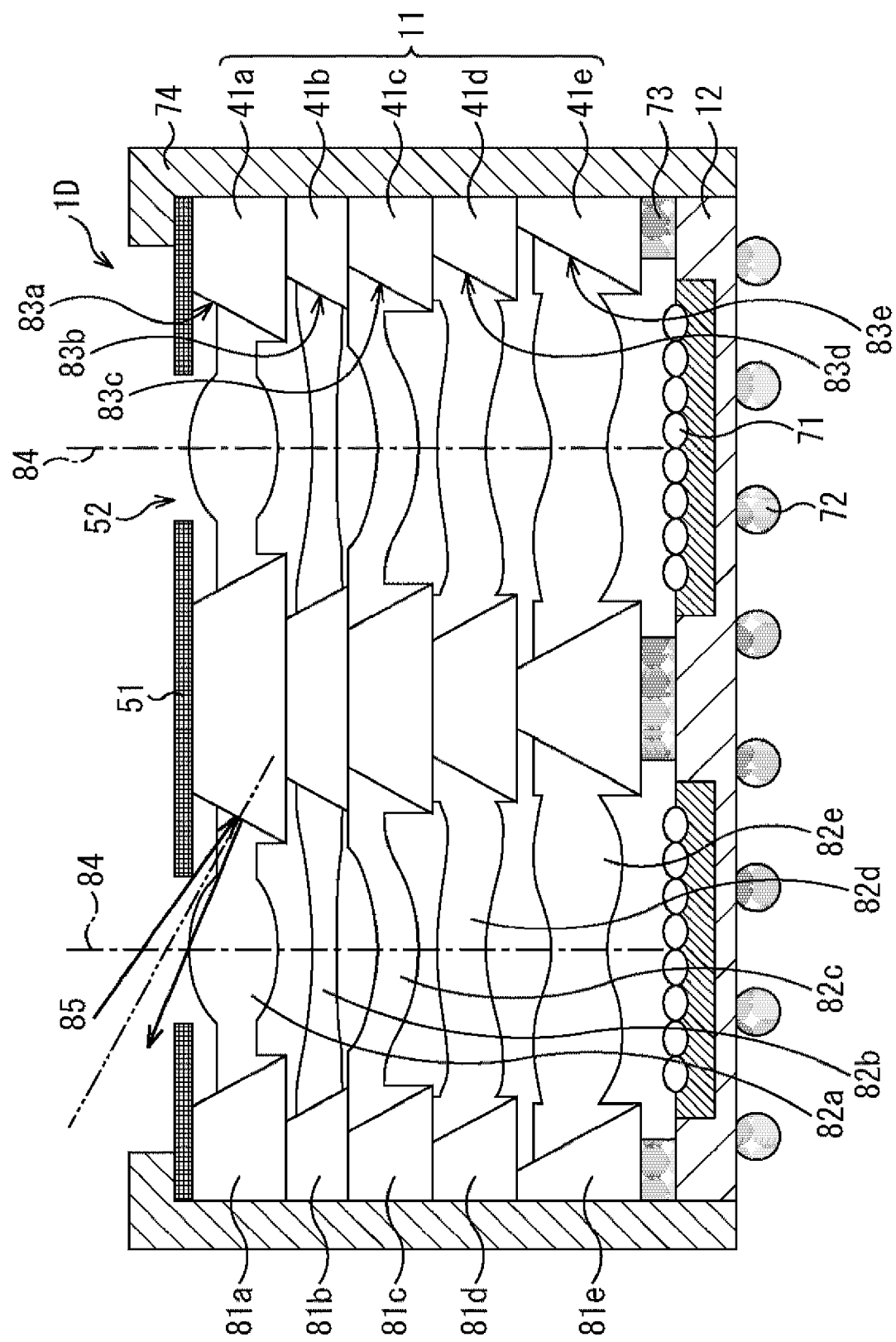
FIG. 13 is a diagram illustrating a detailed configuration of the camera module according to the fourth embodiment.

FIG. 13 is a cross-sectional view of the camera module 1D illustrated in B of FIG. 11.

The camera module 1D is configured to include a stacked lens structure 11 in which a plurality of substrates with lenses 41a to 41e are stacked and a light receiving element 12. The stacked lens structure 11 includes a plurality of optical units 13. One dot chain line 84 indicates an optical axis of each of the optical units 13. The light receiving element 12 is disposed on the lower side of the stacked lens structure 11. In the camera module 1D, light entering camera module 1D from above passes through the stacked lens structure 11 and the light is received by the light receiving element 12 disposed on the lower side of the stacked lens structure 11.

The stacked lens structure 11 includes five stacked substrates with lenses 41a to 41e. When the five substrates with lenses 41a to 41e are not distinguished particularly, the substrates with lenses will be referred to simply as substrates with lenses 41.

A cross-sectional shape of a through-hole 83 of the substrates with lenses 41 that form the stacked lens structure 11 has a so-called downward tapered shape such that an opening width decreases as it advances toward the lower side (the side on which the light receiving element 12 is disposed).

A diaphragm plate 51 is disposed on the stacked lens structure 11. The diaphragm plate 51 has a layer formed of a material having a light absorbing property or a light blocking property, for example. An opening 52 is formed in the diaphragm plate 51.

The light receiving element 12 is formed of a front or back-illuminated complementary metal oxide semiconductor (CMOS) image sensor, for example. On-chip lenses 71 are formed on a surface on an upper side of the light receiving element 12 close to the stacked lens structure 11, and external terminals 72 for inputting and outputting signals are formed on a surface on a lower side of the light receiving element 12.

The stacked lens structure 11, the light receiving element 12, the diaphragm plate 51, and the like are accommodated in a lens barrel 74.

A structure material 73 is disposed on the upper side of the light receiving element 12. The stacked lens structure 11 and the light receiving element 12 are fixed by the structure material 73. The structure material 73 is an epoxy-based resin, for example.

In the present embodiment, although the stacked lens structure 11 includes five stacked substrates with lenses 41a to 41e, the number of stacked substrates with lenses 41 is not particularly limited as long as two substrates with lenses or more are stacked.

Each of the substrates with lenses 41 that form the stacked lens structure 11 is configured by adding a lens resin portion 82 to a support substrate 81. The support substrate 81 has the through-hole 83, and the lens resin portion 82 is formed on the inner side of the through-hole 83. The lens resin portion 82 is a portion which includes the above-described lenses 21 and extends up to the support substrate 81 and which is integrated with a portion that supports the lens 21 by a material that forms the lens 21.

When the support substrates 81, the lens resin portions 82, or the through-holes 83 of the respective substrates with lenses 41a to 41e are distinguished, the respective components will be referred to as support substrates 81a to 81e, lens resin portions 82a to 82e, or through-holes 83a to 83e so as to correspond to the substrates with lenses 41a to 41e as illustrated in FIG. 13.

<Detailed Description of Lens Resin Portion>

Next, the shape of the lens resin portion 82 will be described by way of an example of the lens resin portion 82a of the substrate with lenses 41a.

Figure 14:
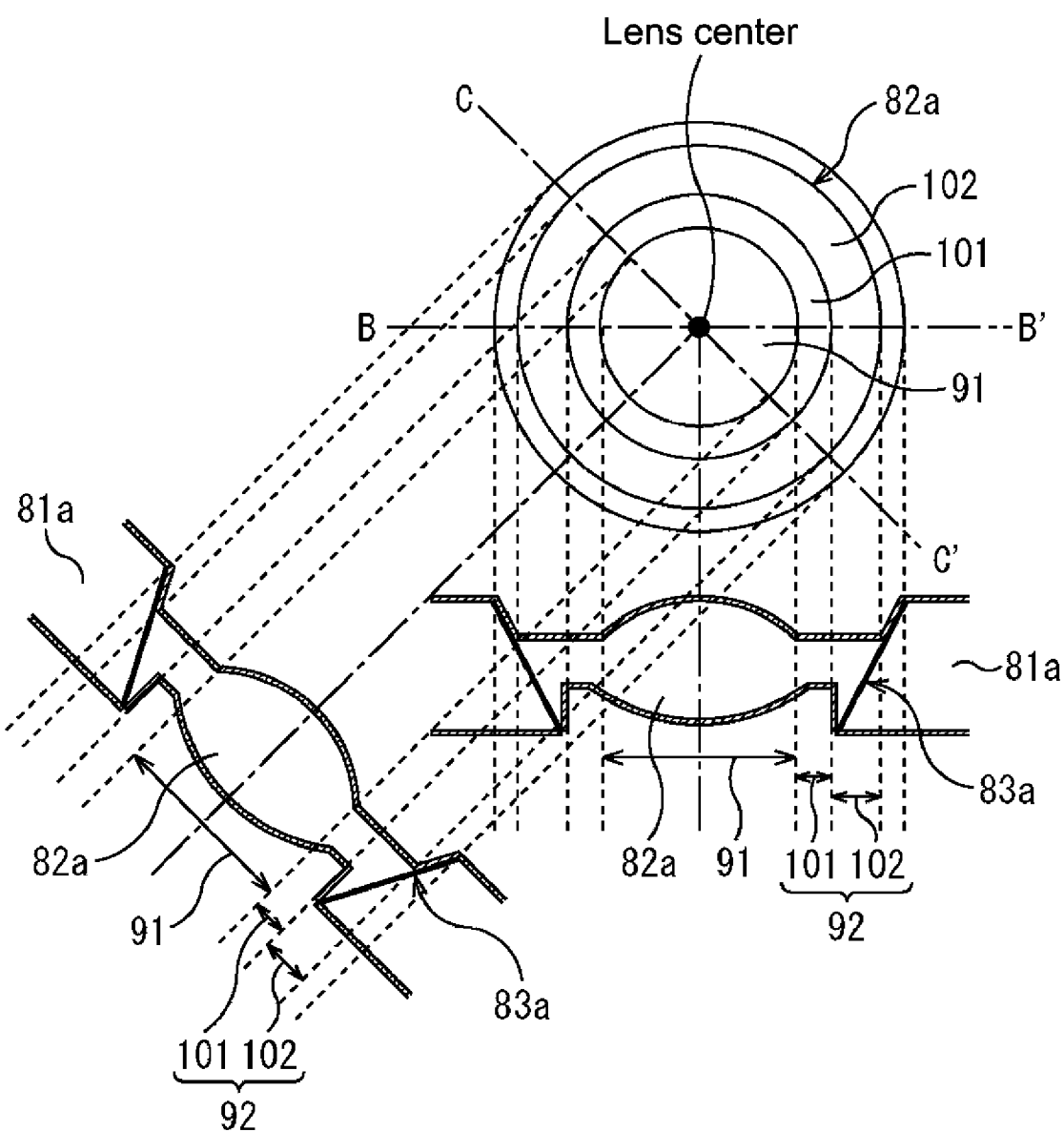
FIG. 14 illustrates a plan view and cross-sectional views of a support substrate and a lens resin portion.

FIG. 14 illustrates a plan view and cross-sectional views of the support substrate 81a and the lens resin portion 82a that form the substrate with lenses 41a.

The cross-sectional views of the support substrate 81a and the lens resin portion 82a illustrated in FIG. 14 are cross-sectional views taken along lines B-B' and C-C' in the plan view.

The lens resin portion 82a is a portion formed integrally by the material that forms the lens 21 and includes a lens portion 91 and a support portion 92. In the above description, the lens 21 corresponds to the entire lens portion 91 or the entire lens resin portion 82a.

The lens portion 91 is a portion having the performance of a lens, and in other words, is "a portion that refracts light so that light converges or diverges" or "a portion having a curved surface such as a convex surface, a concave surface, or an aspherical surface, or a portion in which a plurality of polygons used in a lens which uses a Fresnel screen or a diffraction grating are continuously disposed".

The support portion 92 is a portion that extends from the lens portion 91 up to the support substrate 81a to support the lens portion 91. The support portion 92 includes an arm portion 101 and a leg portion 102 and is positioned at the outer circumference of the lens portion 91.

The arm portion 101 is a portion that is disposed on the outer side of the lens portion 91 in contact with the lens portion 91 and extends outward from the lens portion 91 in a constant thickness. The leg portion 102 is a portion of the support portion 92 other than the arm portion 101 and includes a portion that is in contact with the side wall of the through-hole 83a. The thickness of the resin in the leg portion 102 is preferably larger than that of the arm portion 101.

The planar shape of the through-hole 83a formed in the support substrate 81a is circular, and the cross-sectional shape is naturally the same regardless of the diametrical direction. The cross-sectional shape of the lens resin portion 82a which is the shape determined by the upper and lower molds during forming of a lens is the same regardless of the diametrical direction.

Figure 15:
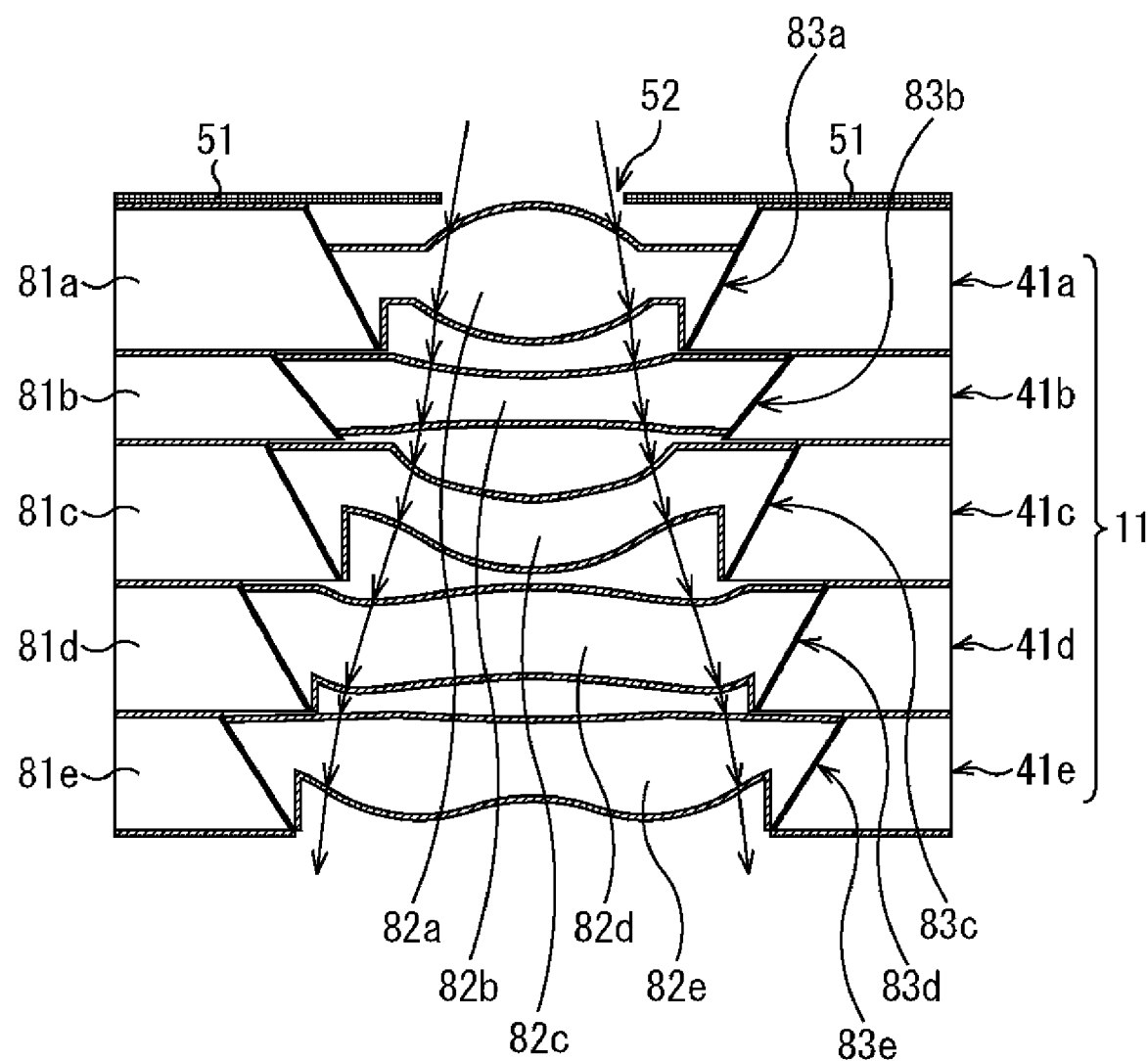
FIG. 15 is a cross-sectional view illustrating a stacked lens structure and a diaphragm plate.

FIG. 15 is a cross-sectional view illustrating the stacked lens structure 11 and the diaphragm plate 51 which are part of the camera module 1D illustrated in FIG. 13.

In the camera module 1D, after light entering the module is narrowed by the diaphragm plate 51, the light is widened inside the stacked lens structure 11 and is incident on the light receiving element 12 (not illustrated in FIG. 15)

disposed on the lower side of the stacked lens structure 11. That is, in a general view of the entire stacked lens structure 11, the light entering the module moves while widening substantially in a fan shape toward the lower side from the opening 52 of the diaphragm plate 51. Due to this, as an example of the size of the lens resin portion 82 provided in the stacked lens structure 11, in the stacked lens structure 11 illustrated in FIG. 15, the lens resin portion 82a provided in the substrate with lenses 41a disposed immediately below the diaphragm plate 51 is the smallest, and the lens resin portion 82e provided in the substrate with lenses 41e disposed on the bottom layer of the stacked lens structure 11 is the largest.

If the lens resin portion 82 of the substrate with lenses 41 has a constant thickness, it is more difficult to manufacture a larger lens than a smaller lens. This is because a large lens is likely to be deformed due to a load applied to the lens when manufacturing the lens and it is difficult to maintain the strength. Due to this, it is preferable to increase the thickness of a large lens to be larger than the thickness of a small lens. Thus, in the stacked lens structure 11 illustrated in FIG. 15, the thickness of the lens resin portion 82e provided in the substrate with lenses 41e disposed on the bottom layer is the largest among the lens resin portions 82.

The stacked lens structure 11 illustrated in FIG. 15 has at least one of the following features in order to increase the degree of freedom in a lens design.

(1) The thickness of the support substrate 81 is different at least among the plurality of substrates with lenses 41 that forms the stacked lens structure 11. For example, the thickness of the support substrate 81 in the substrate with lenses 41 on the bottom layer is the largest.

(2) An opening width of the through-hole 83 provided in the substrate with lenses 41 is different at least among the plurality of substrates with lenses 41 that forms the stacked lens structure 11. For example, the opening width of the through-hole 83 in the substrate with lenses 41 on the bottom layer is the largest.

(3) The diameter of the lens portion 91 provided in the substrate with lenses 41 is different at least among the plurality of substrates with lenses 41 that forms the stacked lens structure 11. For example, the diameter of the lens portion 91 in the substrate with lenses 41 on the bottom layer is the largest.

(4) The thickness of the lens portion 91 provided in the substrate with lenses 41 is different at least among the plurality of substrates with lenses 41 that forms the stacked lens structure 11. For example, the thickness of the lens portion 91 in the substrate with lenses 41 on the bottom layer is the largest.

(5) The distance between the lenses provided in the substrate with lenses 41 is different at least among the plurality of substrates with lenses 41 that forms the stacked lens structure 11.

(6) The volume of the lens resin portion 82 provided in the substrate with lenses 41 is different at least among the plurality of substrates with lenses 41 that forms the stacked lens structure 11. For example, the volume of the lens resin portion 82 in the substrate with lenses 41 on the bottom layer is the largest.

(7) The material of the lens resin portion 82 provided in the substrate with lenses 41 is different at least among the plurality of substrates with lenses 41 that forms the stacked lens structure 11.

In general, light incident on a camera module includes vertical incident light and oblique incident light. A large part of the oblique incident light strikes the diaphragm plate 51 and is absorbed therein or is reflected outside the camera module 1D. The oblique incident light which is not narrowed by the diaphragm plate 51 may strike the side wall of the through-hole 83 depending on an incidence angle thereof and may be reflected therefrom.

The moving direction of the reflected light of the oblique incident light is determined by the incidence angle of oblique incident light 85 and the angle of the side wall of the through-hole 83 as illustrated in FIG. 13. When the opening of the through-hole 83 has a so-called fan shape such that the opening width increases as it advances from the incidence side toward the light receiving element 12, if the oblique incident light 85 of a specific incidence angle which is not narrowed by the diaphragm plate 51 strikes the side wall of the through-hole 83, the oblique incident light may be reflected in the direction of the light receiving element 12, and the reflected light may become stray light or noise light.

However, in the stacked lens structure 11 illustrated in FIG. 13, as illustrated in FIG. 15, the through-hole 83 has a so-called downward tapered shape such that the opening width decreases as it advances toward the lower side (the side on which the light receiving element 12 is disposed). In the case of this shape, the oblique incident light 85 striking the side wall of the through-hole 83 is reflected in the upper direction (so-called the incidence side direction) rather than the lower direction (so-called the direction of the light receiving element 12). Due to this, an effect or an advantage of suppressing the occurrence of stray light or noise light is obtained.

A light absorbing material may be disposed in the side wall of the through-hole 83 of the substrate with lenses 41 in order to suppress light which strikes the side wall and is reflected therefrom.

As an example, when light (for example, visible light) of a wavelength that is to be received when the camera module 1D is used as a camera is first light and light (for example, UV light) of a wavelength different from the first light is second light, a material obtained by dispersing carbon particles as a material absorbing the first light (visible light) into a resin that is cured by the second light (UV light) may be applied or sprayed to the surface of the support substrate 81, the resin of the side wall portion only of the through-hole 83 may be cured by irradiation with the second light (UV light), and the resin in the other region may be removed. In this way, a layer of a material having a property of absorbing the first light (visible light) may be formed on the side wall of the through-hole 83.

The stacked lens structure 11 illustrated in FIG. 15 is an example of a structure in which the diaphragm plate 51 is disposed on top of the plurality of stacked substrates with lenses 41. The diaphragm plate 51 may be disposed by being inserted in any of the intermediate substrates with lenses 41 rather than on top of the plurality of stacked substrates with lenses 41.

As still another example, instead of providing the planar diaphragm plate 51 separately from the substrate with lenses 41, a layer of a material having a light absorbing property may be formed on the surface of the substrate with lenses 41 so as to function as a diaphragm. For example, a material obtained by dispersing carbon particles as a material absorbing the first light (visible light) in a resin that is cured by the second light (UV light) may be applied or sprayed to the surface of the substrate with lenses 41, the resin in a region other than a region through which light is to pass when the layer functions as a diaphragm may be irradiated with the second light (UV light) to cure the resin so as to remain, and the resin in the region that is not cured (that is, the region through which light is to pass when the layer functions as a diaphragm) may be removed. In this way, the diaphragm may be formed on the surface of the substrate with lenses 41.

The substrate with lenses 41 in which the diaphragm is formed on the surface may be the substrate with lenses 41 disposed on the top layer of the stacked lens structure 11 or may be the substrate with lenses 41 which is an inner layer of the stacked lens structure 11.

The stacked lens structure 11 illustrated in FIG. 15 has a structure in which the substrates with lenses 41 are stacked.

As another embodiment, the stacked lens structure 11 may have a structure which includes a plurality of substrates with lenses 41 and at least one support substrate 81 which does not have the lens resin portion 82. In this structure, the support substrate 81 which does not have the lens resin portion 82 may be disposed on the top layer or the bottom layer of the stacked lens structure 11 and may be disposed as an inner layer of the stacked lens structure 11. This structure provides an effect or an advantage, for example, that the distance between the plurality of lenses included in the stacked lens structure 11 and the distance between the lens resin portion 82 on the bottom layer of the stacked lens structure 11 and the light receiving element 12 disposed on the lower side of the stacked lens structure 11 can be set arbitrarily.

Alternatively, this structure provides an effect or an advantage that, when the opening width of the support substrate 81 which does not have the lens resin portion 82 is set appropriately and a material having a light absorbing property is disposed in a region excluding the opening, the material can function as a diaphragm plate.

<7. Sixth Embodiment of Camera Module>

Figure 16:
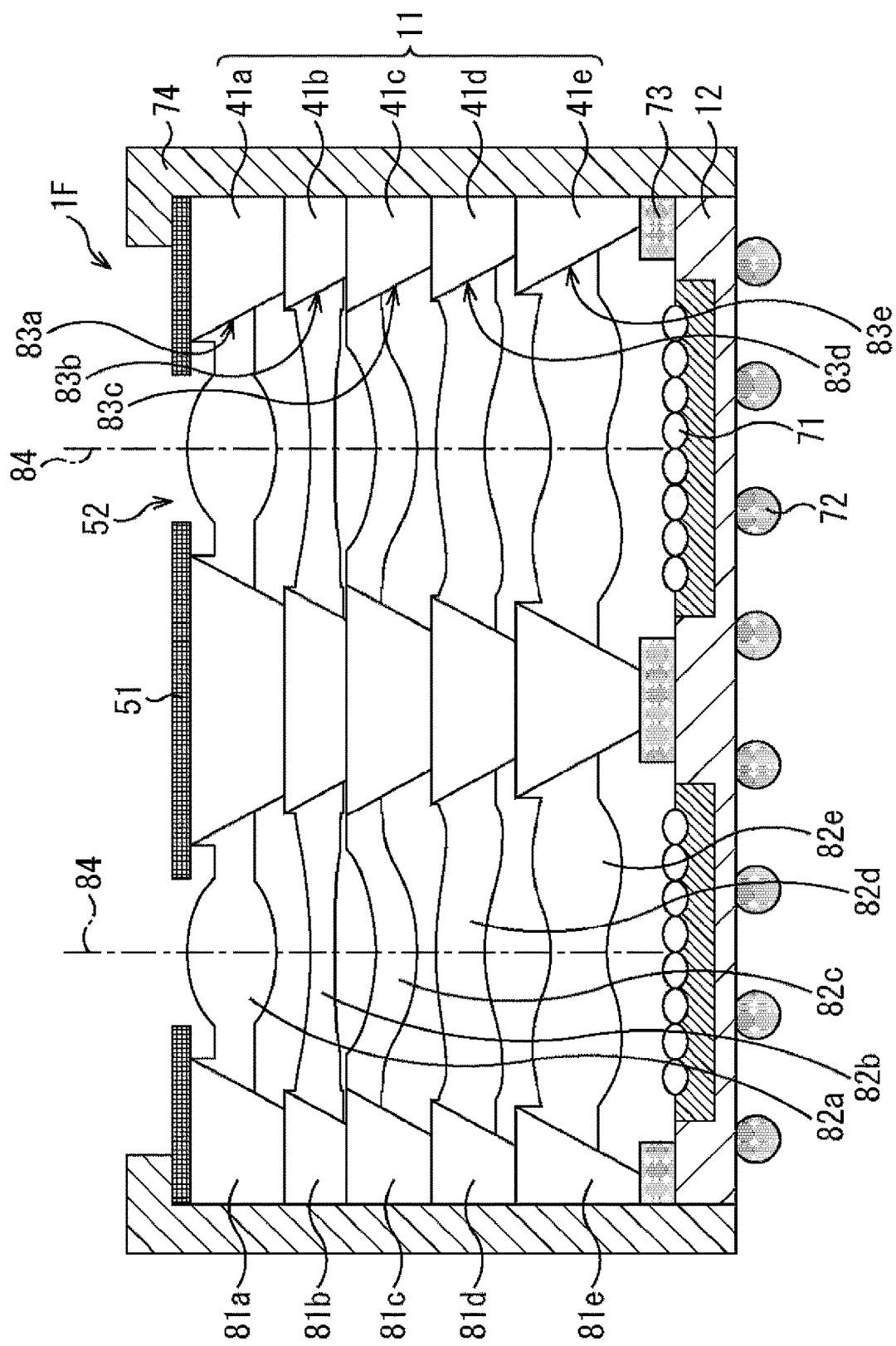
FIG. 16 is a diagram illustrating a sixth embodiment of a camera module which uses a stacked lens structure to which the present technique is applied.

FIG. 16 is a diagram illustrating a sixth embodiment of a camera module which uses a stacked lens structure to which the present technique is applied.

In FIG. 16, the portions corresponding to those of the fourth embodiment illustrated in FIG. 13 will be denoted by the same reference numerals, and different portions from those of the camera module 1D illustrated in FIG. 13 will be described mainly.

In a camera module 1F illustrated in FIG. 16, similarly to the camera module 1D illustrated in FIG. 13, after incident light is narrowed by the diaphragm plate 51, the light is widened inside the stacked lens structure 11 and is incident on the light receiving element 12 disposed on the lower side of the stacked lens structure 11. That is, in a general view of the entire stacked lens structure 11, the light moves while widening substantially in a fan shape toward the lower side from the opening 52 of the diaphragm plate 51.

The camera module 1F illustrated in FIG. 16 is different from the camera module 1D illustrated in FIG. 13 in that the cross-sectional shape of the through-holes 83 of the substrates with lenses 41 that form the stacked lens structure 11 has a so-called fan shape such that the opening width increases as it advances toward the lower side (the side on which the light receiving element 12 is disposed).

The stacked lens structure 11 of the camera module 1F has a structure in which incident light moves while widening in a fan shape from the opening 52 of the diaphragm plate 51 toward the lower side. Thus, such a fan shape that the opening width of the through-hole 83 increases toward the lower side makes the support substrate 81 less likely to obstruct an optical path than such a downward tapered shape that the opening width of the through-hole 83 decreases toward the lower side. Due to this, an effect of increasing the degree of freedom in a lens design is obtained.

Moreover, in the case of the downward tapered shape that the opening width of the through-hole 83 decreases toward the lower side, the cross-sectional area in the substrate plane direction of the lens resin portion 82 including the support portion 92 has a specific size in the lower surface of the lens resin portion 82 in order to transmit light entering the lens 21. On the other hand, the cross-sectional area increases as it advances from the lower surface of the lens resin portion 82 toward the upper surface.

In contrast, in the case of the fan shape that the opening width of the through-hole 83 increases toward the lower side, the cross-sectional area in the lower surface of the lens resin portion 82 is substantially the same as the case of the downward tapered shape. However, the cross-sectional area decreases as it advances from the lower surface of the lens resin portion 82 toward the upper surface.

Due to this, the structure in which the opening width of the through-hole 83 increases toward the lower side provides an effect or an advantage that the size of the lens resin portion 82 including the support portion 92 can be reduced. As a result, it is possible to provide an effect or an advantage that the above-described difficulty in forming lenses, occurring when the lens is large can be reduced.

<8. Seventh Embodiment of Camera Module>

Figure 17:
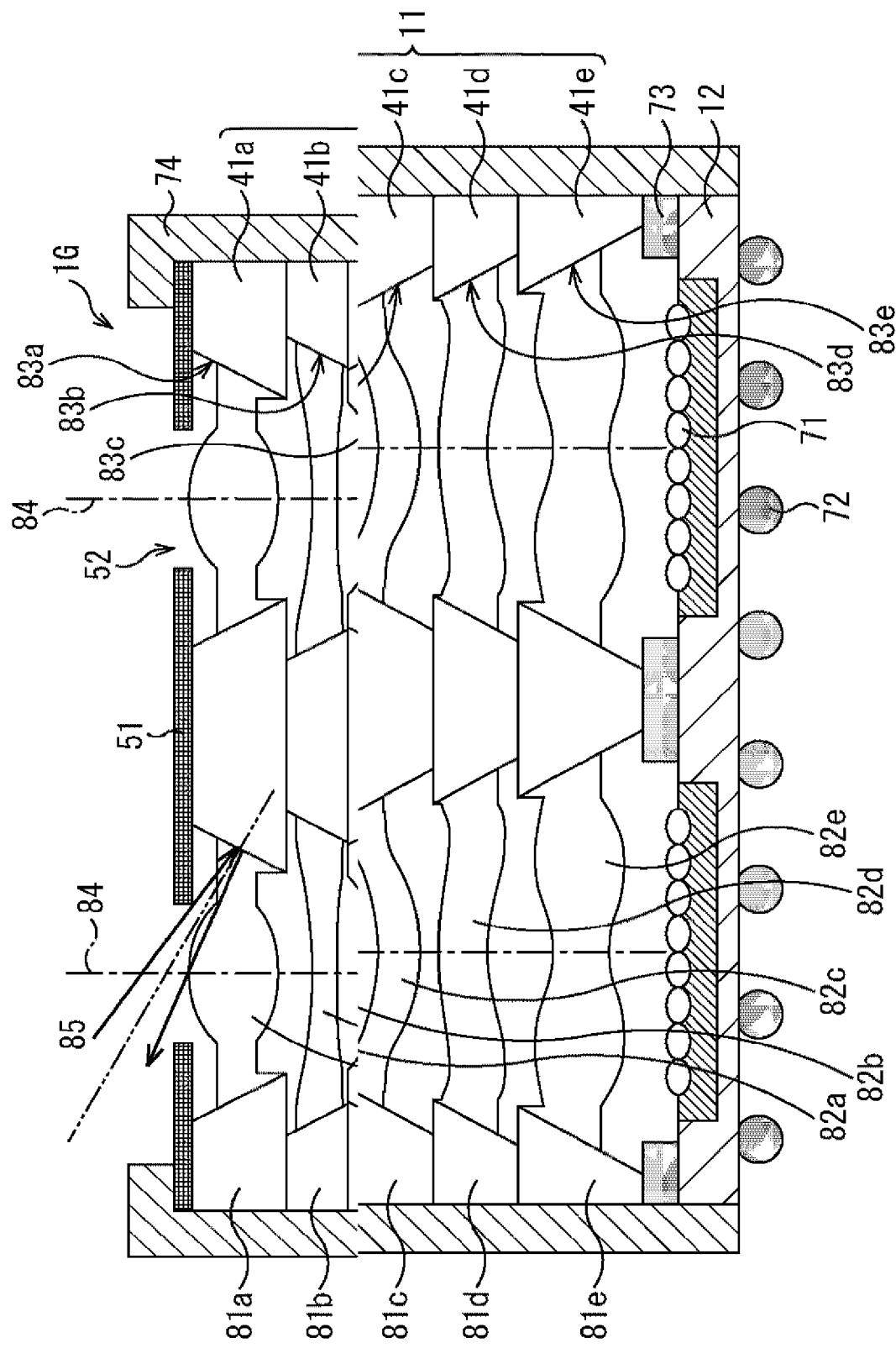
FIG. 17 is a diagram illustrating a seventh embodiment of a camera module which uses a stacked lens structure to which the present technique is applied.

FIG. 17 is a diagram illustrating a seventh embodiment of a camera module which uses a stacked lens structure to which the present technique is applied.

In FIG. 17, the portions corresponding to those of the fourth embodiment illustrated in FIG. 13 will be denoted by the same reference numerals, and different portions from those of the camera module 1D illustrated in FIG. 13 will be described mainly.

In a camera module 1G illustrated in FIG. 17, the shapes of the lens resin portions 82 and the through-holes 83 of the substrates with lenses 41 that form the stacked lens structure 11 are different from those of the camera module 1D illustrated in FIG. 13.

The stacked lens structure 11 of the camera module 1G includes both a substrate with lenses 41 in which the through-hole 83 has a so-called downward tapered shape such that the opening width decreases toward the lower side (the side on which the light receiving element 12 is disposed) and a substrate with lenses 41 in which the through-hole 83 has a so-called fan shape such that the opening width increases toward the lower side.

In the substrate with lenses 41 in which the through-hole 83 has a so-called downward tapered shape that the opening width decreases toward the lower side, the oblique incident light 85 striking the side wall of the through-hole 83 is reflected in the upper direction (so-called the incidence side direction) as described above. Due to this, an effect or an advantage of suppressing the occurrence of stray light or noise light is obtained.

In the stacked lens structure 11 illustrated in FIG. 17, a plurality of substrates with lenses 41 in which the through-hole 83 has the so-called downward tapered shape that the opening width decreases toward the lower side is used particularly on the upper side (the incidence side) among the plurality of substrates with lenses 41 that forms the stacked lens structure 11.

In the substrate with lenses 41 in which the through-hole 83 has the so-called fan shape that the opening width increases toward the lower side, the support substrate 81 provided in the substrate with lenses 41 is rarely likely to obstruct the optical path as described above. Due to this, an effect or an advantage of increasing the degree of freedom in a lens design or reducing the size of the lens resin portion 82 including the support portion 92 provided in the substrate with lenses 41 is obtained.

In the stacked lens structure 11 illustrated in FIG. 17, light moves while being widened in a fan shape from the diaphragm toward the lower side. Thus, the lens resin portion 82 provided in several substrates with lenses 41 disposed on the lower side among the plurality of substrates with lenses 41 that forms the stacked lens structure 11 has a large size. When the through-hole 83 having the fan shape is used in such a large lens resin portion 82, a remarkable effect of reducing the size of the lens resin portion 82 is obtained.

Thus, in the stacked lens structure 11 illustrated in FIG. 17, a plurality of substrates with lenses 41 in which the through-hole 83 has the so-called fan shape that the opening width increases toward the lower side is used particularly on the lower side among the plurality of substrates with lenses 41 that forms the stacked lens structure 11.

<9. Detailed Configuration of Substrate with Lenses>

Next, a detailed configuration of the substrate with lenses 41 will be described.

Figure 18:
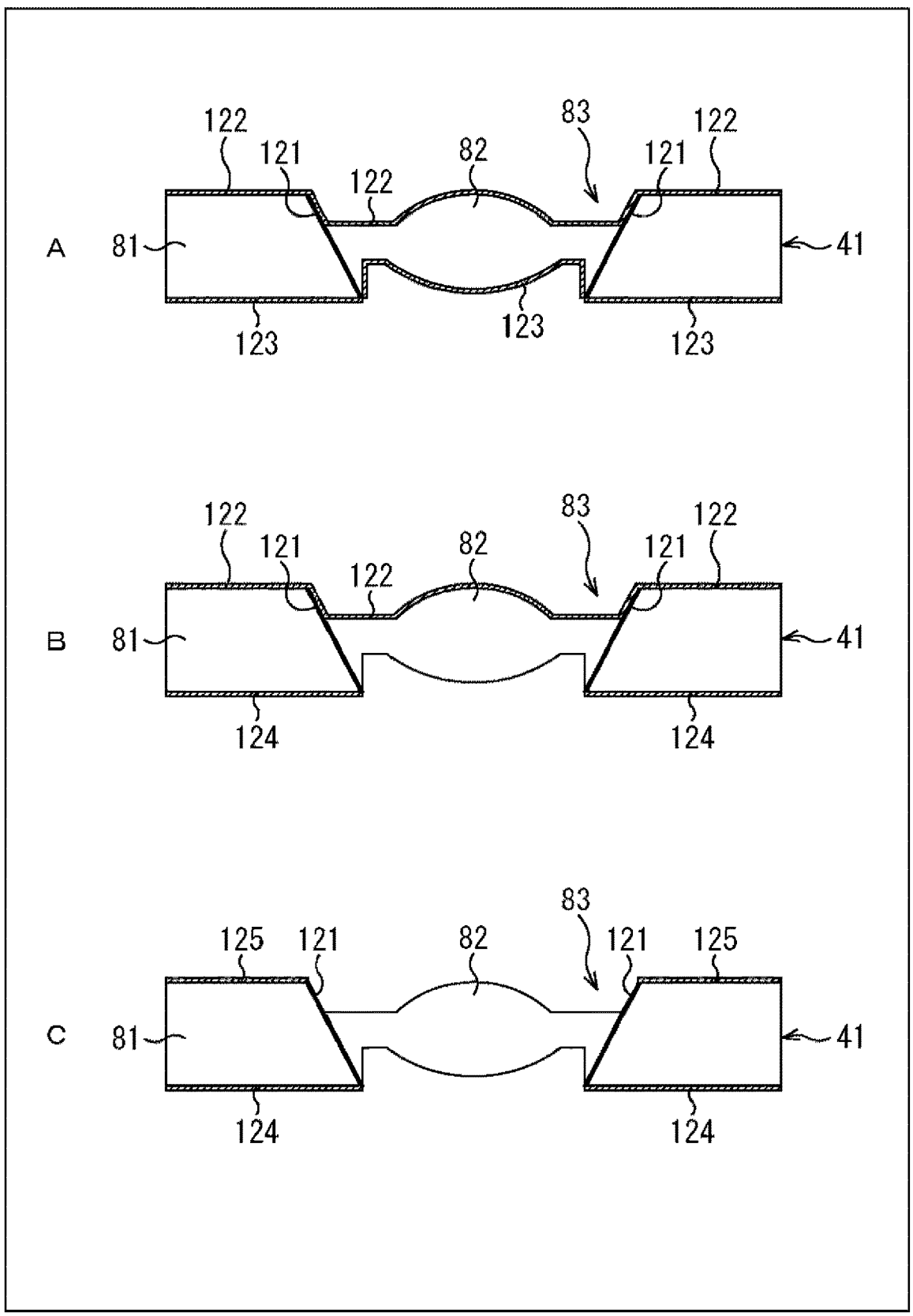
FIG. 18 is a cross-sectional view illustrating a detailed configuration of a substrate with lenses.

A to C of FIG. 18 are cross-sectional views illustrating a detailed configuration of the substrate with lenses 41.

Although A to C of FIG. 18 illustrate the substrate with lenses 41a on the top layer among the five substrates with lenses 41a to 41e, the other substrates with lenses 41 are configured similarly.

The substrate with lenses 41 may have any one of the configurations illustrated in A to C of FIG. 18.

In the substrate with lenses 41 illustrated in A of FIG. 18, the lens resin portion 82 is formed so as to block the through-hole 83 when seen from the upper surface in relation to the through-hole 83 formed in the support substrate 81. As described with reference to FIG. 14, the lens resin portion 82 includes the lens portion 91 (not illustrated) at the center and the support portion 92 (not illustrated) in the periphery.

A film 121 having a light absorbing property or a light blocking property is formed on the side wall of the through-hole 83 of the substrate with lenses 41 in order to prevent ghost or flare resulting from reflection of light. Such a film 121 will be referred to as a light blocking film 121 for the sake of convenience.

An upper surface layer 122 containing oxides, nitrides, or other insulating materials is formed on an upper surface of the support substrate 81 and the lens resin portion 82, and a lower surface layer 123 containing oxides, nitrides, or other insulating materials is formed on a lower surface of the support substrate 81 and the lens resin portion 82.

As an example, the upper surface layer 122 forms an anti-reflection film in which a low refractive index film and a high refractive index film are stacked alternately in a plurality of layers. The anti-reflection film can be formed by alternately stacking a low refractive index film and a high refractive index film in four layers in total. For example, the low refractive index film is formed of an oxide film such as SiOx (1≤x≤2), SiOC, or SiOF, and the high refractive index film is formed of a metal oxide film such as TiO, TaO, or Nb2O5.

The configuration of the upper surface layer 122 may be designed so as to obtain a desired anti-reflection performance using an optical simulation, for example, and the material, the thickness, the number of stacked layers, and the like of the low refractive index film and the high refractive index film are not particularly limited. In the present embodiment, the top surface of the upper surface layer 122 is a low refractive index film which has a thickness of 20 to 1000 nm, for example, a density of 2.2 to 2.5 g/cm$^3$, for example, and a flatness of approximately 1 nm or smaller in root mean roughness Rq (RMS), for example. Moreover, the upper surface layer 122 also serve as a bonding film when it is bonded to other substrates with lenses 41, which will be described in detail later.

As an example, the upper surface layer 122 may be an anti-reflection film in which a low refractive index film and a high refractive index film are stacked alternately in a plurality of layers, and among such anti-reflection films, the upper surface layer 122 may be an anti-reflection film of an inorganic material. As another example, the upper surface layer 122 may be a single-layer film containing oxides, nitrides, or other insulating materials, and among such single-layer films, the upper surface layer 122 may be a film of an inorganic material.

As an example, the lower surface layer 123 may be an anti-reflection film in which a low refractive index film and a high refractive index film are stacked alternately in a plurality of layers, and among such anti-reflection films, the lower surface layer 123 may be an anti-reflection film of an inorganic material. As another example, the lower surface layer 123 may be a single-layer film containing oxides, nitrides, or other insulating materials, and among such single-layer films, the lower surface layer 123 may be a film of an inorganic material.

As for the substrates with lenses 41 illustrated in B and C of FIG. 18, only different portions from those of the substrate with lenses 41 illustrated in A of FIG. 18 will be described.

In the substrate with lenses 41 illustrated in B of FIG. 18, a film formed on the lower surface of the support substrate 81 and the lens resin portion 82 is different from that of the substrate with lenses 41 illustrated in A of FIG. 18.

In the substrate with lenses 41 illustrated in B of FIG. 18, a lower surface layer 124 containing oxides, nitrides, or other insulating materials is formed on the lower surface of the support substrate 81, and the lower surface layer 124 is not formed on the lower surface of the lens resin portion 82. The lower surface layer 124 may be formed of the same material as or a different material from the upper surface layer 122.

Such a structure can be formed by a manufacturing method of forming the lower surface layer 124 on the lower surface of the support substrate 81 before forming the lens resin portion 82 and then forming the lens resin portion 82. Alternatively, such a structure can be formed by forming a mask on the lens resin portion 82 after forming the lens resin portion 82 and then depositing a film that forms the lower surface layer 124 to the lower surface of the support substrate 81 according to PVD, for example, in a state in which a mask is not formed on the support substrate 81.

In the substrate with lenses 41 illustrated in C of FIG. 18, the upper surface layer 125 containing oxides, nitrides, or other insulating materials is formed on the upper surface of the support substrate 81, and the upper surface layer 125 is not formed on the upper surface of the lens resin portion 82.

Similarly, in the lower surface of the substrate with lenses 41, the lower surface layer 124 containing oxides, nitrides, or other insulating materials is formed on the lower surface of the support substrate 81, and the lower surface layer 124 is not formed on the lower surface of the lens resin portion 82.

Such a structure can be formed by a manufacturing method of forming the upper surface layer 125 and the lower surface layer 124 on the support substrate 81 before the lens resin portion 82 is formed and then forming the lens resin portion 82. Alternatively, such a structure can be formed by forming a mask on the lens resin portion 82 after forming the lens resin portion 82 and then depositing a film that forms the upper surface layer 125 and the lower surface layer 124 to the surface of the support substrate 81 according to PVD, for example, in a state in which a mask is not formed on the support substrate 81. The lower surface layer 124 and the upper surface layer 125 may be formed of the same material or different materials.

The substrate with lenses 41 can be formed in the above-described manner.

<10. Method of Manufacturing Substrate with Lenses>

Next, a method of manufacturing the substrate with lenses 41 will be described with reference to A and B of FIG. 19 to FIG. 29.

First, a support substrate 81W in a substrate state in which a plurality of through-holes 83 is formed is prepared. A silicon substrate used in general semiconductor devices, for example, can be used as the support substrate 81W. The support substrate 81W has such as circular shape as illustrated in A of FIG. 19, for example, and the diameter thereof is 200 mm or 300 mm, for example. The support substrate 81W may be a glass substrate, a resin substrate, or a metal substrate, for example, other than the silicon substrate.

Moreover, in the present embodiment, although the planar shape of the through-hole 83 is circular as illustrated in A of FIG. 19, the planar shape of the through-hole 83 may be polygonal such as rectangular as illustrated in B of FIG. 19.

The opening width of the through-hole 83 may be between approximately 100 μm and approximately 20 mm, for example. In this case, for example, approximately 100 to 5,000,000 through-holes 83 can be disposed in the support substrate 81W.

In the present specification, the size of the through-hole 83 in the plane direction of the substrate with lenses 41 is referred to as an opening width. The opening width means the length of one side when the planar shape of the through-hole 83 is rectangular and means the diameter when the planar shape of the through-hole 83 is circular unless particularly stated otherwise.

Figure 20:
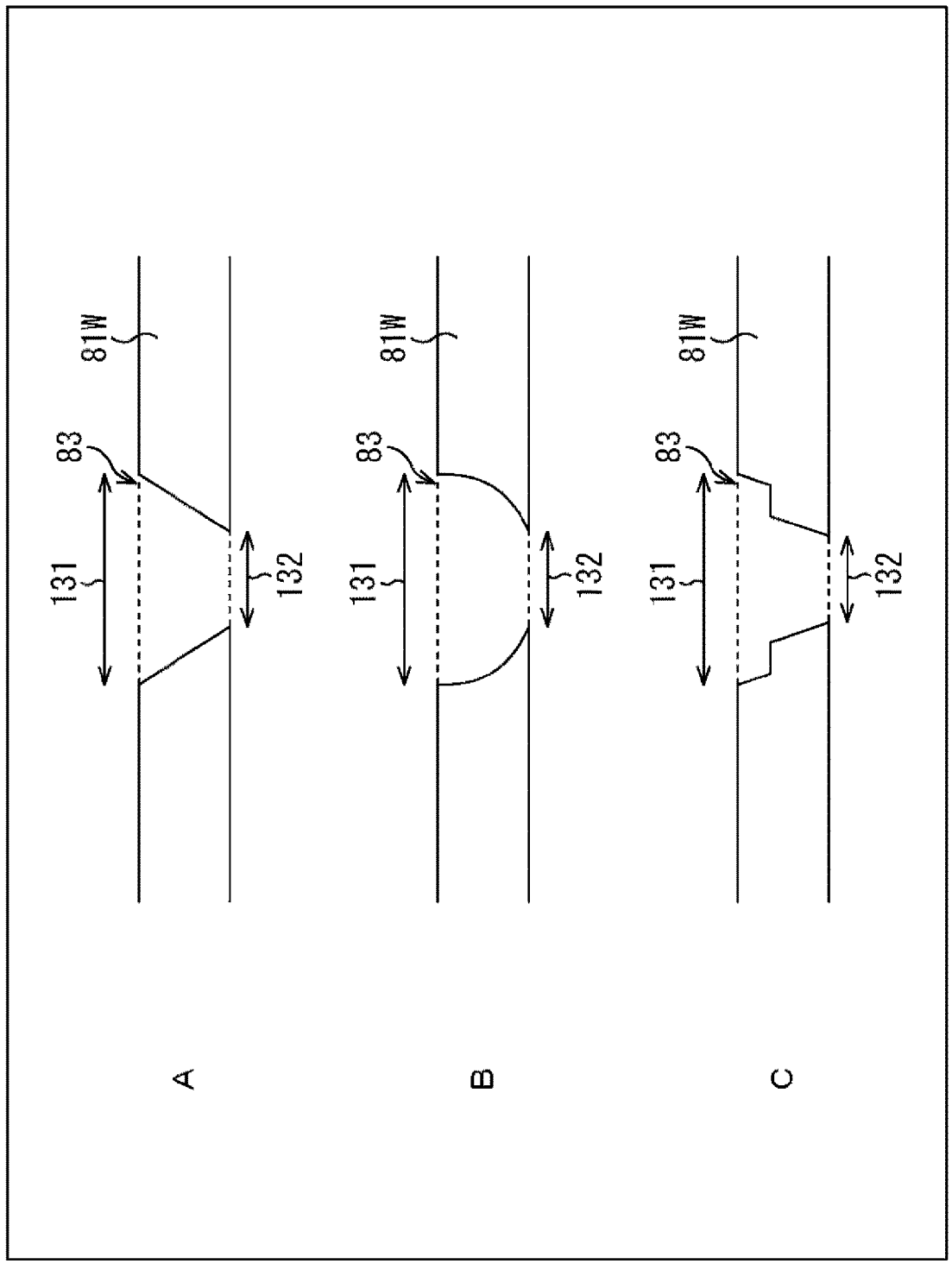
FIG. 20 is a diagram illustrating a method of manufacturing the substrate with lenses.

As illustrated in A to C of FIG. 20, the through-hole 83 is configured such that a second opening width 132 in a second surface facing a first surface of the support substrate 81W is smaller than a first opening width 131 in the first surface.

As an example of a three-dimensional shape of the through-hole 83 of which the second opening width 132 is smaller than the first opening width 131, the through-hole 83 may have a truncated conical shape as illustrated in A of FIG. 20 and may have a truncated polygonal pyramidal shape. The cross-sectional shape of the side wall of the through-hole 83 may be linear as illustrated in A of FIG. 20 and may be curved as illustrated in B of FIG. 20. Alternatively, the cross-sectional shape may have a step as illustrated in C of FIG. 20.

When a resin is supplied into the through-hole 83 having such a shape that the second opening width 132 is smaller than the first opening width 131, and the resin is pressed by mold members in opposite directions from the first and second surfaces to form the lens resin portion 82, the resin that forms the lens resin portion 82 receives force from the two facing mold members and is pressed against the side wall of the through-hole 83. Due to this, it is possible to obtain an effect of increasing the adhesion strength between the support substrate and the resin that forms the lens resin portion 82.

As another embodiment of the through-hole 83, the through-hole 83 may have such a shape that the first opening width 131 is the same as the second opening width 132 (that is, a shape that the cross-sectional shape of the side wall of the through-hole 83 is vertical).

<Through-Hole Forming Method Using Wet-Etching>

The through-holes 83 of the support substrate 81W can be formed by etching the support substrate 81W according to wet-etching. Specifically, before the support substrate 81W is etched, an etching mask for preventing a non-opening region of the support substrate 81W from being etched is formed on the surface of the support substrate 81W. An insulating film such as a silicon oxide film or a silicon nitride film, for example, is used as the material of the etching mask. The etching mask is formed by forming the layer of an etching mask material on the surface of the support substrate 81W and opening a pattern that forms the planar shape of the through-hole 83 in the layer. After the etching mask is formed, the support substrate 81W is etched whereby the through-holes 83 are formed in the support substrate 81W.

When single-crystal silicon of which the substrate plane orientation is (100) is used as the support substrate 81W, for example, crystal anisotropic wet-etching which uses an alkaline solution such as KOH may be used to form the through-hole 83.

When crystal anisotropic wet-etching which uses an alkaline solution such as KOH is performed on the support substrate 81W which is single-crystal silicon of which the substrate plane orientation is (100), etching progresses so that the (111) plane appears on the opening side wall. As a result, even when the planar shape of the opening of the etching mask is circular or rectangular, the through-holes 83 in which the planar shape is rectangular, the second opening width 132 of the through-hole 83 is smaller than the first opening width 131, and the three-dimensional shape of the through-hole 83 has a truncated pyramidal shape or a similar shape are obtained. The angle of the side wall of the through-hole 83 having the truncated pyramidal shape is approximately 55° with respect to the substrate plane.

As another example of etching for forming the through-hole, wet-etching which uses a chemical liquid capable of etching silicon in an arbitrary shape without any limitation of crystal orientations, disclosed in International Patent Publication No. 2011/017739 or the like may be used. Examples of this chemical liquid include a chemical liquid obtained by adding at least one of polyoxyethylene alkylphenyl ethers, poly-oxyalkylenealkyl ethers, and poly-ethylene glycols which are surfactants to an aqueous solution of TMAH (tetramethylammonium hydroxide) or a chemical liquid obtained by adding isopropyl alcohols to an aqueous solution of KOH.

When etching for forming the through-holes 83 is performed on the support substrate 81W which is single-crystal silicon of which the substrate plane orientation is (100) using any one the above-described chemical liquids, the through-holes 83 in which the planar shape is circular when the planar shape of the opening of the etching mask is circular, the second opening width 132 is smaller than the first opening width 131, and the three-dimensional shape is a truncated conical shape or a similar shape are obtained.

When the planar shape of the opening of the etching mask is rectangular, the through-holes 83 in which the planar shape is rectangular, the second opening width 132 is smaller than the first opening width 131, and the three-dimensional shape is a truncated pyramidal shape or a similar shape are obtained. The angle of the side wall of the through-hole 83 having the truncated conical shape or the truncated pyramidal shape is approximately 45° with respect to the substrate plane.

<Through-Hole Forming Method Using Dry-Etching>

In etching for forming the through-holes 83, dry-etching can be also used rather than the wet-etching.

A method of forming the through-holes 83 using dry-etching will be described with reference to A to F of FIG. 21.

Figure 21:
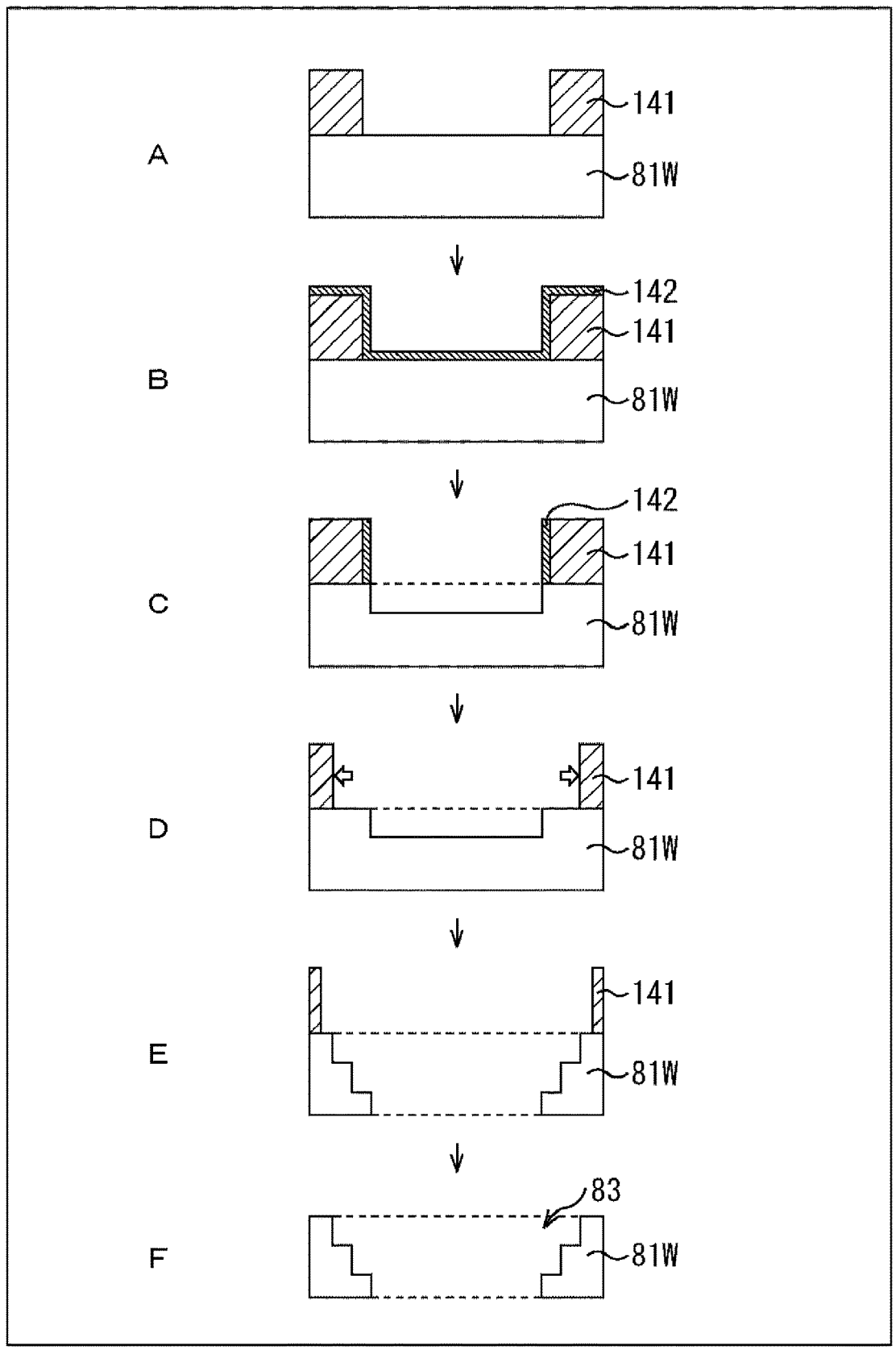
FIG. 21 is a diagram illustrating a method of manufacturing the substrate with lenses.

As illustrated in A of FIG. 21, an etching mask 141 is formed on one surface of the support substrate 81W. The etching mask 141 has a mask pattern in which portions that form the through-holes 83 are open.

Subsequently, after a protective film 142 for protecting the side wall of the etching mask 141 is formed as illustrated in B of FIG. 21, the support substrate 81W is etched to a predetermined depth according to dry-etching as illustrated in C of FIG. 21. With the dry etching step, although the protective film 142 on the surface of the support substrate 81W and the surface of the etching mask 141 is removed, the protective film 142 on the side surface of the etching mask 141 remains and the side wall of the etching mask 141 is protected. After etching is performed, as illustrated in D of FIG. 21, the protective film 142 on the side wall is removed and the etching mask 141 is removed in a direction of increasing the size of the opening pattern.

Moreover, a protective film forming step, a dry-etching step, and an etching mask removal step illustrated in B to D of FIG. 21 are repeatedly performed a plurality of number of times. In this way, as illustrated in E of FIG. 21, the support substrate 81W is etched in a stair shape (concave-convex shape) having periodic steps.

Finally, when the etching mask 141 is removed, the through-holes 83 having a stair shaped side wall are formed in the support substrate 81W as illustrated in F of FIG. 21. The width (the width of one step) in the plane direction of the stair shape of the through-hole 83 is between approximately 400 nm and 1 µm, for example.

When the through-holes 83 are formed using the above-described dry-etching, a protective film forming step, a dry-etching step, and an etching mask removal step are executed repeatedly.

Since the side wall of the through-hole 83 has a periodic stair shape (concave-convex shape), it is possible to suppress reflection of incident light. If the side wall of the through-hole 83 has a concave-convex shape of a random size, a void (cavity) is formed in an adhesion layer between the side wall and the lens formed in the through-hole 83, and the adhesion to the lens may decrease due to the void. However, according to the above-described forming method, since the side wall of the through-hole 83 has a periodic concave-convex shape, the adhesion property is improved, and a change in optical characteristics due to a positional shift of lenses can be suppressed.

As examples of the materials used in the respective steps, for example, the support substrate 81W may be single-crystal silicon, the etching mask 141 may be a photoresist, and the protective film 142 may be fluorocarbon polymer formed using gas plasma such as C4F8 or CHF3. The etching process may use plasma etching which uses gas that contains F such as SF6/O2 or C4F8/SF6. The mask removing step may use plasma etching which uses O2 gas or gas that contains 02 such as CF4/O2.

Alternatively, the support substrate 81W may be single-crystal silicon, the etching mask 141 may be SiO2, etching may use plasma that contains Cl2, the protective film 142 may use an oxide film obtained by oxidating an etching target material using 02 plasma, the etching process may use plasma using gas that contains Cl2, and the etching mask removal step may use plasma etching which uses gas that contains F such as CF4/O2.

Figure 22:
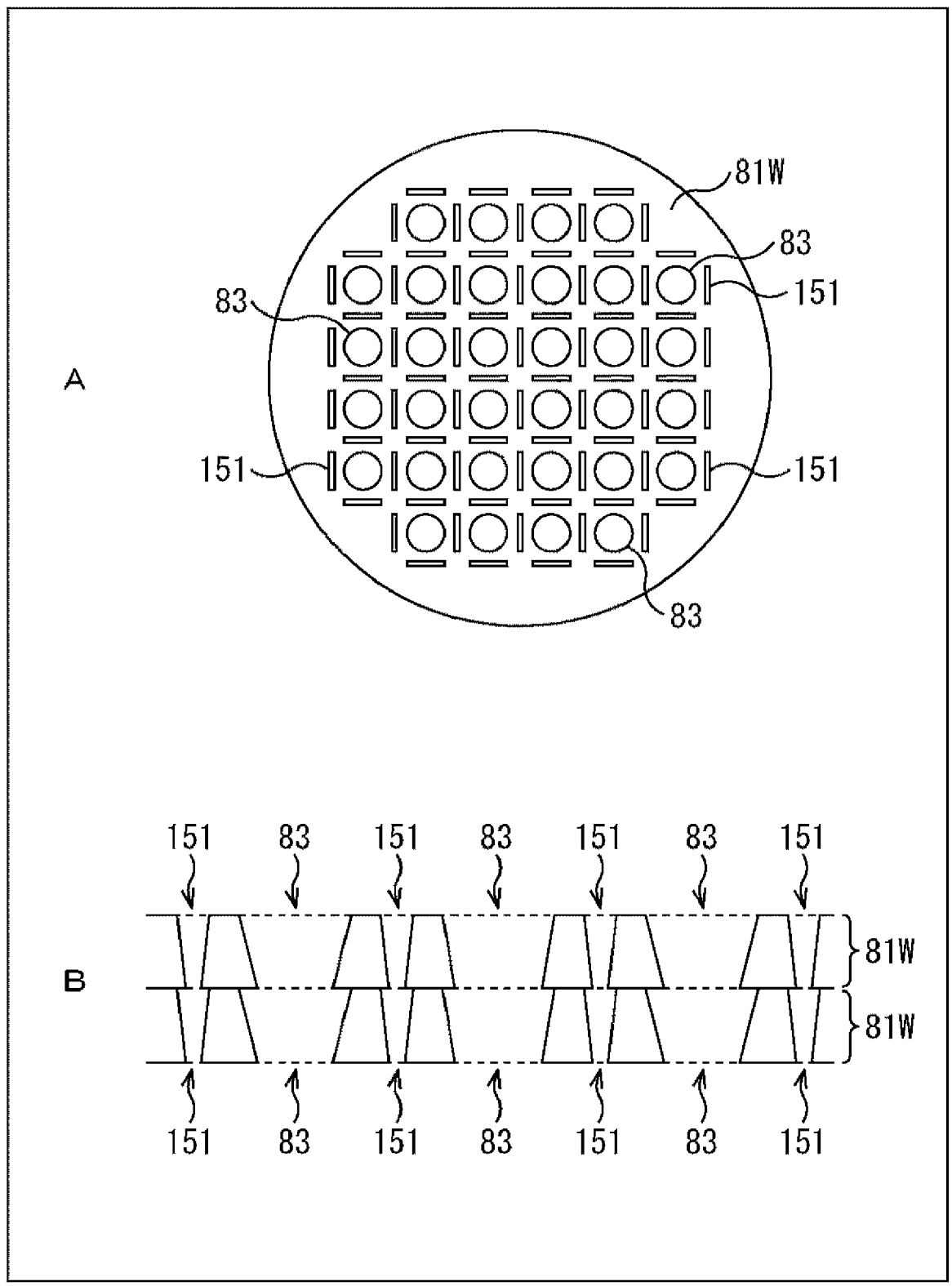
FIG. 22 is a diagram illustrating a method of manufacturing the substrate with lenses.

As described above, although a plurality of through-holes 83 can be simultaneously formed in the support substrate 81W by wet-etching or dry-etching, through-grooves 151 may be formed in a region in which the through-holes 83 are not formed, of the support substrate 81W as illustrated in A of FIG. 22.

A of FIG. 22 is a plan view of the support substrate 81W in which the through-groove 151 as well as the through-hole 83 are formed.

For example, as illustrated in A of FIG. 22, the through-groove 151 is disposed only in a portion between the through-holes 83 in each of the row and column directions outside the plurality of through-holes 83 disposed in a matrix form.

Moreover, the through-grooves 151 of the support substrate 81W can be formed at the same position in the respective substrates with lenses 41 that form the stacked lens structure 11. In this case, in a state in which a plurality of support substrates 81W is stacked as the stacked lens structure 11, the through-grooves 151 of the plurality of support substrates 81W pass between the plurality of support substrates 81W as in the cross-sectional view of B of FIG. 22.

The through-groove 151 of the support substrate 81W as a portion of the substrate with lenses 41 can provide an effect or an advantage of alleviating a deformation of the substrate with lenses 41 resulting from stress when the stress that deforms the substrate with lenses 41 is applied from the outside of the substrate with lenses 41.

Alternatively, the through-groove 151 can provide an effect or an advantage of alleviating a deformation of the substrate with lenses 41 resulting from stress when the stress that deforms the substrate with lenses 41 is generated from the inside of the substrate with lenses 41.

<Method of Manufacturing Substrate with Lenses>

Next, a method of manufacturing the substrate with lenses 41W in a substrate state will be described with reference to A to G of FIG. 23.

Figure 23:
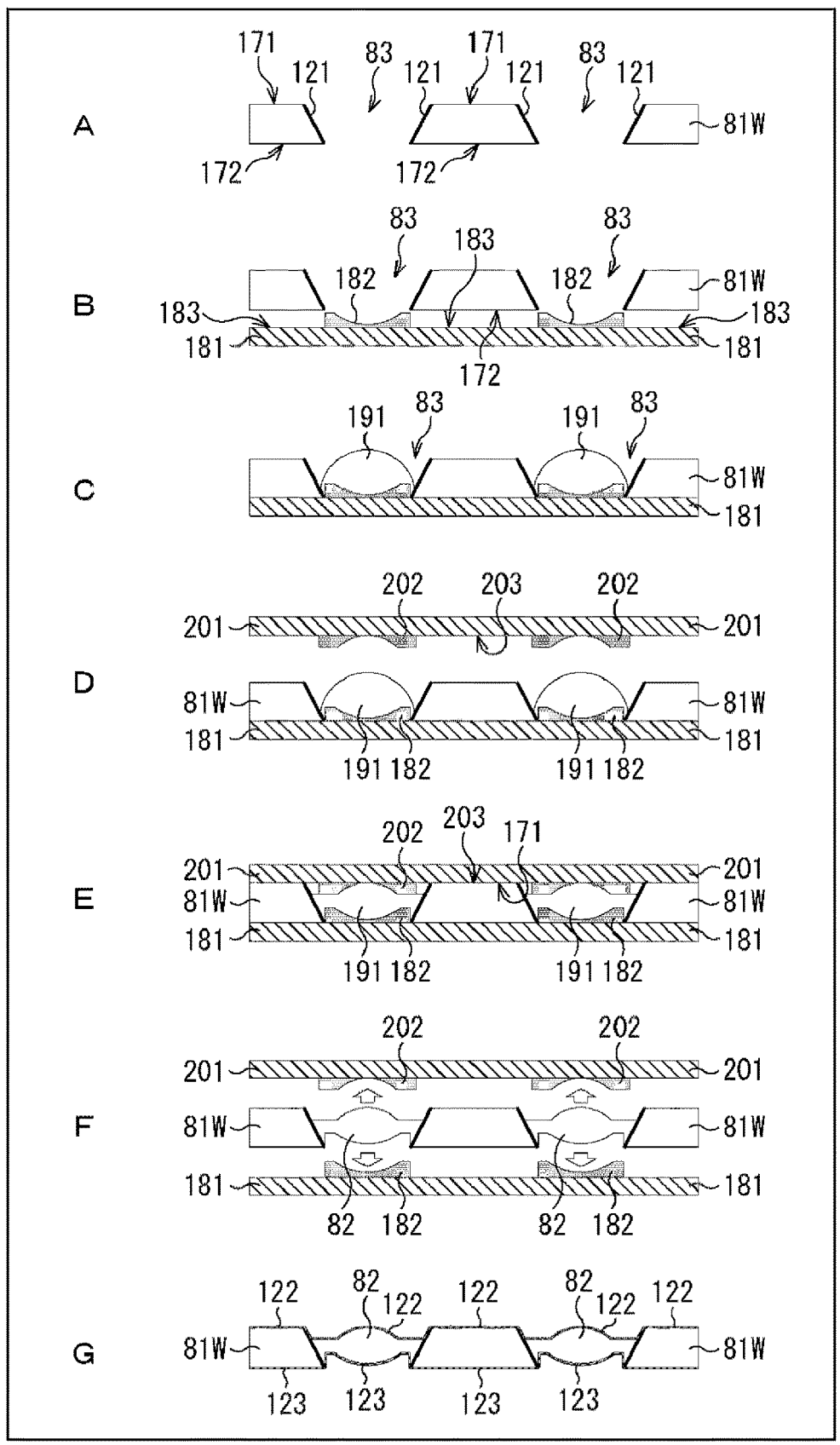
FIG. 23 is a diagram illustrating a method of manufacturing the substrate with lenses.

First, a support substrate 81W in which a plurality of through-holes 83 is formed is prepared as illustrated in A of FIG. 23. A light blocking film 121 is formed on the side wall of the through-hole 83. Although only two through-holes 83 are illustrated in A to G of FIG. 23 due to limitation of the drawing surface, a number of through-holes 83 are actually formed in the plane direction of the support substrate 81W as illustrated in A and B of FIG. 19. Moreover, an alignment mark (not illustrated) for positioning is formed in a region close to the outer circumference of the support substrate 81W.

A front planar portion 171 on an upper side of the support substrate 81W and a rear planar portion 172 on a lower side thereof are planar surfaces formed so flat as to allow plasma bonding performed in a later step. The thickness of the support substrate 81W also plays the role of a spacer that determines a lens-to-lens distance when the support substrate 81W is finally divided as the substrate with lenses 41 and is superimposed on another substrate with lenses 41.

A base material having a low thermal expansion coefficient of 10 ppm/° C. or less is preferably used as the support substrate 81W.

Subsequently, as illustrated in B of FIG. 23, the support substrate 81W is disposed on a lower mold 181 in which a plurality of concave optical transfer surfaces 182 is disposed at a fixed interval. More specifically, the rear planar portion 172 of the support substrate 81W and the planar surface 183 of the lower mold 181 are superimposed together so that the concave optical transfer surface 182 is positioned inside the through-hole 83 of the support substrate 81W. The optical transfer surfaces 182 of the lower mold 181 are formed so as to correspond to the through-holes 83 of the support substrate 81W in one-to-one correspondence, and the positions in the plane direction of the support substrate 81W and the lower mold 181 are adjusted so that the centers of the corresponding optical transfer surface 182 and the through-hole 83 are identical in the optical axis direction. The lower mold 181 is formed of a hard mold member and is configured using metal, silicon, quartz, or glass, for example.

Subsequently, as illustrated in C of FIG. 23, an energy-curable resin 191 is filled (dropped) into the through-holes 83 of the lower mold 181 and the support substrate 81W superimposed together. The lens resin portion 82 is formed using the energy-curable resin 191. Thus, the energy-curable resin 191 is preferably subjected to a defoaming process in advance so that bubbles are not included. A vacuum defoaming process or a defoaming process which uses centrifugal force is preferably performed as the defoaming process. Moreover, the vacuum defoaming process is preferably performed after the filling. When the defoaming process is performed, it is possible to form the lens resin portion 82 without any bubble included therein.

Subsequently, as illustrated in D of FIG. 23, the upper mold 201 is disposed on the lower mold 181 and the support substrate 81W superimposed together. A plurality of concave optical transfer surfaces 202 is disposed at a fixed interval in the upper mold 201, and similarly to the case of disposing the lower mold 181, the upper mold 201 is disposed after the through-holes 83 and the optical transfer surfaces 202 are aligned with high accuracy so that the centers thereof are identical in the optical axis direction.

In a height direction which is the vertical direction on the drawing surface, the position of the upper mold 201 is fixed so that the interval between the upper mold 201 and the lower mold 181 reaches a predetermined distance with the aid of a controller that controls the interval between the upper mold 201 and the lower mold 181. In this case, the space interposed between the optical transfer surface 202 of the upper mold 201 and the optical transfer surface 182 of the lower mold 181 is equal to the thickness of the lens resin portion 82 (the lens 21) calculated by optical design.

Alternatively, as illustrated in E of FIG. 23, similarly to the case of disposing the lower mold 181, the planar surface 203 of the upper mold 201 and the front planar portion 171 of the support substrate 81W may be superimposed together. In this case, the distance between the upper mold 201 and the lower mold 181 is the same as the thickness of the support substrate 81W, and high-accuracy alignment can be realized in the plane direction and the height direction.

When the interval between the upper mold 201 and the lower mold 181 is controlled to reach a predetermined distance, in the above-described step of C of FIG. 23, the amount of the energy-curable resin 191 dropped into the through-holes 83 of the support substrate 81W is controlled to such an amount that the resin does not overflow the through-holes 83 of the support substrate 81W and the space surrounded by the upper mold 201 and the lower mold 181 disposed on the upper and lower sides of the support substrate 81W. Due to this, it is possible to reduce the manufacturing cost without wasting the material of the energy-curable resin 191.

Subsequently, in the state illustrated in E of FIG. 23, a process of curing the energy-curable resin 191 is performed.

The energy-curable resin 191 is cured by being irradiated with heat or UV light as energy and being left for a predetermined period, for example. During curing, the upper mold 201 is pushed downward and is subjected to alignment, whereby a deformation resulting from shrinkage of the energy-curable resin 191 can be suppressed as much as possible.

A thermoplastic resin may be used instead of the energy-curable resin 191. In this case, in the state illustrated in E of FIG. 23, the upper mold 201 and the lower mold 181 are heated whereby the energy-curable resin 191 is molded in a lens shape and is cured by being cooled.

Subsequently, as illustrated in F of FIG. 23, the controller that controls the positions of the upper mold 201 and the lower mold 181 moves the upper mold 201 upward and the lower mold 181 downward so that the upper mold 201 and the lower mold 181 are separated from the support substrate 81W. When the upper mold 201 and the lower mold 181 are separated from the support substrate 81W, the lens resin portion 82 including the lenses 21 is formed inside the through-holes 83 of the support substrate 81W.

The surfaces of the upper mold 201 and the lower mold 181 that make contact with the support substrate 81W may be coated with a fluorine-based or silicon-based mold releasing agent. By doing so, the support substrate 81W can be easily separated from the upper mold 201 and the lower mold 181. Moreover, various coatings such as fluorine-containing diamond-like carbon (DLC) may be performed as a method of separating the support substrate 81W from the contact surface easily.

Subsequently, as illustrated in G of FIG. 23, the upper surface layer 122 is formed on the surface of the support substrate 81W and the lens resin portion 82, and the lower surface layer 123 is formed on the rear surface of the support substrate 81W and the lens resin portion 82. Before or after the upper surface layer 122 and the lower surface layer 123 are formed, chemical mechanical polishing (CMP) or the like may be performed as necessary to planarize the front planar portion 171 and the rear planar portion 172 of the support substrate 81W.

As described above, when the energy-curable resin 191 is pressure-molded (imprinted) into the through-holes 83 formed in the support substrate 81W using the upper mold 201 and the lower mold 181, it is possible to form the lens resin portion 82 and to manufacture the substrate with lenses 41.

The shape of the optical transfer surface 182 and the optical transfer surface 202 is not limited to the concave shape described above but may be determined appropriately according to the shape of the lens resin portion 82. As illustrated in FIG. 15, the lens shape of the substrates with lenses 41*a* to 41*e* may take various shapes derived by optical design. For example, the lens shape may have a biconvex shape, a biconcave shape, a plano-convex shape, a plano-concave shape, a convex meniscus shape, a concave meniscus shape, or a high-order aspherical shape.

Moreover, the optical transfer surface 182 and the optical transfer surface 202 may have such a shape that the lens shape after forming has a moth-eye structure.

According to the above-described manufacturing method, since a variation in the distance in the plane direction between the lens resin portions 82 due to a curing shrinkage of the energy-curable resin 191 can be prevented by the interposed support substrate 81W, it is possible to control the lens-to-lens distance with high accuracy. Moreover, the manufacturing method provides an effect of reinforcing the weak energy-curable resin 191 with the strong support substrate 81W. Due to this, the manufacturing method provides an advantage that it is possible to provide the lens array substrate in which a plurality of lenses having good handling properties is disposed and to suppress a warp of the lens array substrate.

<Example in which Through-Hole has Polygonal Shape>

As illustrated in B of FIG. 19, the planar shape of the through-hole 83 may be polygonal such as rectangular.

Figure 24:
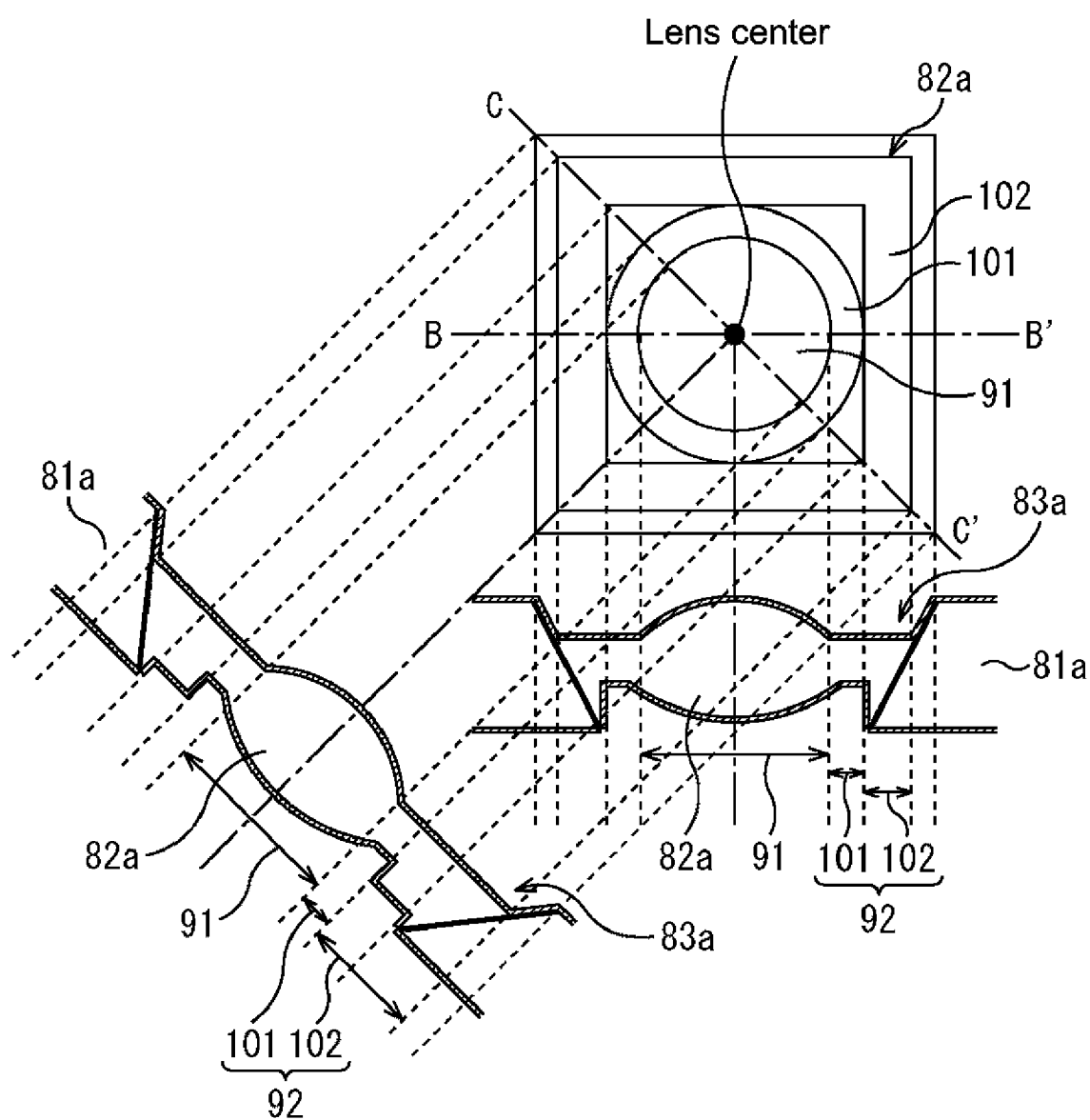
FIG. 24 is a diagram illustrating a method of manufacturing the substrate with lenses.

FIG. 24 illustrates a plan view and cross-sectional views of the support substrate 81a and the lens resin portion 82a of the substrate with lenses 41a when the planar shape of the through-hole 83 is rectangular.

The cross-sectional views of the substrate with lenses 41a illustrated in FIG. 24 are cross-sectional views taken along lines B-B' and C-C' in the plan view.

As can be understood from comparison between the cross-sectional views taken along lines B-B' and C-C', when the through-hole 83a is rectangular, the distance from the center of the through-hole 83a to an upper outer edge of the through-hole 83a and the distance from the center of the through-hole 83a to a lower outer edge of the through-hole 83a are different in the side direction and the diagonal direction of the through-hole 83a which is a rectangle, and the distance in the diagonal direction is larger than that in the side direction. Due to this, when the planar shape of the through-hole 83a is rectangular, if the lens portion 91 is circular, the distance from the outer circumference of the lens portion 91 to the side wall of the through-hole 83a (that is, the length of the support portion 92) needs to be different in the side direction and the diagonal direction of the rectangle.

Thus, the lens resin portion 82a illustrated in FIG. 24 has the following structures.

(1) The length of the arm portion 101 disposed on the outer circumference of the lens portion 91 is the same in the side direction and the diagonal direction of the rectangle.

(2) The length of the leg portion 102 disposed on the outer side of the arm portion 101 to extend up to the side wall of the through-hole 83a is set such that the length of the leg portion 102 in the diagonal direction of the rectangle is larger than the length of the leg portion 102 in the side direction of the rectangle.

As illustrated in FIG. 24, the leg portion 102 is not in direct-contact with the lens portion 91, and the arm portion 101 is in direct-contact with the lens portion 91.

In the lens resin portion 82a illustrated in FIG. 24, the length and the thickness of the arm portion 101 being in direct-contact with the lens portion 91 are constant over the entire outer circumference of the lens portion 91. Thus, it is possible to provide an effect or an advantage that the entire lens portion 91 is supported with constant force without deviation.

Further, when the entire lens portion 91 is supported with constant force without deviation, it is possible to obtain an effect or an advantage that, when stress is applied from the support substrate 81a surrounding the through-holes 83a to the entire outer circumference of the through-hole 83a, for example, the stress is transmitted to the entire lens portion 91 without deviation whereby transmission of stress to a specific portion of the lens portion 91 in a deviated manner is prevented.

Figure 25:
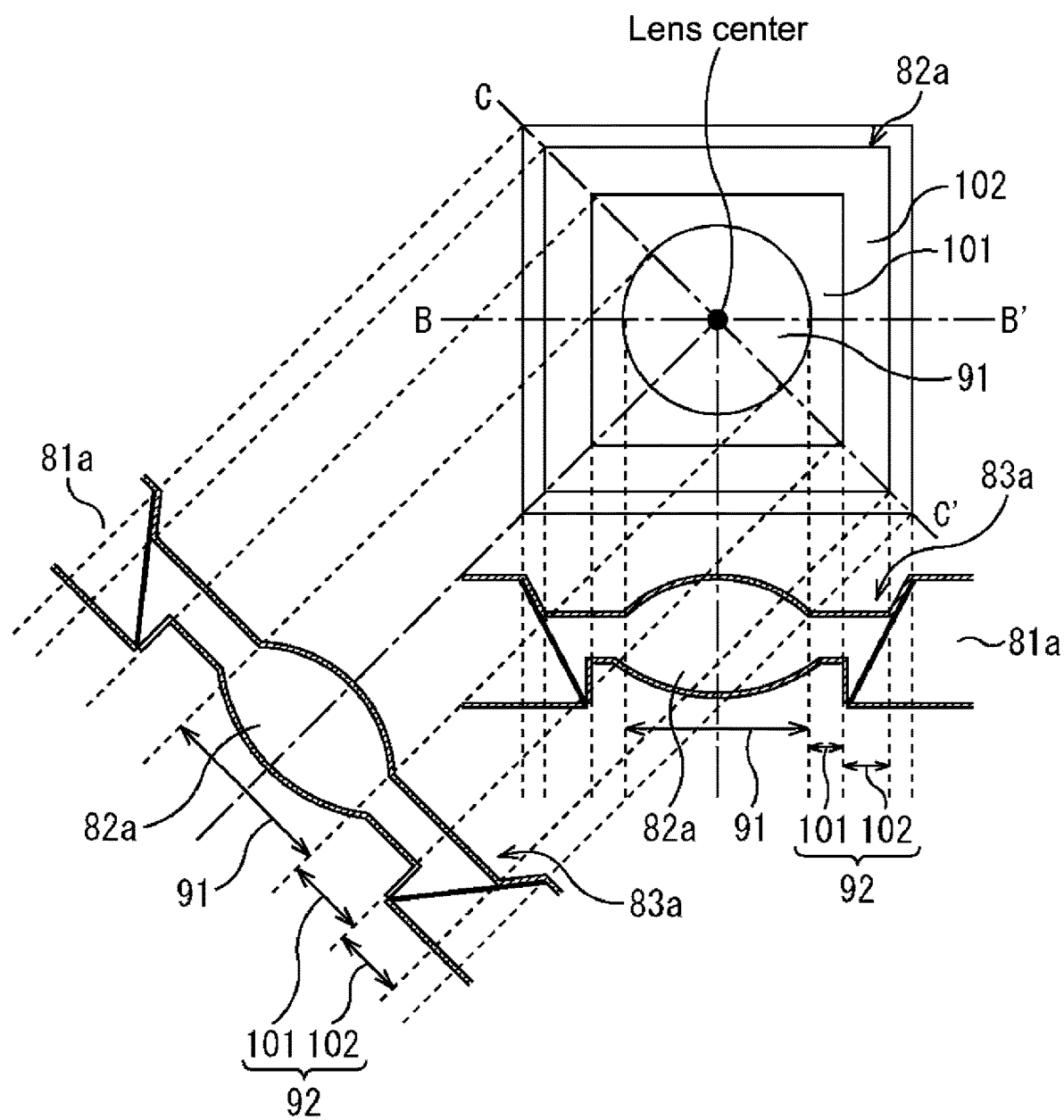
FIG. 25 is a diagram illustrating a method of manufacturing the substrate with lenses.

FIG. 25 illustrates a plan view and a cross-sectional view of the support substrate 81a and the lens resin portion 82a of the substrate with lenses 41a, illustrating another example of the through-hole 83 of which the planar shape is rectangular.

The cross-sectional views of the substrate with lenses 41a illustrated in FIG. 25 are cross-sectional views taken along lines B-B' and C-C' in the plan view.

In FIG. 25, similarly to A and B of FIG. 22, the distance from the center of the through-hole 83a to an upper outer edge of the through-hole 83a and the distance from the center of the through-hole 83a to a lower outer edge of the through-hole 83a are different in the side direction and the diagonal direction of the through-hole 83a which is a rectangle, and the distance in the diagonal direction is larger than that in the side direction. Due to this, when the planar shape of the through-hole 83a is rectangular, if the lens portion 91 is circular, the distance from the outer circumference of the lens portion 91 to the side wall of the through-hole 83a (that is, the length of the support portion 92) needs to be different in the side direction and the diagonal direction of the rectangle.

Thus, the lens resin portion 82a illustrated in FIG. 25 has the following structures.

(1) The length of the leg portion 102 disposed on the outer circumference of the lens portion 91 is constant along the four sides of the rectangle of the through-hole 83a.

(2) In order to realize the structure (1), the length of the arm portion 101 is set such that the length of the arm portion in the diagonal direction of the rectangle is larger than the length of the arm portion in the side direction of the rectangle.

As illustrated in FIG. 25, the thickness of the resin in the leg portion 102 is larger than the thickness of the resin in the arm portion 101. Due to this, the volume of the leg portion 102 per unit area in the plane direction of the substrate with lenses 41a is larger than the volume of the arm portion 101.

In the embodiment of FIG. 25, when the volume of the leg portion 102 is decreased as much as possible and is made constant along the four sides of the rectangle of the through-hole 83a, it is possible to provide an effect or an advantage that, when a deformation such as swelling of a resin, for example, occurs, a change in the volume resulting from the deformation is suppressed as much as possible and the change in the volume does not deviate on the entire outer circumference of the lens portion 91 as much as possible.

Figure 26:
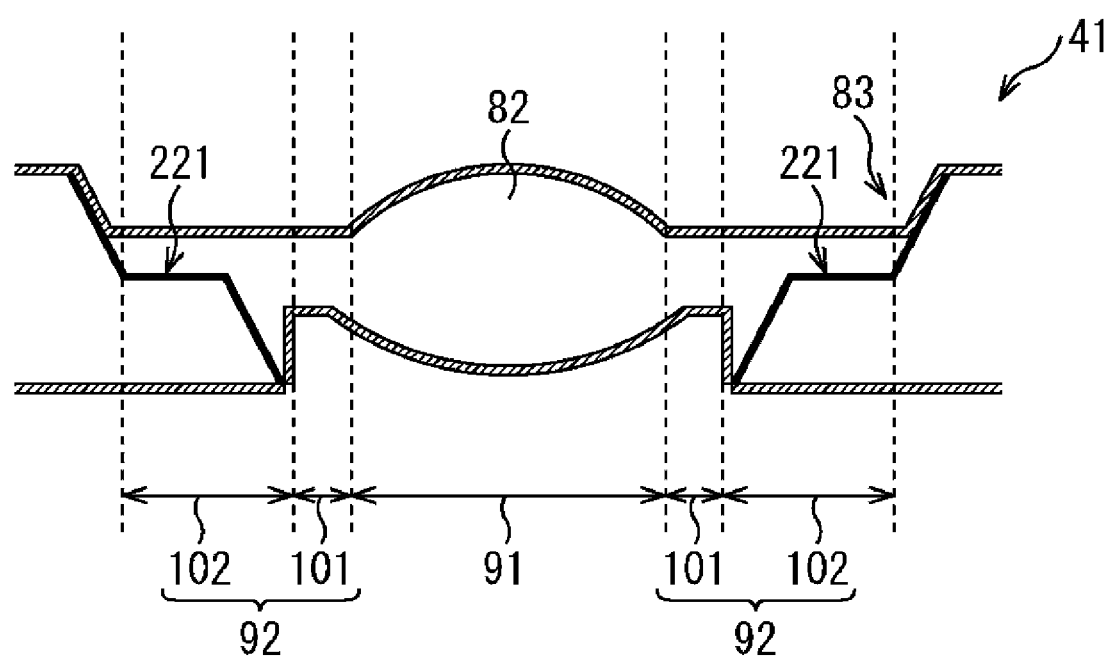
FIG. 26 is a diagram illustrating a method of manufacturing the substrate with lenses.

FIG. 26 is a cross-sectional view illustrating another embodiment of the lens resin portion 82 and the through-hole 83 of the substrate with lenses 41.

The lens resin portion 82 and the through-hole 83 illustrated in FIG. 26 have the following structures.

(1) The side wall of the through-hole 83 has a stair shape having a stair portion 221.

(2) The leg portion 102 of the support portion 92 of the lens resin portion 82 is disposed on the upper side of the side wall of the through-hole 83 and is also disposed on the stair portion 221 provided in the through-hole 83 so as to extend in the plane direction of the substrate with lenses 41.

A method of forming the stair-shaped through-hole 83 illustrated in FIG. 26 will be described with reference to A to F of FIG. 27.

Figure 27:
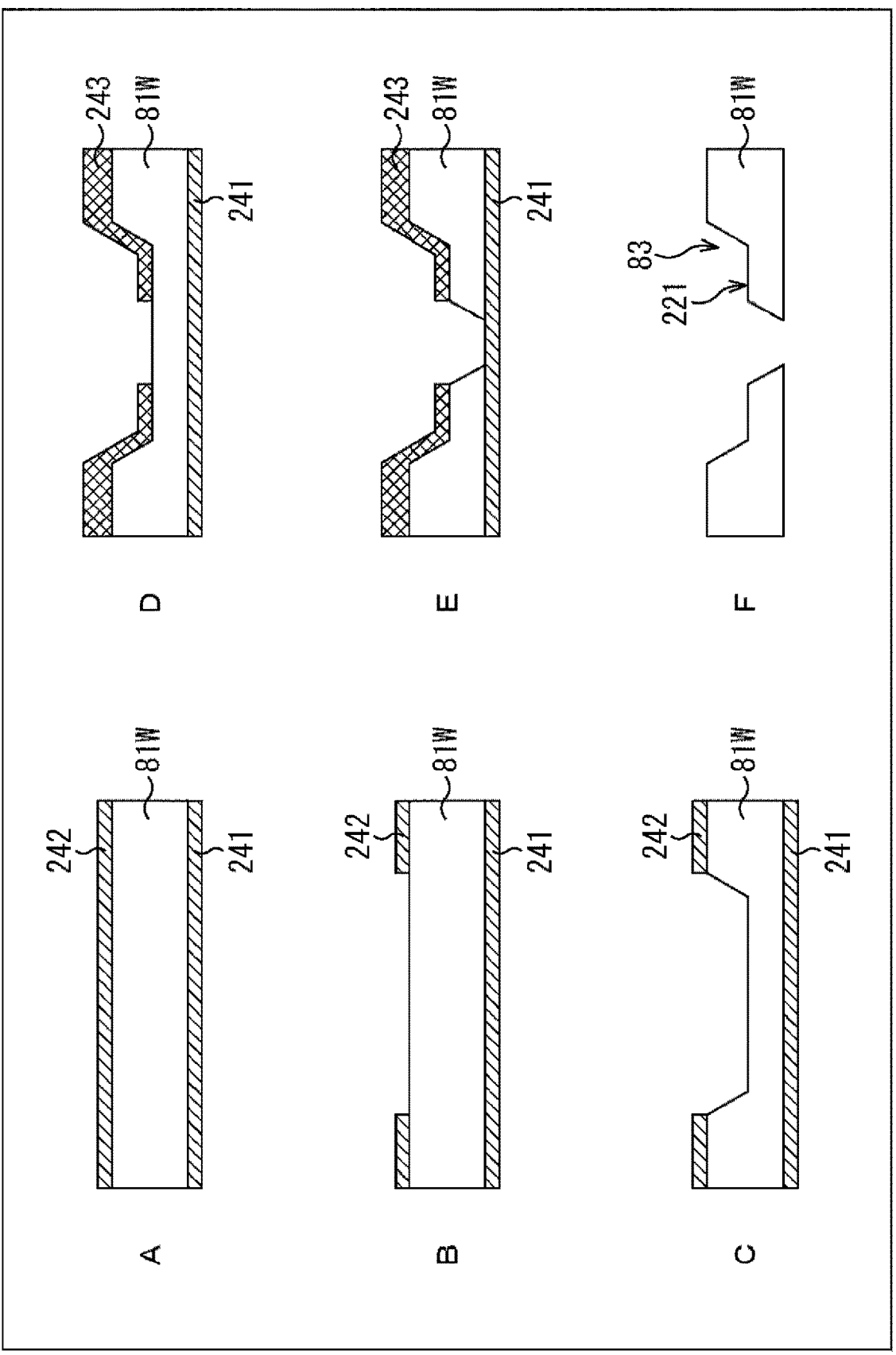
FIG. 27 is a diagram illustrating a method of manufacturing the substrate with lenses.

First, as illustrated in A of FIG. 27, an etching stop film 241 having resistance to the wet etching when forming through-holes is formed on one surface of the support substrate 81W. The etching stop film 241 may be a silicon nitride film, for example.

Subsequently, a hard mask 242 having resistance to the wet-etching when forming through-holes is formed on the other surface of the support substrate 81W. The hard mask 242 may also be a silicon nitride film, for example.

Subsequently, as illustrated in B of FIG. 27, a predetermined region of the hard mask 242 is opened to perform a first round of etching. In the first round of etching, a portion of the through-hole 83, which forms the upper end of the stair portion 221 is etched. Due to this, the opening of the hard mask 242 for the first round of etching is a region corresponding to the opening, of the surface of the upper surface of the substrate with lenses 41 illustrated in FIG. 26.

Subsequently, as illustrated in C of FIG. 27, wet-etching is performed so that the support substrate 81W is etched to a predetermined depth according to the opening of the hard mask 242.

Subsequently, as illustrated in D of FIG. 27, a hard mask 243 is formed again on the surface of the etched support substrate 81W, and the hard mask 243 is opened in a region corresponding to the lower portion of the stair portion 221 of the through-hole 83. The second hard mask 243 may also be a silicon nitride film, for example.

Subsequently, as illustrated in E of FIG. 27, wet-etching is performed so that the support substrate 81W is etched to reach the etching stop film 241 according to the opening of the hard mask 243.

Finally, as illustrated in F of FIG. 27, the hard mask 243 on the upper surface of the support substrate 81W and the etching stop film 241 on the lower surface thereof are removed.

When wet-etching of the support substrate 81W for forming through-holes is performed in two rounds in the above-described manner, the through-hole 83 having the stair shape illustrated in FIG. 26 is obtained.

Figure 28:
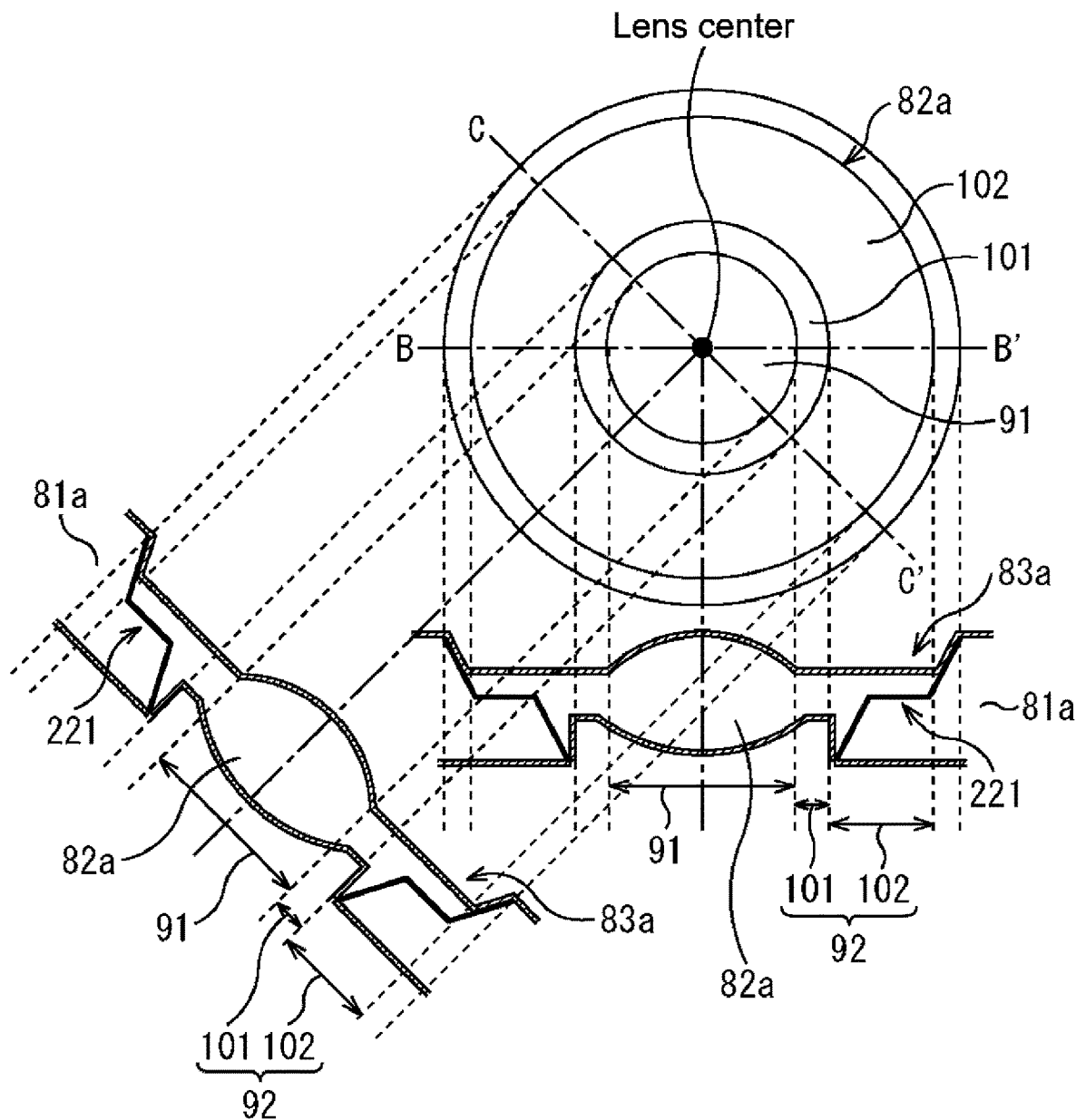
FIG. 28 is a diagram illustrating a method of manufacturing the substrate with lenses.

FIG. 28 illustrates a plan view and cross-sectional views of the support substrate 81a and the lens resin portion 82a of the substrate with lenses 41a when the through-hole 83a has the stair portion 221 and the planar shape of the through-hole 83a is circular.

The cross-sectional views of the substrate with lenses 41a in FIG. 28 are cross-sectional views taken along lines B-B' and C-C' in the plan view.

When the planar shape of the through-hole 83a is circular, the cross-sectional shape of the through-hole 83a is naturally the same regardless of the diametrical direction. In addition to this, the cross-sectional shapes of the outer edge, the arm portion 101, and the leg portion 102 of the lens resin portion 82a are the same regardless of the diametrical direction.

The through-hole 83a having the stair shape illustrated in FIG. 28 provides an effector an advantage that the area in which the leg portion 102 of the support portion 92 of the lens resin portion 82 makes contact with the side wall of the through-hole 83a can be increased as compared to the through-hole 83a illustrated in FIG. 14 in which the stair portion 221 is not provided in the through-hole 83a. Due to this, it is possible to provide an effect or an advantage of increasing the adhesion strength between the lens resin portion 82 and the side wall of the through-hole 83a (that is, the adhesion strength between the lens resin portion 82a and the support substrate 81W).

Figure 29:
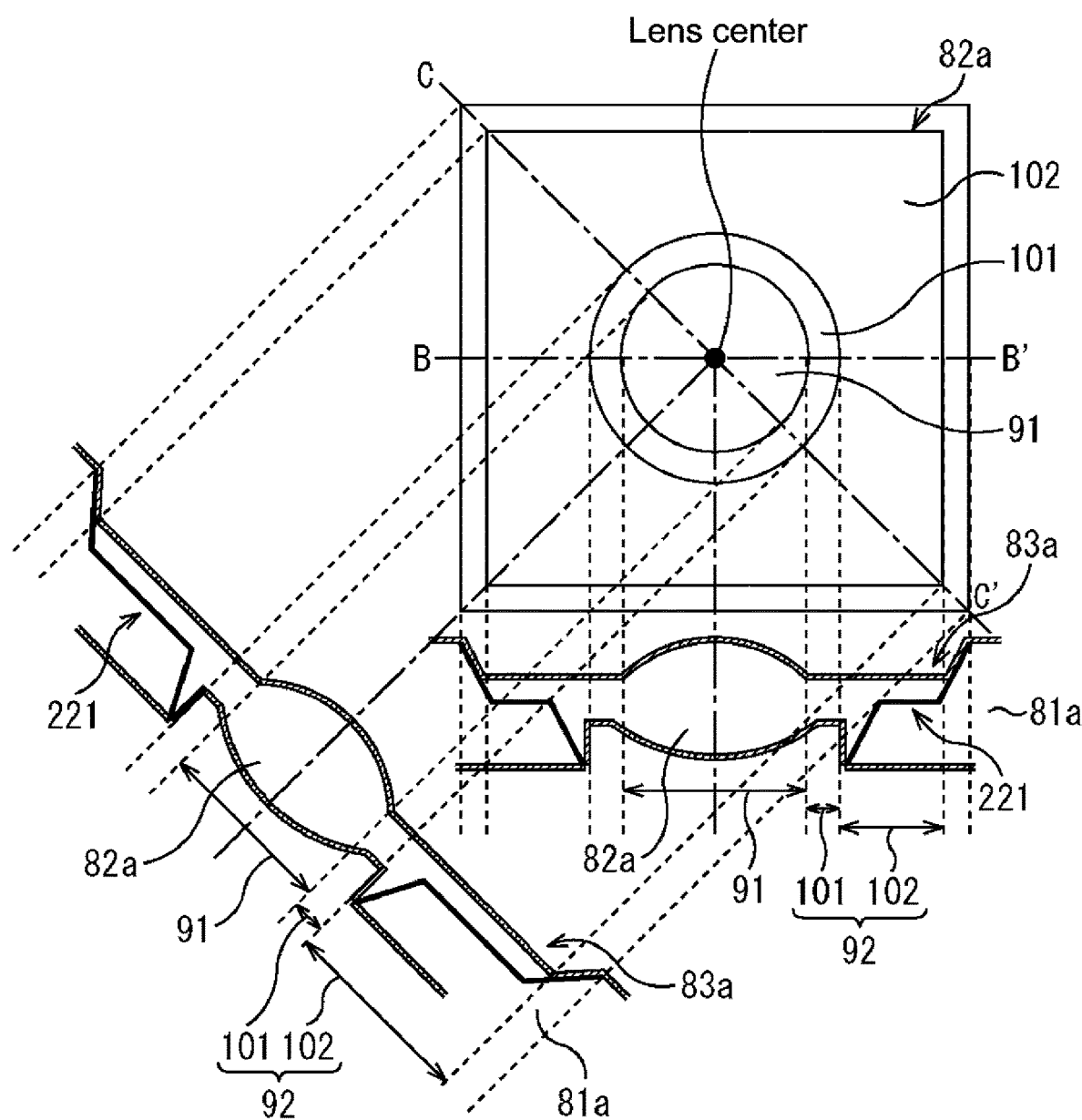
FIG. 29 is a diagram illustrating a method of manufacturing the substrate with lenses.

FIG. 29 illustrates a plan view and cross-sectional views of the support substrate 81a and the lens resin portion 82a of the substrate with lenses 41a when the through-hole 83a has the stair portion 221 and the planar shape of the through-hole 83a is rectangular.

The cross-sectional views of the substrate with lenses 41a in FIG. 29 are cross-sectional views taken along lines B-B' and C-C' in the plan view.

The lens resin portion 82 and the through-hole 83 illustrated in FIG. 29 have the following structures.

(1) The length of the arm portion 101 disposed on the outer circumference of the lens portion 91 is the same in the side direction and the diagonal direction of the rectangle.

(2) The length of the leg portion 102 disposed on the outer side of the arm portion 101 to extend up to the side wall of the through-hole 83a is set such that the length of the leg portion 102 in the diagonal direction of the rectangle is larger than the length of the leg portion 102 in the side direction of the rectangle.

As illustrated in FIG. 29, the leg portion 102 is not in direct-contact with the lens portion 91 whereas the arm portion 101 is in direct-contact with the lens portion 91.

In the lens resin portion 82a illustrated in FIG. 29, similarly to the lens resin portion 82a illustrated in FIG. 24, the length and the thickness of the arm portion 101 being indirect-contact with the lens portion 91 are constant over the entire outer circumference of the lens portion 91. Due to this, it is possible to provide an effect or an advantage that the entire lens portion 91 is supported with constant force without deviation.

Further, when the entire lens portion 91 is supported with constant force without deviation, it is possible to obtain an effect or an advantage that, when stress is applied from the support substrate 81a surrounding the through-holes 83a to the entire outer circumference of the through-hole 83a, for example, the stress is transmitted to the entire lens portion 91 without deviation whereby transmission of stress to a specific portion of the lens portion 91 in a deviated manner is prevented.

Further, the structure of the through-hole 83a illustrated in FIG. 29 provides an effector an advantage that the area in which the leg portion 102 of the support portion 92 of the lens resin portion 82a makes contact with the side wall of the through-hole 83a can be increased as compared to the through-hole 83a illustrated in FIG. 24 and the like in which the stair portion 221 is not provided in the through-hole 83a. Due to this, it is possible to provide an effect or an advantage of increasing the adhesion strength between the lens resin portion 82a and the side wall of the through-hole 83a (that is, the adhesion strength between the lens resin portion 82a and the support substrate 81a).

<11. Direct Bonding of Substrates with Lenses>

Next, direct bonding of the substrates with lenses 41W in the substrate state in which the plurality of substrates with lenses 41 is formed will be described.

Figure 30:
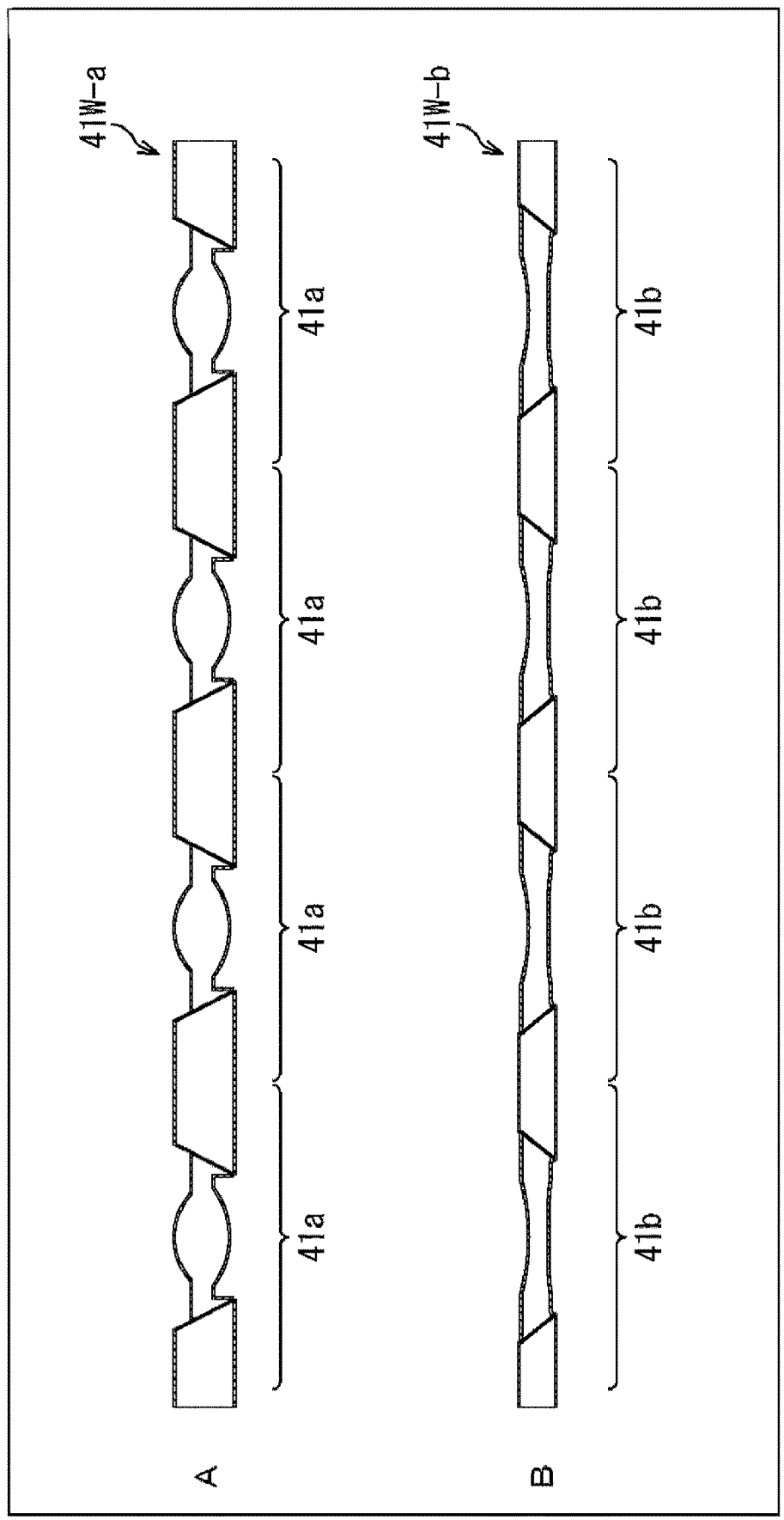
FIG. 30 is a diagram illustrating bonding of substrates with lenses in a substrate state.

In the following description, as illustrated in A and B of FIG. 30, the substrate with lenses 41W in the substrate state in which the plurality of substrates with lenses 41a is formed will be referred to as a substrate with lenses 41W-a, and the substrate with lenses 41W in the substrate state in which the plurality of substrates with lenses 41b is formed will be referred to as a substrate with lenses 41W-b. The other substrates with lenses 41c to 41e are similarly referred to.

Direct bonding between the substrate with lenses 41W-a in the substrate state and the substrate with lenses 41W-b in the substrate state will be described with reference to A and B of FIG. 31.

Figure 31:
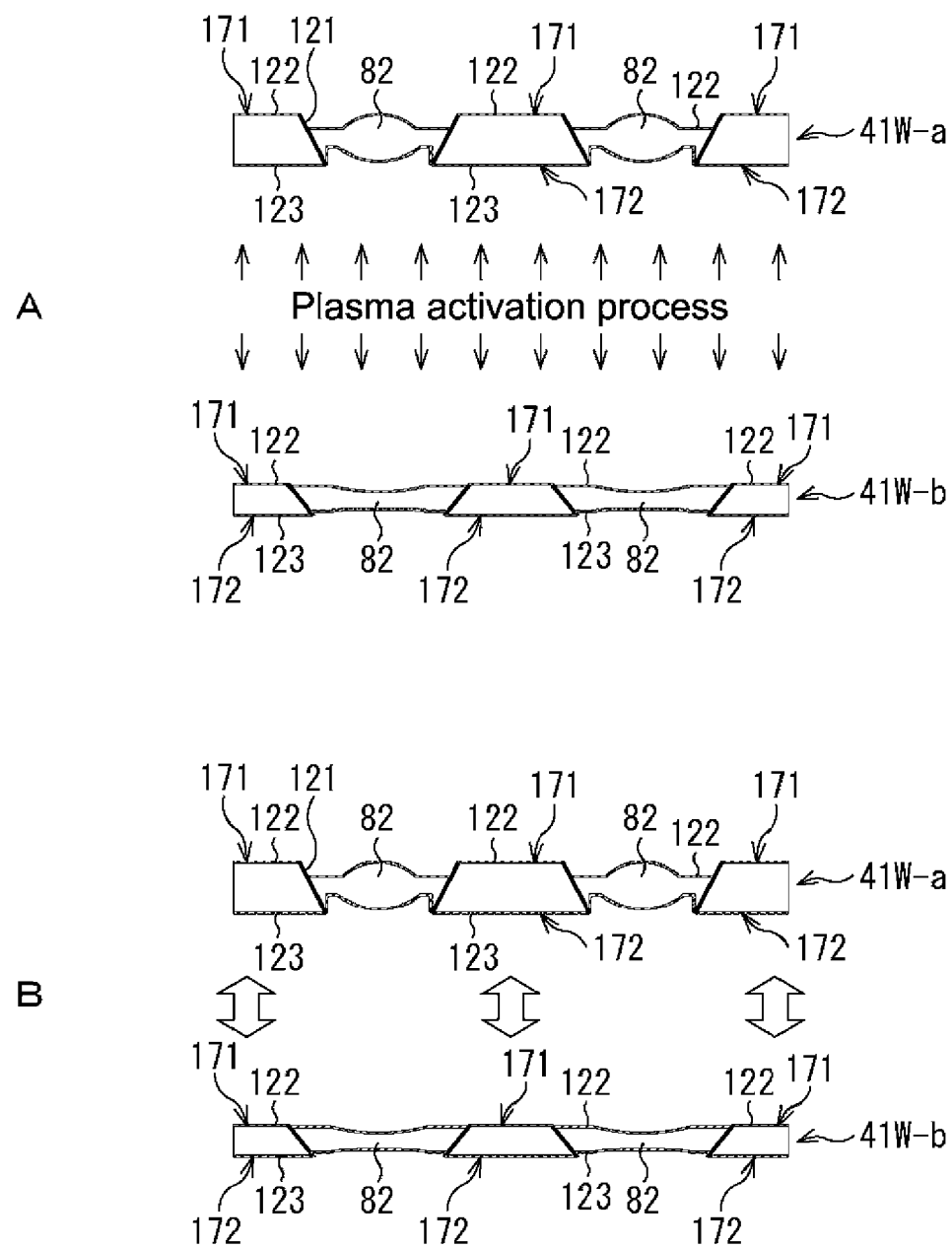
FIG. 31 is a diagram illustrating bonding of substrates with lenses in a substrate state.

In A and B of FIG. 31, the portions of the substrate with lenses 41W-b corresponding to the respective portions of the substrate with lenses 41W-a will be denoted by the same reference numerals as those of the substrate with lenses 41W-a.

The upper surface layer 122 or 125 are formed on the upper surface of the substrates with lenses 41W-a and 41W-b. The lower surface layer 123 or 124 is formed on the lower surface of the substrates with lenses 41W-a and 41W-b. Moreover, as illustrated in A of FIG. 31, a plasma activation process is performed on the entire lower surface including the rear planar portion 172 of the substrate with lenses 41W-a and the entire upper surface including the front planar portion 171 of the substrate with lenses 41W-b, serving as the bonding surfaces of the substrates with lenses 41W-a and 41W-b. The gas used in the plasma activation process may be arbitrary gas which can be plasma-processed such as O2, N2, He, Ar, or H2. However, it is desirable that the same gas as the constituent elements of the upper surface layer 122 and the lower surface layer 123 is used as the gas used in the plasma activation process. By doing so, degeneration of the film itself of the upper surface layer 122 and the lower surface layer 123 can be suppressed.

As illustrated in B of FIG. 31, the rear planar portion 172 of the substrate with lenses 41W-a in the activated surface state and the front planar portion 171 of the substrate with lenses 41W-b are attached together.

With the attachment process of the substrates with lenses, a hydrogen bond is formed between the hydrogen of the OH radical on the surface of the lower surface layer 123 or 124 of the substrate with lenses 41W-a and the hydrogen of the OH radical on the surface of the upper surface layer 122 or 125 of the substrate with lenses 41W-b. Due to this, the substrates with lenses 41W-a and 41W-b are fixed together. The attachment process of the substrates with lenses can be performed under the condition of the atmospheric pressure.

An annealing process is performed on the attached substrates with lenses 41W-a and 41W-b. In this way, dehydration condensation occurs from the state in which the OH radicals form a hydrogen bond, and an oxygen-based covalent bond is formed between the lower surface layer 123 or 124 of the substrate with lenses 41W-a and the upper surface layer 122 or 125 of the substrate with lenses 41W-b. Alternatively, the element contained in the lower surface layer 123 or 124 of the substrate with lenses 41W-a and the element contained in the upper surface layer 122 or 125 of the substrate with lenses 41W-b form a covalent bond. By these bonds, the two substrates with lenses are strongly fixed together. A state in which a covalent bond is formed between the lower surface layer 123 or 124 of the substrate with lenses 41W disposed on the upper side and the upper surface layer 122 or 125 of the substrate with lenses 41W disposed on the lower side whereby the two substrates with lenses 41W are fixed together is referred to as direct bonding in the present specification. The method of fixing a plurality of substrates with lenses by the resin formed on the entire surface, disclosed in Patent Literature 1 has a problem that the resin may experience curing shrinkage and thermal expansion and the lens may be deformed. In contrast, the direct bonding of the present technique provides an effect or an advantage that, since the resin is not used when fixing the plurality of substrates with lenses 41W, the plurality of substrates with lenses 41W can be fixed without causing a curing shrinkage and a thermal expansion.

The annealing process can be performed under the condition of the atmospheric pressure. This annealing process can be performed at a temperature of 100° C. or higher, 150° C. or higher, or 200° C. or higher in order to realize dehydration condensation. On the other hand, this annealing process can be performed at a temperature of 400° C. or lower, 350° C. or lower, or 300° C. or lower from the perspective of protecting the energy-curable resin 191 for forming the lens resin portion 82 from heat and the perspective of suppressing degassing from the energy-curable resin 191.

If the attachment process of the substrates with lenses 41W or the direct bonding process of the substrates with lenses 41W is performed under the condition of the atmospheric pressure, when the bonded substrates with lenses 41W-a and 41W-b are returned to the environment of the atmospheric pressure, a pressure difference occurs between the outside of the lens resin portion 82 and the space between the bonded lens resin portions 82. Due to this pressure difference, pressure is applied to the lens resin portion 82 and the lens resin portion 82 may be deformed.

When both the attachment process of the substrates with lenses 41W and the direct bonding process of the substrates with lenses are performed under the condition of the atmospheric pressure, it is possible to provide an effect or an advantage that the deformation of the lens resin portion 82 which may occur when the bonding was performed under the condition other than the atmospheric pressure can be avoided.

When the substrate subjected to the plasma activation process is direct-bonded (that is, plasma-bonded), since such fluidity and thermal expansion as when a resin is used as an adhesive can be suppressed, it is possible to improve the positional accuracy when the substrates with lenses 41W-a and 41W-b are bonded.

As described above, the upper surface layer 122 or the lower surface layer 123 is formed on the rear planar portion 172 of the substrate with lenses 41W-a and the front planar portion 171 of the substrate with lenses 41W-b. In the upper surface layer 122 and the lower surface layer 123, a dangling bond is likely to be formed due to the plasma activation process performed previously. That is, the lower surface layer 123 formed on the rear planar portion 172 of the substrate with lenses 41W-a and the upper surface layer 122 formed on the front planar portion 171 of the substrate with lenses 41W-a also have the function of increasing the bonding strength.

Moreover, when the upper surface layer 122 or the lower surface layer 123 is formed of an oxide film, since the layer is not affected by a change in the film property due to plasma (O2), it is possible to provide an effect of suppressing plasma-based corrosion of the lens resin portion 82.

As described above, the substrate with lenses 41W-a in the substrate state in which the plurality of substrates with lenses 41a is formed and the substrate with lenses 41W-b in the substrate state in which the plurality of substrates with lenses 41b is formed are direct-bonded after being subjected to a plasma-based surface activation process (that is, the substrates are bonded using plasma bonding).

Figure 32:
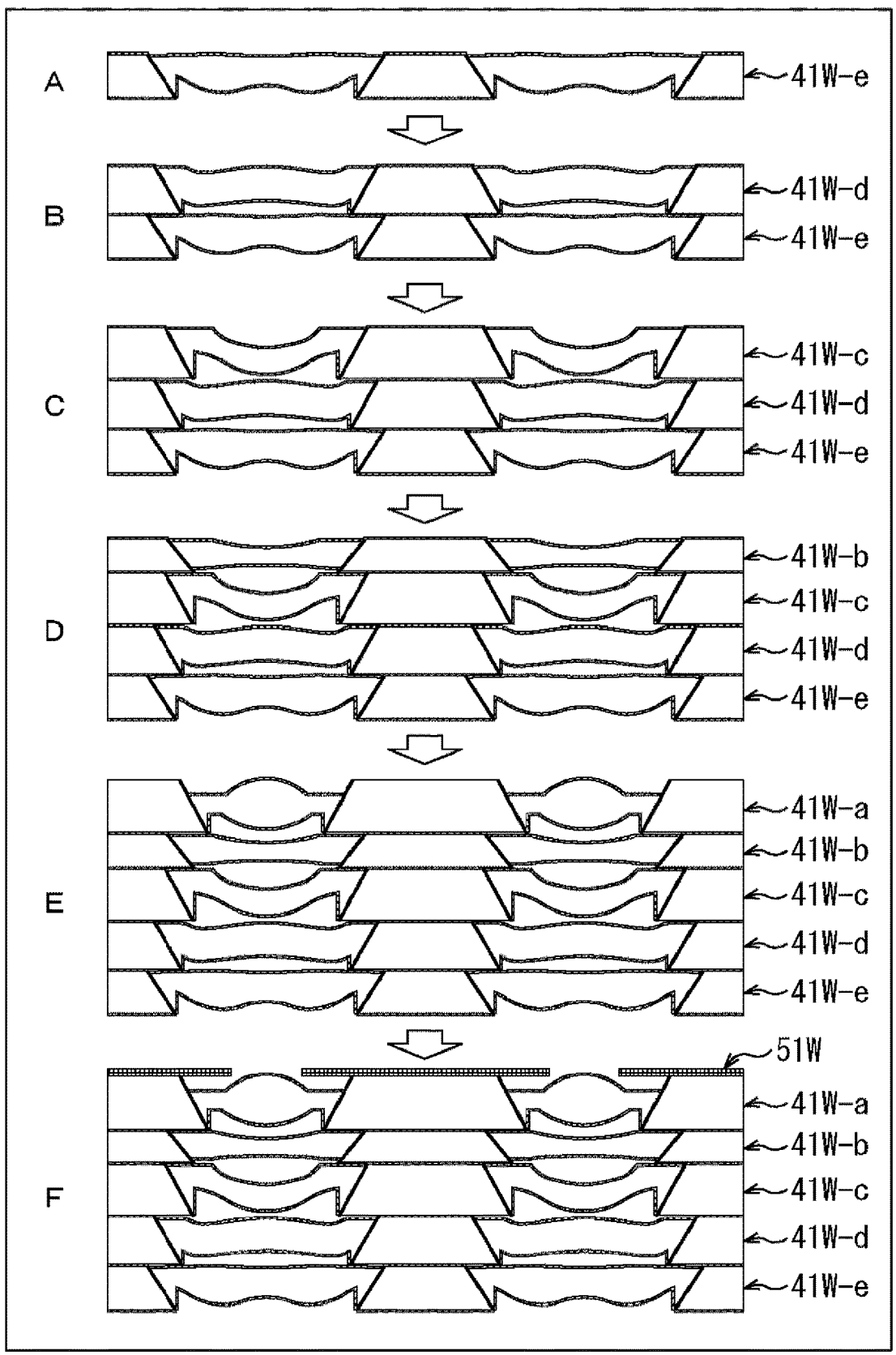
FIG. 32 is a diagram illustrating a first stacking method of stacking five substrates with lenses in a substrate state.

A to F of FIG. 32 illustrate a first stacking method of stacking five substrates with lenses 41a to 41e corresponding to the stacked lens structure 11 illustrated in FIG. 13 in the substrate state using the method of bonding the substrates with lenses 41W in the substrate state described with reference to A and B of FIG. 31.

First, as illustrated in A of FIG. 32, a substrate with lenses 41W-e in the substrate state positioned on the bottom layer of the stacked lens structure 11 is prepared.

Subsequently, as illustrated in B of FIG. 32, a substrate with lenses 41W-d in the substrate state positioned on the second layer from the bottom of the stacked lens structure 11 is bonded to the substrate with lenses 41W-e in the substrate state.

Subsequently, as illustrated in C of FIG. 32, a substrate with lenses 41W-c in the substrate state positioned on the third layer from the bottom of the stacked lens structure 11 is bonded to the substrate with lenses 41W-d in the substrate state.

Subsequently, as illustrated in D of FIG. 32, a substrate with lenses 41W-b in the substrate state positioned on the fourth layer from the bottom of the stacked lens structure 11 is bonded to the substrate with lenses 41W-c in the substrate state.

Subsequently, as illustrated in E of FIG. 32, a substrate with lenses 41W-a in the substrate state positioned on the fifth layer from the bottom of the stacked lens structure 11 is bonded to the substrate with lenses 41W-b in the substrate state.

Finally, as illustrated in F of FIG. 32, a diaphragm plate 51W positioned on the upper layer of the substrate with lenses 41a of the stacked lens structure 11 is bonded to the substrate with lenses 41W-a in the substrate state.

In this way, when the five substrates with lenses 41W-a to 41W-e in the substrate state are sequentially stacked one by one in the order from the substrate with lenses 41W on the lower layer of the stacked lens structure 11 to the substrate with lenses 41W on the upper layer, the stacked lens structure 11W in the substrate state is obtained.

Figure 33:
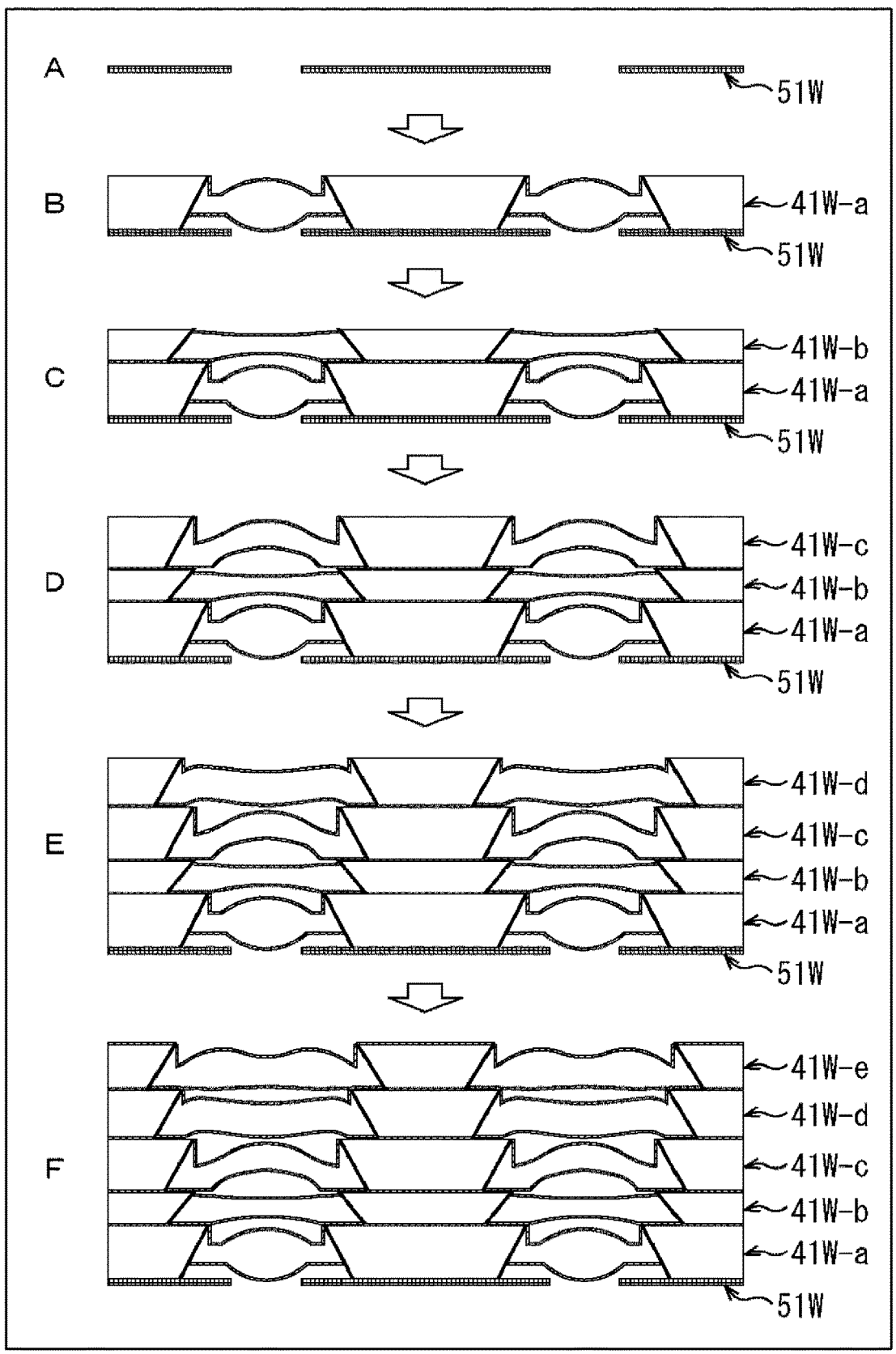
FIG. 33 is a diagram illustrating a second stacking method of stacking five substrates with lenses in a substrate state.

F of FIG. 33 illustrate a second stacking method of stacking five substrates with lenses 41a to 41e corresponding to the stacked lens structure 11 illustrated in FIG. 13 in the substrate state using the method of bonding the substrates with lenses 41W in the substrate state described with reference to A and B of FIG. 31.

First, as illustrated in A of FIG. 33, a diaphragm plate 51W positioned on the upper layer of the substrate with lenses 41a of the stacked lens structure 11 is prepared.

Subsequently, as illustrated in B of FIG. 33, a substrate with lenses 41W-a in the substrate state positioned on the top layer of the stacked lens structure 11 is inverted upside down and is then bonded to the diaphragm plate 51W.

Subsequently, as illustrated in C of FIG. 33, a substrate with lenses 41W-b in the substrate state positioned on the second layer from the top of the stacked lens structure 11 is inverted upside down and is then bonded to the substrate with lenses 41W-a in the substrate state.

Subsequently, as illustrated in D of FIG. 33, a substrate with lenses 41W-c in the substrate state positioned on the third layer from the top of the stacked lens structure 11 is inverted upside down and is then bonded to the substrate with lenses 41W-b in the substrate state.

Subsequently, as illustrated in E of FIG. 33, a substrate with lenses 41W-d in the substrate state positioned on the fourth layer from the top of the stacked lens structure 11 is inverted upside down and is then bonded to the substrate with lenses 41W-c in the substrate state.

Finally, as illustrated in F of FIG. 33, a substrate with lenses 41W-e in the substrate state positioned on the fifth layer from the top of the stacked lens structure 11 is inverted upside down and is then bonded to the substrate with lenses 41W-d in the substrate state.

In this way, when the five substrates with lenses 41W-a to 41W-e in the substrate state are sequentially stacked one by one in the order from the substrate with lenses 41W on the upper layer of the stacked lens structure 11 to the substrate with lenses 41W on the lower layer, the stacked lens structure 11W in the substrate state is obtained.

The five substrates with lenses 41W-a to 41W-e in the substrate state stacked by the stacking method described in A to F of FIG. 32 or A to F of FIG. 33 are divided in respective modules or chips using a blade, a laser, or the like whereby the stacked lens structure 11 in which the five substrates with lenses 41a to 41e are stacked is obtained.

<12. Eighth and Ninth Embodiments of Camera Module>

Figure 34:
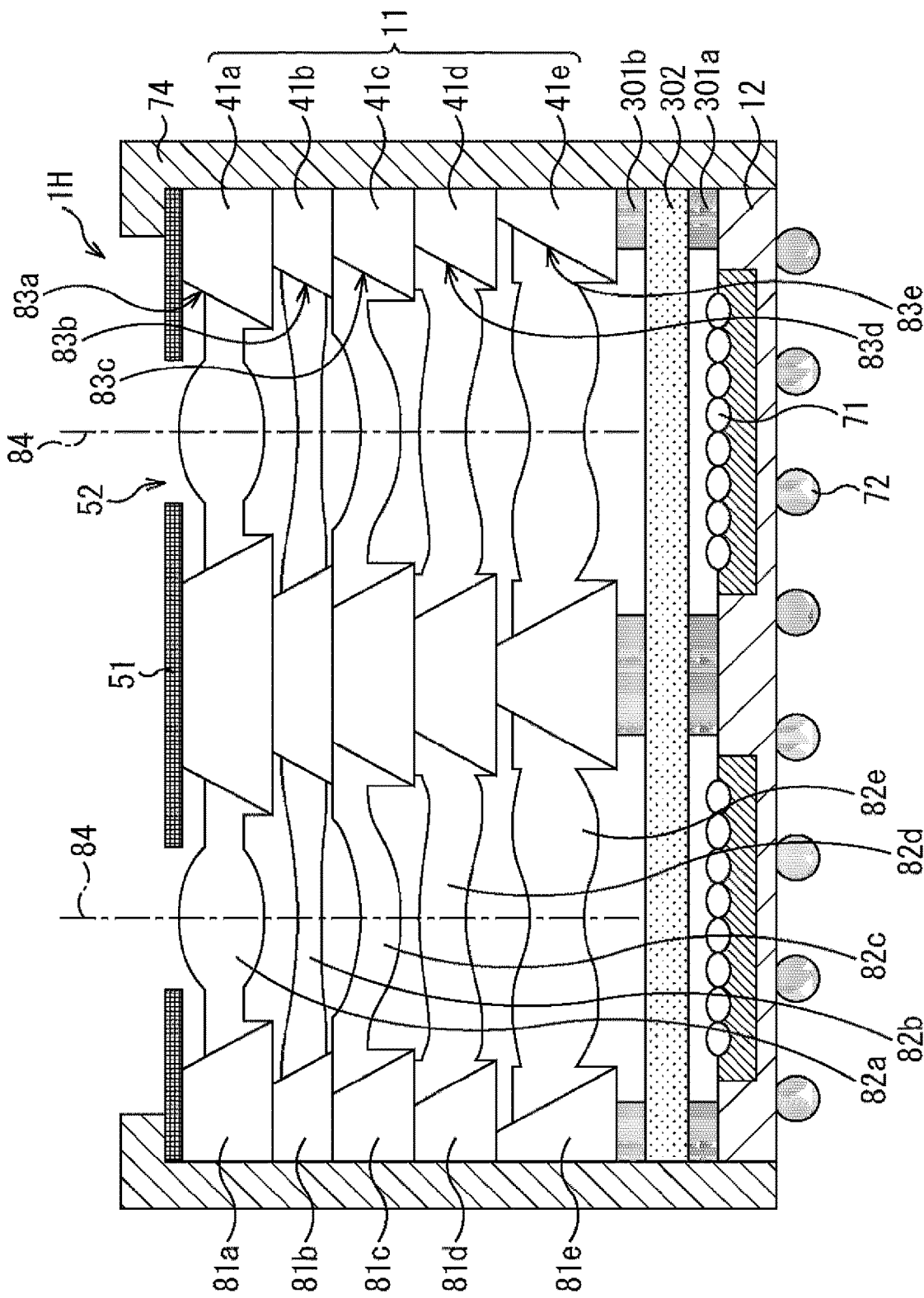
FIG. 34 is a diagram illustrating an eighth embodiment of a camera module which uses a stacked lens structure to which the present technique is applied.

FIG. 34 is a diagram illustrating an eighth embodiment of a camera module which uses a stacked lens structure to which the present technique is applied.

Figure 35:
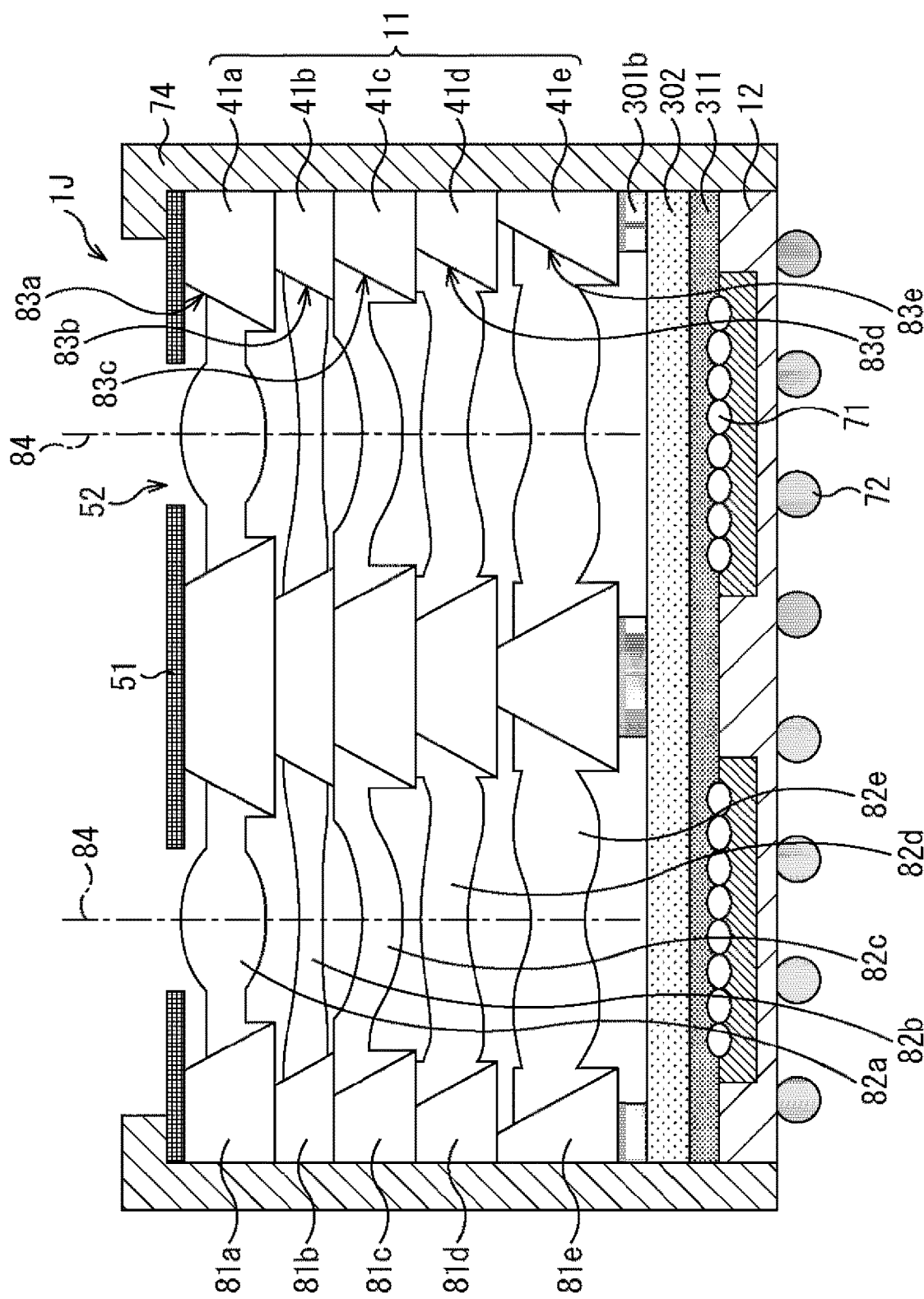
FIG. 35 is a diagram illustrating a ninth embodiment of a camera module which uses a stacked lens structure to which the present technique is applied.

FIG. 35 is a diagram illustrating a ninth embodiment of a camera module which uses a stacked lens structure to which the present technique is applied.

In description of FIGS. 34 and 35, only the portions different from those of the camera module E illustrated in FIG. 13 will be described.

In a camera module 1H illustrated in FIG. 34 and a camera module 1J illustrated in FIG. 35, the portion of the structure material 73 of the camera module E illustrated in FIG. 13 is replaced with another structure.

In the camera module 1H illustrated in FIG. 34, the portion of the structure material 73 of the camera module 1J is replaced with structure materials 301a and 301b and a light transmitting substrate 302.

Specifically, the structure material 301a is disposed in a portion of the upper side of the light receiving element 12. The light receiving element 12 and the light transmitting substrate 302 are fixed by the structure material 301a. The structure material 301a is an epoxy-based resin, for example.

The structure material 301b is disposed on the upper side of the light transmitting substrate 302. The light transmitting substrate 302 and the stacked lens structure 11 are fixed by the structure material 301b. The structure material 301b is an epoxy-based resin, for example.

In contrast, in the camera module 1J illustrated in FIG. 35, the portion of the structure material 301a of the camera module 1H illustrated in FIG. 34 is replaced with a resin layer 311 having a light transmitting property.

The resin layer 311 is disposed on the entire upper surface of the light receiving element 12. The light receiving element 12 and the light transmitting substrate 302 are fixed by the resin layer 311. The resin layer 311 disposed on the entire upper surface of the light receiving element 12 provides an effect or an advantage that, when stress is applied to the light transmitting substrate 302 from the upper side of the light transmitting substrate 302, the resin layer 311 prevents the stress from concentrating on a partial region of the light receiving element 12 so that the stress is received while being distributed to the entire surface of the light receiving element 12.

The structure material 301b is disposed on the upper side of the light transmitting substrate 302. The light transmitting substrate 302 and the stacked lens structure 11 are fixed by the structure material 301b.

The camera module 1H illustrated in FIG. 34 and the camera module 1J illustrated in FIG. 35 include the light transmitting substrate 302 on the upper side of the light receiving element 12. The light transmitting substrate 302 provides an effect or an advantage of suppressing the light receiving element 12 from being damaged in the course of manufacturing the camera module 1H or 1J, for example.

<13. Tenth Embodiment of Camera Module>

Figure 36:
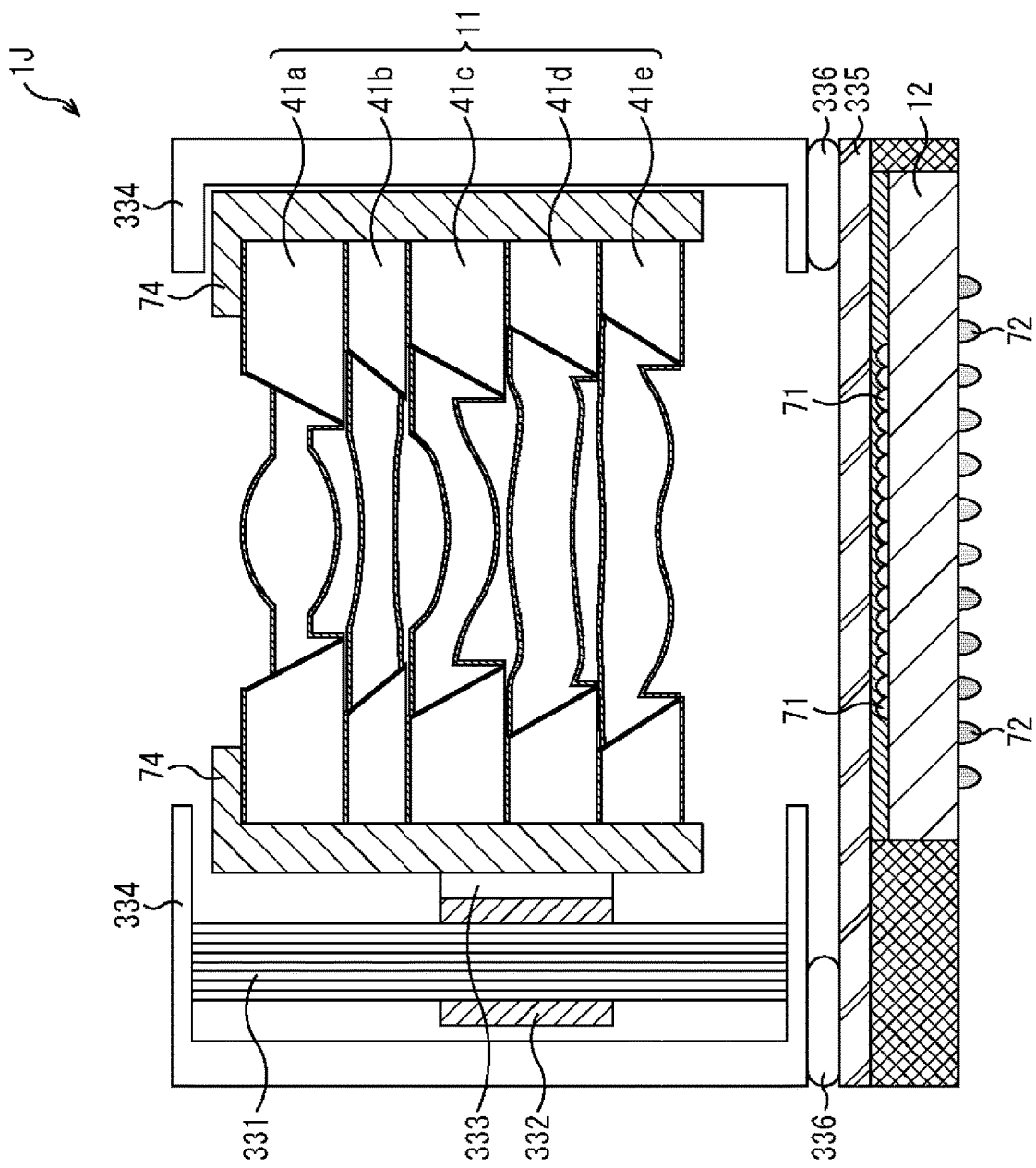
FIG. 36 is a diagram illustrating a tenth embodiment of a camera module which uses a stacked lens structure to which the present technique is applied.

FIG. 36 is a diagram illustrating a tenth embodiment of a camera module which uses a stacked lens structure to which the present technique is applied.

In the camera module 1J illustrated in FIG. 36, the stacked lens structure 11 is accommodated in a lens barrel 74. The lens barrel 74 is fixed to a moving member 332 moving along a shaft 331 by a fixing member 333. When the lens barrel 74 is moved in an axial direction of the shaft 331 by a drive motor (not illustrated), the distance from the stacked lens structure 11 to the imaging surface of the light receiving element 12 is adjusted.

The lens barrel 74, the shaft 331, the moving member 332, and the fixing member 333 are accommodated in the housing 334. A protective substrate 335 is disposed on an upper portion of the light receiving element 12, and the protective substrate 335 and the housing 334 are connected by an adhesive 336.

The mechanism that moves the stacked lens structure 11 provides an effect or an advantage of allowing a camera which uses the camera module 1J to perform an autofocus operation when photographing an image.

<14. Eleventh Embodiment of Camera Module>

Figure 37:
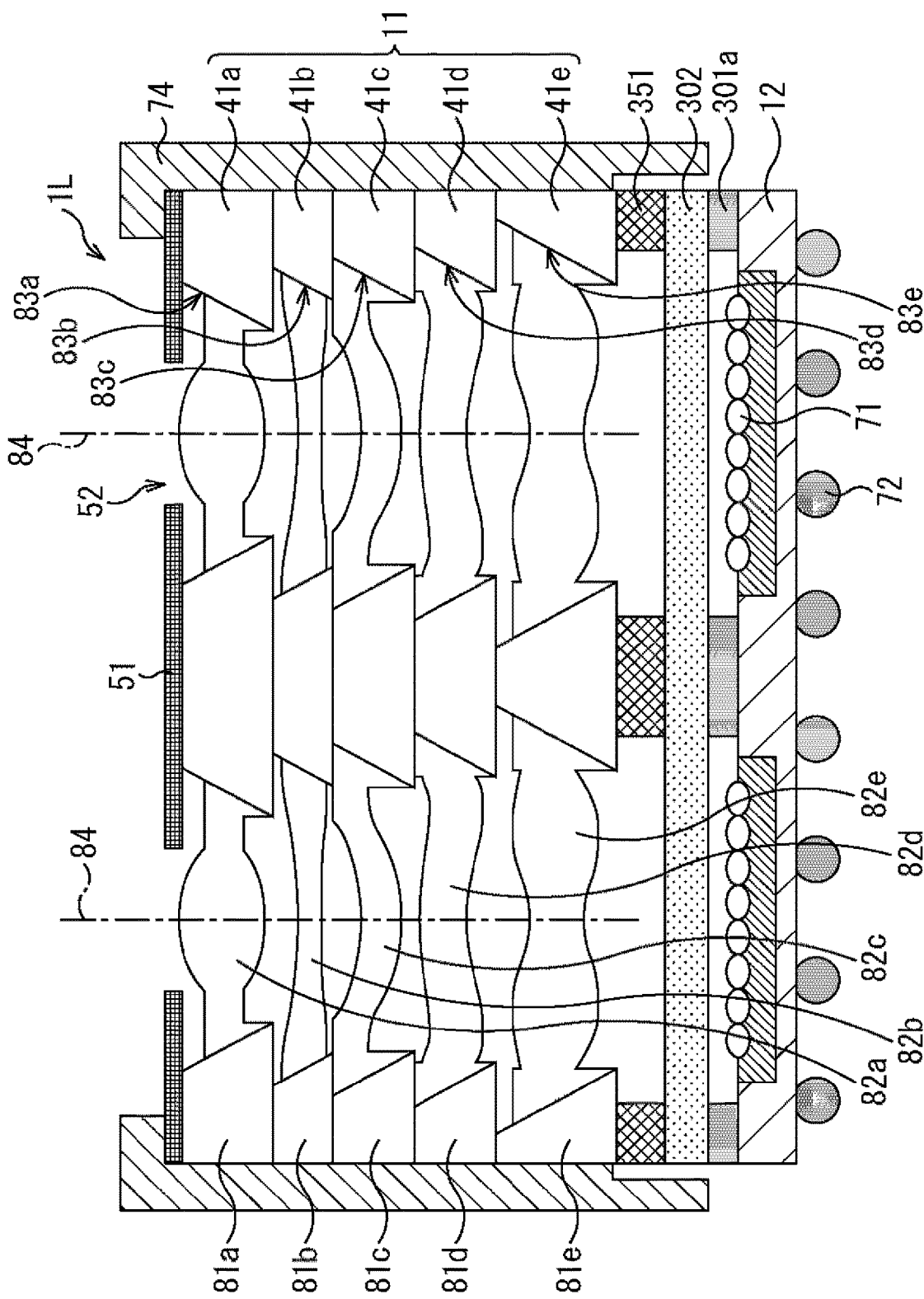
FIG. 37 is a diagram illustrating an eleventh embodiment of a camera module which uses a stacked lens structure to which the present technique is applied.

FIG. 37 is a diagram illustrating an eleventh embodiment of a camera module which uses a stacked lens structure to which the present technique is applied.

A camera module 1L illustrated in FIG. 37 is a camera module in which a focus adjustment mechanism based on a piezoelectric element is added.

That is, in the camera module 1L, a structure material 301a is disposed in a portion of the upper side of the light receiving element 12 similarly to the camera module 1H illustrated in FIG. 34. The light receiving element 12 and the light transmitting substrate 302 are fixed by the structure material 301a. The structure material 301a is an epoxy-based resin, for example.

A piezoelectric element 351 is disposed on an upper side of the light transmitting substrate 302. The light transmitting substrate 302 and the stacked lens structure 11 are fixed by the piezoelectric element 351.

In the camera module 1L, when a voltage is applied to the piezoelectric element 351 disposed on the lower side of the stacked lens structure 11 and the voltage is blocked, the stacked lens structure 11 can be moved up and down. The means for moving the stacked lens structure 11 is not limited to the piezoelectric element 351, but another device of which the shape changes when a voltage is applied or blocked can be used. For example, a MEMS device can be used.

The mechanism that moves the stacked lens structure 11 provides an effect or an advantage of allowing a camera which uses the camera module 1L to perform an autofocus operation when photographing an image.

<15. Advantage of Present Structure Compared to Other Structures>

The stacked lens structure 11 has a structure (hereinafter referred to as a present structure) in which the substrates with lenses 41 are fixed by direct bonding. The effect and the advantage of the present structure will be described in comparison with other structures of a substrate with lenses in which lenses are formed.

Comparative Structure Example 1

Figure 38:
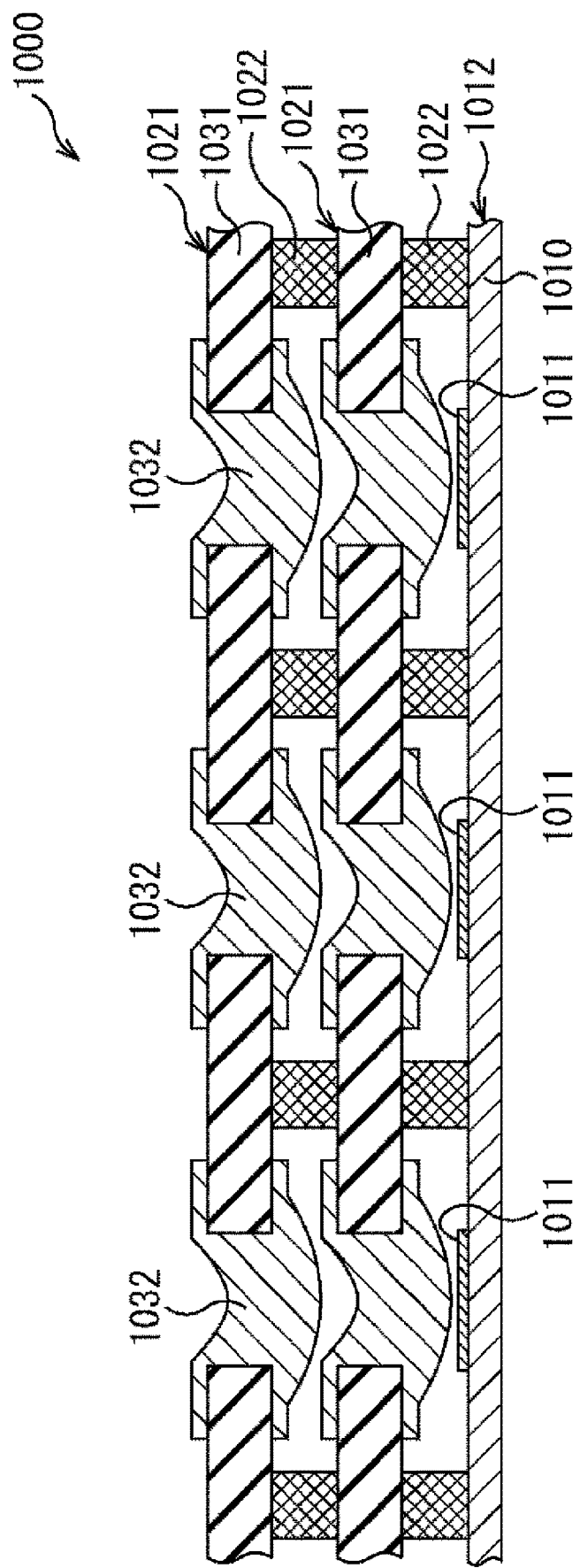
FIG. 38 is a cross-sectional view of a wafer-level stacked structure as Comparative Structure Example 1.

FIG. 38 is a cross-sectional view of a first substrate structure (hereinafter referred to as Comparative Structure Example 1) for comparing with the present structure and is across-sectional view of a wafer-level stacked structure disclosed in FIG. 14B of JP 2011-138089 A (hereinafter referred to as Comparative Literature 1).

A wafer-level stacked structure 1000 illustrated in FIG. 38 has a structure in which two lens array substrates 1021 are stacked on a sensor array substrate 1012 in which a plurality of image sensors 1011 is arranged on a wafer substrate 1010 with a columnar spacer 1022 interposed. Each lens array substrate 1021 includes a substrate with lenses 1031 and lenses 1032 formed in a plurality of through-hole portions formed in the substrate with lenses 1031.

Comparative Structure Example 2

Figure 39:
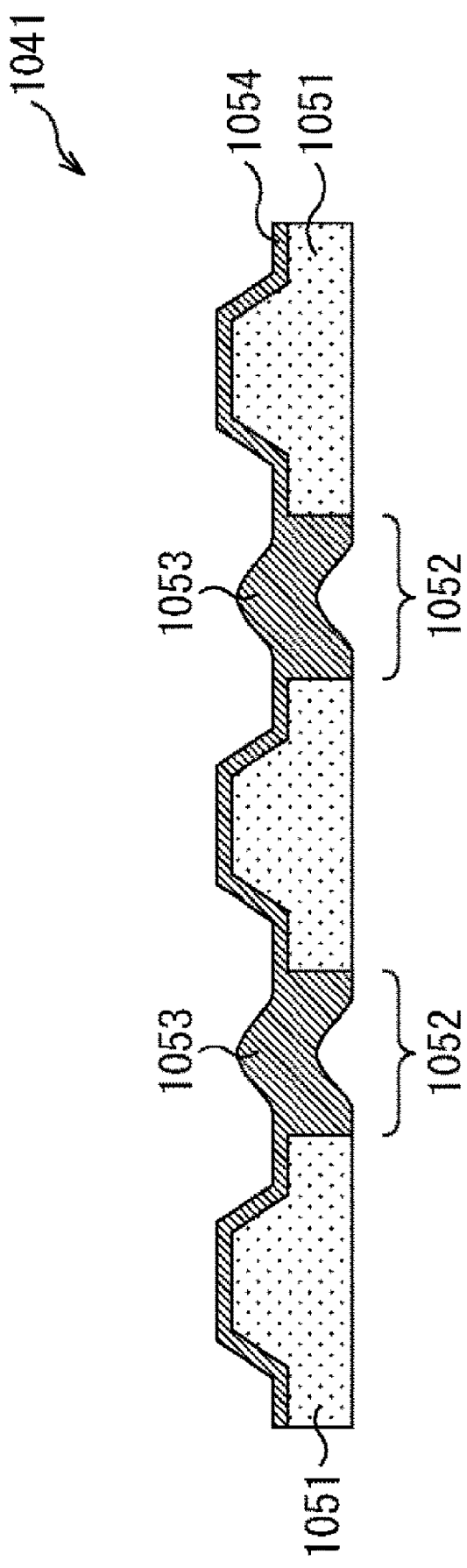
FIG. 39 is a cross-sectional view of a lens array substrate as Comparative Structure Example 2.

FIG. 39 is a cross-sectional view of a second substrate structure (hereinafter referred to as Comparative Structure Example 2) for comparing with the present structure and is a cross-sectional view of a lens array substrate disclosed in FIG. 5A of JP 2009-279790 A (hereinafter referred to as Comparative Literature 2).

In a lens array substrate 1041 illustrated in FIG. 39, lenses 1053 are provided in a plurality of through-holes 1052 formed in a planar substrate 1051. Each lens 1053 is formed of a resin (energy-curable resin) 1054, and the resin 1054 is also formed on the upper surface of the substrate 1051.

A method of manufacturing the lens array substrate 1041 illustrated in FIG. 39 will be described briefly with reference to A to C of FIG. 40.

Figure 40:
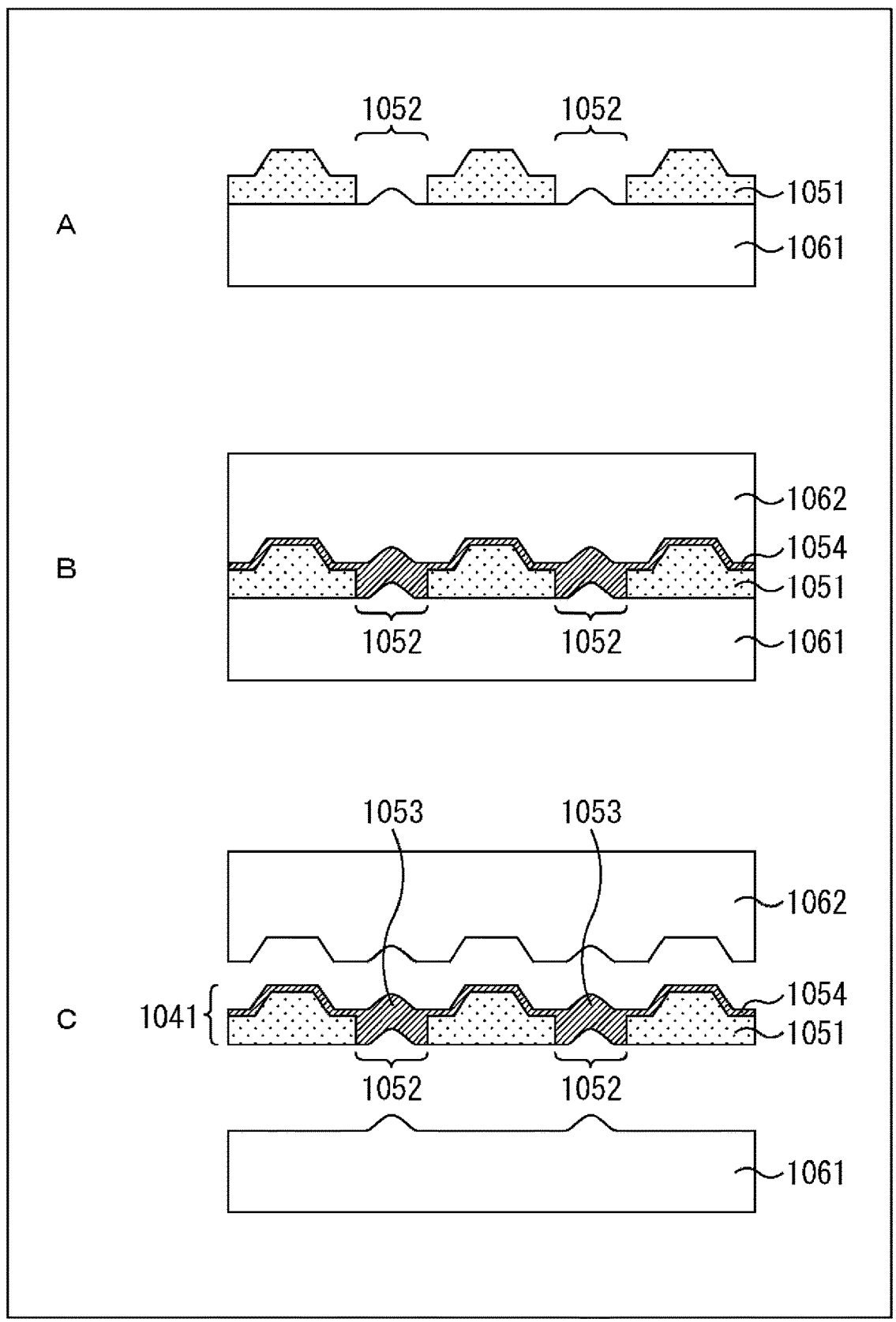
FIG. 40 is a diagram illustrating a method of manufacturing the lens array substrate illustrated in FIG. 39.

A of FIG. 40 illustrates a state in which the substrate 1051 in which the plurality of through-holes 1052 is formed is placed on a lower mold 1061. The lower mold 1061 is a metal mold that presses the resin 1054 toward the upper side from the lower side in a subsequent step.

B of FIG. 40 illustrates a state in which, after the resin 1054 is applied to the inside of the plurality of through-holes 1052 and the upper surface of the substrate 1051, the upper mold 1062 is disposed on the substrate 1051 and pressure-molding is performed using the upper mold 1062 the lower mold 1061. The upper mold 1062 is a metal mold that presses the resin 1054 toward the lower side from the upper side. In a state illustrated in B of FIG. 40, the resin 1054 is cured.

C of FIG. 40 illustrates a state in which, after the resin 1054 is cured, the upper mold 1062 and the lower mold 1061 are removed and the lens array substrate 1041 is obtained.

The lens array substrate 1041 is characterized in that (1) the resin 1054 formed at the positions of the through-holes 1052 of the substrate 1051 forms the lenses 1053 whereby a plurality of lenses 1053 is formed in the substrate 1051 and (2) a thin layer of the resin 1054 is formed on the entire upper surface of the substrate 1051 positioned between the plurality of lenses 1053.

When a plurality of lens array substrates 1041 is stacked to form a structure, it is possible to obtain an effect or an advantage that the thin layer of the resin 1054 formed on the entire upper surface of the substrate 1051 functions as an adhesive that attaches the substrates.

Moreover, when the plurality of lens array substrates 1041 is stacked to form a structure, since the area of attaching the substrates can be increased as compared to the wafer-level stacked structure 1000 illustrated in FIG. 38 as Comparative Structure Example 1, the substrates can be attached with stronger force.

<Effect of Resin in Comparative Structure Example 2>

In Comparative Literature 2 which discloses the lens array substrate 1041 illustrated in FIG. 39 as Comparative Structure Example 2, it is described that the resin 1054 serving as the lenses 1053 provides the following effects.

In Comparative Structure Example 2, an energy-curable resin is used as the resin 1054. Moreover, a photo-curable resin is used as an example of the energy-curable resin. When a photo-curable resin is used as the energy-curable resin and the resin 1054 is irradiated with UV light, the resin 1054 is cured. With this curing, a curing shrinkage occurs in the resin 1054.

However, according to the structure of the lens array substrate 1041 illustrated in FIG. 39, even when a curing shrinkage of the resin 1054 occurs, since the substrate 1051 is interposed between the plurality of lenses 1053, it is possible to prevent a variation in the distance between the lenses 1053 resulting from a curing shrinkage of the resin 1054. As a result, it is possible to suppress a warp of the lens array substrate 1041 in which the plurality of lenses 1053 is disposed.

Comparative Structure Example 3

Figure 41:
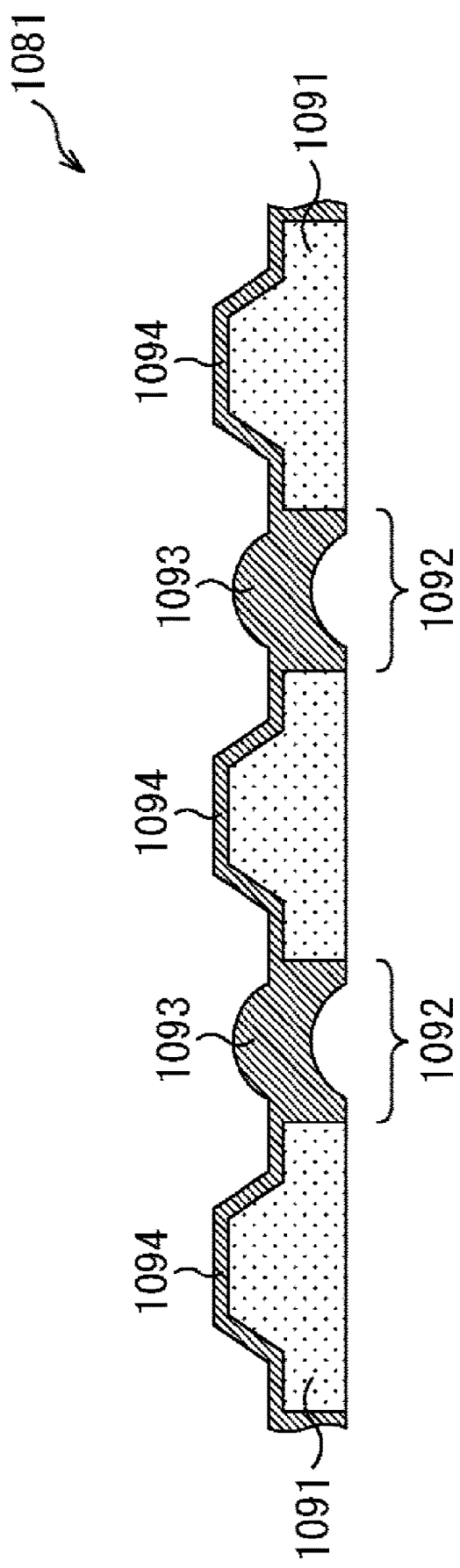
FIG. 41 is a cross-sectional view of a lens array substrate as Comparative Structure Example 3.

FIG. 41 is a cross-sectional view of a third substrate structure (hereinafter referred to as Comparative Structure Example 3) for comparing with the present structure and is a cross-sectional view of a lens array substrate disclosed in FIG. 1 of JP 2010-256563 A (hereinafter referred to as Comparative Document 3).

In a lens array substrate 1081 illustrated in FIG. 41, lenses 1093 are provided in a plurality of through-holes 1092 formed in a planar substrate 1091. Each lens 1093 is formed of a resin (energy-curable resin) 1094, and the resin 1094 is also formed on the upper surface of the substrate 1091 in which the through-hole 1092 is not formed.

A method of manufacturing the lens array substrate 1081 illustrated in FIG. 41 will be described briefly with reference to A to C of FIG. 42.

Figure 42:
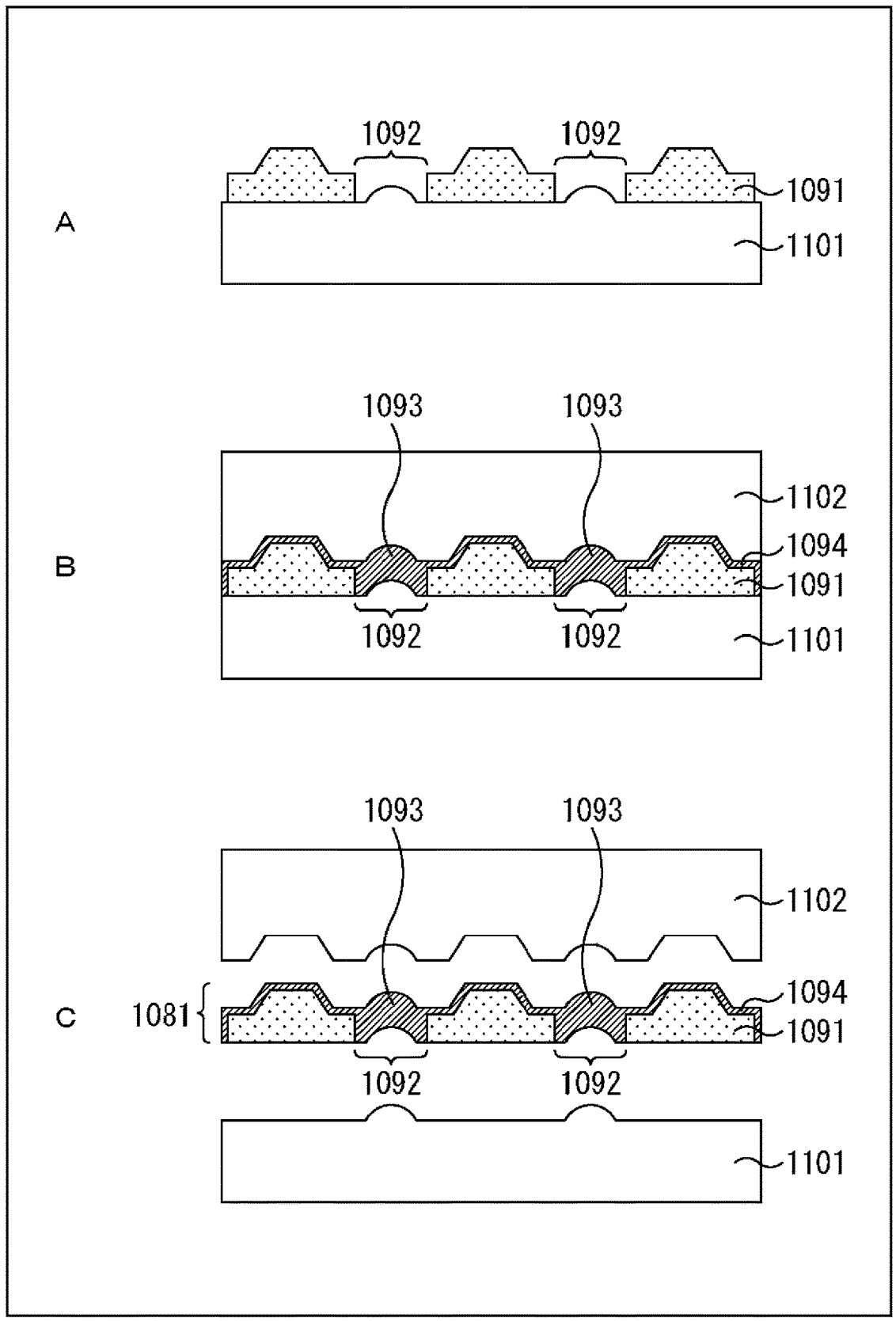
FIG. 42 is a diagram illustrating a method of manufacturing the lens array substrate illustrated in FIG. 41.

A of FIG. 42 illustrates a state in which the substrate 1091 in which the plurality of through-holes 1092 is formed is placed on a lower mold 1101. The lower mold 1101 is a metal mold that presses the resin 1094 toward the upper side from the lower side in a subsequent step.

B of FIG. 42 illustrates a state in which, after the resin 1094 is applied to the inside of the plurality of through-holes 1092 and the upper surface of the substrate 1091, an upper mold 1102 is disposed on the substrate 1091 and pressure-molding is performed using the upper mold 1102 and the lower mold 1101. The upper mold 1102 is a metal mold that presses the resin 1094 toward the lower side from the upper side. In the state illustrated in B of FIG. 42, the resin 1094 is cured.

C of FIG. 42 illustrates a state in which, after the resin 1094 is cured, the upper mold 1102 and the lower mold 1101 are removed to obtain the lens array substrate 1081.

The lens array substrate 1081 is characterized in that (1) the resin 1094 formed at the positions of the through-holes 1092 of the substrate 1091 forms the lenses 1093 whereby a plurality of lenses 1093 is formed in the substrate 1091 and (2) a thin layer of the resin 1094 is formed on the entire upper surface of the substrate 1091 positioned between the plurality of lenses 1093.

<Effect of Resin in Comparative Structure Example 3>

In Comparative Literature 3 which discloses the lens array substrate 1081 illustrated in FIG. 41 as Comparative Structure Example 3, it is described that the resin 1094 serving as the lenses 1093 provides the following effects.

In Comparative Structure Example 3, an energy-curable resin is used as the resin 1094. Moreover, a photo-curable resin is used as an example of the energy-curable resin. When a photo-curable resin is used as the energy-curable resin and the resin 1094 is irradiated with UV light, the resin 1094 is cured. With this curing, a curing shrinkage occurs in the resin 1094.

However, according to the structure of the lens array substrate 1081 illustrated in FIG. 41, even when a curing shrinkage of the resin 1094 occurs, since the substrate 1091 is interposed between the plurality of lenses 1093, it is possible to prevent a variation in the distance between the lenses 1093 resulting from a curing shrinkage of the resin 1094. As a result, it is possible to suppress a warp of the lens array substrate 1081 in which the plurality of lenses 1093 is disposed.

As described above, in Comparative Literature 2 and 3, it is described that a curing shrinkage occurs when a photo-curable resin is cured. The curing shrinkage occurring when a photo-curable resin is cured is also disclosed in JP 2013-1091 A or the like as well as Comparative Literature 2 and 3.

Moreover, the problem of a curing shrinkage occurring in a resin when the resin is molded into the shape of lenses and the molded resin is cured is not limited to the photo-curable resin. For example, a curing shrinkage occurring during curing is also a problem in a heat-curable resin which is one type of an energy-curable resin similarly to the photo-curable resin. This is also disclosed in JP 2010-204631 A or the like as well as Comparative Literature 1 and 3, for example.

Comparative Structure Example 4

Figure 43:
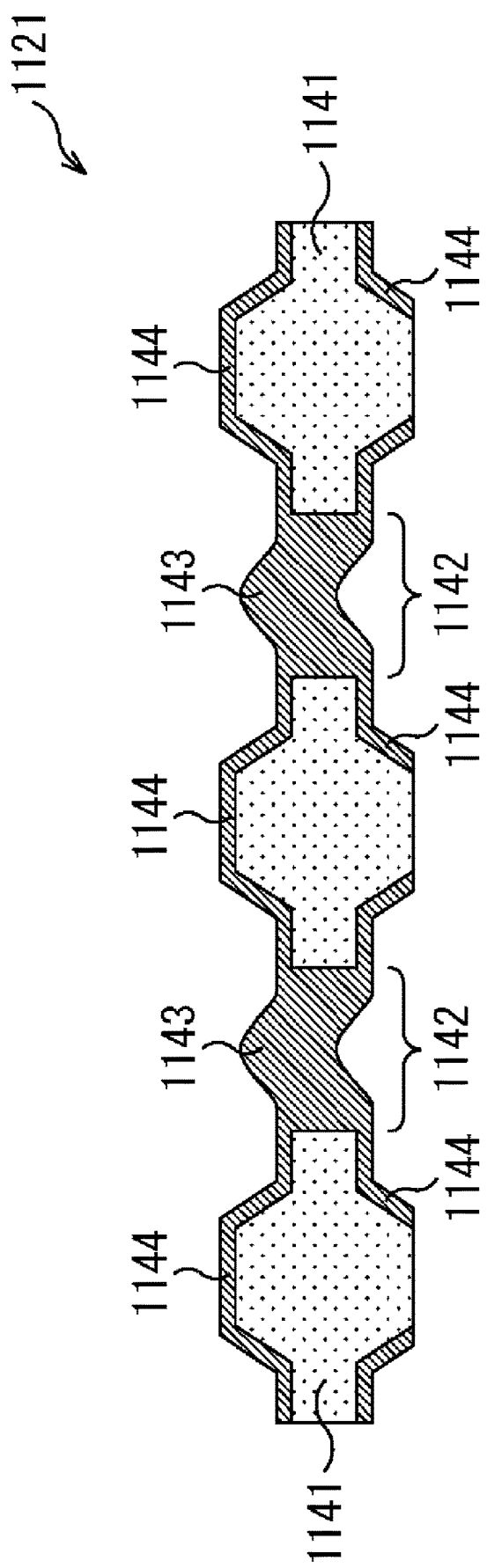
FIG. 43 is a cross-sectional view of a lens array substrate as Comparative Structure Example 4.

FIG. 43 is a cross-sectional view of a fourth substrate structure (hereinafter referred to as Comparative Structure Example 4) for comparing with the present structure and is a cross-sectional view of a lens array substrate disclosed in FIG. 6 of Comparative Literature 2 described above.

A lens array substrate 1121 illustrated in FIG. 43 is different from the lens array substrate 1041 illustrated in FIG. 39 in that the shape of a substrate 1141 other than the through-holes 1042 protrudes toward the lower side as well as the upper side and a resin 1144 is also formed in a portion of the lower surface of the substrate 1141. The other configurations of the lens array substrate 1121 are the same as those of the lens array substrate 1041 illustrated in FIG. 39.

Figure 44:
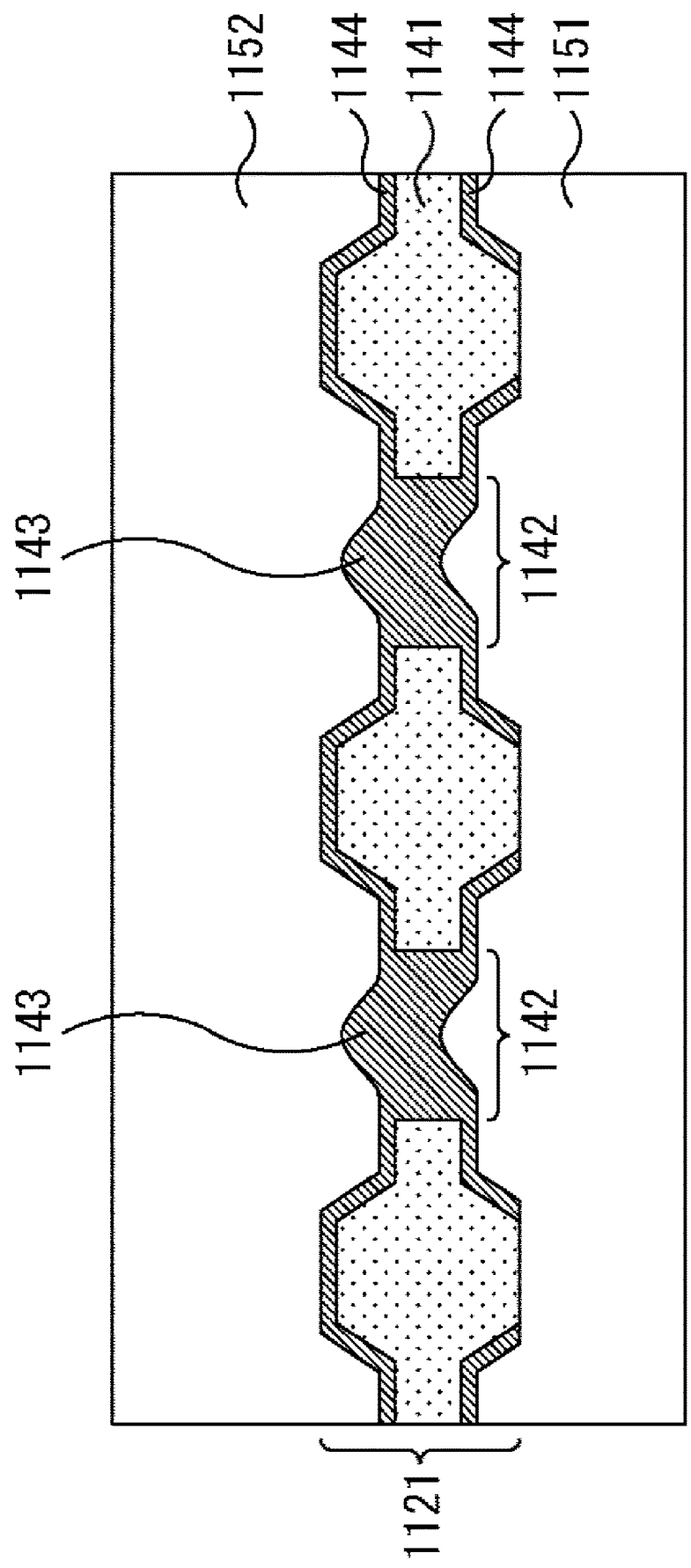
FIG. 44 is a diagram illustrating a method of manufacturing the lens array substrate illustrated in FIG. 43.

FIG. 44 is a diagram illustrating a method of manufacturing the lens array substrate 1121 illustrated in FIG. 43 and is a diagram corresponding to B of FIG. 40.

FIG. 44 illustrates a state in which, after the resin 1144 is applied to the inside of the plurality of through-holes 1142 and the upper surface of the substrate 1141, pressure molding is performed using an upper mold 1152 and a lower mold 1151. The resin 1144 is also injected between the lower surface of the substrate 1141 and the lower mold 1151. In the state illustrated in FIG. 44, the resin 1144 is cured.

The lens array substrate 1121 is characterized in that (1) the resin 1144 formed at the positions of the through-holes 1142 of the substrate 1141 forms the lenses 1143 whereby a plurality of lenses 1143 is formed in the substrate 1141 and (2) a thin layer of the resin 1144 is formed on the entire upper surface of the substrate 1141 positioned between the plurality of lenses 1143 and a thin layer of the resin 1144 is also formed in a portion of the lower surface of the substrate 1141.

<Effect of Resin in Comparative Structure Example 4>

In Comparative Literature 2 which discloses the lens array substrate 1121 illustrated in FIG. 43 as Comparative Structure Example 4, it is described that the resin 1144 serving as the lenses 1143 provides the following effects.

In the lens array substrate 1121 illustrated in FIG. 43, which is Comparative Structure Example 4, a photo-curable resin which is an example of an energy-curable resin is used as the resin 1144. When the resin 1144 is irradiated with UV light, the resin 1144 is cured. With this curing, a curing shrinkage occurs in the resin 1144 similarly to Comparative Structure Examples 2 and 3.

However, in the lens array substrate 1121 of Comparative Structure Example 4, a thin layer of the resin 1144 is formed in a certain region of the lower surface of the substrate 1141 as well as the entire upper surface of the substrate 1141 positioned between the plurality of lenses 1143.

In this way, when a structure in which the resin 1144 is formed on both the upper surface and the lower surface of the substrate 1141 is used, it is possible to cancel the direction of a warp of the entire lens array substrate 1121.

In contrast, in the lens array substrate 1041 illustrated in FIG. 39 as Comparative Structure Example 2, although a thin layer of the resin 1054 is formed on the entire upper surface of the substrate 1051 positioned between the plurality of lenses 1053, a thin layer of the resin 1054 is not formed on the lower surface of the substrate 1051.

Thus, in the lens array substrate 1121 illustrated in FIG. 43, it is possible to provide a lens array substrate in which the amount of a warp is reduced as compared to the lens array substrate 1041 illustrated in FIG. 39.

Comparative Structure Example 5

Figure 45:
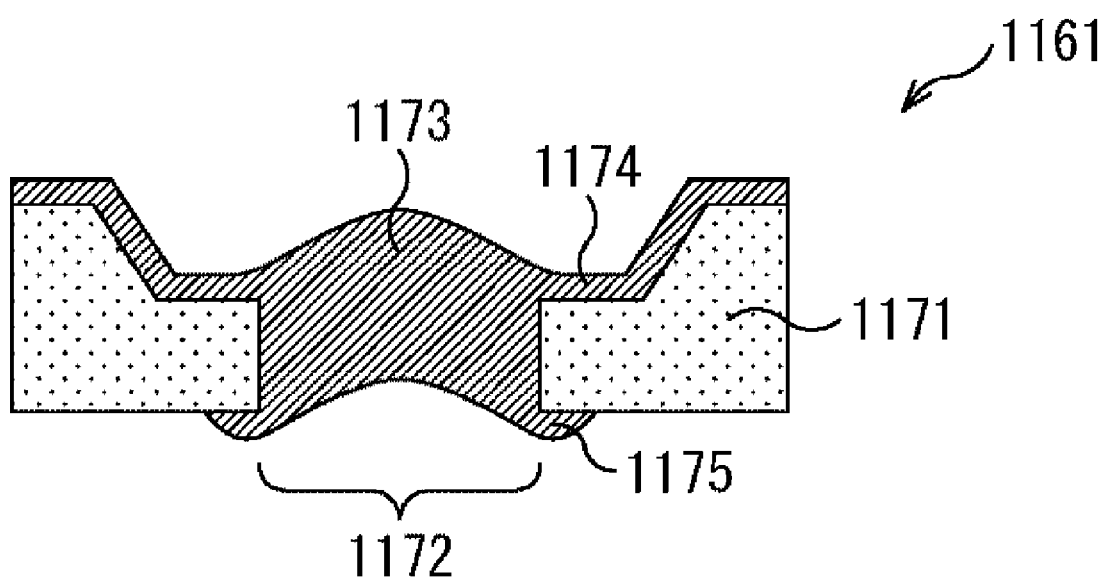
FIG. 45 is a cross-sectional view of a lens array substrate as Comparative Structure Example 5.

FIG. 45 is a cross-sectional view of a fifth substrate structure (hereinafter referred to as Comparative Structure Example 5) for comparing with the present structure and is across-sectional view of a lens array substrate disclosed in FIG. 9 of Comparative Literature 2 described above.

A lens array substrate 1161 illustrated in FIG. 45 is different from the lens array substrate 1041 illustrated in FIG. 39 in that a resin protrusion region 1175 is formed on a rear surface of a substrate 1171 near through-holes 1172 formed in the substrate 1171. The other configurations of the lens array substrate 1161 are the same as those of the lens array substrate 1041 illustrated in FIG. 39.

FIG. 45 illustrates the divided lens array substrate 1161. The lens array substrate 1161 is characterized in that (1) a resin 1174 formed at the positions of the through-holes 1172 of the substrate 1171 forms lenses 1173 whereby a plurality of lenses 1173 is formed in the substrate 1171 and (2) a thin layer of the resin 1174 is formed on the entire upper surface of the substrate 1171 positioned between the plurality of lenses 1173 and a thin layer of the resin 1174 is also formed in a portion of the lower surface of the substrate 1171.

<Effect of Resin in Comparative Structure Example 5>

In Comparative Literature 2 which discloses the lens array substrate 1161 illustrated in FIG. 45 as Comparative Structure Example 5, it is described that the resin 1174 serving as the lenses 1173 provides the following effects.

In the lens array substrate 1161 illustrated in FIG. 45, which is Comparative Structure Example 5, a photo-curable resin which is an example of an energy-curable resin is used as the resin 1174. When the resin 1174 is irradiated with UV light, the resin 1174 is cured. With this curing, a curing shrinkage occurs in the resin 1174 similarly to Comparative Structure Examples 2 and 3.

However, in the lens array substrate 1171 of Comparative Structure Example 5, a thin layer (the resin protrusion region 1175) of the resin 1174 is formed in a certain region of the lower surface of the substrate 1171 as well as the entire upper surface of the substrate 1171 positioned between the plurality of lenses 1173. Due to this, it is possible to provide a lens array substrate in which the direction of a warp of the entire lens array substrate 1171 is canceled and the amount of a warp is reduced.

<Comparison of Effects of Resin in Comparative Structure Examples 2 to 5>

The effects of the resin in Comparative Structure Examples 2 to 5 can be summarized as below.

(1) As in Comparative Structure Examples 2 and 3, in the case of the structure in which a resin layer is disposed on the entire upper surface of a lens array substrate, a warp occurs in the substrate in which the plurality of lenses is disposed.

Figure 46:
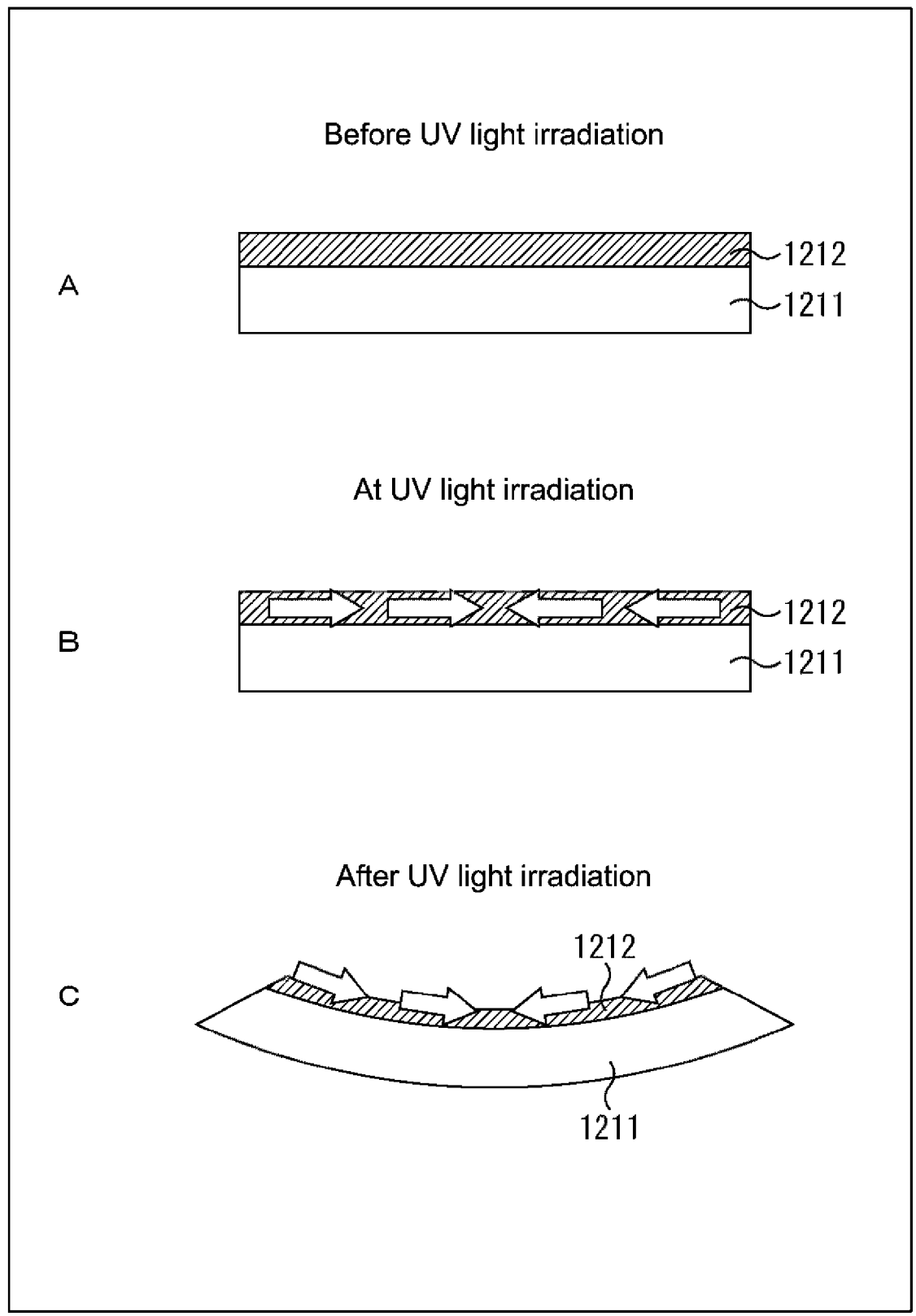
FIG. 46 is a diagram illustrating the effects of a resin which forms a lens.

A to C of FIG. 46 are diagrams schematically illustrating a structure in which a resin layer is disposed on the entire upper surface of a lens array substrate and are diagrams illustrating the effect of the resin serving as lenses.

As illustrated in A and B of FIG. 46, a curing shrinkage occurs in the layer of a photo-curable resin 1212 disposed on the upper surface of a lens array substrate 1211 (lenses and through-holes are not illustrated) when irradiated with UV light for curing. As a result, force in the shrinking direction resulting from the photo-curable resin 1212 occurs in the layer of the photo-curable resin 1212.

On the other hand, the lens array substrate 1211 itself does not shrink or expand even when irradiated with UV light. That is, force resulting from the substrate does not occur in the lens array substrate 1211 itself. As a result, the lens array substrate 1211 warps in a downward convex shape as illustrated in C of FIG. 46.

(2) However, as in Comparative Structure Examples 4 and 5, in the case of a structure in which a resin layer is disposed on both the upper surface and the lower surface of a lens array substrate, since the direction of a warp of the lens array substrate is canceled, it is possible to reduce the amount of a warp of the lens array substrate as compared to Comparative Structure Examples 2 and 3.

Figure 47:
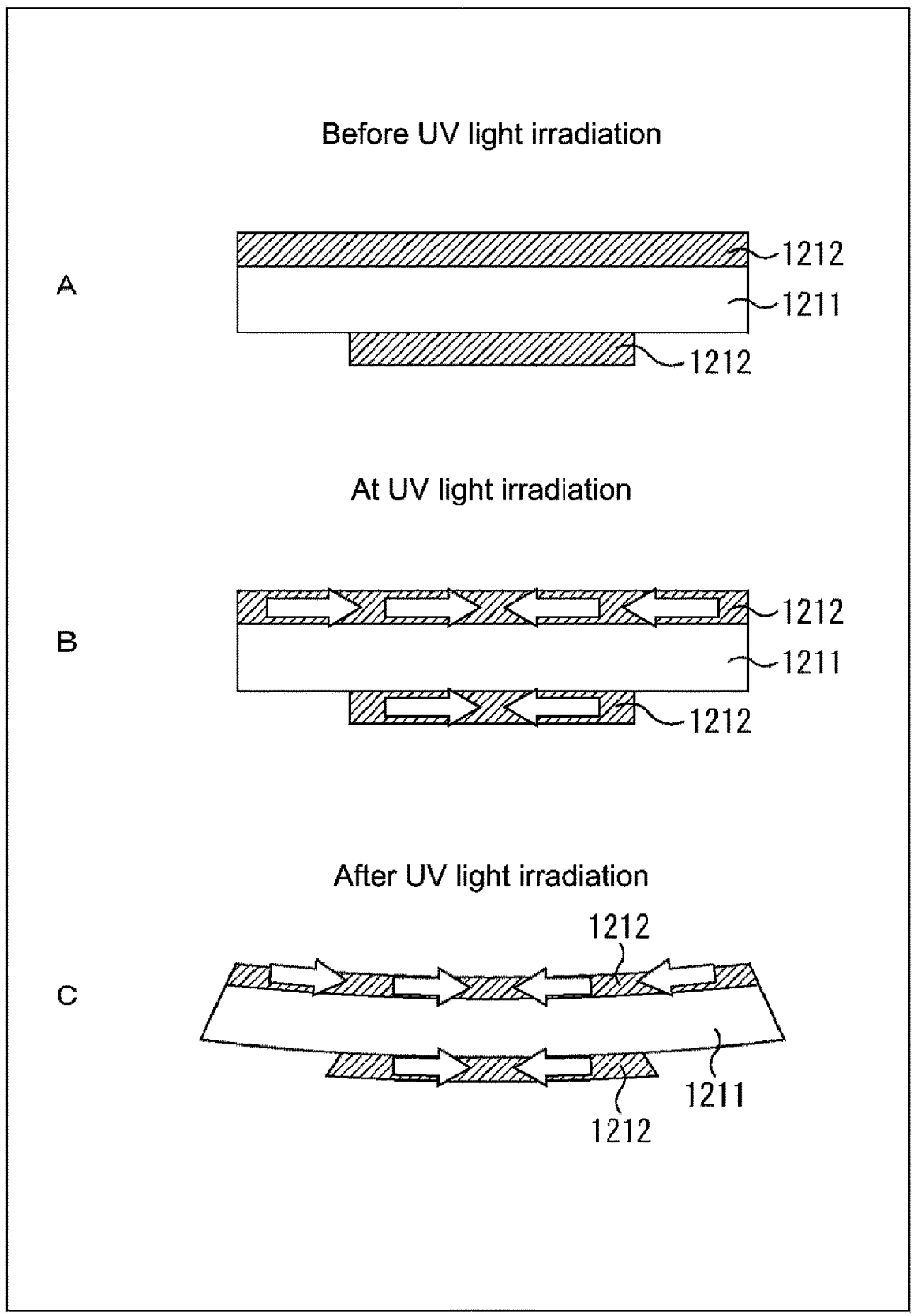
FIG. 47 is a diagram illustrating the effects of a resin which forms a lens.

A to C of FIG. 47 are diagrams schematically illustrating a structure in which a resin layer is disposed on both the upper surface and the lower surface of a lens array substrate and is a diagram illustrating the effect of the resin serving as lenses.

As illustrated in A and B of FIG. 47, a curing shrinkage occurs in the layer of a photo-curable resin 1212 disposed on the upper surface of a lens array substrate 1211 when irradiated with UV light for curing. As a result, force in the shrinking direction resulting from the photo-curable resin 1212 occurs in the layer of the photo-curable resin 1212 disposed on the upper surface of the lens array substrate 1211. Due to this, force that warps the lens array substrate 1211 in a downward convex shape acts on the upper surface side of the lens array substrate 1211.

In contrast, the lens array substrate 1211 itself does not shrink or expand even when irradiated with UV light. That is, force resulting from the substrate does not occur in the lens array substrate 1211 itself.

On the other hand, a curing shrinkage occurs in the layer of the photo-curable resin 1212 disposed on the lower surface of the lens array substrate 1211 when irradiated with UV light for curing. As a result, force in the shrinking direction resulting from the photo-curable resin 1212 occurs in the layer of the photo-curable resin 1212 disposed on the lower surface of the lens array substrate 1211. Due to this, force that warps the lens array substrate 1211 in an upward convex shape acts on the lower surface side of the lens array substrate 1211.

The force that warps the lens array substrate 1211 in a downward convex shape, acting on the upper surface side of the lens array substrate 1211 and the force that warps the lens array substrate 1211 in an upward convex shape, acting on the lower surface side of the lens array substrate 1211 cancel each other.

As a result, as illustrated in C of FIG. 47, the amount of a warp of the lens array substrate 1211 in Comparative Structure Examples 4 and 5 is smaller than the amount of a warp in Comparative Structure Examples 2 and 3 illustrated in C of FIG. 46.

As described above, the force that warps the lens array substrate and the amount of a warp of the lens array substrate are affected by a relative relation between (1) the direction and the magnitude of the force acting on the lens array substrate on the upper surface of the lens array substrate and (2) the direction and the magnitude of the force acting on the lens array substrate on the lower surface of the lens array substrate.

Comparative Structure Example 6

Figure 48:
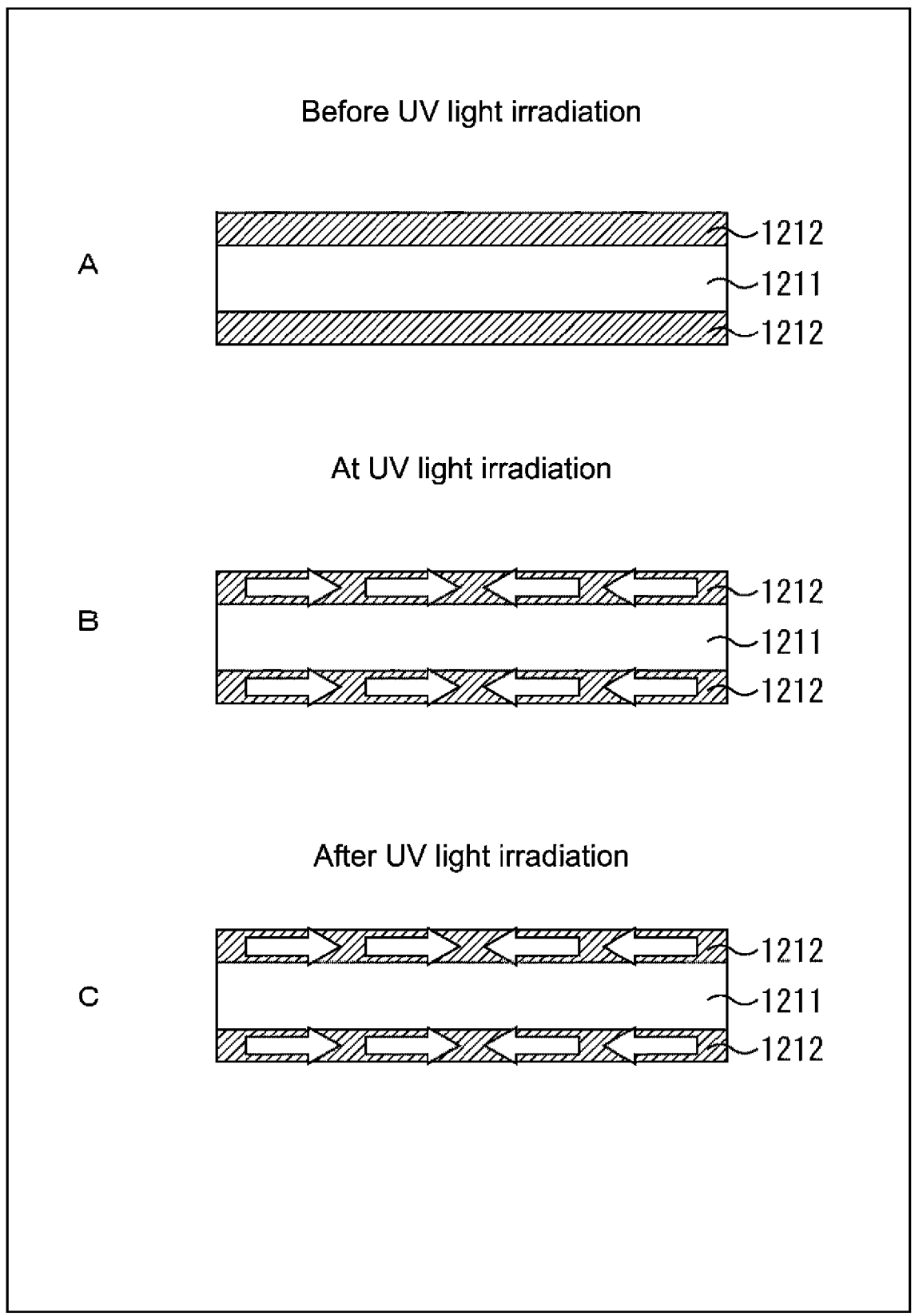
FIG. 48 is a diagram schematically illustrating a lens array substrate as Comparative Structure Example 6.

Thus, for example, as illustrated in A of FIG. 48, a lens array substrate structure in which the layer and the area of the photo-curable resin 1212 disposed on the upper surface of the lens array substrate 1211 are the same as the layer and the area of the photo-curable resin 1212 disposed on the lower surface of the lens array substrate 1211 can be considered. This lens array substrate structure will be referred to as a sixth substrate structure (hereinafter referred to as Comparative Structure Example 6) for comparison with the present structure.

In Comparative Structure Example 6, force in a shrinking direction resulting from the photo-curable resin 1212 occurs in the layer of the photo-curable resin 1212 disposed on the upper surface of the lens array substrate 1211. Force resulting from the substrate does not occur in the lens array substrate 1211 itself. Due to this, force that warps the lens array substrate 1211 in a downward convex shape acts on the upper surface side of the lens array substrate 1211.

On the other hand, force in a shrinking direction resulting from the photo-curable resin 1212 occurs in the layer of the photo-curable resin 1212 disposed on the lower surface of the lens array substrate 1211. Force resulting from the substrate does not occur in the lens array substrate 1211 itself. Due to this, force that warps the lens array substrate 1211 in an upward convex shape acts on the lower surface side of the lens array substrate 1211.

The two types of force that warps the lens array substrate 1211 act in the direction of canceling each other more effectively than the structure illustrated in A of FIG. 47. As a result, the force that warps the lens array substrate 1211 and the amount of a warp of the lens array substrate 1211 are further reduced as compared to Comparative Structure Examples 4 and 5.

Comparative Structure Example 7

However, practically, the shapes of the substrates with lenses that form the stacked lens structure assembled into a camera module are not the same. More specifically, among the plurality of substrates with lenses that forms a stacked lens structure, for example, the thicknesses of the substrates with lenses and the sizes of the through-holes may be different and the thicknesses, shapes, volumes, and the like of lenses formed in the through-holes may be different. Further specifically, the thickness of a photo-curable resin formed on the upper surface and the lower surface of a substrate with lenses may be different from one substrate with lenses to another.

Figure 49:
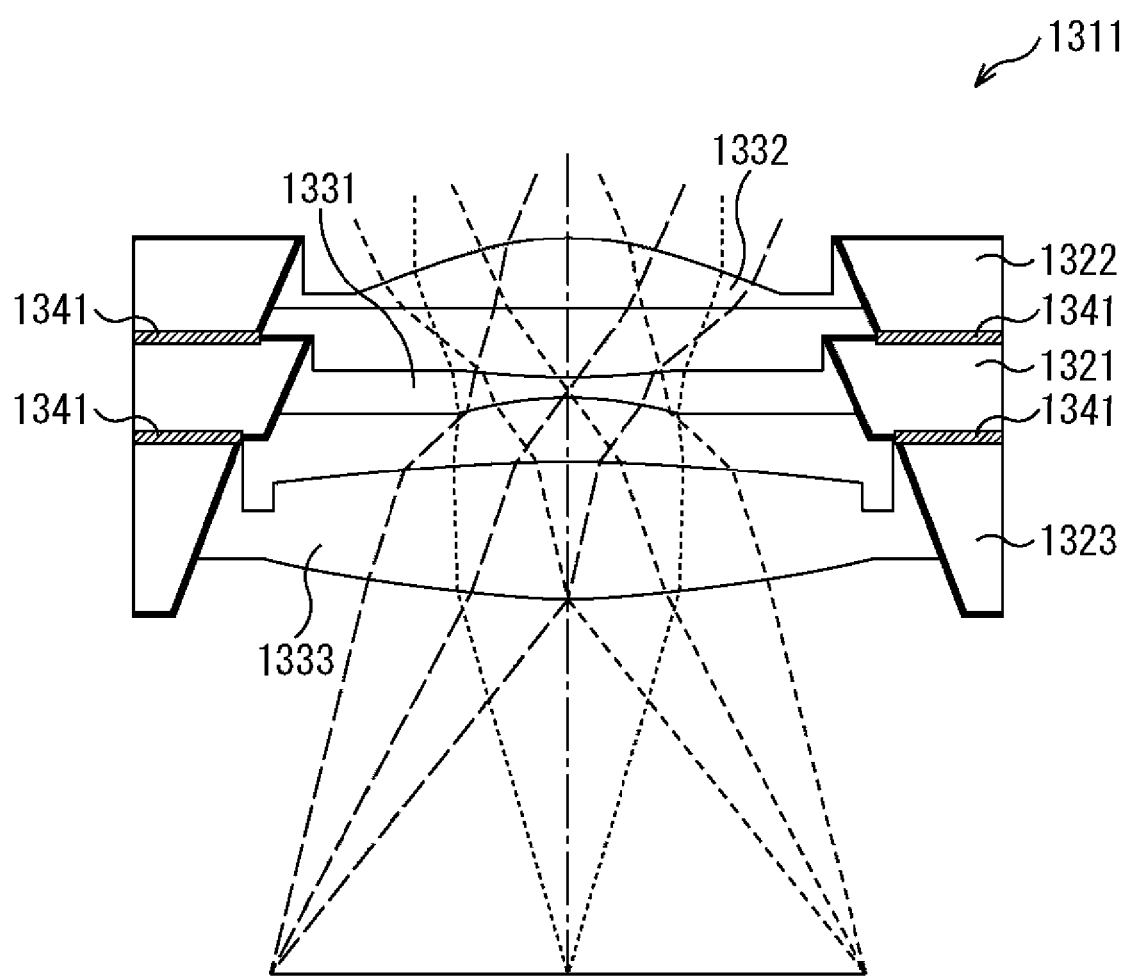
FIG. 49 is a cross-sectional view of a stacked lens structure as Comparative Structure Example 7.

FIG. 49 is a cross-sectional view of a stacked lens structure formed by stacking three substrates with lenses as a seventh substrate structure (hereinafter referred to as Comparative Structure Example 7). In this stacked lens structure, similarly to Comparative Structure Example 6 illustrated in A to C of FIG. 48, it is assumed that the layer and the area of the photo-curable resin disposed on the upper surface and the lower surface of each of the substrates with lenses are the same.

A stacked lens structure 1311 illustrated in FIG. 49 includes three substrates with lenses 1321 to 1323.

In the following description, among the three substrates with lenses 1321 to 1323, the substrate with lenses 1321 on the middle layer will be referred to as a first substrate with lenses 1321, the substrate with lenses 1322 on the top layer will be referred to as a second substrate with lenses 1322, and the substrate with lenses 1323 on the bottom layer will be referred to as a third substrate with lenses 1323.

The substrate thickness and the lens thickness in the second substrate with lenses 1322 disposed on the top layer are different from those of the third substrate with lenses 1323 disposed on the bottom layer.

More specifically, the lens thickness in the third substrate with lenses 1323 is larger than the lens thickness in the second substrate with lenses 1322. Thus, the substrate thickness in the third substrate with lenses 1323 is larger than the substrate thickness in the second substrate with lenses 1322.

A resin 1341 is formed on an entire contact surface between the first and second substrates with lenses 1321 and 1322 and an entire contact surface between the first and third substrates with lenses 1321 and 1323.

The cross-sectional shape of the through-holes of the three substrates with lenses 1321 to 1323 has such a so-called fan shape that the upper surface of the substrate is wider than the lower surface of the substrate.

The effect of the three substrates with lenses 1321 to 1323 having different shapes will be described with reference to A to D of FIG. 50.

Figure 50:
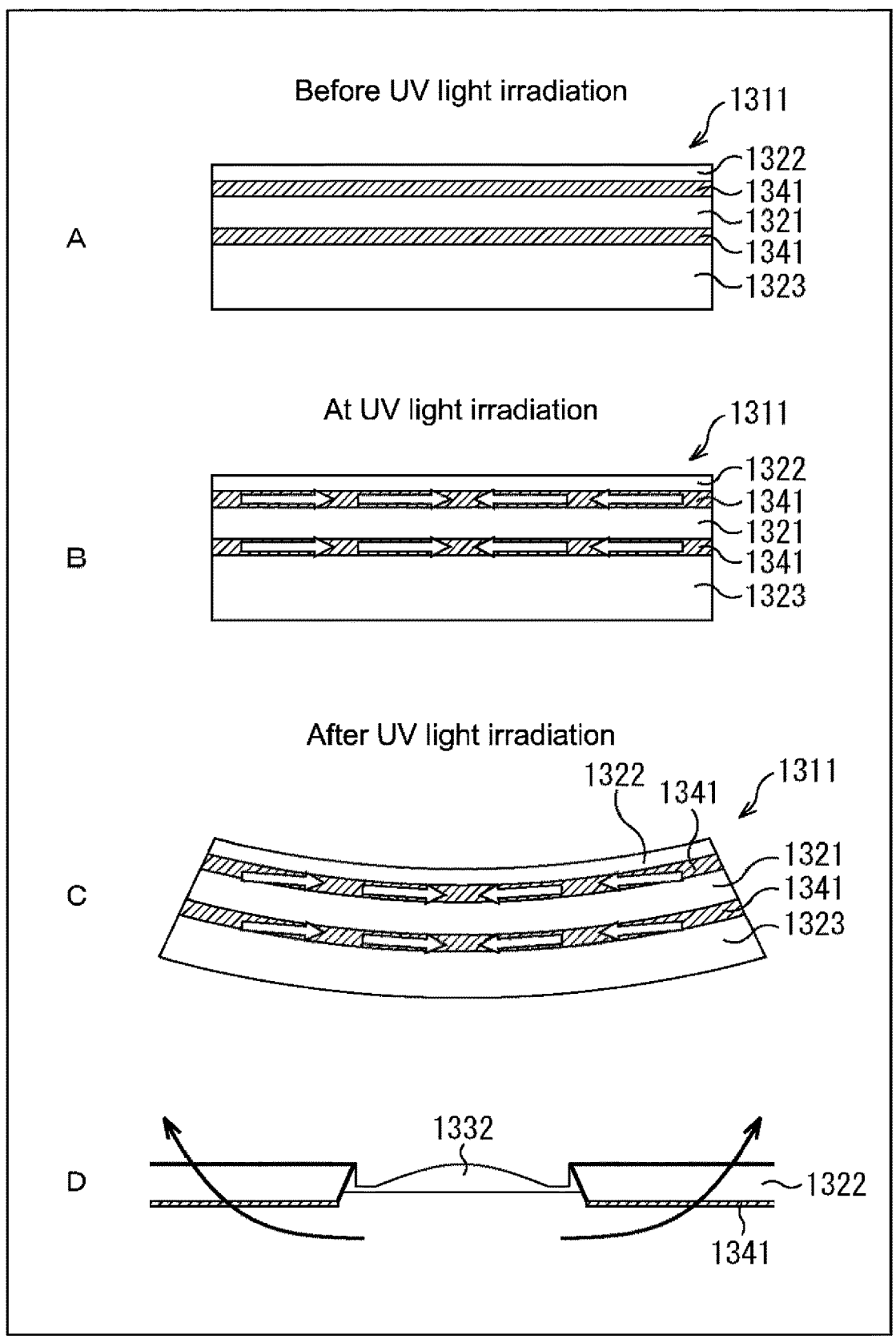
FIG. 50 is a diagram illustrating the effects of the stacked lens structure illustrated in FIG. 49.

A to C of FIG. 50 are diagrams schematically illustrating the stacked lens structure 1311 illustrated in FIG. 49.

As in this stacked lens structure 1311, when the second and third substrates with lenses 1322 and 1323 having different substrate thicknesses are disposed on the upper surface and the lower surface of the first substrate with lenses 1321, respectively, the force of warping the stacked lens structure 1311 and the amount of a warp of the stacked lens structure 1311 change depending on the position in the thickness direction of the stacked lens structure 1311 at which the layer of the resin 1341 present in the entire contact surface of the three substrates with lenses 1321 to 1323 is present.

Unless the layer of the resin 1341 present in the entire contact surface of the three substrates with lenses 1321 to 1323 is disposed symmetrical about a line that passes through the central line (that is, the central point in the thickness direction of the stacked lens structure 1311) of the stacked lens structure 1311 and runs in the plane direction of the substrate, the effect of the force occurring due to a curing shrinkage of the resin 1341 disposed on the upper surface and the lower surface of the first substrate with lenses 1321 is not canceled completely as illustrated in C of FIG. 48. As a result, the stacked lens structure 1311 warps in a certain direction.

For example, when the two layers of the resin 1341 on the upper surface and the lower surface of the first substrate with lenses 1321 are disposed to be shifted in an upper direction than the central line in the thickness direction of the stacked lens structure 1311, if a curing shrinkage occurs in the two layers of the resin 1341, the stacked lens structure 1311 warps in a downward convex shape as illustrated in C of FIG. 50.

Further, when the cross-sectional shape of the through-hole in a thinner substrate among the second and third substrates with lenses 1322 and 1323 has such a shape that widens toward the first substrate with lenses 1321, the possibility of the loss or breakage of lenses may increase.

In the example illustrated in FIG. 49, the cross-sectional shape of the through-hole in the second substrate with lenses 1322 having the smaller thickness among the second and third substrates with lenses 1322 and 1323 has such a fan shape that widens toward the first substrate with lenses 1321. In such a shape, when a curing shrinkage occurs in the two layers of the resin 1341 on the upper surface and the lower surface of the first substrate with lenses 1321, force that warps the stacked lens structure 1311 in a downward convex shape as illustrated in C of FIG. 50 acts on the stacked lens structure 1311. This force acts as force acting in the direction of separating the lenses and the substrate in the second substrate with lenses 1322 as illustrated in D of FIG. 50. With this action, the possibility that the lenses 1332 of the second substrate with lenses 1322 are lost or broken increases.

Next, a case in which a resin is expanded thermally will be considered.

Comparative Structure Example 8

Figure 51:
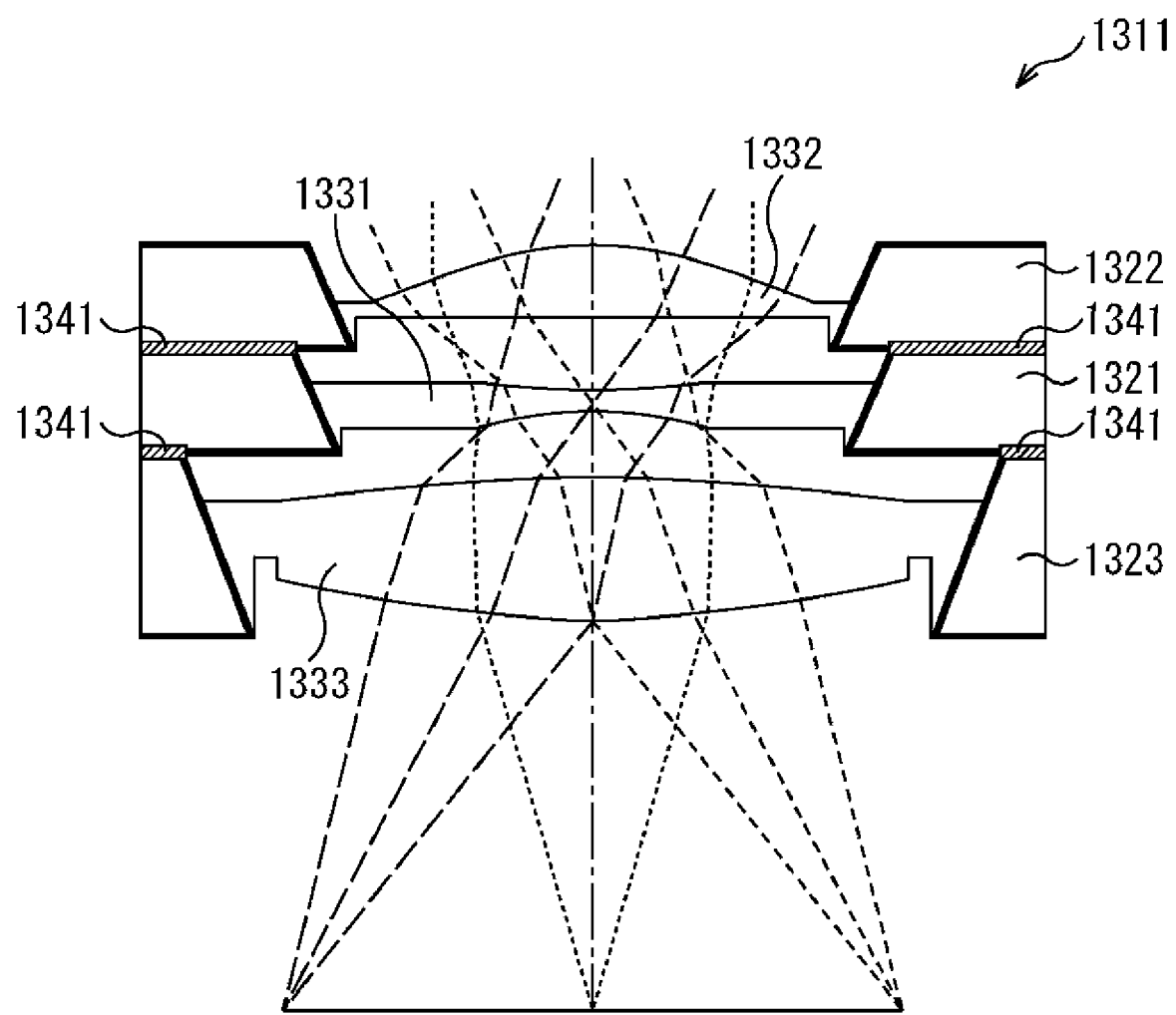
FIG. 51 is a cross-sectional view of a stacked lens structure as Comparative Structure Example 8.

FIG. 51 is a cross-sectional view of a stacked lens structure formed by stacking three substrates with lenses as an eighth substrate structure (hereinafter referred to as Comparative Structure Example 8). In this stacked lens structure, similarly to Comparative Structure Example 6 illustrated in A to C of FIG. 48, it is assumed that the layer and the area of the photo-curable resin disposed on the upper surface and the lower surface of each of the substrates with lenses are the same.

Comparative Structure Example 8 illustrated in FIG. 51 is different from Comparative Structure Example 7 illustrated in FIG. 49 in that the cross-sectional shape of the through-holes of the three substrates with lenses 1321 to 1323 has such a so-called downward tapered shape that the lower surface of the substrate is narrower than the upper surface of the substrate.

Figure 52:
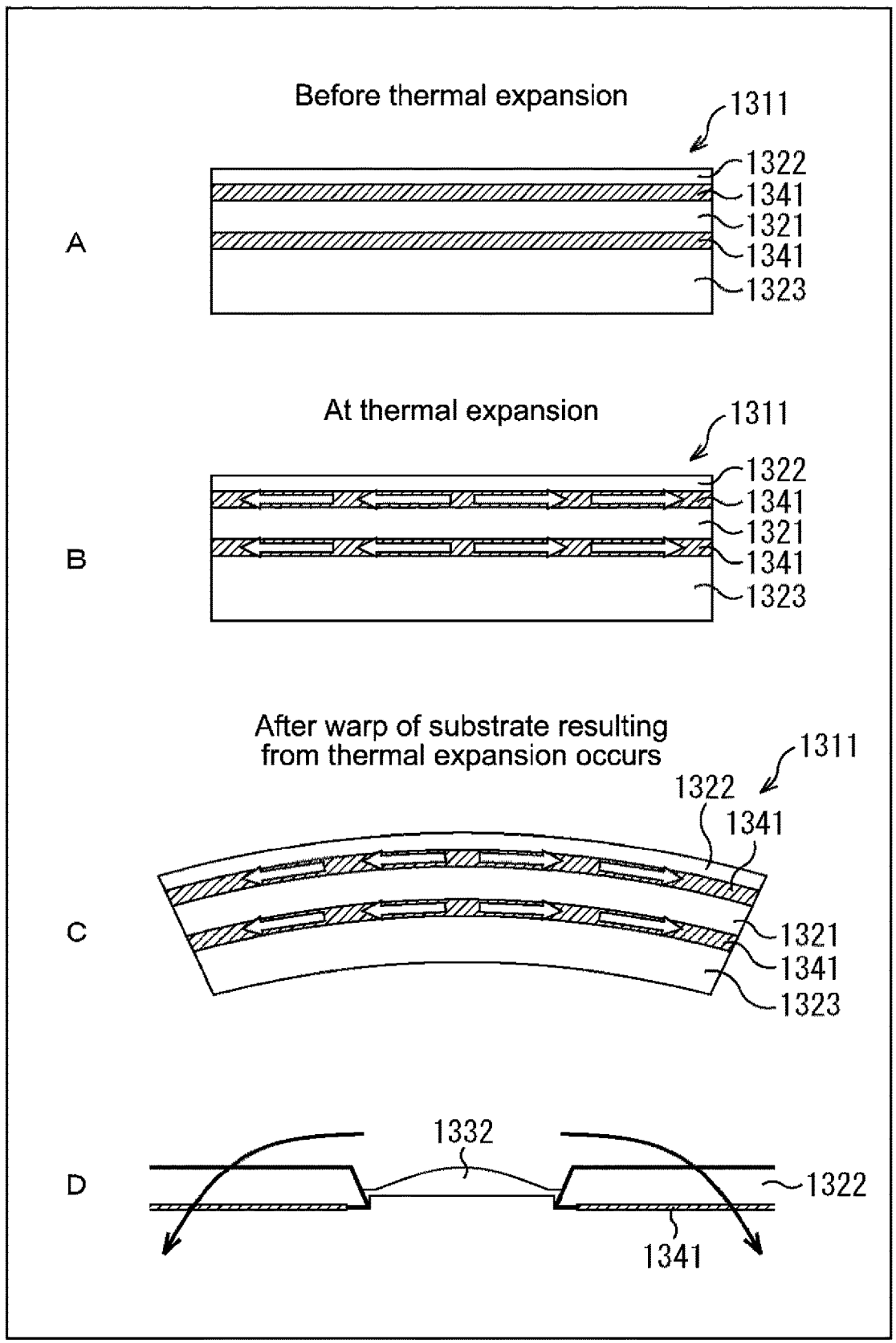
FIG. 52 is a diagram illustrating the effects of a stacked lens structure illustrated in FIG. 51.

A to C of FIG. 52 are diagrams schematically illustrating the stacked lens structure 1311 illustrated in FIG. 51.

When a user actually uses a camera module, the temperature in the housing of a camera increases with an increase in power consumption accompanied by the operation of the camera and the temperature of the camera module also increases. With this temperature rise, the resin 1341 disposed on the upper surface and the lower surface of the first substrate with lenses 1321 of the stacked lens structure 1311 illustrated in FIG. 51 is expanded thermally.

Even when the area and the thickness of the resin 1341 disposed on the upper surface and the lower surface of the first substrate with lenses 1321 are the same as illustrated in A of FIG. 48, unless the layer of the resin 1341 present in the entire contact surface of the three substrates with lenses 1321 to 1323 is disposed symmetrical about a line that passes through the central line (that is, the central point in the thickness direction of the stacked lens structure 1311) of the stacked lens structure 1311 and runs in the plane direction of the substrate, the effect of the force occurring due to thermal expansion of the resin 1341 disposed on the upper surface and the lower surface of the first substrate with lenses 1321 is not canceled completely as illustrated in C of FIG. 48. As a result, the stacked lens structure 1311 warps in a certain direction.

For example, when the two layers of the resin 1341 on the upper surface and the lower surface of the first substrate with lenses 1321 are disposed to be shifted in an upper direction than the central line in the thickness direction of the stacked lens structure 1311, if thermal expansion occurs in the two layers of the resin 1341, the stacked lens structure 1311 warps in an upward convex shape as illustrated in C of FIG. 52.

Further, in the example illustrated in FIG. 51, the cross-sectional shape of the through-hole of the second substrate with lenses 1322 having a smaller thickness among the second and third substrates with lenses 1322 and 1323 has a downward tapered shape that narrows toward the first substrate with lenses 1321. In such a shape, when the two layers of the resin 1341 on the upper surface and the lower surface of the first substrate with lenses 1321 is thermally expanded, force that warps the stacked lens structure 1311 in an upward convex shape acts on the stacked lens structure 1311. This force acts as force acting in the direction of separating the lenses and the substrate in the second substrate with lenses 1322 as illustrated in D of FIG. 52. With this action, the possibility that the lenses 1332 of the second substrate with lenses 1322 are lost or broken increases.

<Present Structure>

Figure 53:
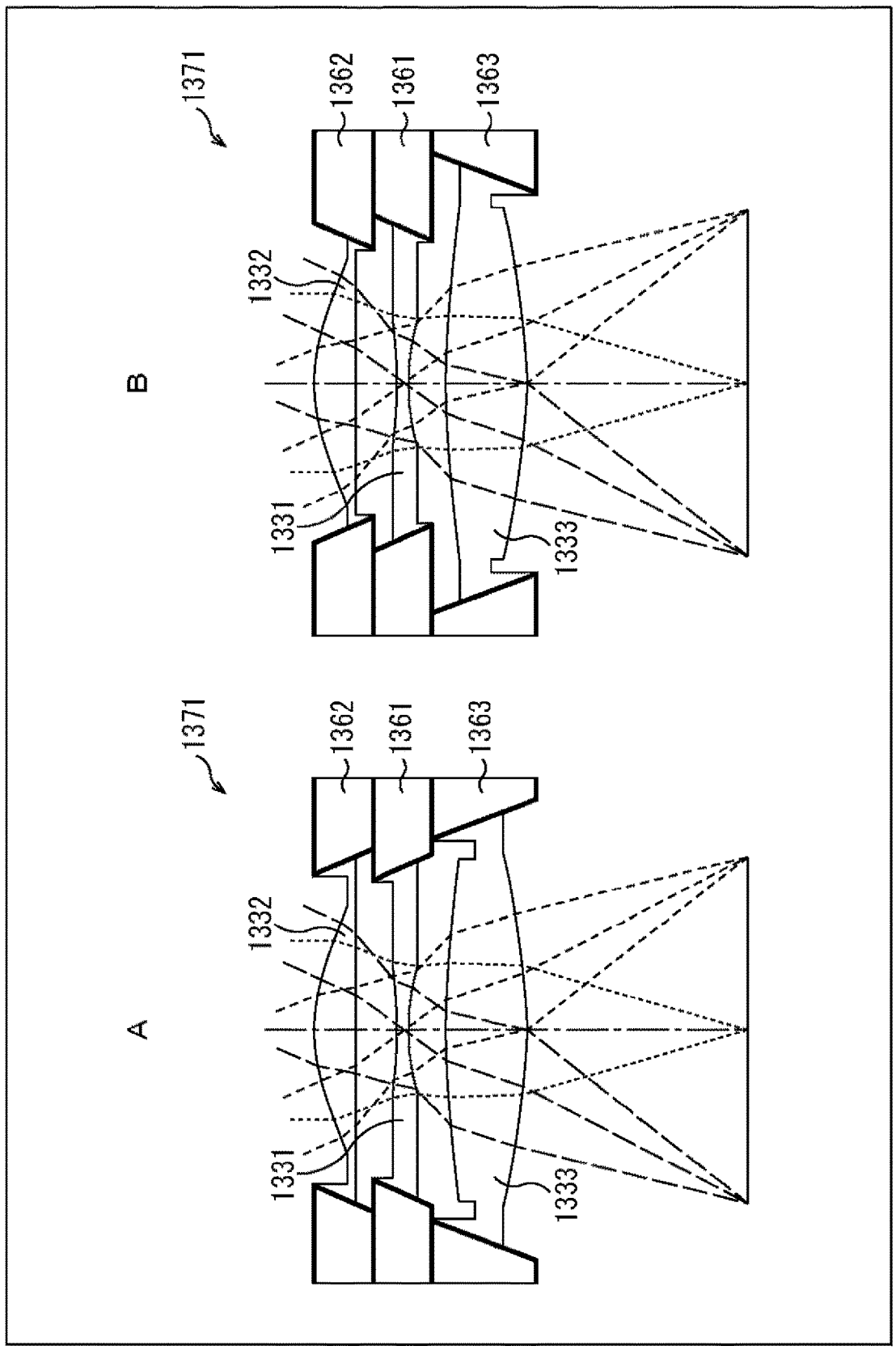
FIG. 53 is a cross-sectional view of a stacked lens structure which employs the present structure.

A and B of FIG. 53 are diagrams illustrating a stacked lens structure 1371 including three substrates with lenses 1361 to 1363, which employs the present structure.

A of FIG. 53 illustrates a structure corresponding to the stacked lens structure 1311 illustrated in FIG. 49, in which the cross-sectional shape of the through-hole has a so-called fan shape. On the other hand, B of FIG. 53 illustrates a structure corresponding to the stacked lens structure 1311 illustrated in FIG. 51, in which the cross-sectional shape of the through-hole has a so-called downward tapered shape.

Figure 54:
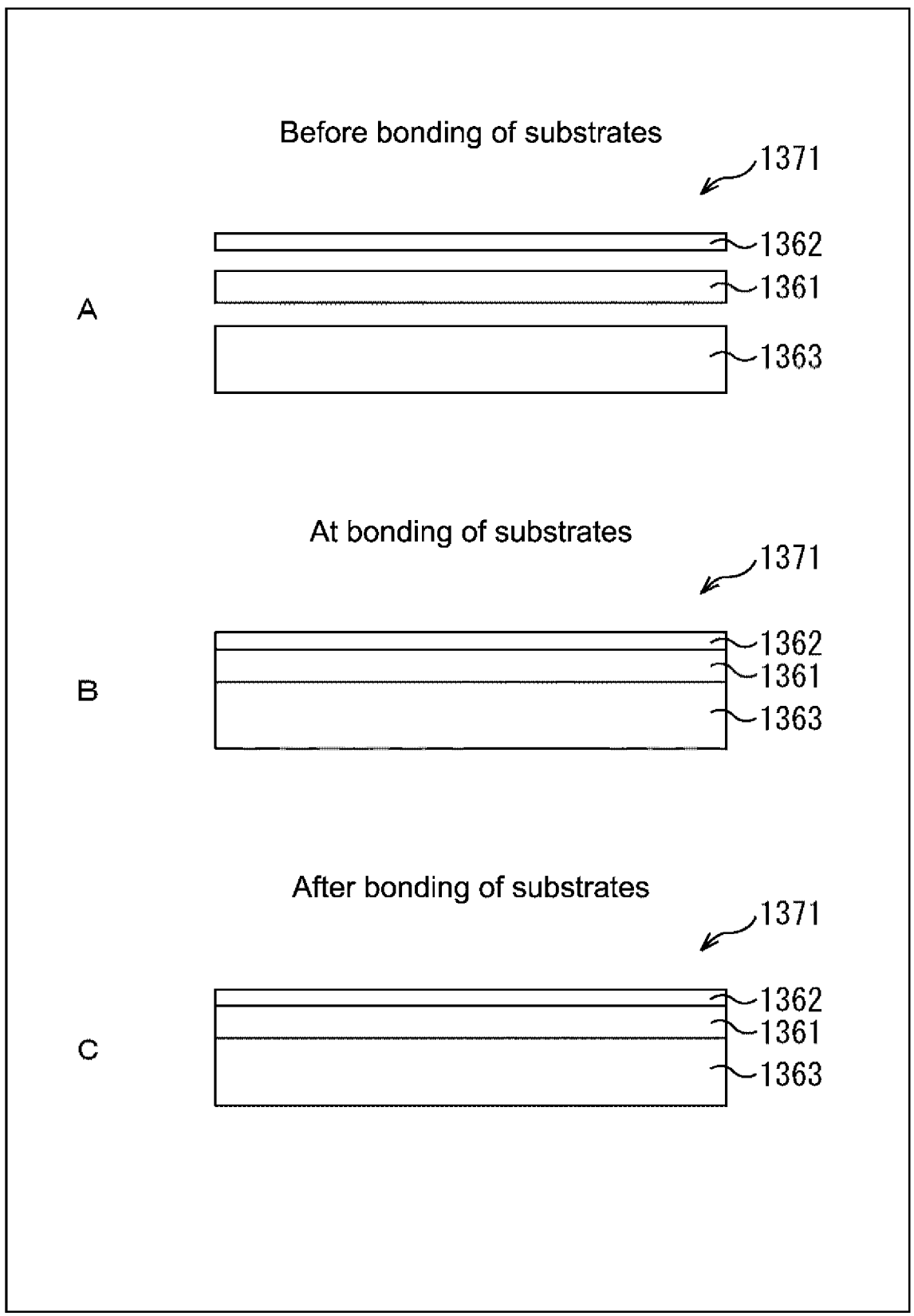
FIG. 54 is a diagram schematically illustrating the stacked lens structure illustrated in FIG. 53.

A to C of FIG. 54 are diagrams schematically illustrating the stacked lens structure 1371 illustrated in A and B of FIG. 53 in order to describe the effect of the present structure.

The stacked lens structure 1371 has a structure in which a second substrate with lenses 1362 is disposed on a first substrate with lenses 1361 at the center, and a third substrate with lenses 1363 is disposed under the first substrate with lenses 1361.

The substrate thickness and the lens thickness in the second substrate with lenses 1362 disposed on the top layer are different from those of the third substrate with lenses 1363 disposed on the bottom layer. More specifically, the lens thickness in the third substrate with lenses 1363 is larger than the lens thickness in the second substrate with lenses 1362. Thus, the substrate thickness in the third substrate with lenses 1363 is larger than the substrate thickness in the second substrate with lenses 1362.

In the stacked lens structure 1371 of the present structure, direct bonding of substrates is used as the means for fixing substrates with lenses. In other words, substrates with lenses to be fixed are subjected to a plasma activation process, and two substrates with lenses to be fixed are plasma-bonded. In still other words, a silicon oxide film is formed on the surfaces of the two substrates with lenses to be stacked, and a hydroxyl radical is combined with the film. After that, the two substrates with lenses are attached together and are heated and subjected to dehydration condensation. In this way, the two substrates with lenses are direct-bonded by a silicon-oxygen covalent bond.

Thus, in the stacked lens structure 1371 of the present structure, resin-based attachment is not used as the means for fixing substrates with lenses. Due to this, a resin for forming lenses or a resin for attaching substrates is not disposed between the substrates with lenses. Moreover, since a resin is not disposed on the upper surface or the lower surface of the substrate with lenses, thermal expansion or a curing shrinkage of the resin does not occur in the upper surface or the lower surface of the substrate with lenses.

Thus, in the stacked lens structure 1371 even when the second and third substrates with lenses 1362 and 1363 having different lens thicknesses and different substrate thicknesses are disposed on the upper and lower surfaces of the first substrates with lenses 1351, respectively, a warp of the substrate resulting from a curing shrinkage and a warp of the substrate resulting from thermal expansion do not occur unlike Comparative Structure Examples 1 to 8 described above.

That is, the present structure in which substrates with lenses are fixed by direct bonding provides an effect and an advantage that, even when substrates with lenses having different lens thicknesses and different substrate thicknesses are stacked on and under the present structure, it is possible to suppress a warp of the substrate more effectively than Comparative Structure Examples 1 to 8 described above.

<16. Various Modifications>

Other modifications of the respective embodiments described above will be described below.

<16.1 Cover Glass with Optical Diaphragms>

A cover glass is sometimes provided in an upper portion of the stacked lens structure 11 in order to protect the surface of the lens 21 of the stacked lens structure 11. In this case, the cover glass may have the function of an optical diaphragm.

Figure 55:
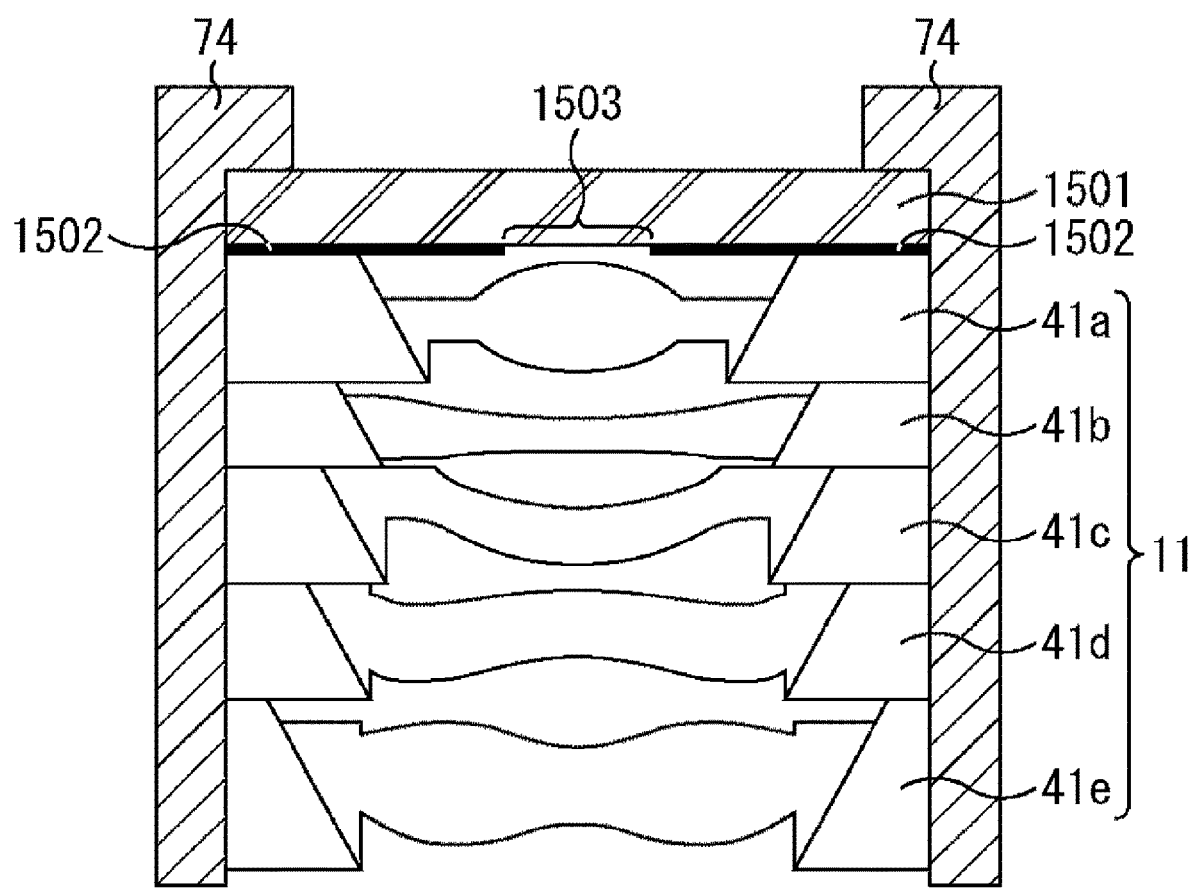
FIG. 55 is a diagram illustrating a first configuration example in which a diaphragm is added to a cover glass.

FIG. 55 is a diagram illustrating a first configuration example in which a cover glass has the function of an optical diaphragm.

In the first configuration example in which a cover glass has the function of an optical diaphragm as illustrated in FIG. 55, a cover glass 1501 is further stacked on the stacked lens structure 11. Moreover, a lens barrel 74 is disposed on an outer side of the stacked lens structure 11 and the cover glass 1501.

A light blocking film 1502 is formed on a surface (in the drawing, the lower surface of the cover glass 1501) of the cover glass 1501 close to the substrate with lenses 41a. Here, a predetermined range from the lens centers (optical centers) of the substrates with lenses 41a to 41e is configured as an opening 1503 in which the light blocking film 1502 is not formed, and the opening 1503 functions as an optical diaphragm. In this way, the diaphragm plate 51 formed in the camera module 1D or the like illustrated in FIG. 13, for example, is omitted.

Figure 56:
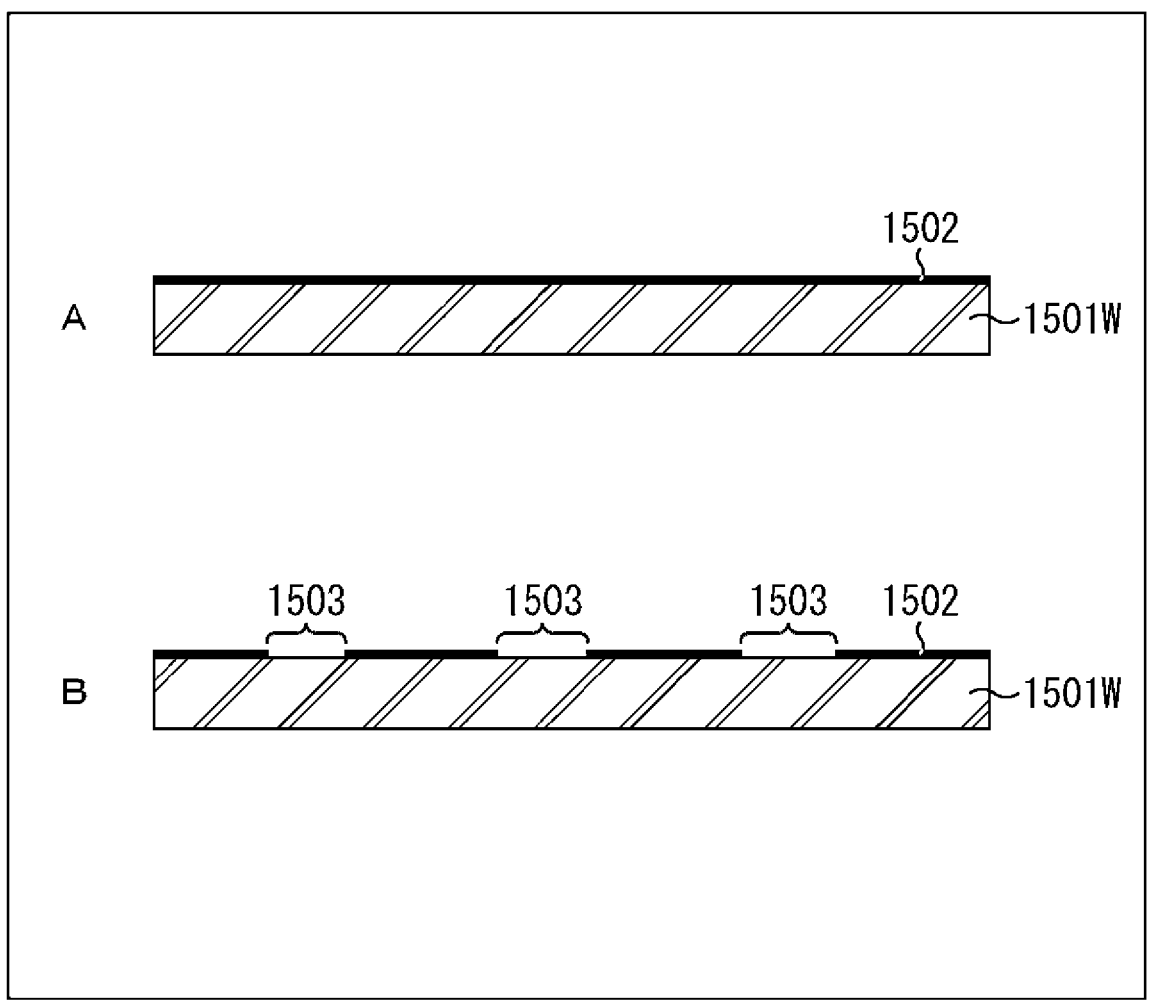
FIG. 56 is a diagram for describing a method of manufacturing the cover glass illustrated in FIG. 55.

A and B of FIG. 56 are diagrams for describing a method of manufacturing the cover glass 1501 in which the light blocking film 1502 is formed.

First, as illustrated in A of FIG. 56, a light absorbing material is deposited by spin coating to an entire area of one surface of the cover glass (glass substrate) 1501W in a wafer or panel form, for example, whereby the light blocking film 1502 is formed. As the light absorbing material which forms the light blocking film 1502, a resin having light absorbing properties, containing a carbon black pigment or a titanium black pigment, for example, is used.

Subsequently, a predetermined region of the light blocking film 1502 is removed by lithography or etching, whereby a plurality of openings 1503 is formed at a predetermined interval as illustrated in B of FIG. 56. The arrangement of the openings 1503 corresponds to the arrangement of the through-holes 83 of the support substrate 81W illustrated in A to G of FIG. 23 in one-to-one correspondence. As another example of the method of forming the light blocking film 1502 and the opening 1503, a method of jetting a light absorbing material that forms the light blocking film 1502 to an area excluding the opening 1503 by an ink-jet method can be used.

After the cover glass 1501W in the substrate state manufactured in this way is attached to a plurality of substrates with lenses 41W in the substrate state, the substrates with lenses 41W are divided by dicing or the like which uses a blade or a laser. In this way, the stacked lens structure 11 on which the cover glass 1501 having the diaphragm function is stacked, illustrated in FIG. 55 is obtained.

When the cover glass 1501 is formed as a step of semiconductor processes in this manner, it is possible to suppress the occurrence of dust-caused defects which may occur when the cover glass is formed by another assembling step.

According to the first configuration example illustrated in FIG. 55, since the optical diaphragm is formed by deposition, the light blocking film 1502 can be formed as thin as approximately 1 μm. Moreover, it is possible to suppress deterioration (light attenuation in a peripheral portion) of an optical performance resulting from shielded incident light due to the diaphragm mechanism having a predetermined thickness.

In the above-described example, although the cover glass 1501W was divided after the cover glass 1501W was bonded to the plurality of substrates with lenses 41W, the cover glass 1501W may be divided before the bonding. In other words, the bonding of the cover glass 1501 having the light blocking film 1502 and the five substrates with lenses 41a to 41e may be performed in the wafer level or the chip level.

The surface of the light blocking film 1502 may be roughened. In this case, since it is possible to suppress surface reflection on the surface of the cover glass 1501 having the light blocking film 1502 formed thereon and to increase the surface area of the light blocking film 1502, it is possible to improve the bonding strength between the cover glass 1501 and the substrate with lenses 41.

As an example of the method of roughening the surface of the light blocking film 1502, a method of roughening the surface by etching or the like after depositing a light absorbing material that forms the light blocking film 1502, a method of depositing alight absorbing material after roughening the surface of the cover glass 1501 before deposition of the light absorbing material, a method of forming an uneven surface after forming the film using a coagulating light absorbing material, and a method of forming an uneven surface after forming the film using a light absorbing material that contains a solid content may be used.

Moreover, an anti-reflection film may be formed between the light blocking film 1502 and the cover glass 1501.

Since the cover glass 1501 also serves as the support substrate of the diaphragm, it is possible to reduce the size of the camera module 1.

Figure 57:
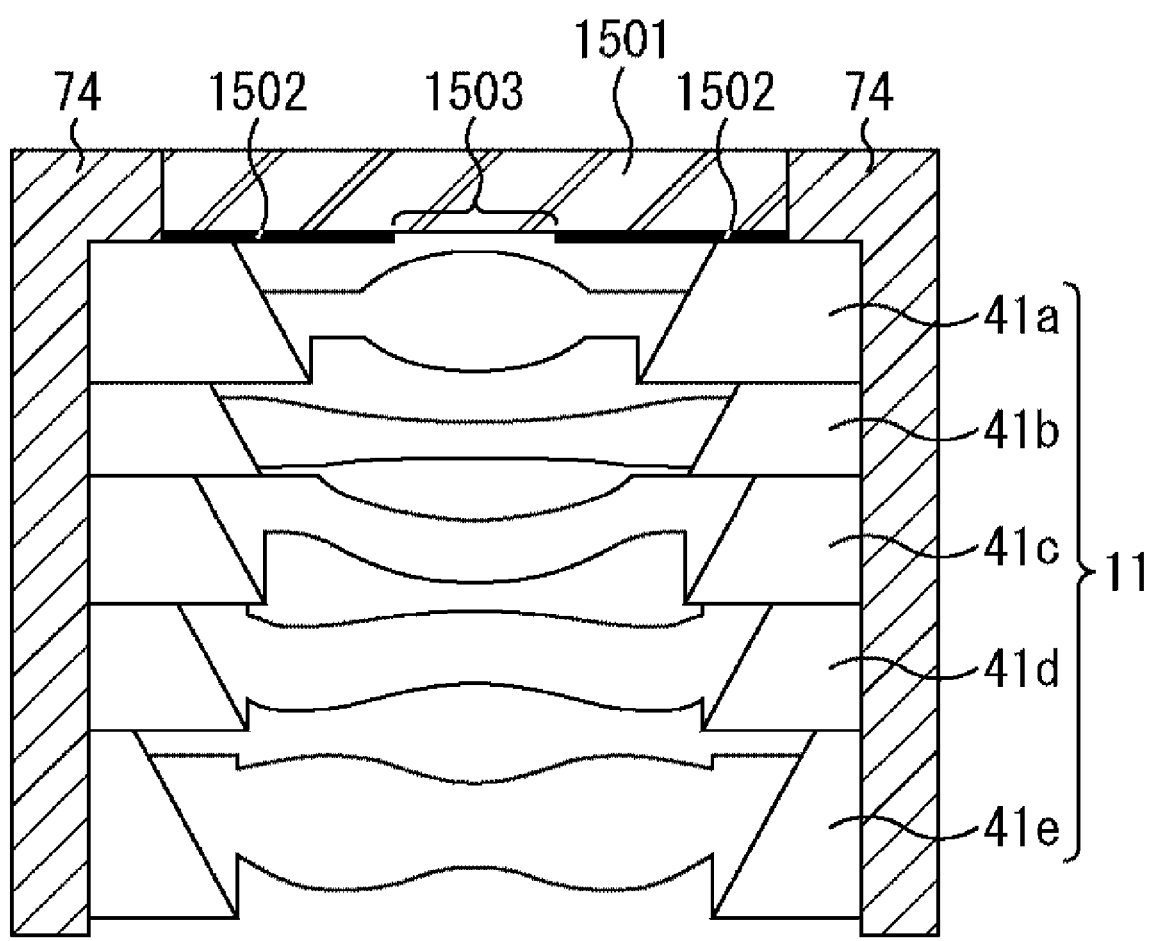
FIG. 57 is a diagram illustrating a second configuration example in which a diaphragm is added to a cover glass.

FIG. 57 is a diagram illustrating a second configuration example in which a cover glass has the function of an optical diaphragm.

In the second configuration example in which the cover glass has the function of an optical diaphragm, as illustrated in FIG. 57, the cover glass 1501 is disposed at the position of the opening of the lens barrel 74. The other configuration is the same as that of the first configuration example illustrated in FIG. 55.

Figure 58:
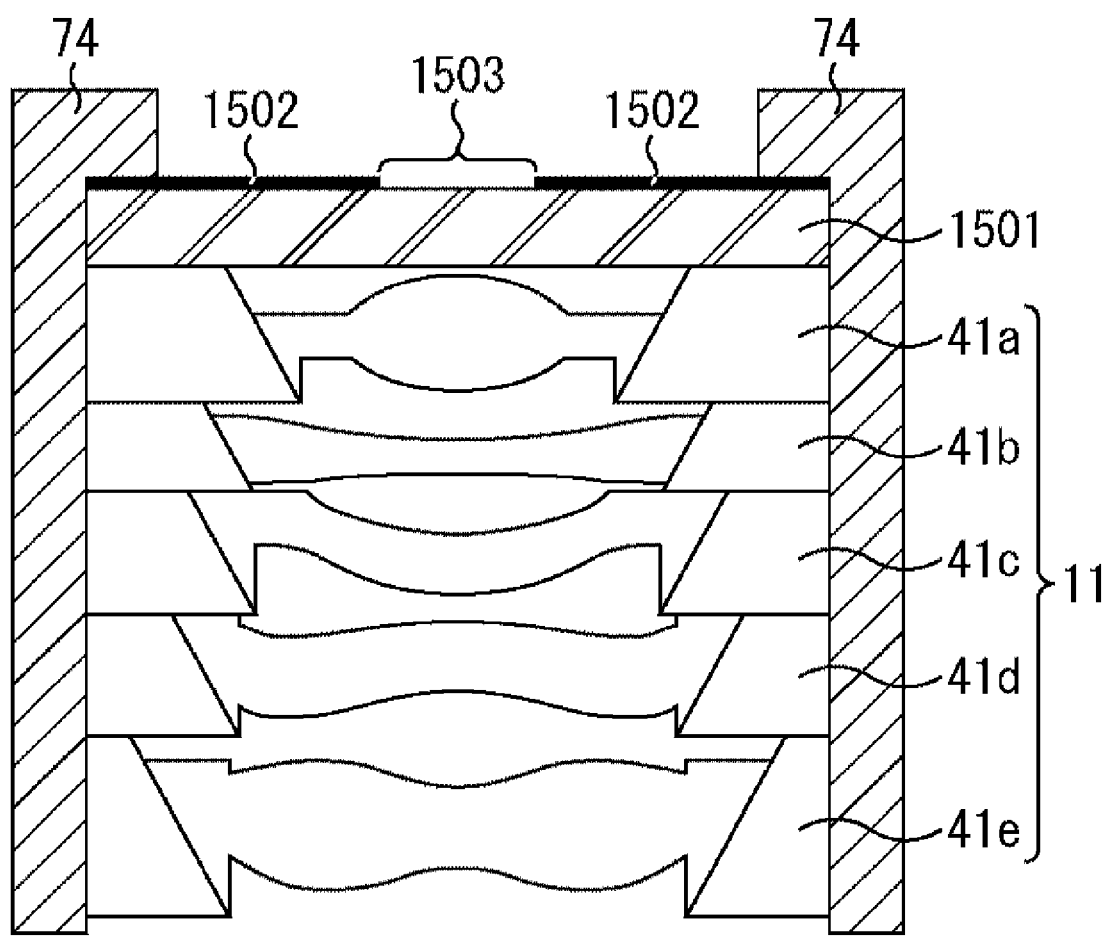
FIG. 58 is a diagram illustrating a third configuration example in which a diaphragm is added to a cover glass.

FIG. 58 is a diagram illustrating a third configuration example in which a cover glass has the function of an optical diaphragm.

In the third configuration example in which the cover glass has the function of an optical diaphragm as illustrated in FIG. 58, the light blocking film 1502 is formed on an upper surface of the cover glass 1501 (that is, on the opposite side from the substrate with lenses 41a). The other configuration is the same as that of the first configuration example illustrated in FIG. 55.

In the configuration in which the cover glass 1501 is disposed in the opening of the lens barrel 74 as illustrated in FIG. 57, the light blocking film 1502 may be formed on the upper surface of the cover glass 1501.

<16.2 Forming Diaphragm Using Through-Hole>

Next, an example in which the opening itself of the through-hole 83 of the substrate with lenses 41 is configured as a diaphragm mechanism instead of the diaphragm which uses the diaphragm plate 51 or the cover glass 1501 will be described.

Figure 59:
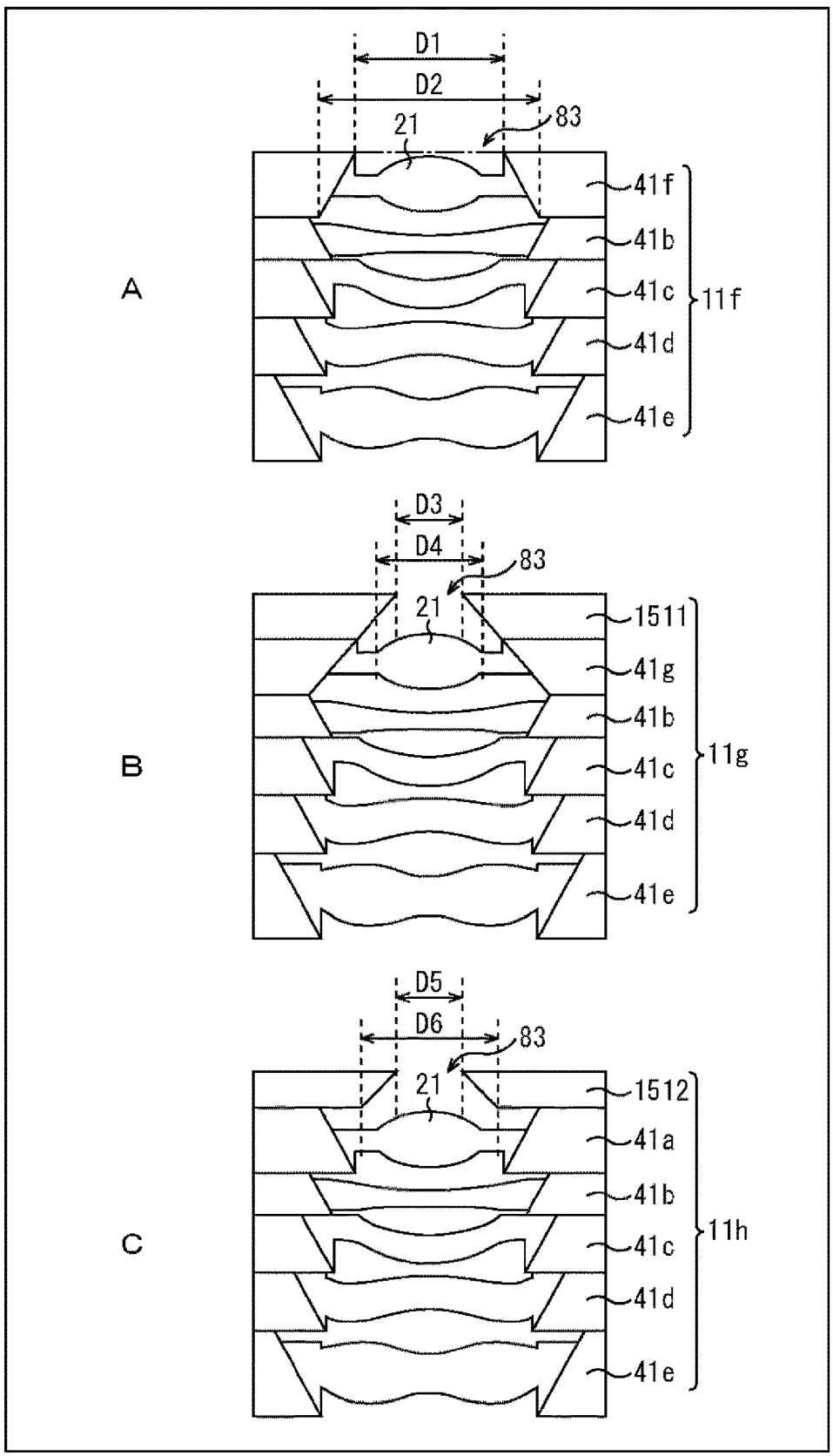
FIG. 59 is a diagram illustrating a configuration example in which an opening itself of a through-hole is configured as a diaphragm mechanism.

A of FIG. 59 is a diagram illustrating a first configuration example in which the opening itself of the through-hole 83 is configured as a diaphragm mechanism.

In description of A to C of FIG. 59, only different portions from those of the stacked lens structure 11 illustrated in FIG. 58 will be described, and the description of the same portions will be omitted appropriately. Moreover, in A to C of FIG. 59, reference numerals necessary for description only are added in order to prevent the drawings from becoming complex.

A stacked lens structure 11f illustrated in A of FIG. 59 has a configuration in which the substrate with lenses 41a located closest to the light incidence side and farthest from the light receiving element 12 among the five substrates with lenses 41a to 41e that form the stacked lens structure 11 illustrated in FIG. 58 is replaced with a substrate with lenses 41f.

When the substrate with lenses 41f is compared with the substrate with lenses 41a illustrated in FIG. 58, the hole diameter in the upper surface of the substrate with lenses 41a illustrated in FIG. 58 is larger than the hole diameter in the lower surface whereas the hole diameter D1 in the upper surface of the substrate with lenses 41f illustrated in A to C of FIG. 59 is smaller than the hole diameter D2 in the lower surface. That is, the cross-sectional shape of the through-hole 83 of the substrate with lenses 41f has a so-called fan shape.

A height position of the top surface of the lens 21 formed in the through-hole 83 of the substrate with lenses 41f is lower than the position of the top surface of the substrate with lenses 41f indicated by a one-dot chain line in A of FIG. 59.

In the stacked lens structure 11f, the hole diameter on the light incidence side of the through-hole 83 of the substrate with lenses 41f on the top layer among the plurality of substrates with lenses 41 is the smallest, whereby the portion (the portion corresponding to the hole diameter D1) having the smallest hole diameter, of the through-hole 83 functions as an optical diaphragm that limits the rays of incident light.

B of FIG. 59 is a diagram illustrating a second configuration example in which the opening itself of the through-hole 83 is configured as a diaphragm mechanism.

A stacked lens structure 11g illustrated in B of FIG. 59 has a configuration in which the substrate with lenses 41a on the top layer among the five substrates with lenses 41a to 41e that form the stacked lens structure 11 illustrated in FIG. 58 is replaced with a substrate with lenses 41g. Moreover, a substrate 1511 is further stacked on the substrate with lenses 41g.

The hole diameter of the through-hole 83 of the substrate with lenses 41g has such a fan shape that the hole diameter on the light incidence side is small similarly to the substrate with lenses 41f illustrated in A of FIG. 59. The substrate 1511 is a substrate that has the through-hole 83 but does not hold the lens 21. The cross-sectional shapes of the through-holes 83 of the substrate with lenses 41g and the substrate 1511 have a so-called fan shape.

Since the substrate 1511 is stacked on the substrate with lenses 41g, a planar region on which incident light is incident is further narrowed than the substrate with lenses 41f illustrated in A of FIG. 59. The hole diameter D3 in the upper surface of the substrate 1511 is smaller than the hole diameter D4 in the curved surface portion (the lens portion 91) of the lens 21. Due to this, the portion (the portion corresponding to the hole diameter D3) having the smallest hole diameter, of the through-hole 83 of the substrate 1511 functions as an optical diaphragm that limits the rays of incident light.

When the position of the optical diaphragm is located as far as possible from the lens 21 on the top surface of the stacked lens structure 11g, it is possible to separate the exit pupil position from the optical diaphragm and to suppress shading.

As illustrated in B of FIG. 59, when the substrate 1511 is further stacked on the five substrates with lenses 41b to 41e and 41g, the position of the optical diaphragm can be located as far as possible in the opposite direction from the light incidence direction from the lens 21 of the substrate with lenses 41g, which is the lens 21 on the top surface of the stacked lens structure 11g and the shading can be suppressed.

C of FIG. 59 is a diagram illustrating a third configuration example in which the opening itself of the through-hole 83 is configured as a diaphragm mechanism.

A stacked lens structure 11h illustrated in C of FIG. 59 has a configuration in which a substrate 1512 is further stacked on the substrate with lenses 41a among the five substrates with lenses 41a to 41f that form the stacked lens structure 11 illustrated in FIG. 58.

The substrate 1512 is a substrate that has the through-hole 83 but does not hold the lens 21. The through-hole 83 of the substrate 1512 has such a so-called fan shape that the hole diameter in the top surface of the substrate 1512 is different from that in the bottom surface, and the hole diameter D5 in the upper surface is smaller than the hole diameter D5 in the lower surface. Moreover, the hole diameter D5 in the top surface of the substrate 1512 is smaller than the diameter of the curved surface portion (the lens portion 91) of the lens 21. Due to this, the portion (the portion corresponding to the hole diameter D5) having the smallest hole diameter, of the through-hole 83 functions as an optical diaphragm that limits the rays of incident light. As another example of the shape of the substrate 1512, the substrate 1512 may have such a so-called downward tapered shape that the hole diameter D5 in the upper surface is larger than the hole diameter D5 in the lower surface.

In the examples of A to C of FIG. 59, the hole diameter of the through-hole 83 of the substrate with lenses 41f on the top surface (at the position farthest from the light receiving element 12) among the plurality of substrates with lenses 41 that form the stacked lens structure 11 is configured as the optical diaphragm or the hole diameter of the through-hole 83 of the substrate 1511 or 1512 disposed on the top layer is configured as the optical diaphragm.

However, the hole diameter of any one of the through-holes 83 of the substrates with lenses 41b to 41e on layers other than the top layer among the plurality of substrates with lenses 41 that form the stacked lens structure 11 may be configured similarly to the substrate with lenses 41f or the substrate 1511 or 1512 so as to function as the optical diaphragm.

However, from the perspective of suppressing the shading, as illustrated in A to C of FIG. 59, the substrate with lenses 41 having the function of the optical diaphragm may be disposed on the top layer or as close as possible to the top layer (at the position farthest from the light receiving element 12).

As described above, when a predetermined one substrate with lenses 41 among the plurality of substrates with lenses 41 that forms the stacked lens structure 11 or the substrate 1511 or 1512 that does not hold the lens 21 has the function of the optical diaphragm, it is possible to reduce the size of the stacked lens structure 11 and the camera module 1.

When the optical diaphragm is integrated with the substrate with lenses 41 that holds the lens 21, it is possible to improve the positional accuracy between the optical diaphragm and the curved lens surface closest to the diaphragm which affects the imaging performance and to improve the imaging performance.

<16.3 Wafer-Level Bonding Based on Metal Bonding>

In the above-described embodiment, although the substrates with lenses 41W in which the lens 21 is formed in the through-hole 83 are attached by plasma bonding, the substrates with lenses may be attached using metal bonding.

Figure 60:
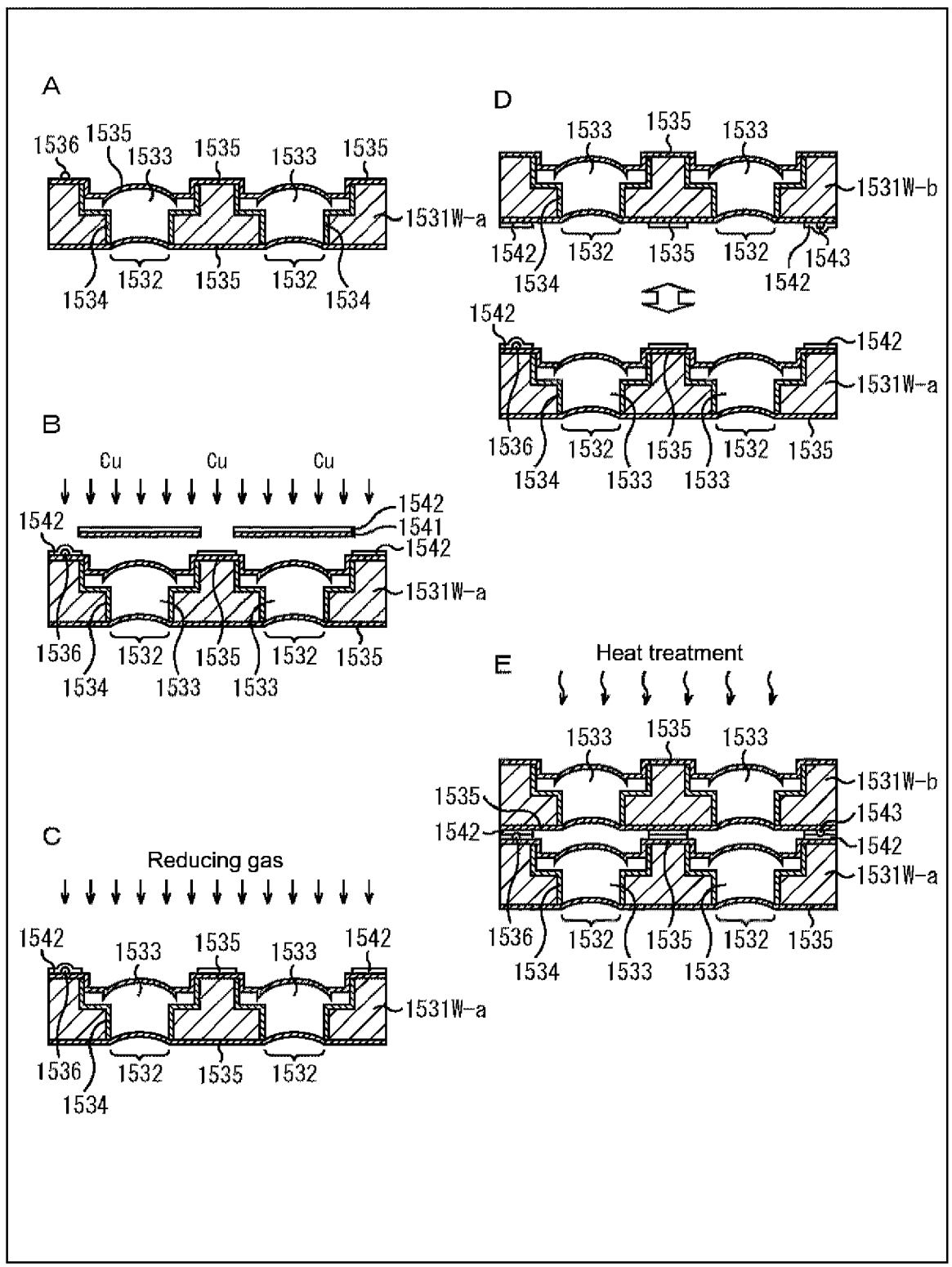
FIG. 60 is a diagram for describing wafer-level attachment using metal bonding.

A to E of FIG. 60 are diagrams for describing wafer-level attachment using metal bonding.

First, as illustrated in A of FIG. 60, a substrate with lenses 1531W-a in a substrate state in which a lens 1533 is formed in each of a plurality of through-holes 1532 is prepared, and an anti-reflection film 1535 is formed on an upper surface and a lower surface of the substrate with lenses 1531W-a.

The substrate with lenses 1531W corresponds to the substrate with lenses 41W in the substrate state described above. Moreover, the anti-reflection film 1535 corresponds to the upper surface layer 122 and the lower surface layer 123 described above.

Here, a state in which a foreign material 1536 is mixed into a portion of the anti-reflection film 1535 formed on the upper surface of the substrate with lenses 1531W-a will be considered. The upper surface of the substrate with lenses 1531W-a is a surface that is bonded to a substrate with lenses 1531W-b in the step of D of FIG. 60.

Subsequently, as illustrated in B of FIG. 60, a metal film 1542 is formed on the upper surface of the substrate with lenses 1531W-a, which is the surface bonded to the substrate with lenses 1531W-b. In this case, the portion of the through-hole 1532 in which the lens 1533 is formed is masked using a metal mask 1541 so that the metal film 1542 is not formed.

Cu which is often used for metal bonding, for example, can be used as a material of the metal film 1542. As a method of forming the metal film 1542, a PVD method such as a deposition method, a sputtering method, or an ion plating method which can forma film at a low temperature can be used.

Instead of Cu, Ni, Co, Mn, Al, Sn, In, Ag, Zn, or the like and an alloy of two or more of these materials may be used as the material of the metal film 1542. Moreover, materials other than the above-mentioned materials may be used as long as the materials are metal materials which are easily plastically deformed.

As a method of forming the metal film 1542, an ink-jet method which uses metal nanoparticles such as silver particles, for example, may be used instead of the method which uses a PVD method and a metal mask.

Subsequently, as illustrated in C of FIG. 60, as a pretreatment before bonding, an oxide film formed on the surface of the metal film 1542 when exposed to the air is removed using a reducing gas such as a formic acid, a hydrogen gas, or a hydrogen radical, whereby the surface of the metal film 1542 is cleaned.

As a method of cleaning the surface of the metal film 1542, Ar ions in the plasma may be radiated to the metal surface to physically remove the oxide film by sputtering instead of using the reducing gas.

With the same steps as those illustrated in A to C of FIG. 60, a substrate with lenses 1531W-b which is the other substrate with lenses 1531W in the substrate state to be bonded is prepared.

Subsequently, as illustrated in D of FIG. 60, the substrates with lenses 1531W-a and 1531W-b are disposed so that the bonding surfaces thereof face each other and alignment is performed. After that, when appropriate pressure is applied, the metal film 1542 of the substrate with lenses 1531W-a and the metal film 1542 of the substrate with lenses 1531W-b are bonded by metal bonding.

Here, it is assumed that a foreign material 1543 is also mixed into the lower surface of the substrate with lenses 1531W-b which is the bonding surface of the substrate with lenses 1531W-b, for example. However, even when the foreign materials 1536 and 1543 are present, since a metal material which is easily plastically deformed is used as the metal film 1542, the metal film 1542 is deformed and the substrates with lenses 1531W-a and 1531W-b are bonded together.

Finally, as illustrated in E of FIG. 60, a heat treatment is performed to accelerate atomic bonding and crystallization of metal to increase the bonding strength. This heat treatment step may be omitted.

In this way, the substrates with lenses 1531W in which the lens 1533 is formed in each of the plurality of through-holes 1532 can be bonded using metal bonding.

In order to realize bonding between the substrate with lenses 1531W-a and the metal film 1542, a film that serves as an adhesion layer may be formed between the substrate with lenses 1531W-a and the metal film 1542. In this case, the adhesion layer is formed on an upper side (outer side) of the anti-reflection film 1535 (that is, between the anti-reflection film 1535 and the metal film 1542). Ti, Ta, W, or the like, for example, can be used as the adhesion layer. Alternatively, a nitride or an oxide of Ti, Ta, W, or the like or a stacked structure of a nitride and an oxide may be used. The same can be applied to the bonding between the substrate with lenses 1531W-b and the metal film 1542.

Moreover, the material of the metal film 1542 formed on the substrate with lenses 1531W-a and the material of the metal film 1542 formed on the substrate with lenses 1531W-b may be different metal materials.

When the substrates with lenses 1531W in the substrate state are bonded by bonding metals which have a low Young's modulus and are easily plastically deformed, even when a foreign material is present on a bonding surface, the bonding surface is deformed by pressure and a necessary contact area is obtained.

When the plurality of substrates with lenses 1531W bonded using metal bonding is divided to obtain the stacked lens structure 11 and the stacked lens structure 11 is incorporated into the camera module 1, since the metal film 1542 has excellent sealing properties and can prevent light and moisture from entering the side surface, it is possible to manufacture the stacked lens structure 11 and the camera module 1 which have high reliability.

<16.4 Substrate with Lenses Using Highly-Doped Substrate>

Figure 61:
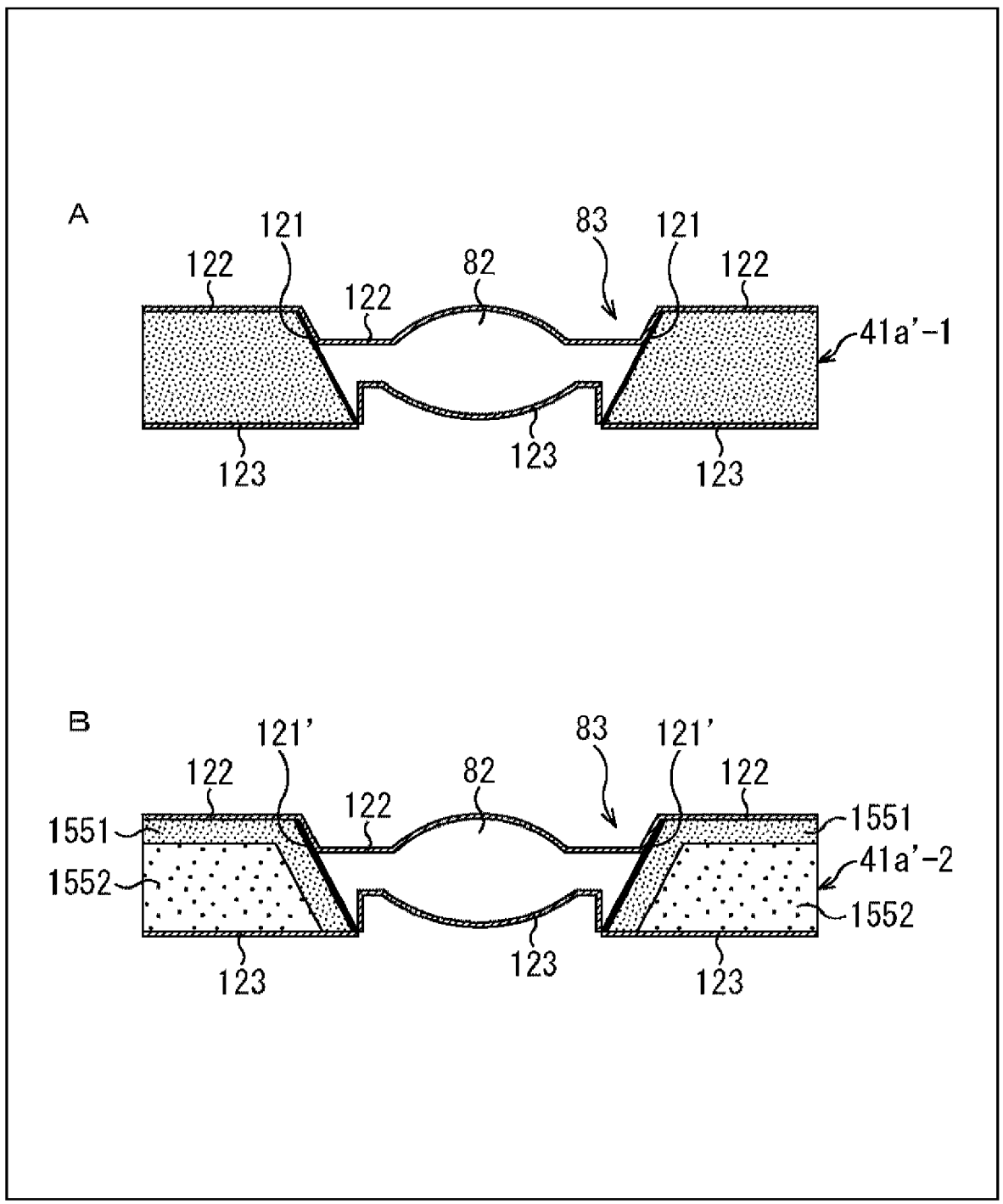
FIG. 61 is a diagram illustrating an example of a substrate with lenses which uses a highly-doped substrate.

A and B of FIG. 61 are cross-sectional views of substrates with lenses 41a'-1 and 41a'-2 which are modifications of the substrate with lenses 41a described above.

In description of the substrates with lenses 41a'-1 and 41a'-2 illustrated in A and B of FIG. 61, the description of the same portions as those of the substrate with lenses 41a described above will be omitted and the different portions only will be described.

The substrate with lenses 41a'-1 illustrated in A of FIG. 61 is a highly-doped substrate obtained by diffusing (ion-implanting) boron (B) of high concentration into a silicon substrate. An impurity concentration in the substrate with lenses 41a'-1 is approximately $1*10^{19}$ cm$^{-3}$, and the substrate with lenses 41a'-1 can efficiently absorb light in a wide range of wavelengths.

The other configuration of the substrate with lenses 41a'-1 is the same as the substrate with lenses 41a described above.

On the other hand, in the substrate with lenses 41a'-2 illustrated in B of FIG. 61, the region of the silicon substrate is divided into two regions (that is, a first region 1551 and a second region 1552) having different impurity concentrations.

The first region 1551 is formed to a predetermined depth (for example, approximately 3 μm) from the substrate surface on the light incidence side. The impurity concentration in the first region 1551 is as high as approximately $1*10^{16}$ cm$^{-3}$, for example. The impurity concentration in the second region 1552 is approximately $1*10^{10}$ cm$^{-3}$, for example, and is lower than the first concentration. The ions diffused (ion-implanted) into the first and second regions 1551 and 1552 are boron (B) similarly to the substrate with lenses 41a'-1, for example.

The impurity concentration in the first region 1551 on the light incidence side of the substrate with lenses 41a'-2 is approximately $1*10^{16}$ cm$^{-3}$ and is lower than the impurity concentration (for example, $1*10^{19}$ cm$^{-3}$) of the substrate with lenses 41a'-1. Thus, the thickness of a light blocking film 121' formed on a side wall of the through-hole 83 of the substrate with lenses 41a'-2 is larger than the thickness of a light blocking film 121 of the substrate with lenses 41a'-1 illustrated in A of FIG. 61. For example, if the thickness of the light blocking film 121 of the substrate with lenses 41a'-1 is 2 μm, the thickness of the light blocking film 121' of the substrate with lenses 41a'-2 is 5 μm.

The other configuration of the substrate with lenses 41a'-2 is the same as the substrate with lenses 41a described above.

As described above, when a highly-doped substrate is used as the substrates with lenses 41a'-1 and 41a'-2, since the substrate itself can absorb light which has passed through the light blocking film 121 and the upper surface layer 122 and reached the substrate, it is possible to suppress reflection of light. The doping amount can be appropriately set depending on the amount of light reaching the substrate and the thickness of the light blocking film 121 and the upper surface layer 122 since it is only necessary to absorb light having reached the substrate.

Moreover, since a silicon substrate which is easy to handle is used as the substrates with lenses 41a'-1 and 41a'-2, it is easy to handle the substrates with lenses. Since the substrate itself can absorb light which has passed through the light blocking film 121 and the upper surface layer 122 and reached the substrate, it is possible to decrease the thicknesses of the light blocking film 121, the upper surface layer 122, and the stacked substrate itself and to simplify the structure.

In the substrates with lenses 41a'-1 and 41a'-2, the ion doped into the silicon substrate is not limited to boron (B). Instead of this, phosphor (P), arsenic (As), antimony (Sb), or the like may be used, for example. Further, an arbitrary element which can have a band structure that increases the amount of absorbed light may be used.

The other substrates with lenses 41b to 41e that form the stacked lens structure 11 may have the same configuration as the substrates with lenses 41a'-1 and 41a'-2.

<Manufacturing Method>

A method of manufacturing the substrate with lenses 41a'-1 illustrated in A of FIG. 61 will be described with reference to A to D of FIG. 62.

Figure 62:
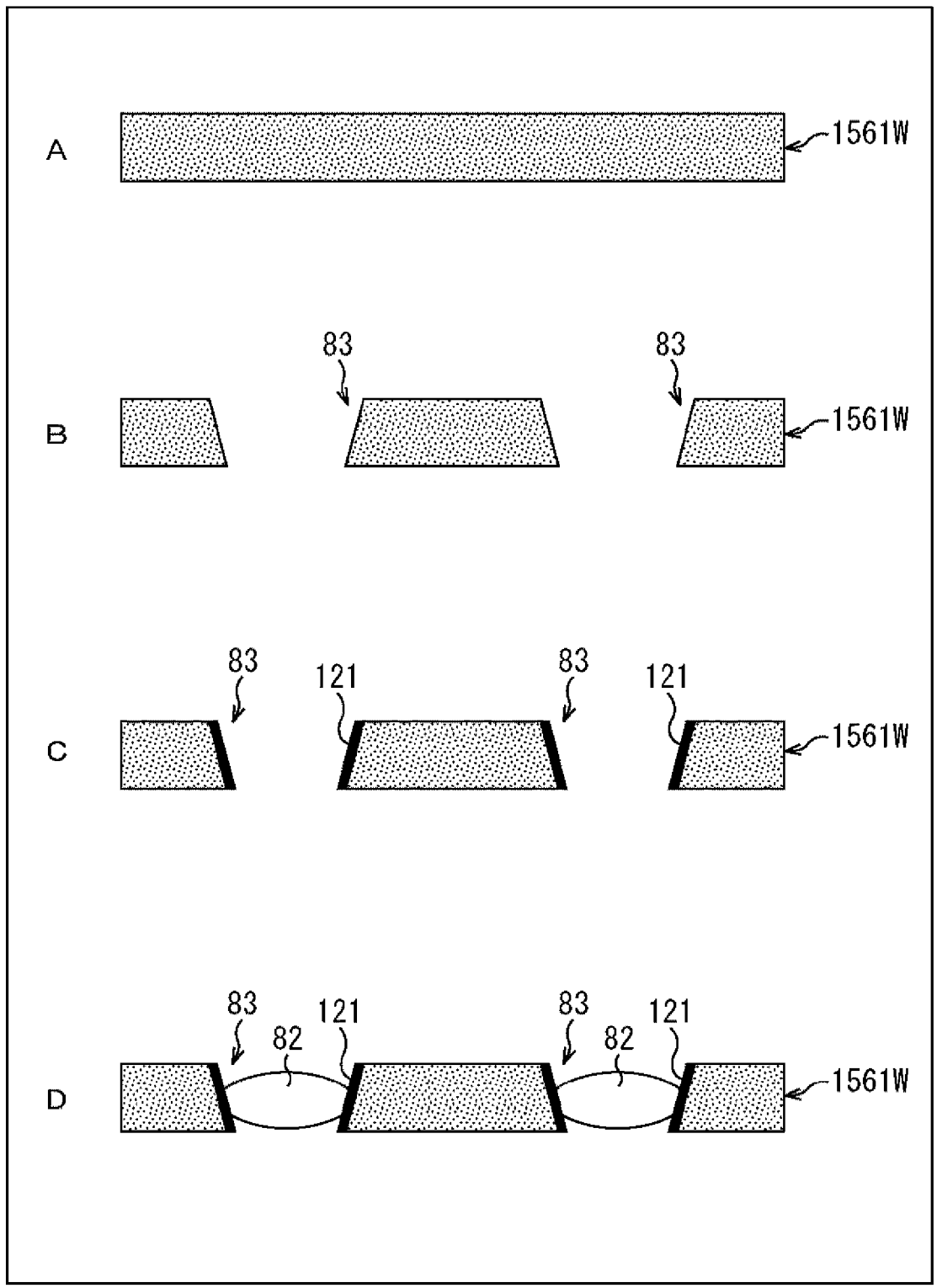
FIG. 62 is a diagram for describing a method of manufacturing the substrate with lenses illustrated in A of FIG. 61.

First, as illustrated in A of FIG. 62, a highly-doped substrate 1561W in a substrate state in which boron (B) of a high concentration is diffused (ion-implanted) is prepared. The impurity concentration of the highly-doped substrate 1561W is approximately $1*10^{19}$ cm$^{-3}$, for example.

Subsequently, as illustrated in B of FIG. 62, through-holes 83 are formed by etching at predetermined positions of the highly-doped substrate 1561W. In A to D of FIG. 62, although only two through-holes 83 are illustrated due to limitation of the drawing surface, a number of through-holes 83 are actually formed in the plane direction of the highly-doped substrate 1561W.

Subsequently, as illustrated in C of FIG. 62, a light blocking film 121 is formed on a sidewall of the through-hole 83 by depositing a black resist material by spray coating.

Subsequently, as illustrated in D of FIG. 62, a lens resin portion 82 including the lens 21 is formed on the inner side of the through-hole 83 by pressure molding using the upper mold 201 and the lower mold 181 described with reference to A to G of FIG. 23.

After that, although not illustrated in the drawings, an upper surface layer 122 is formed on the upper surface of the highly-doped substrate 1561W and the lens resin portion 82, and a lower surface layer 123 is formed on the lower surface of the highly doped substrate 1561W and the lens resin portion 82, and the structure is divided. In this way, the substrate with lenses 41a'-1 illustrated in A of FIG. 61 is obtained.

Next, a method of manufacturing the substrate with lenses 41a'-2 illustrated in B of FIG. 61 will be described with reference to A to F of FIG. 63.

Figure 63:
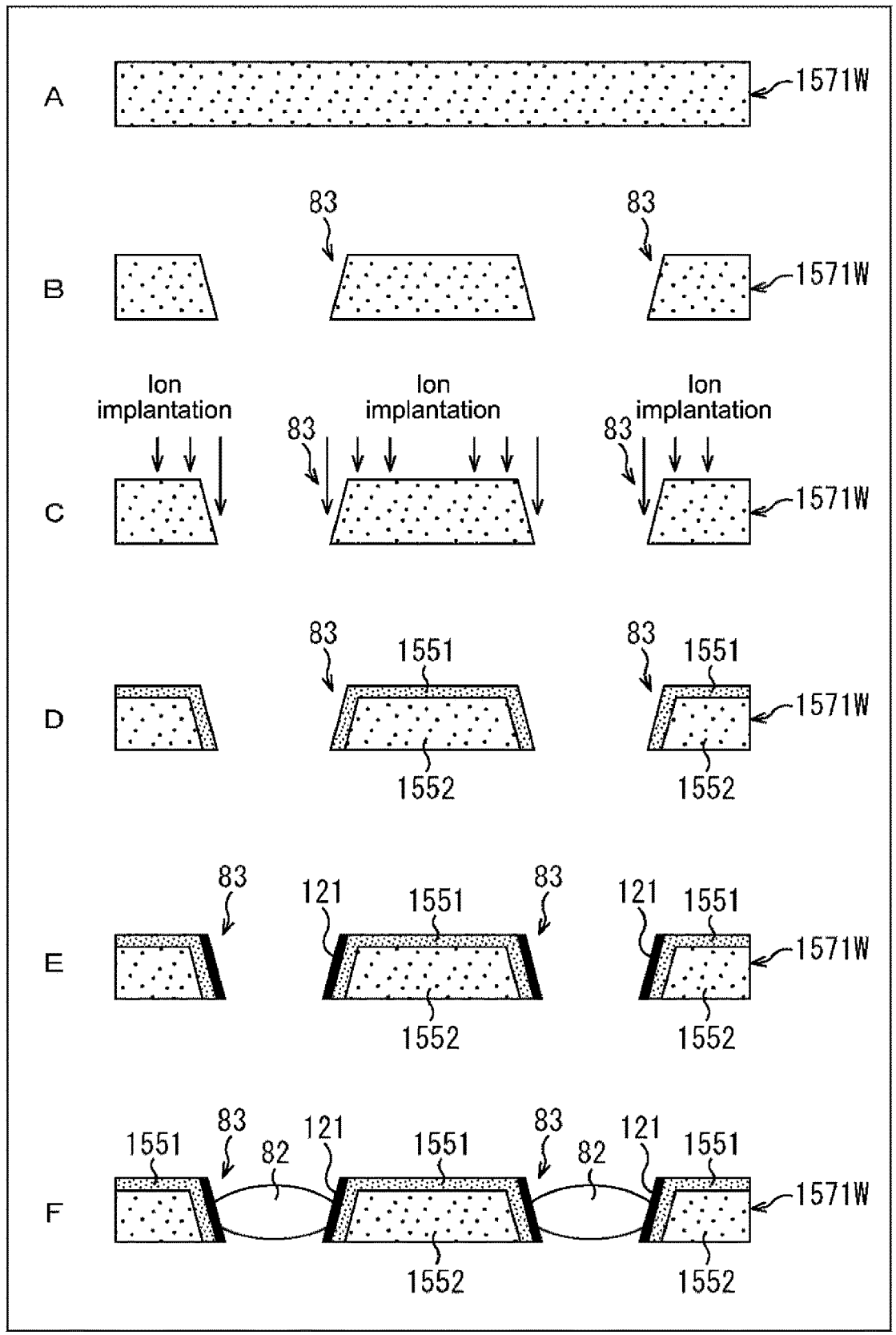
FIG. 63 is a diagram for describing a method of manufacturing the substrate with lenses illustrated in B of FIG. 61.

First, as illustrated in A of FIG. 63, a doped substrate 1571W in a substrate state in which boron (B) of a predetermined concentration is diffused (ion-implanted) is prepared. The impurity concentration of the doped substrate 1571W is approximately $1*10^{10}$ cm$^{-3}$, for example.

Subsequently, as illustrated in B of FIG. 63, through-holes 83 are formed by etching at predetermined positions of the doped substrate 1571W. In A to F of FIG. 63, although only two through-holes 83 are illustrated due to limitation of the drawing surface, a number of through-holes 83 are actually formed in the plane direction of the doped substrate 1571W.

Subsequently, as illustrated in C of FIG. 63, after boron (B) is ion-implanted up to a predetermined depth (for example, approximately 3 μm) from the substrate surface on the light incidence side of the doped substrate 1571W, a heat treatment is performed at 900° C. As a result, as illustrated in D of FIG. 63, a first region 1551 having a high impurity concentration and a second region 1552 having a lower impurity concentration are formed.

Subsequently, as illustrated in E of FIG. 63, a light blocking film 121 is formed on a sidewall of the through-hole 83 by depositing a black resist material by spray coating.

Subsequently, as illustrated in F of FIG. 63, a lens resin portion 82 including the lens 21 is formed on the inner side of the through-hole 83 by pressure molding using the upper mold 201 and the lower mold 181 described with reference to A to G of FIG. 23.

After that, although not illustrated in the drawings, an upper surface layer 122 is formed on the upper surface of the doped substrate 1571W and the lens resin portion 82, and a lower surface layer 123 is formed on the lower surface of the doped substrate 1571W and the lens resin portion 82, and the structure is divided. In this way, the substrate with lenses 41a'-2 illustrated in B of FIG. 61 is obtained.

The respective substrates with lenses 41a to 41e that form the stacked lens structure 11 illustrated in A and B of FIG. 1 may be configured as such a highly-doped substrate as illustrated in A and B of FIG. 61. In this way, it is possible to increase the amount of light absorbed by the substrate itself.

<17. Pixel Arrangement of Light Receiving Element and Structure and Use of Diaphragm Plate>

Next, a pixel arrangement of the light receiving element 12 included in the camera module 1 illustrated in A to F of FIG. 10 and A to D of FIG. 11 and the configuration of the diaphragm plate 51 will be described further.

Figure 64:
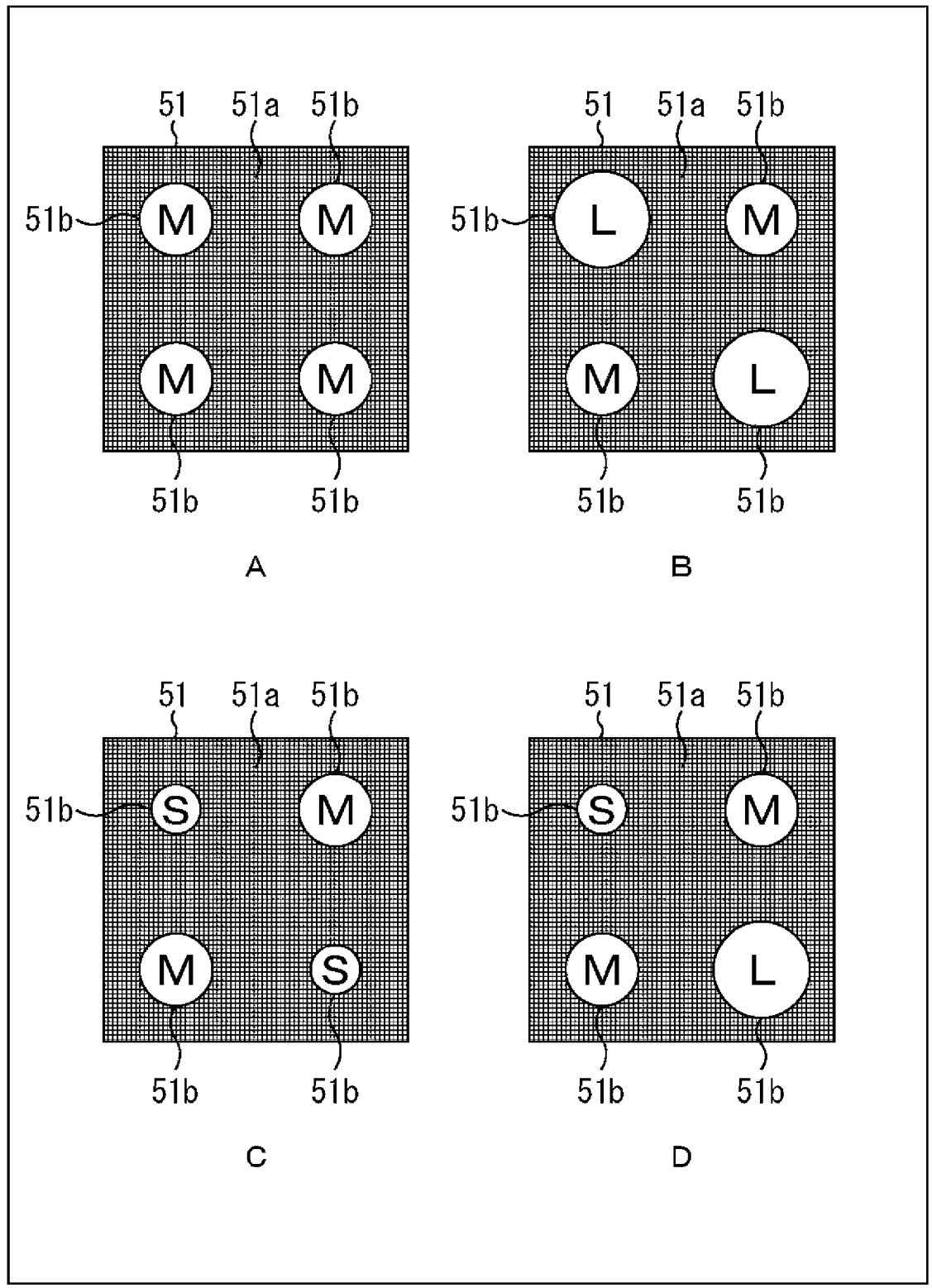
FIG. 64 is a diagram illustrating a planar shape of a diaphragm plate included in a camera module.

A to D of FIG. 64 are diagrams illustrating examples of the planar shape of the diaphragm plate 51 included in the camera module 1 illustrated in A to F of FIG. 10 and A to D of FIG. 11.

The diaphragm plate 51 includes a shielding region 51a that absorbs or reflects light to prevent entrance of the light and an opening region 51b that transmits light.

In the four optical units 13 included in the camera module 1 illustrated in A to F of FIG. 10 and A to D of FIG. 11, the opening regions 51b of the diaphragm plates 51 thereof may have the same opening diameter and may have different opening diameters as illustrated in A to D of FIG. 64. In A to D of FIG. 64, symbols "L", "M", and "S" indicate that the opening diameter of the opening region 51b is "Large", "Middle", and "Small", respectively.

In the diaphragm plate 51 illustrated in A of FIG. 64, the four opening regions 51b have the same opening diameter.

In the diaphragm plate 51 illustrated in B of FIG. 64, two opening regions 51b are standard diaphragm openings having a "Middle" opening diameter. For example, as illustrated in FIG. 13, the diaphragm plate 51 may slightly overlap the lens 21 of the substrate with lenses 41. That is, the opening region 51b of the diaphragm plate 51 may be slightly smaller than the diameter of the lens 21. The remaining two opening regions 51b of the diaphragm plate 51 illustrated in B of FIG. 64 have a "Large" opening diameter. That is, the remaining two opening regions 51b have a larger opening diameter than the "Middle" opening diameter. These large opening regions 51b have an effect of allowing a larger amount of light to enter the light receiving element 12 included in the camera module 1 when the illuminance of a subject is low, for example.

In the diaphragm plate 51 illustrated in C of FIG. 64, two opening regions 51b are standard diaphragm openings having a "Middle" opening diameter. The remaining two opening regions 51b of the diaphragm plate 51 illustrated in C of FIG. 64 have a "Small" opening diameter. That is, the remaining two opening regions 51b have a smaller opening diameter than the "Middle" opening diameter. These small opening regions 51b have an effect of decreasing the amount of light entering the light receiving element 12 when the illuminance of a subject is high, and the amount of charge generated in a photoelectric conversion unit included in the light receiving element 12 may exceed a saturation charge amount of the photoelectric conversion unit if light entering from these opening regions is incident on the light receiving element 12 included in the camera module 1 through the opening regions 51b having the "Middle" opening diameter, for example.

In the diaphragm plate 51 illustrated in D of FIG. 64, two opening regions 51b are standard diaphragm openings having a "Middle" opening diameter. One of the remaining two opening regions 51b of the diaphragm plate 51 illustrated in D of FIG. 64 has the "Large" opening diameter and the other has the "Small" opening diameter. These opening regions 51b have the same effect as the opening regions 51b having the "Large" and "Small" opening diameters described with reference to B and C of FIG. 64.

Figure 65:
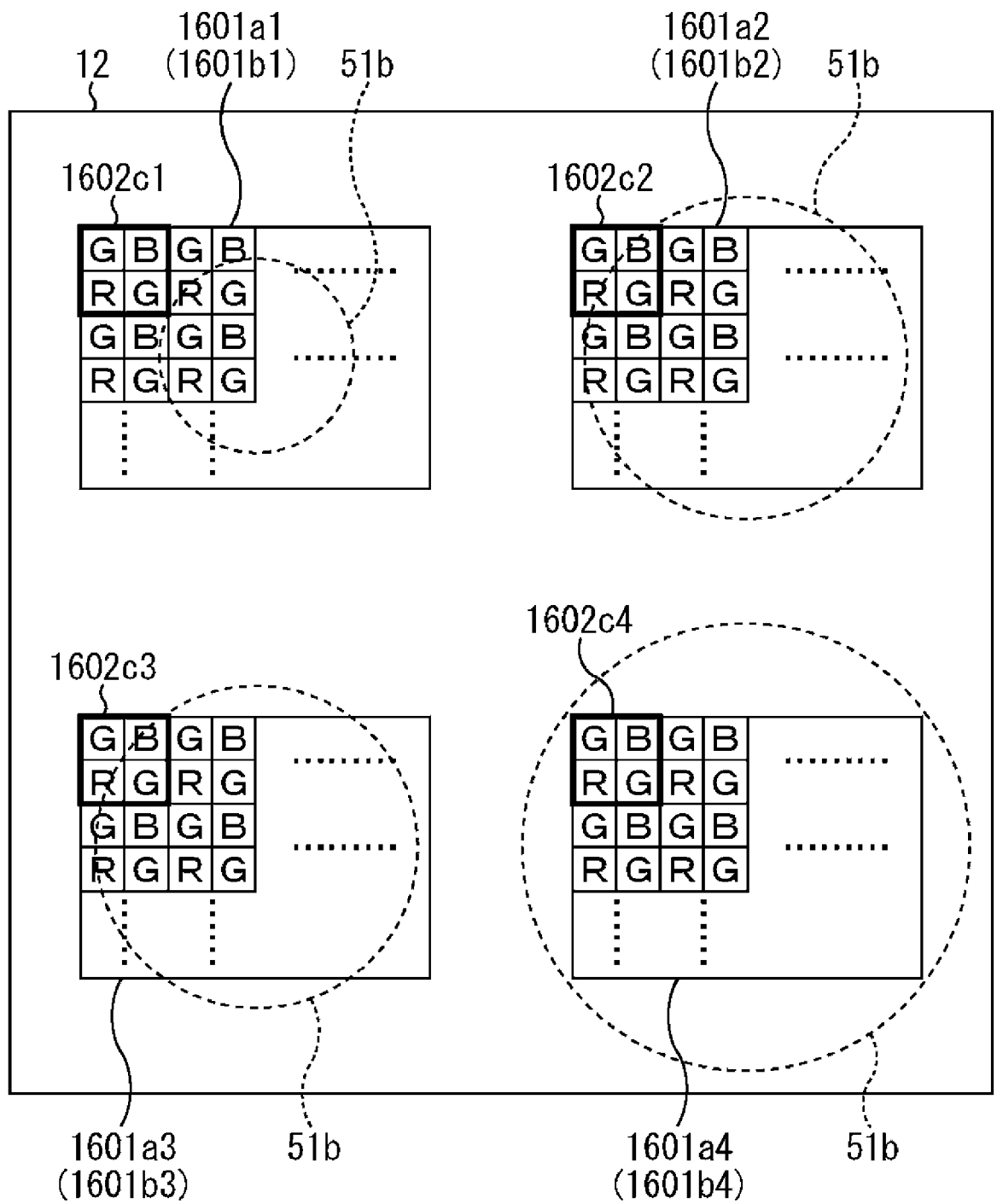
FIG. 65 is a diagram for describing a configuration of a light receiving area of a camera module.

FIG. 65 illustrates a configuration of a light receiving area of the camera module 1 illustrated in A to F of FIG. 10 and A to D of FIG. 11.

As illustrated in FIG. 65, the camera module 1 includes four optical units 13 (not illustrated). Moreover, light components incident on these four optical units 13 are received by light receiving units corresponding to the respective optical units 13. Thus, the light receiving element 12 of the camera module 1 illustrated in A to F of FIG. 10 and A to D of FIG. 11 includes four light receiving areas 1601a1 to 1601a4.

As another embodiment related to the light receiving unit, the light receiving element 12 may include one light receiving area 1601a that receives light incident on one optical unit 13 included in the camera module 1, and the camera module 1 includes a number of light receiving elements 12 corresponding to the number of optical units 13 included in the camera module 1. For example, in the case of the camera module 1 illustrated in A to F of FIG. 10 and A to D of FIG. 11, the camera module 1 includes four optical units 13.

The light receiving areas 1601a1 to 1601a4 include pixel arrays 1601b1 to 1601b4, respectively, in which pixels for receiving light are arranged in an array form.

In FIG. 65, for the sake of simplicity, a circuit for driving the pixels included in the pixel array and a circuit for reading pixels are not illustrated, and the light receiving areas 1601a1 to 1601a4 are illustrated in the same size as the pixel arrays 1601b1 to 1601b4.

The pixel arrays 1601b1 to 1601b4 included in the light receiving areas 1601a1 to 1601a4 include pixel repetition units 1602c1 to 1602c4 made up of a plurality of pixels. These repetition units 1602c1 to 1602c4 are arranged in a plurality of array forms in both vertical and horizontal directions whereby the pixel arrays 1601b1 to 1601b4 are formed.

The optical units 13 are disposed on the four light receiving areas 1601a1 to 1601a4 included in the light receiving element 12. The four optical units 13 include the diaphragm plate 51 as a part thereof. In FIG. 65, the opening region 51b of the diaphragm plate 51 illustrated in D of FIG. 64 is depicted by a broken line as an example of the opening diameter of the four opening regions 51b of the diaphragm plate 51.

In the field of image signal processing, a super-resolution technique is known as a technique of obtaining images having a high resolution by applying the super resolution technique to an original image. An example thereof is disclosed in JP 2015-102794 A, for example.

The camera module 1 illustrated in A to F of FIG. 10 and A to D of FIG. 11 may have the structures illustrated in FIGS. 13, 16, 17, 34, 35, 37, and 55 as a cross-sectional structure thereof.

In these camera modules 1, the optical axes of the two optical units 13 each disposed in each of the vertical and horizontal directions of the surface of the module 1 serving as the light incidence surface extend in the same direction. Due to this, it is possible to obtain a plurality of non-identical images using different light receiving areas with the optical axes extending in the same direction.

The camera module 1 having such a structure is suitable for obtaining an image having a higher resolution based on the obtained plurality of original images than that of one image obtained from one optical unit 13 by applying the super-resolution technique to these images.

FIGS. 66 to 69 illustrate configuration examples of pixels in the light receiving area of the camera module 1 illustrated in A to F of FIG. 10 and A to D of FIG. 11.

In FIGS. 66 to 69, G pixels indicate pixels that receive light in the green wavelength, R pixels indicate pixels that receive light in the red wavelength, and B pixels indicate pixels that receive light in the blue wavelength. C pixels indicate pixels that receive light in the entire wavelength region of visible light.

Figure 66:
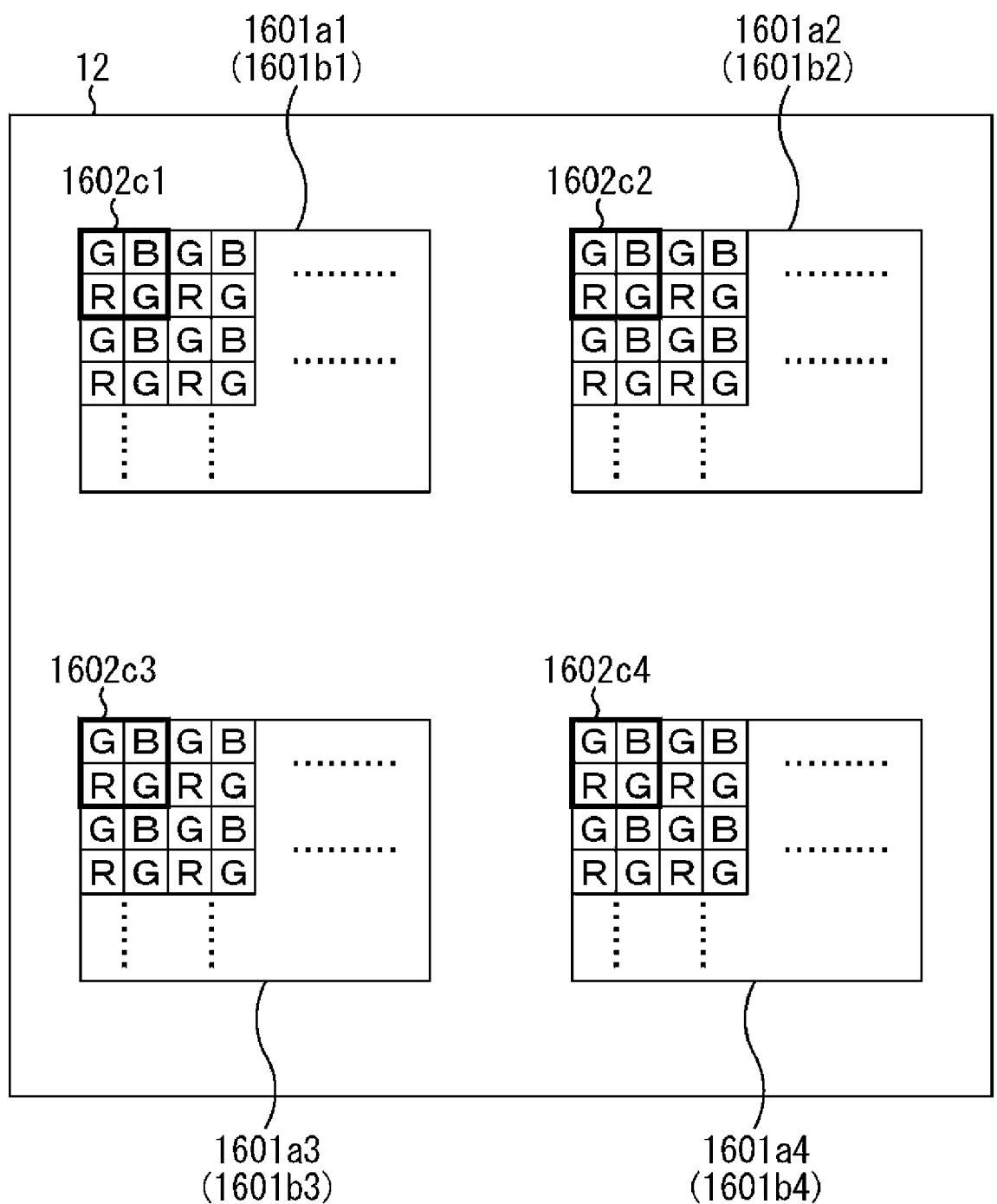
FIG. 66 is a diagram illustrating a first example of a pixel arrangement in a light receiving area of a camera module.

FIG. 66 illustrates a first example of a pixel arrangement of the four pixel arrays 1601*b*1 to 1601*b*4 included in the light receiving element 12 of the camera module 1.

The repetition units 1602*c*1 to 1602*c*4 are repeatedly arranged in row and column directions in the four pixel arrays 1601*b*1 to 1601*b*4, respectively. The repetition units 1602*c*1 to 1602*c*4 illustrated in FIG. 66 are made up of R, G, B, and G pixels, respectively.

The pixel arrangement illustrated in FIG. 66 has an effect that the pixel arrangement is suitable for splitting incident light from a subject irradiated with visible light into red (R), green (G), and blue (B) light components to obtain an image made up of the three colors R, G, and B.

Figure 67:
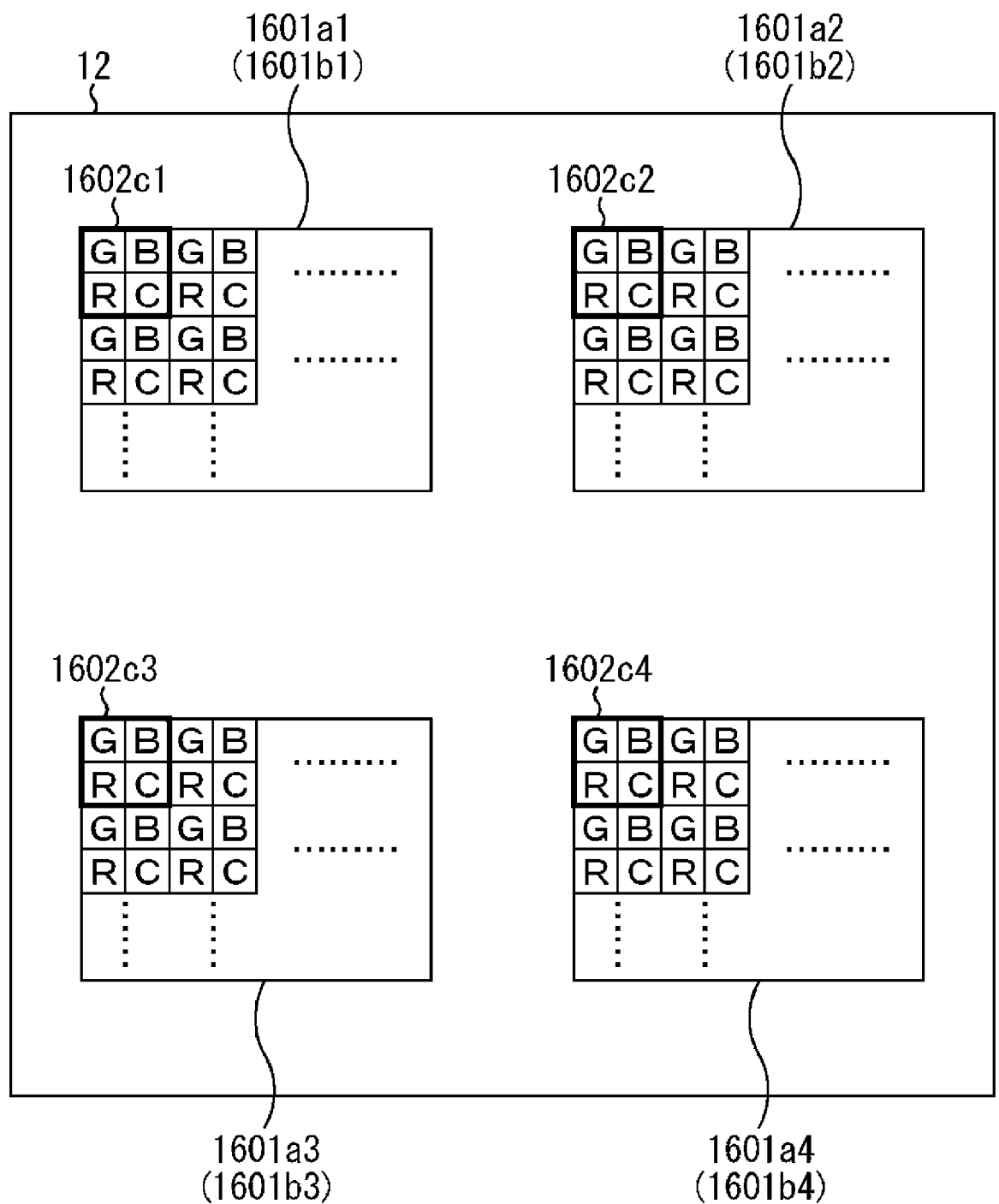
FIG. 67 is a diagram illustrating a second example of a pixel arrangement in alight receiving area of a camera module.

FIG. 67 illustrates a second example of a pixel arrangement of the four pixel arrays 1601*b*1 to 1601*b*4 included in the light receiving element 12 of the camera module 1.

In the pixel arrangement illustrated in FIG. 67, the combination of wavelengths (colors) of light that the respective pixels that form the repetition units 1602*c*1 to 1602*c*4 receive is different from that of the pixel arrangement illustrated in FIG. 66. The repetition units 1602*c*1 to 1602*c*4 illustrated in FIG. 67 are made up of R, G, B, and C pixels, respectively.

The pixel arrangement illustrated in FIG. 67 does not split light into the R, G, and Blight components as described above but has C pixels that receive light in the entire wavelength region of visible light. The C pixels receive a larger amount of light than the R, G, and B pixels that receive a portion of the split light components. Due to this, this configuration has an effect that, even when the illuminance of a subject is low, for example, it is possible to obtain an image having higher lightness or an image having a larger luminance gradation using information (for example, luminance information of the subject) obtained by the C pixels which receives a large amount of light.

Figure 68:
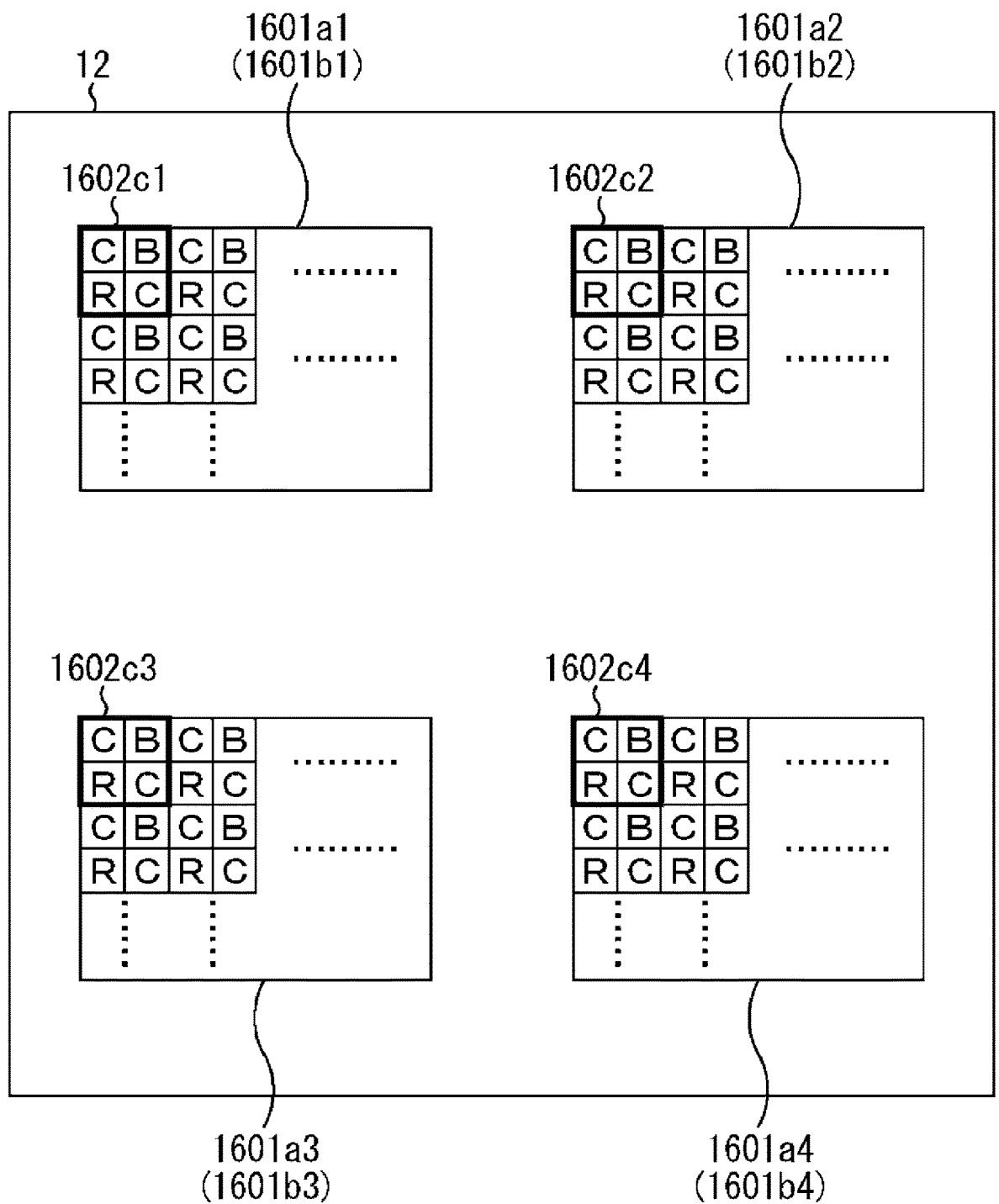
FIG. 68 is a diagram illustrating a third example of a pixel arrangement in alight receiving area of a camera module.

FIG. 68 illustrates a third example of a pixel arrangement of the four pixel arrays 1601*b*1 to 1601*b*4 included in the light receiving element 12 of the camera module 1.

The repetition units 1602*c*1 to 1602*c*4 illustrated in FIG. 68 are made up of R, C, B, and C pixels, respectively.

The pixel repetition units 1602*c*1 to 1602*c*4 illustrated in FIG. 68 do not include G pixels. Information corresponding to the G pixels is obtained by arithmetically processing the information obtained from the C, R, and B pixels. For example, the information corresponding to the G pixels is obtained by subtracting the output values of the R and B pixels from the output value of the C pixels.

Each of the pixel repetition units 1602*c*1 to 1602*c*4 illustrated in FIG. 68 includes two C pixels that receive light in the entire wavelength region, which is twice the number of C pixels in each of the repetition units 1602*c*1 to 1602*c*4 illustrated in FIG. 67. Moreover, in the pixel repetition units 1602*c*1 to 1602*c*4 illustrated in FIG. 68, two C pixels are disposed in the diagonal direction of the contour of the repetition unit 1602*c* so that the pitch of C pixels in the pixel array 1601*b* illustrated in FIG. 68 is twice the pitch of C pixels in the pixel array 1601*b* illustrated in FIG. 67 in both vertical and horizontal directions of the pixel array 1601*b*.

Due to this, the configuration illustrated in FIG. 68 has an effect that, even when the illuminance of a subject is low, for example, it is possible to obtain information (for example, luminance information) obtained from the C pixels that receive a large amount of light with a resolution twice that of the configuration illustrated in FIG. 67 whereby a clear image having a resolution twice higher than that obtained by the configuration illustrated in FIG. 67 can be obtained.

Figure 69:
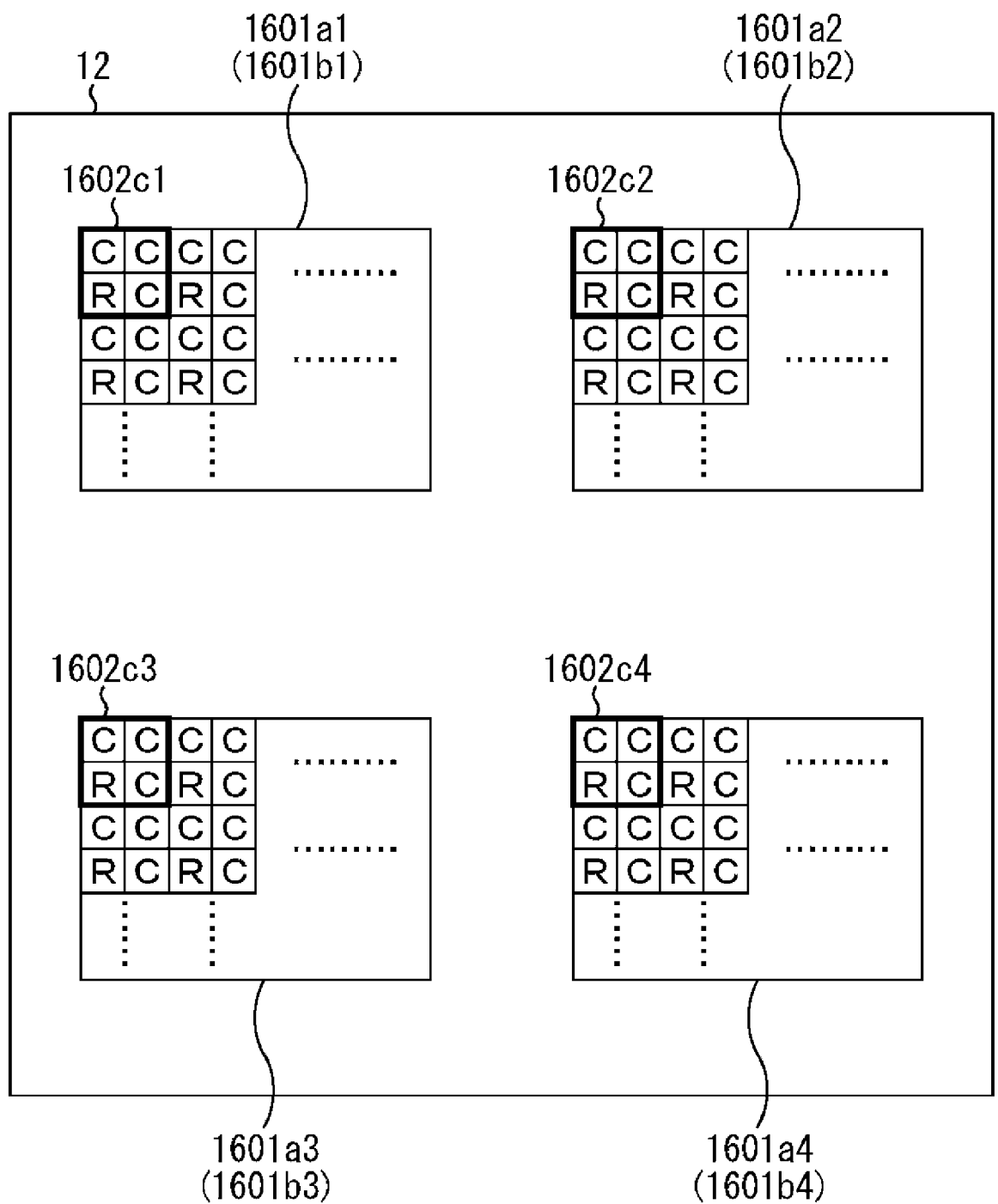
FIG. 69 is a diagram illustrating a fourth example of a pixel arrangement in alight receiving area of a camera module.

FIG. 69 illustrates a fourth example of a pixel arrangement of the four pixel arrays 1601*b*1 to 1601*b*4 included in the light receiving element 12 of the camera module 1.

The repetition units 1602*c*1 to 1602*c*4 illustrated in FIG. 69 are made up of R, C, C, and C pixels, respectively.

For example, when a camera module is used for a camera which is mounted on a vehicle to photograph the forward side of the vehicle, a color image is not typically necessary in many cases. It is often necessary to recognize a red brake lamp of a vehicle traveling on the forward side and the red signal of a traffic signal on a road and to recognize the shape of other subjects.

Since the configuration illustrated in FIG. 69 includes R pixels which can recognize the red brake lamp of a vehicle and the red signal of a traffic signal on a road and includes a larger number of C pixels that receive a large amount of light than the C pixels included in the pixel repetition unit 1602*c* illustrated in FIG. 68, the configuration illustrated in FIG. 69 provides an effect that, even when the illuminance of a subject is low, for example, it is possible to obtain a clear image having a higher resolution.

The camera modules 1 including the light receiving element 12 illustrated in FIGS. 66 to 69 may use any one of the shapes of the diaphragm plate 51 illustrated in A to D of FIG. 64.

In the camera module 1 illustrated in A to F of FIG. 10 and A to D of FIG. 11, including any one of the light receiving elements 12 illustrated in FIGS. 66 to 69 and the diaphragm plate 51 illustrated in any one of A to D of FIG. 64, the optical axes of the two optical units 13 each disposed in the vertical and horizontal directions of the surface of the camera module 1 serving as a light incidence surface extend in the same direction.

The camera module 1 having such a structure has an effect that it is possible to obtain an image having a higher resolution by applying the super-resolution technique to the obtained plurality of original images.

Figure 70:
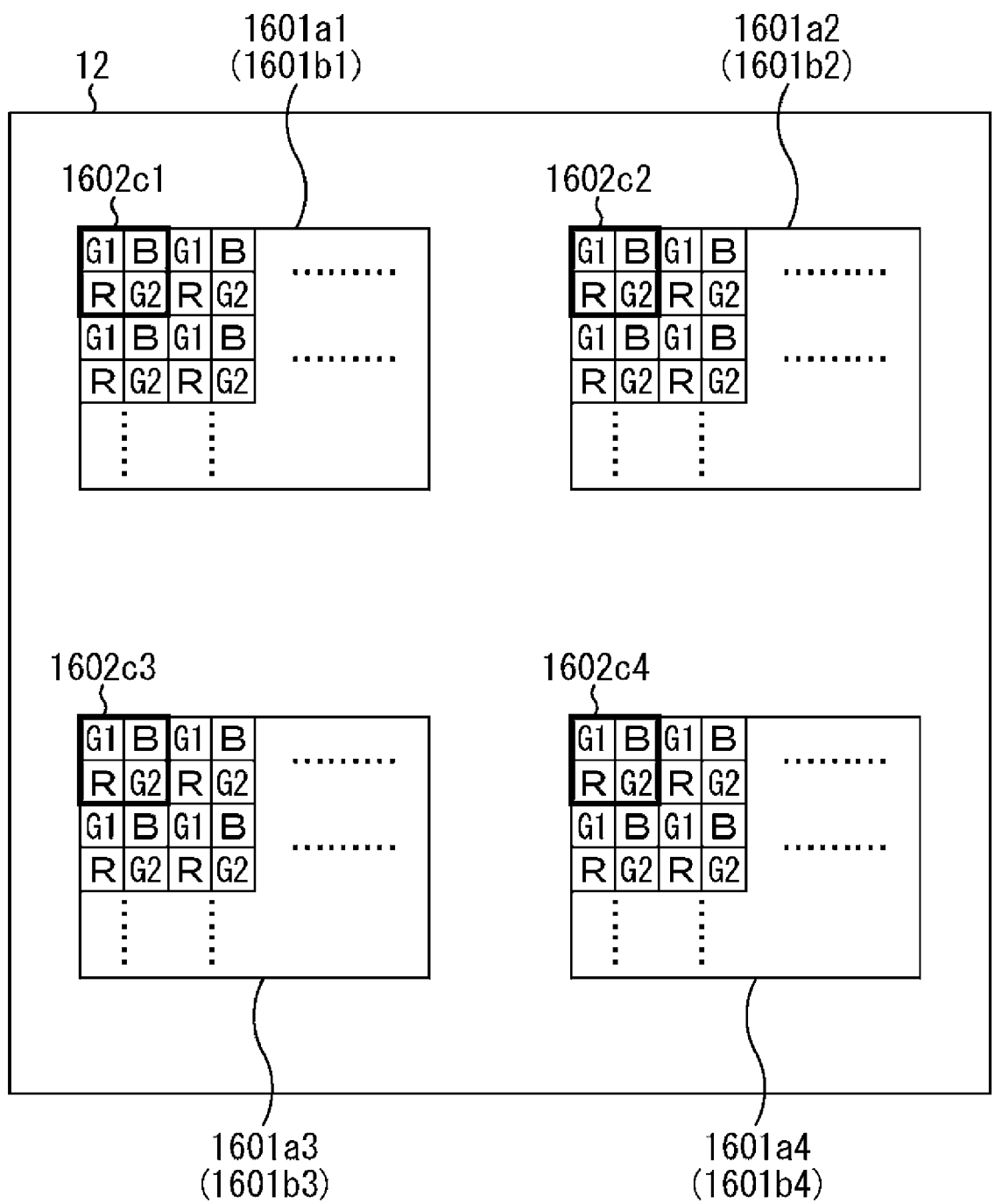
FIG. 70 is a diagram illustrating a modification of the pixel arrangement illustrated in FIG. 66.

FIG. 70 illustrates a modification of the pixel arrangement illustrated in FIG. 66.

The repetition units 1602*c*1 to 1602*c*4 illustrated in FIG. 66 are made up of R, G, B, and G pixels, respectively, and the two G pixels of the same color have the same structure. In contrast, the repetition units 1602c1 to 1602c4 illustrated in FIG. 70 are made up of R, G1, B, and G2 pixels, respectively, and the two G pixels of the same color (that is, G1 and G2 pixels) have different structures.

A signal generation unit (for example, a photodiode) included in the G2 pixel has a higher appropriate operation limit (for example, a saturation charge amount) than the G1 pixel. Moreover, a signal conversion unit (for example, a charge voltage conversion capacitor) included in the G2 pixel is a larger size than the G1 pixel.

According to such a configuration, since an output signal of the G2 pixel when the pixel generates a predetermined amount of signal (for example, charge) per unit time is smaller than that of the G1 pixel and the saturation charge amount of the G2 pixel is larger than that of the G1 pixel, the configuration provides an effect that, even when the illuminance of a subject is high, for example, the pixels do not reach its operation limit and an image having a high gradation is obtained.

On the other hand, since the G1 pixel when the pixel generates a predetermined amount of signal (for example, charge) per unit time provides a larger output signal than the G2 pixel, the configuration provides an effect that, even when the illuminance of a subject is low, for example, an image having a high gradation is obtained.

Since the light receiving element 12 illustrated in FIG. 70 includes such G1 and G2 pixels, the light receiving element 12 provides an effect that an image having a high gradation in a wide illuminance range (that is, an image having a wide dynamic range) is obtained.

Figure 71:
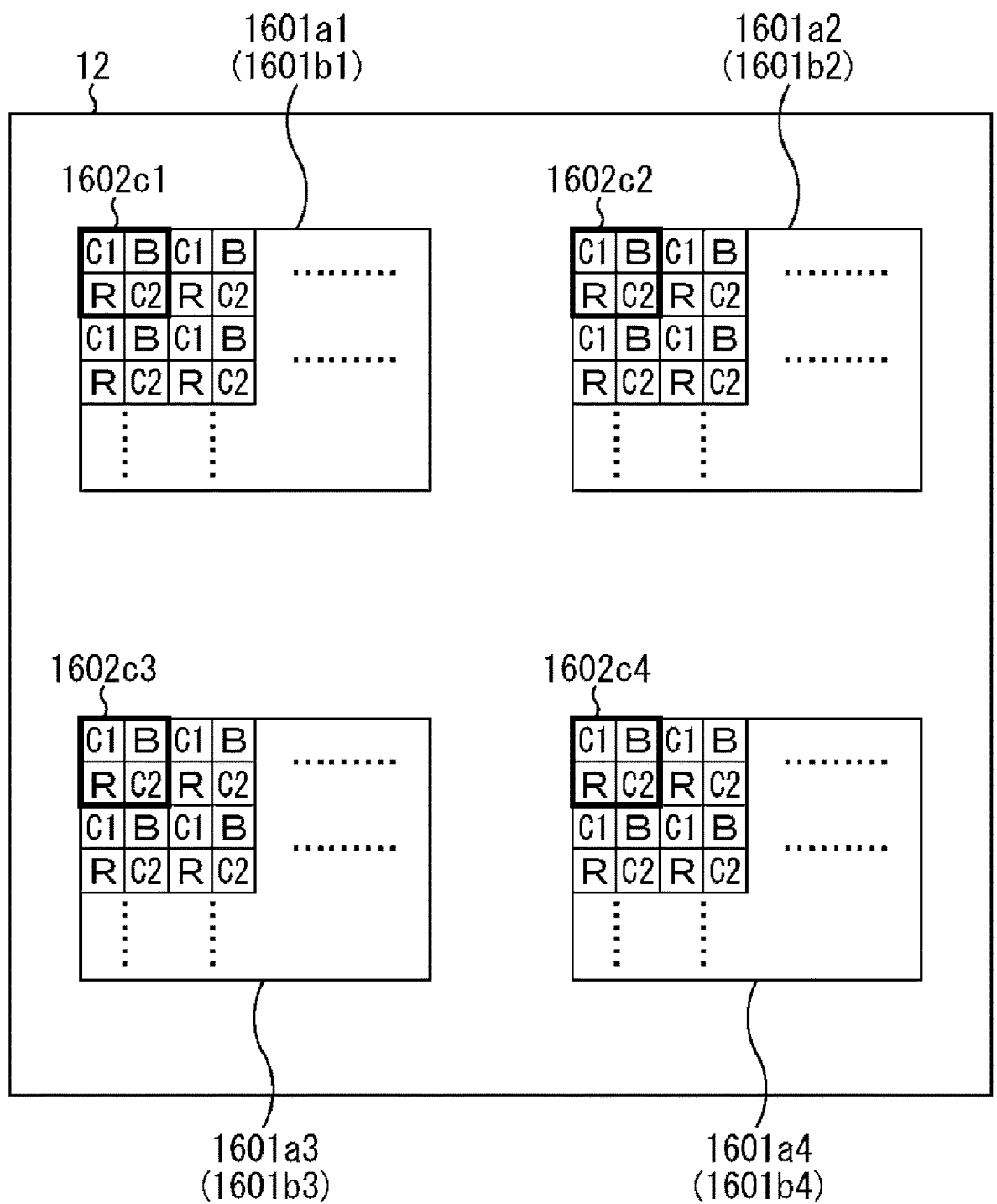
FIG. 71 is a diagram illustrating a modification of the pixel arrangement illustrated in FIG. 68.

FIG. 71 illustrates a modification of the pixel arrangement illustrated in FIG. 68.

The repetition units 1602c1 to 1602c4 illustrated in FIG. 68 are made up of R, C, B, and C pixels, respectively, and the two C pixels of the same color have the same structure. In contrast, the repetition units 1602c1 to 1602c4 illustrated in FIG. 71 are made up of R, C1, B, and C2 pixels, respectively, and the two C pixels of the same color (that is, C1 and C2 pixels) have different structures.

A signal generation unit (for example, a photodiode) included in the C2 pixel has a higher operation limit (for example, a saturation charge amount) than the C1 pixel. Moreover, a signal conversion unit (for example, a charge voltage conversion capacitor) included in the C2 pixel is a larger size than the C1 pixel.

Figure 72:
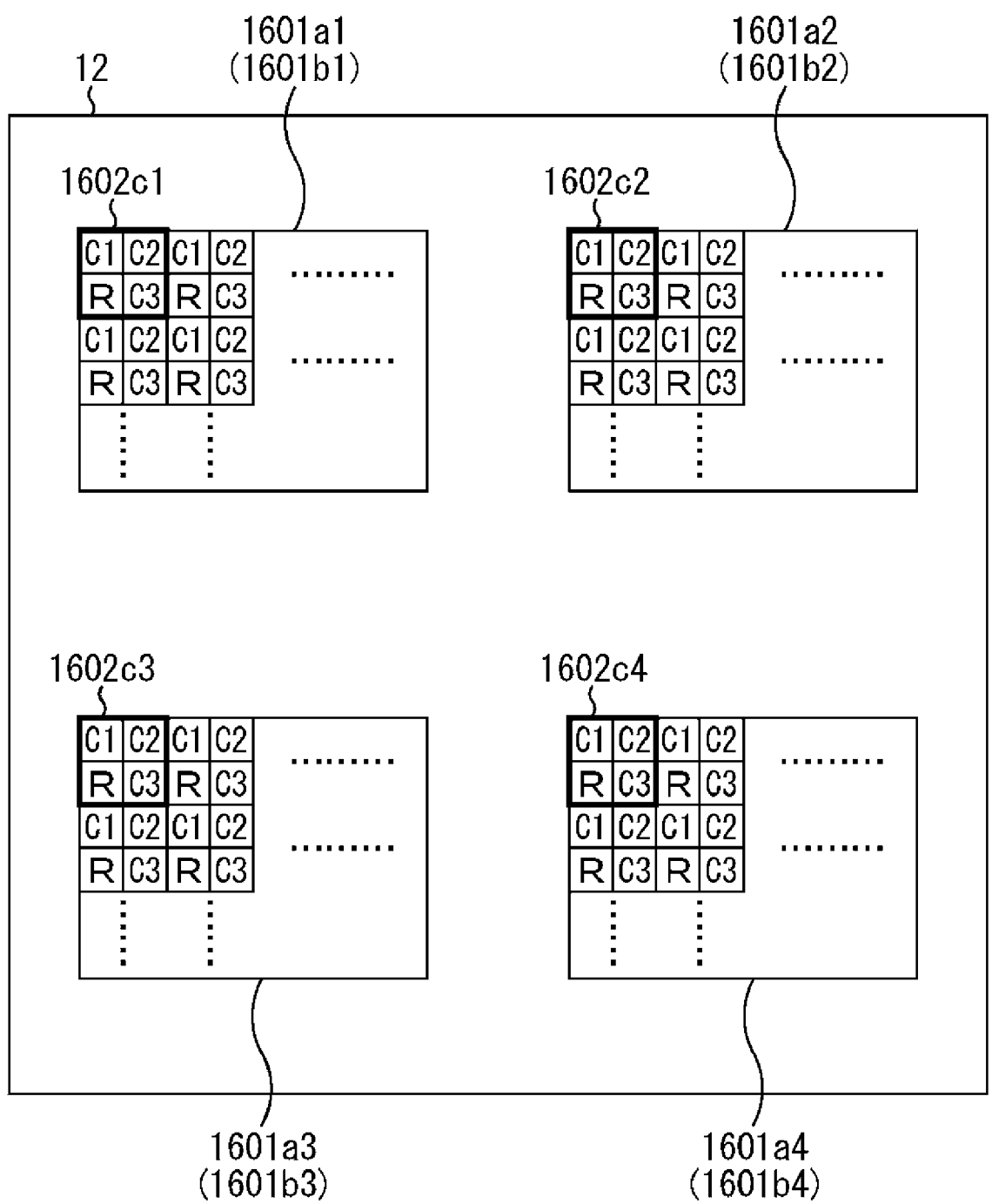
FIG. 72 is a diagram illustrating a modification of the pixel arrangement illustrated in FIG. 69.

FIG. 72 illustrates a modification of the pixel arrangement illustrated in FIG. 69.

The repetition units 1602c1 to 1602c4 illustrated in FIG. 69 are made up of R, C, C, and C pixels, respectively, and the three C pixels of the same color have the same structure. In contrast, the repetition units 1602c1 to 1602c4 illustrated in FIG. 72 are made up of R, C1, C2, and C3 pixels, respectively, and the three C pixels of the same color (that is, C1 to C3 pixels) have different structures.

For example, a signal generation unit (for example, a photodiode) included in the C2 pixel has a higher operation limit (for example, a saturation charge amount) than the C1 pixel, and a signal generation unit (for example, a photodiode) included in the C3 pixel has a higher operation limit (for example, a saturation charge amount) than the C2 pixel. Moreover, a signal conversion unit (for example, a charge voltage conversion capacitor) included in the C2 pixel is a larger size than the C1 pixel, and a signal conversion unit (for example, a charge voltage conversion capacitor) included in the C3 pixel is a larger size than the C2 pixel.

Since the light receiving element 12 illustrated in FIGS. 71 and 72 has the above described configuration, the light receiving element 12 provides an effect that an image having a high gradation in a wide illuminance range (that is, an image having a wide dynamic range) is obtained similarly to the light receiving element 12 illustrated in FIG. 70.

The diaphragm plate 51 of the camera module 1 including the light receiving element 12 illustrated in FIGS. 70 to 72 may have various configurations of the diaphragm plates 51 illustrated in A to D of FIG. 64 and the modifications thereof.

In the camera module 1 illustrated in A to F of FIG. 10 and A to D of FIG. 11, including any one of the light receiving elements 12 illustrated in FIGS. 70 to 72 and the diaphragm plate 51 illustrated in any one of A to D of FIG. 64, the optical axes of the two optical units 13 each disposed in the vertical and horizontal directions of the surface of the camera module 1 serving as a light incidence surface extend in the same direction.

The camera module 1 having such a structure has an effect that it is possible to obtain an image having a higher resolution by applying the super-resolution technique to the obtained plurality of original images.

Figure 73:
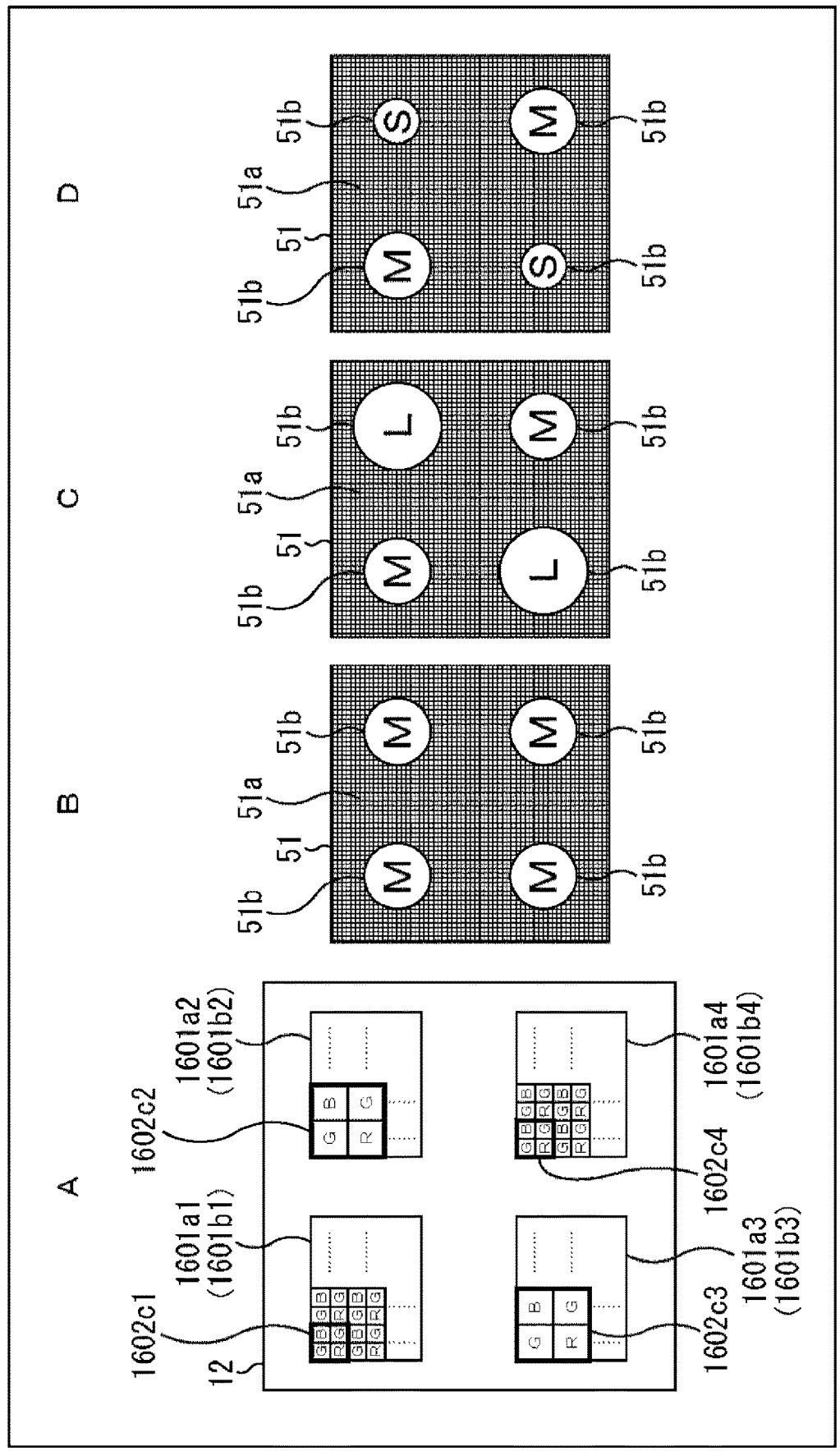
FIG. 73 is a diagram illustrating a fifth example of a pixel arrangement in a light receiving area of a camera module.

A of FIG. 73 illustrates a fifth example of the pixel arrangement of the four pixel arrays 1601b1 to 1601b4 included in the light receiving element 12 of the camera module 1.

The four pixel arrays 1601b1 to 1601b4 included in the light receiving element 12 may not necessarily have the same structure as described above but may have different structures as illustrated in A of FIG. 73.

In the light receiving element 12 illustrated in A of FIG. 73, the pixel arrays 1601b1 and 1601b4 have the same structure and the repetition units 1602c1 and 1602c4 that form the pixel arrays 1601b1 and 1601b4 have the same structure.

In contrast, the pixel arrays 1601b2 and 1601b3 have a different structure from the pixel arrays 1601b1 and 1601b4. Specifically, the pixels included in the repetition units 1602c2 and 1602c3 of the pixel arrays 1601b2 and 1601b3 have a larger size than the pixels of the repetition units 1602c1 and 1602c4 of the pixel arrays 1601b1 and 1601b4. More specifically, the photoelectric conversion unit included in the pixels of the repetition units 1602c2 and 1602c3 has a larger size than that of the repetition units 1602c1 and 1602c4. The region of the repetition units 1602c2 and 1602c3 has a larger size than the region of the repetition units 1602c1 and 1602c4 since the pixels of the repetition units 1602c2 and 1602c3 have a larger size than the pixels of the repetition units 1602c1 and 1602c4. Due to this, although the pixel arrays 1601b2 and 1601b3 have the same area as the pixel arrays 1601b1 and 1601b4, the pixel arrays 1601b2 and 1601b3 are made up of a smaller number of pixels than the pixel arrays 1601b1 and 1601b4.

The diaphragm plate 51 of the camera module 1 including the light receiving element 12 illustrated in A of FIG. 73 may have various configurations of the diaphragm plates 51 illustrated in A to C of FIG. 64, the configurations of the diaphragm plates 51 illustrated in B to D of FIG. 73, or the modifications thereof.

In general, a light receiving element which uses large pixels provides an effect that an image having a better signal-to-noise ratio (S/N ratio) than a light receiving element which uses small pixels is obtained.

Although the magnitude of noise generated in a signal readout circuit and a signal amplification circuit in a light receiving element which uses large pixels is the same as that of a light receiving element which uses small pixels, the magnitude of a signal generated by a signal generation unit included in a pixel increases as the size of a pixel increases.

Due to this, the light receiving element which uses large pixels provides an effect that an image having a better signal-to-noise ratio (S/N ratio) than the light receiving element which uses small pixels is obtained.

On the other hand, if the size of a pixel array is the same, a light receiving element which uses small pixels provides a higher resolution than a light receiving element which uses large pixels.

Due to this, the light receiving element which uses small pixels provides an effect that an image having a higher resolution than the light receiving element which uses large pixels is obtained.

The configuration of the light receiving element 12 illustrated in A of FIG. 73 provides an effect that, when the illuminance of a subject is high, and therefore, a large signal is obtained in the light receiving element 12, for example, it is possible to obtain images having a high resolution using the light receiving areas 1601a1 and 1601a4 in which the pixels have a small size and the resolution is high, and an image having a high resolution is obtained by applying the super-resolution technique to these two images.

Moreover, it is possible to provide an effect that, when the illuminance of a subject is low, and therefore, there is a possibility that the S/N ratio of an image decreases because a large signal is not obtained in the light receiving element 12, for example, it is possible to obtain images having a high S/N ratio using the light receiving areas 1601a2 and 1601a3 in which images having a high S/N ratio are obtained, and an image having a high resolution is obtained by applying the super-resolution technique to these two images.

In this case, as the shape of the diaphragm plate 51, the camera module 1 including the light receiving element 12 illustrated in A of FIG. 73 may use the shape of the diaphragm plate 51 illustrated in B of FIG. 73, for example, among the three shapes of the diaphragm plates 51 illustrated in B to D of FIG. 73.

In the diaphragm plate 51 illustrated in C of FIG. 73, for example, among the three shapes of the diaphragm plates 51 illustrated in B to D of FIG. 73, the opening region 51b of the diaphragm plate 51 which is used in combination with the light receiving areas 1601a2 and 1601a3 which use large pixels is larger than the opening region 51b of the diaphragm plate 51 which is used in combination with the other light receiving area.

Due to this, the camera module 1 which uses a combination of the light receiving element 12 illustrated in A of FIG. 73 and the diaphragm plate 51 illustrated in C of FIG. 73 among the three shapes of the diaphragm plates 51 illustrated in B to D of FIG. 73 provides an effect that, when the illuminance of a subject is low, and therefore, a large signal is not obtained in the light receiving element 12, for example, images having a higher S/N ratio can be obtained in the light receiving areas 1601a2 and 1601a3 than the camera module 1 which uses a combination of the light receiving element 12 illustrated in A of FIG. 73 and the diaphragm plate 51 illustrated in B of FIG. 73.

In the diaphragm plate 51 illustrated in D of FIG. 73, for example, among the three shapes of the diaphragm plates 51 illustrated in B to D of FIG. 73, the opening region 51b of the diaphragm plate 51 which is used in combination with the light receiving areas 1601a2 and 1601a3 which use large pixels is smaller than the opening region 51b of the diaphragm plate 51 which is used in combination with the other light receiving area.

Due to this, the camera module 1 which uses a combination of the light receiving element 12 illustrated in A of FIG. 73 and the diaphragm plate 51 illustrated in D of FIG. 73 among the three shapes of the diaphragm plates 51 illustrated in B to D of FIG. 73 provides an effect that, when the illuminance of a subject is high, and therefore, a large signal is not obtained in the light receiving element 12, for example, the amount of light incident on the light receiving areas 1601a2 and 1601a3 is suppressed more than the camera module 1 which uses a combination of the light receiving element 12 illustrated in A of FIG. 73 and the diaphragm plate 51 illustrated in B of FIG. 73 among the three shapes of the diaphragm plates 51 illustrated in B to D of FIG. 73.

Due to this, it is possible to provide an effect of suppressing the occurrence of a situation in which an excessively large amount of light enters the pixels included in the light receiving areas 1601a2 and 1601a3, and as a result, an appropriate operation limit (for example, the saturation charge amount) of the pixels included in the light receiving areas 1601a2 and 1601a3 is exceeded.

Figure 74:
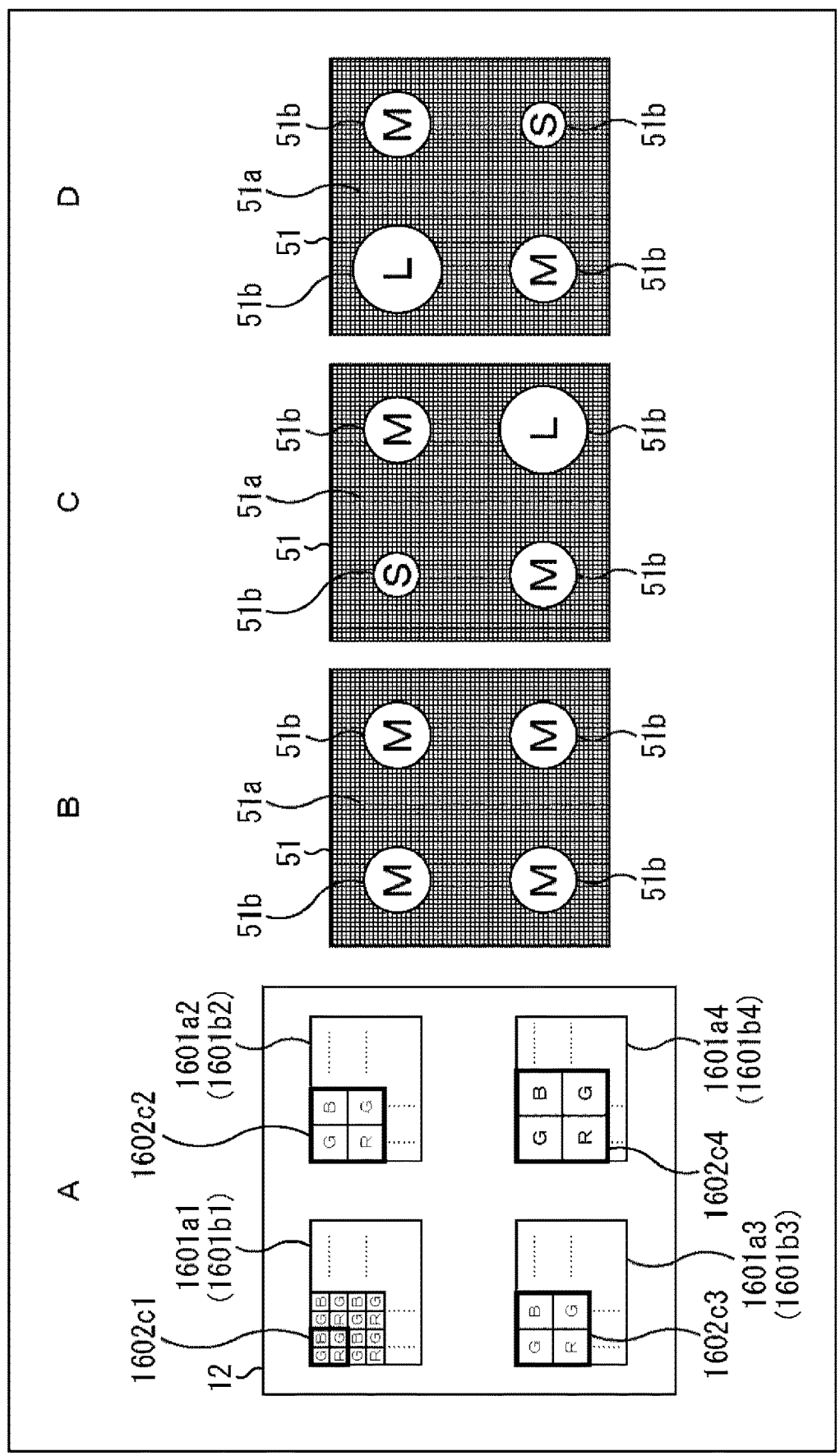
FIG. 74 is a diagram illustrating a sixth example of a pixel arrangement in alight receiving area of a camera module.

A of FIG. 74 illustrates a sixth example of the pixel arrangement of the four pixel arrays 1601b1 to 1601b4 included in the light receiving element 12 of the camera module 1.

In the light receiving element 12 illustrated in A of FIG. 74, the region of the repetition unit 1602c1 of the pixel array 1601b1 has a smaller size than the region of the repetition units 1602c1 and 1602c2 of the pixel arrays 1601b2 and 1601b3. The region of the repetition unit 1602c4 of the pixel array 1601b4 has a larger size than the region of the repetition units 1602c1 and 1602c2 of the pixel arrays 1601b2 and 1601b3.

That is, the sizes of the regions of the repetition units 1602c1 to 1602c4 have such a relation that (Repetition unit 1602c1)<[(Repetition unit 1602c2)=(Repetition unit 1602c3)]<(Repetition unit 1602c4).

The larger the size of the region of each of the repetition units 1602c1 to 1602c4, the larger becomes the pixel size and the larger becomes the size of the photoelectric conversion unit.

The diaphragm plate 51 of the camera module 1 including the light receiving element 12 illustrated in A of FIG. 74 may have various configurations of the diaphragm plates 51 illustrated in A to C of FIG. 64, the configurations of the diaphragm plates 51 illustrated in B to D of FIG. 74, or the modifications thereof.

The configuration of the light receiving element 12 illustrated in A of FIG. 74 provides an effect that, when the illuminance of a subject is high, and therefore, a large signal is obtained in the light receiving element 12, for example, it is possible to obtain images having a high resolution using the light receiving area 1601a1 in which the pixels have a small size and the resolution is high.

Moreover, it is possible to provide an effect that, when the illuminance of a subject is low, and therefore, there is a possibility that the S/N ratio of an image decreases because a large signal is not obtained in the light receiving element 12, for example, it is possible to obtain images having a high S/N ratio using the light receiving areas 1601a2 and 1601a3 in which images having a high S/N ratio are obtained, and an image having a high resolution is obtained by applying the super-resolution technique to these two images.

Further, it is possible to provide an effect that, when the illuminance of a subject is further lower, and therefore, there is a possibility that the S/N ratio of an image decreases further in the light receiving element 12, for example, it is possible to obtain images having a higher S/N ratio using the light receiving area 1601a4 in which images having a higher S/N ratio are obtained.

In this case, as the shape of the diaphragm plate 51, the camera module 1 including the light receiving element 12 illustrated in A of FIG. 74 may use the shape of the diaphragm plate 51 illustrated in B of FIG. 74, for example, among the three shapes of the diaphragm plates 51 illustrated in B to D of FIG. 74.

In the diaphragm plate 51 illustrated in C of FIG. 74, for example, among the three shapes of the diaphragm plates 51 illustrated in B to D of FIG. 74, the opening region 51b of the diaphragm plate 51 which is used in combination with the light receiving areas 1601a2 and 1601a3 which use large pixels is larger than the opening region 51b of the diaphragm plate 51 which is used in combination with the light receiving area 1601a1 which use small pixels. Moreover, the opening region 51b of the diaphragm plate 51 which is used in combination with the light receiving area 1601a4 which use still larger pixels is still larger.

Due to this, the camera module 1 which uses a combination of the light receiving element 12 illustrated in A of FIG. 74 and the diaphragm plate 51 illustrated in C of FIG. 74 among the three shapes of the diaphragm plates 51 illustrated in B to D of FIG. 74 provides an effect that, when the illuminance of a subject is low, and therefore, a large signal is not obtained in the light receiving element 12, for example, images having a higher S/N ratio can be obtained in the light receiving areas 1601a2 and 1601a3 and that, when the illuminance of a subject is further lower, for example, it is possible to obtain images having a higher S/N ratio in the light receiving area 1601a4 than the camera module 1 which uses a combination of the light receiving element 12 illustrated in A of FIG. 74 and the diaphragm plate 51 illustrated in B of FIG. 74 among the three shapes of the diaphragm plates 51 illustrated in B to D of FIG. 74.

In the diaphragm plate 51 illustrated in D of FIG. 74, for example, among the three shapes of the diaphragm plates 51 illustrated in B to D of FIG. 74, the opening region 51b of the diaphragm plate 51 which is used in combination with the light receiving areas 1601a2 and 1601a3 which use large pixels is smaller than the opening region 51b of the diaphragm plate 51 which is used in combination with the light receiving area 1601a1 which use small pixels. Moreover, the opening region 51b of the diaphragm plate 51 which is used in combination with the light receiving area 1601a4 which use still larger pixels is still smaller.

Due to this, the camera module 1 which uses a combination of the light receiving element 12 illustrated in A of FIG. 74 and the diaphragm plate 51 illustrated in D of FIG. 74 among the three shapes of the diaphragm plates 51 illustrated in B to D of FIG. 74 provides an effect that, when the illuminance of a subject is high, and therefore, a large signal is obtained in the light receiving element 12, for example, the amount of light incident on the light receiving areas 1601a2 and 1601a3 is suppressed more than the camera module 1 which uses a combination of the light receiving element 12 illustrated in A of FIG. 74 and the diaphragm plate 51 illustrated in B of FIG. 74 among the three shapes of the diaphragm plates 51 illustrated in B to D of FIG. 74.

Due to this, it is possible to provide an effect of suppressing the occurrence of a situation in which an excessively large amount of light enters the pixels included in the light receiving areas 1601a2 and 1601a3, and as a result, an appropriate operation limit (for example, the saturation charge amount) of the pixels included in the light receiving area 1601a2 and 1601a3 is exceeded.

Moreover, it is possible to provide an effect of further suppressing the amount of light incident on the light receiving area 1601a4 to thereby suppress the occurrence of a situation in which an excessively large amount of light enters the pixels included in the light receiving area 1601a4, and as a result, an appropriate operation limit (for example, the saturation charge amount) of the pixels included in the light receiving area 1601a4 is exceeded.

As another embodiment, using a structure similar to a diaphragm that changes the size of an opening by combining a plurality of plates and changing a positional relation thereof as is used in a general camera, for example, a structure may be used in which a camera module includes the diaphragm plate 51 of which the opening region 51b is variable and the size of the opening of a diaphragm is changed according to the illuminance of a subject.

For example, when the light receiving element 12 illustrated in A of FIG. 73 or A of FIG. 74 is used, a structure may be used in which the shape illustrated in C of FIG. 73 or C of FIG. 74 among the three shapes of the diaphragm plates 51 illustrated in B to D of FIG. 73 or B to D of FIG. 74 is used when the illuminance of a subject is low, the shape illustrated in B of FIG. 73 or B of FIG. 74 is used when the illuminance of the subject is higher than the above-mentioned illuminance, and the shape illustrated in D of FIG. 73 or D of FIG. 74 is used when the illuminance of the subject is further higher than the above-mentioned illuminance.

Figure 75:
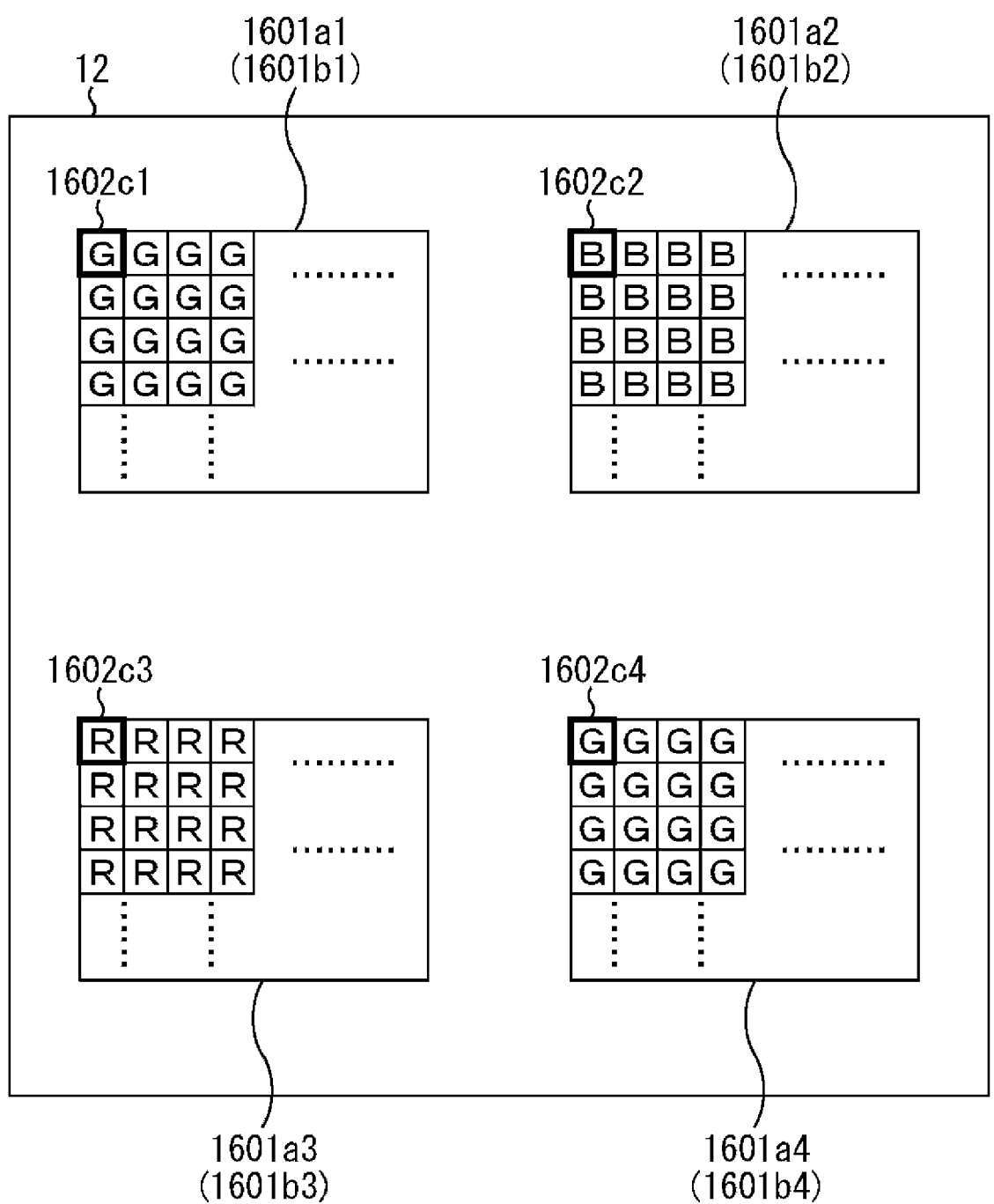
FIG. 75 is a diagram illustrating a seventh example of a pixel arrangement in alight receiving area of a camera module.

FIG. 75 illustrates a seventh example of the pixel arrangement of the four pixel arrays 1601b1 to 1601b4 included in the light receiving element 12 of the camera module 1.

In the light receiving element 12 illustrated in FIG. 75, all pixels of the pixel array 1601b1 are made up of pixels that receive light in the green wavelength. All pixels of the pixel array 1601b2 are made up of pixels that receive light in the blue wavelength. All pixels of the pixel array 1601b3 are made up of pixels that receive light in the red wavelength. All pixels of the pixel array 1601b4 are made up of pixels that receive light in the green wavelength.

Figure 76:
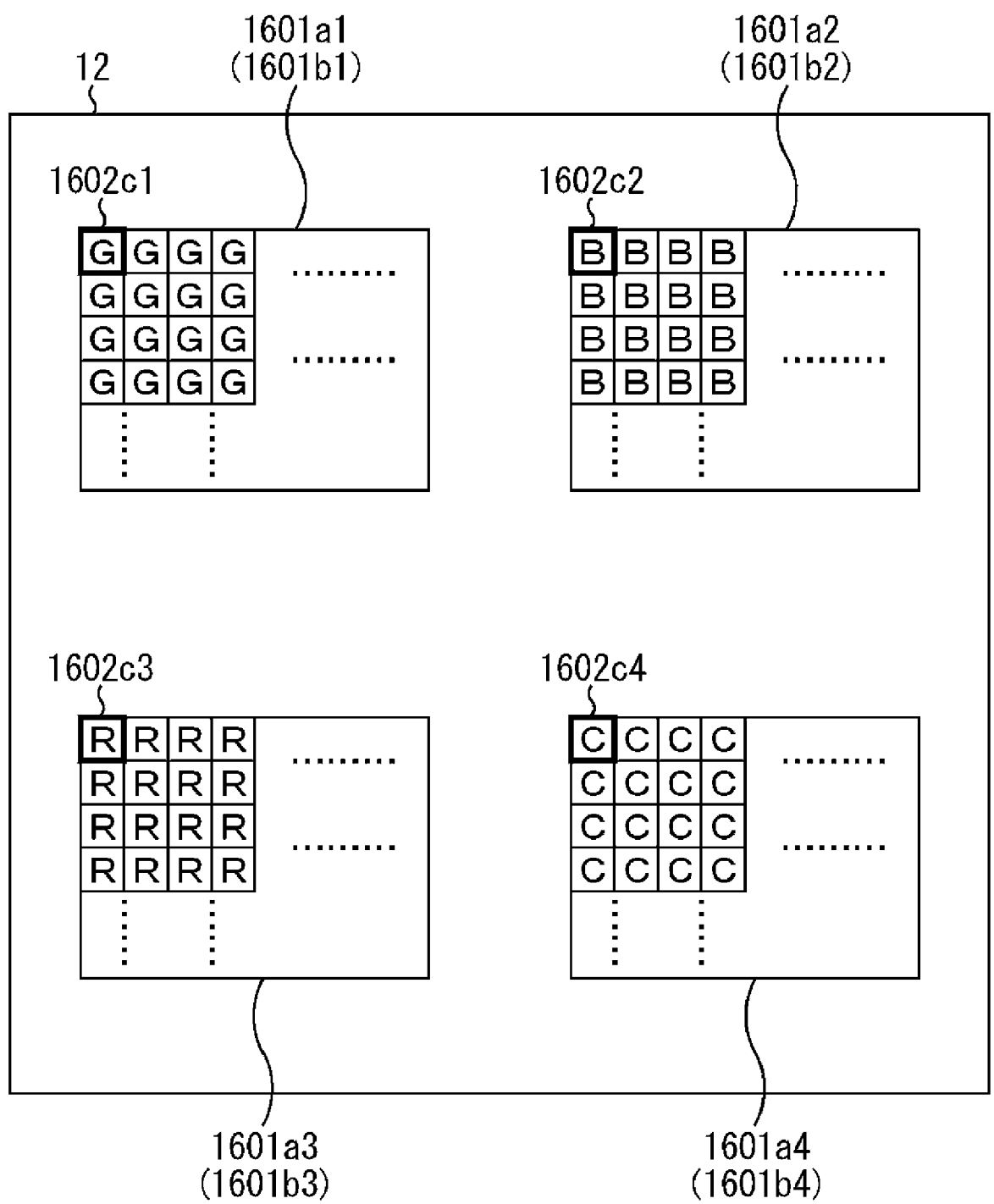
FIG. 76 is a diagram illustrating an eighth example of a pixel arrangement in alight receiving area of a camera module.

FIG. 76 illustrates an eighth example of the pixel arrangement of the four pixel arrays 1601b1 to 1601b4 included in the light receiving element 12 of the camera module 1.

In the light receiving element 12 illustrated in FIG. 76, all pixels of the pixel array 1601b1 are made up of pixels that receive light in the green wavelength. All pixels of the pixel array 1601b2 are made up of pixels that receive light in the blue wavelength. All pixels of the pixel array 1601b3 are made up of pixels that receive light in the red wavelength. All pixels of the pixel array 1601b4 are made up of pixels that receive light in the entire wavelength region of visible light.

Figure 77:
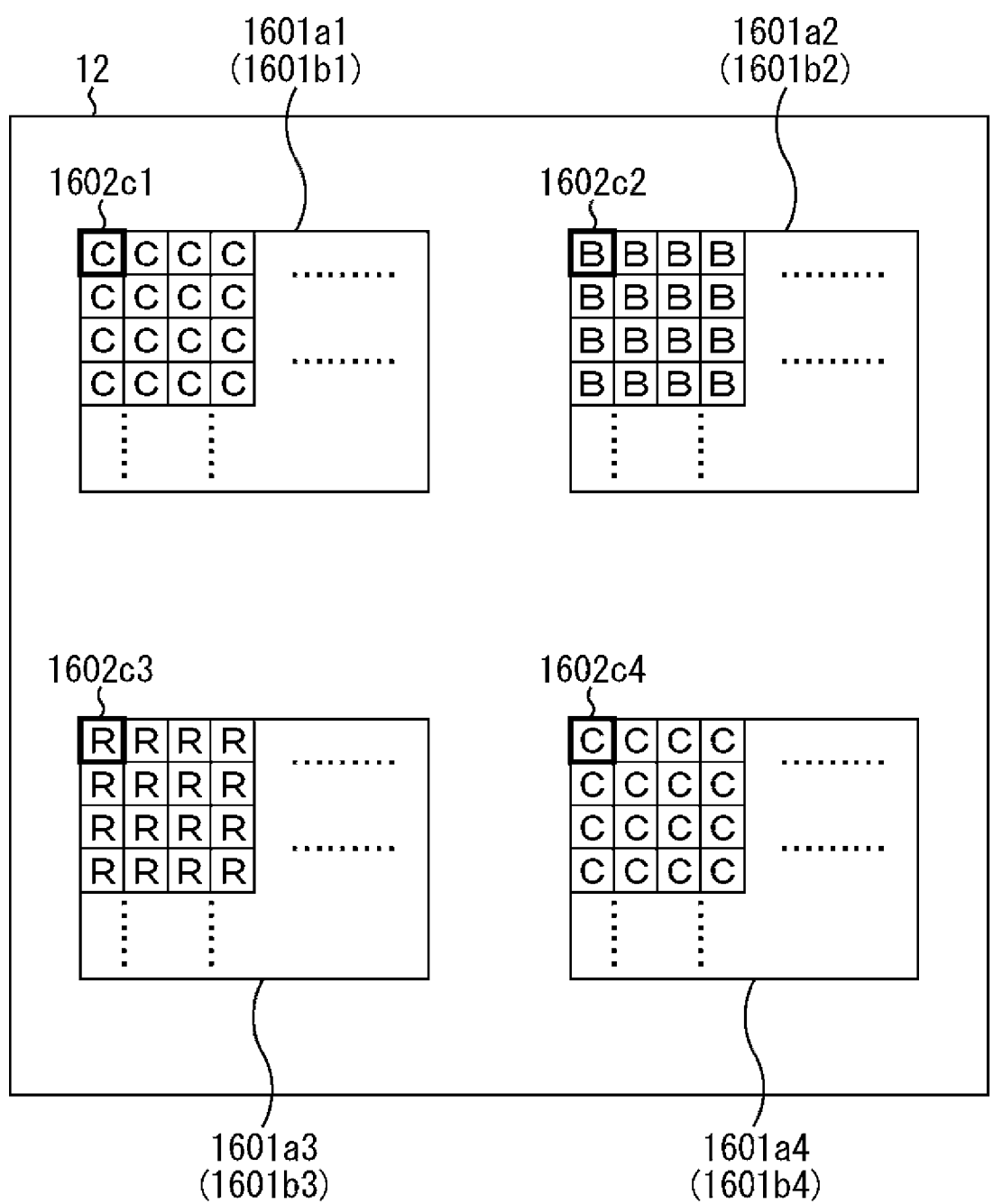
FIG. 77 is a diagram illustrating a ninth example of a pixel arrangement in alight receiving area of a camera module.

FIG. 77 illustrates a ninth example of the pixel arrangement of the four pixel arrays 1601b1 to 1601b4 included in the light receiving element 12 of the camera module 1.

In the light receiving element 12 illustrated in FIG. 77, all pixels of the pixel array 1601b1 are made up of pixels that receive light in the entire wavelength region of visible light. All pixels of the pixel array 1601b2 are made up of pixels that receive light in the blue wavelength. All pixels of the pixel array 1601b3 are made up of pixels that receive light in the red wavelength. All pixels of the pixel array 1601b4 are made up of pixels that receive light in the entire wavelength region of visible light.

Figure 78:
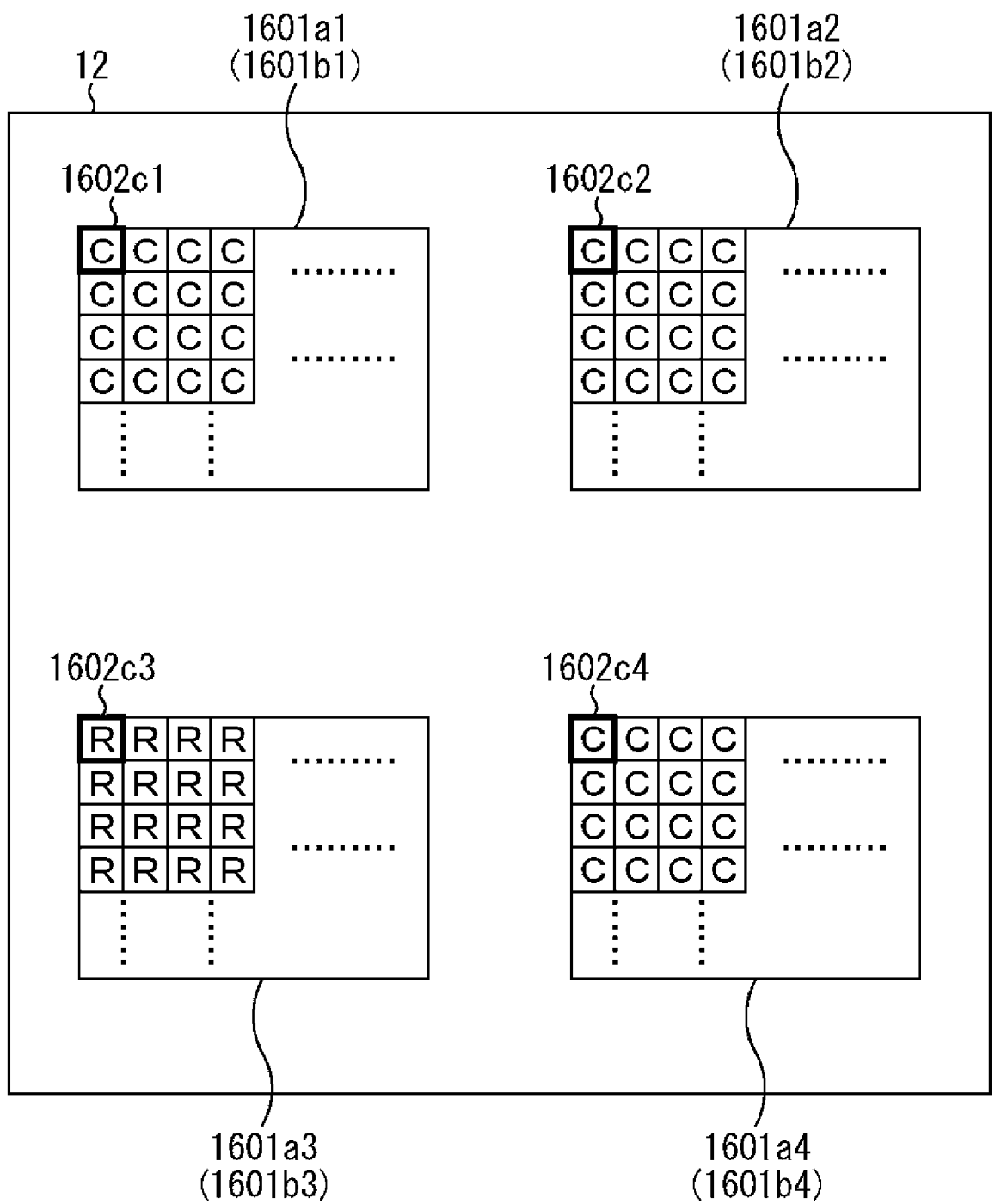
FIG. 78 is a diagram illustrating a tenth example of a pixel arrangement in alight receiving area of a camera module.

FIG. 78 illustrates a tenth example of the pixel arrangement of the four pixel arrays 1601b1 to 1601b4 included in the light receiving element 12 of the camera module 1.

In the light receiving element 12 illustrated in FIG. 78, all pixels of the pixel array 1601b1 are made up of pixels that receive light in the entire wavelength region of visible light. All pixels of the pixel array 1601b2 are made up of pixels that receive light in the entire wavelength region of visible light. All pixels of the pixel array 1601b3 are made up of pixels that receive light in the red wavelength. All pixels of the pixel array 1601b4 are made up of pixels that receive light in the entire wavelength region of visible light.

As illustrated in FIGS. 75 to 78, the pixel arrays 1601b1 to 1601b4 of the light receiving element 12 can be configured so that each of the respective pixel arrays receives light in the same wavelength region.

A known RGB three-plate type solid-state imaging apparatus in related art includes three light receiving elements, and the respective light receiving elements capture R, G, and B images only, respectively. In the known RGB three-plate type solid-state imaging apparatus in related art, light incident on one optical unit is split in three directions by a prism and the split light components are received using three light receiving elements. Due to this, the positions of the subject images incident on the three light receiving elements are the same. Thus, it is difficult to obtain a highly sensitive image by applying the super-resolution technique to these three images.

In contrast, in the camera module illustrated in A to F of FIG. 10 and A to D of FIG. 11, which uses any one of the light receiving elements 12 illustrated in FIGS. 75 to 78, two optical units 13 are disposed in each of the vertical and horizontal directions of the surface of the camera module 1 serving as the light incidence surface, and the optical axes of these four optical units 13 extend in the same direction in parallel to each other. Due to this, it is possible to obtain a plurality of images which are not necessarily identical using the four different light receiving areas 1601a1 to 1601a4 included in the light receiving element 12 with the optical axes extending in the same direction.

The camera module 1 having such a structure provides an effect that it is possible to obtain an image having a higher resolution based on a plurality of images obtained from the four optical units 13 having the above-described arrangement than that of one image obtained from one optical unit 13 by applying the super-resolution technique to these images.

The configuration in which four images of the colors G, R, G, and B are obtained by the light receiving element 12 illustrated in FIG. 75 provides the same effect as that provided by the configuration of the light receiving element 12 illustrated in FIG. 66 in which the four pixels of the colors G, R, G, and B form a repetition unit.

The configuration in which four images of the colors R, G, B, and C are obtained by the light receiving element 12 illustrated in FIG. 76 provides the same effect as that provided by the configuration of the light receiving element 12 illustrated in FIG. 67 in which the four pixels of the colors R, G, B, and C form a repetition unit.

The configuration in which four images of the colors R, C, B, and C are obtained by the light receiving element 12 illustrated in FIG. 77 provides the same effect as that provided by the configuration of the light receiving element 12 illustrated in FIG. 68 in which the four pixels of the colors R, C, B, and C form a repetition unit.

The configuration in which four images of the colors R, C, C, and C are obtained by the light receiving element 12 illustrated in FIG. 78 provides the same effect as that provided by the configuration of the light receiving element 12 illustrated in FIG. 69 in which the four pixels of the colors R, C, C, and C form a repetition unit.

The diaphragm plate 51 of the camera module 1 including any one of the light receiving elements 12 illustrated in FIGS. 75 to 78 may have various configurations of the diaphragm plates 51 illustrated in A to D of FIG. 64 and the modifications thereof.

Figure 79:
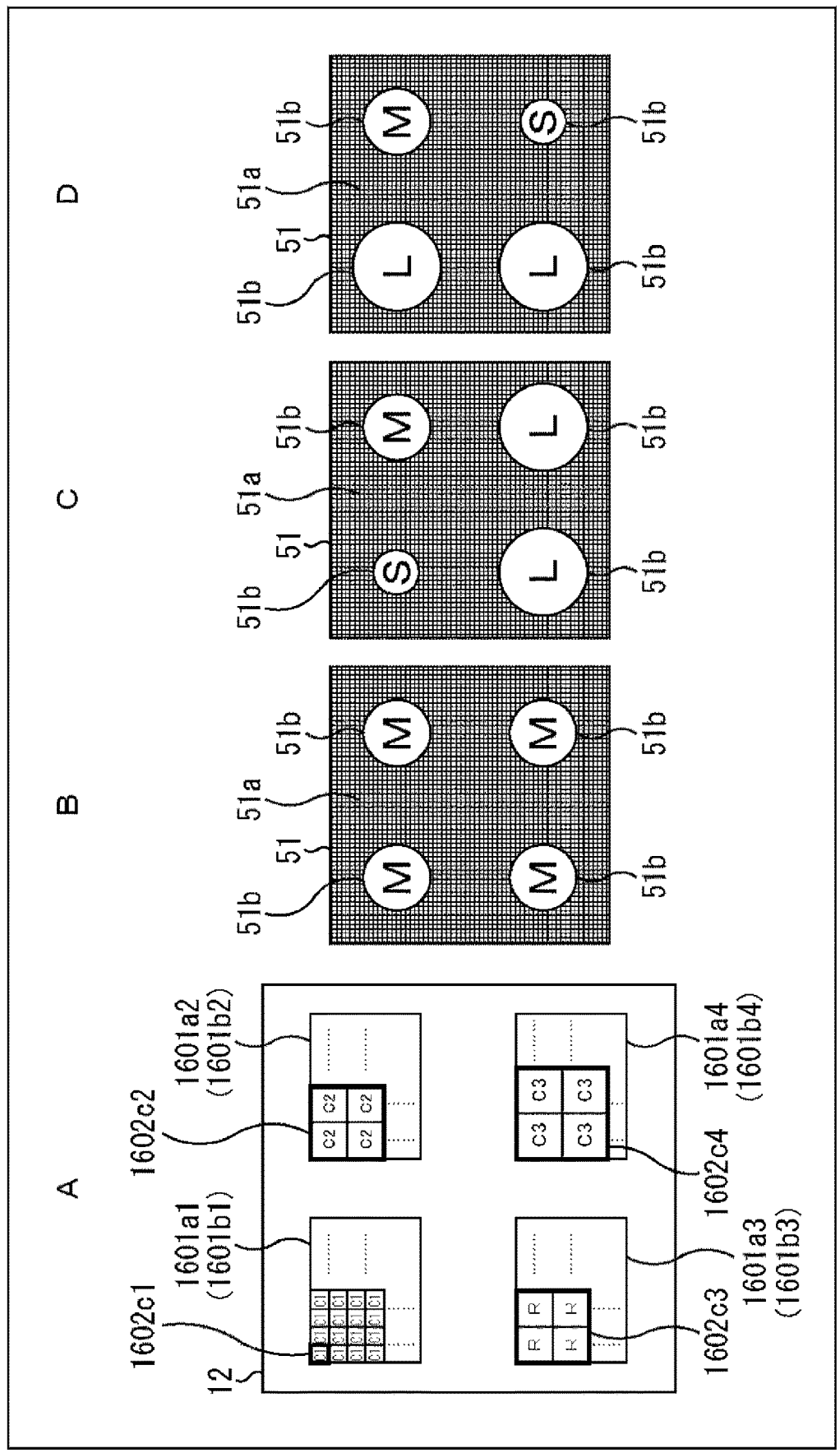
FIG. 79 is a diagram illustrating an eleventh example of a pixel arrangement in a light receiving area of a camera module.

A of FIG. 79 illustrates an eleventh example of the pixel arrangement of the four pixel arrays 1601b1 to 1601b4 included in the light receiving element 12 of the camera module 1.

In the light receiving element 12 illustrated in A of FIG. 79, the pixel sizes of each pixel of the pixel arrays 1601b1 to 1601b4 or the wavelengths of light received by each pixel are different.

As for the pixel size, the pixel array 1601b1 has the smallest size, the pixel arrays 1601b2 and 1601b3 have the same size which is larger than the pixel array 1601b1, and the pixel array 1601b4 has a larger size than the pixel arrays 1601b2 and 1601b3. The pixel size is proportional to the size of the photoelectric conversion unit included in each pixel.

As for the wavelength of light received by each pixel, the pixel arrays 1601b1, 1601b2, and 1601b4 are made up of pixels that receive light in the entire wavelength region of visible light, and the pixel array 1601b3 is made up of pixels that receive light in the red wavelength.

The configuration of the light receiving element 12 illustrated in A of FIG. 79 provides an effect that, when the illuminance of a subject is high, and therefore, a large signal is obtained in the light receiving element 12, for example, it is possible to obtain images having a high resolution using the light receiving area 1601a1 in which the pixels have a small size.

Moreover, it is possible to provide an effect that, when the illuminance of a subject is low, and therefore, there is a possibility that the S/N ratio of an image decreases because a large signal is not obtained in the light receiving element 12, for example, it is possible to obtain images having a high S/N ratio using the light receiving area 1601a2 in which an image having a high S/N ratio is obtained.

Further, it is possible to provide an effect that, when the illuminance of a subject is further lower, and therefore, there is a possibility that the S/N ratio of an image decreases further in the light receiving element 12, for example, it is possible to obtain images having a higher S/N ratio using the light receiving area 1601a4 in which images having a higher S/N ratio are obtained.

The configuration in which the light receiving element 12 illustrated in A of FIG. 79 is used in combination with the diaphragm plate 51 illustrated in B of FIG. 79 among the three shapes of the diaphragm plates 51 illustrated in B to D of FIG. 79 provides the same effects as that provided by the configuration in which the light receiving element 12 illustrated in A of FIG. 74 is used in combination with the diaphragm plate 51 illustrated in B of FIG. 74 among the three shapes of the diaphragm plates 51 illustrated in B to D of FIG. 74.

The configuration in which the light receiving element 12 illustrated in A of FIG. 79 is used in combination with the diaphragm plate 51 illustrated in C of FIG. 79 among the three shapes of the diaphragm plates 51 illustrated in B to D of FIG. 79 provides the same effects as that provided by the configuration in which the light receiving element 12 illustrated in A of FIG. 74 is used in combination with the diaphragm plate 51 illustrated in C of FIG. 74 among the three shapes of the diaphragm plates 51 illustrated in B to D of FIG. 74.

The configuration in which the light receiving element 12 illustrated in A of FIG. 79 is used in combination with the diaphragm plate 51 illustrated in D of FIG. 79 among the three shapes of the diaphragm plates 51 illustrated in B to D of FIG. 79 provides the same effects as that provided by the configuration in which the light receiving element 12 illustrated in A of FIG. 74 is used in combination with the diaphragm plate 51 illustrated in D of FIG. 74 among the three shapes of the diaphragm plates 51 illustrated in B to D of FIG. 74.

The camera module 1 including the light receiving element 12 illustrated in A of FIG. 79 may have the configuration of the diaphragm plate 51 illustrated in A or D of FIG. 64, the configurations of the diaphragm plates 51 illustrated in B to D of FIG. 79, or the modifications thereof.

<18. Twelfth Embodiment of Camera Module>

Figure 80:
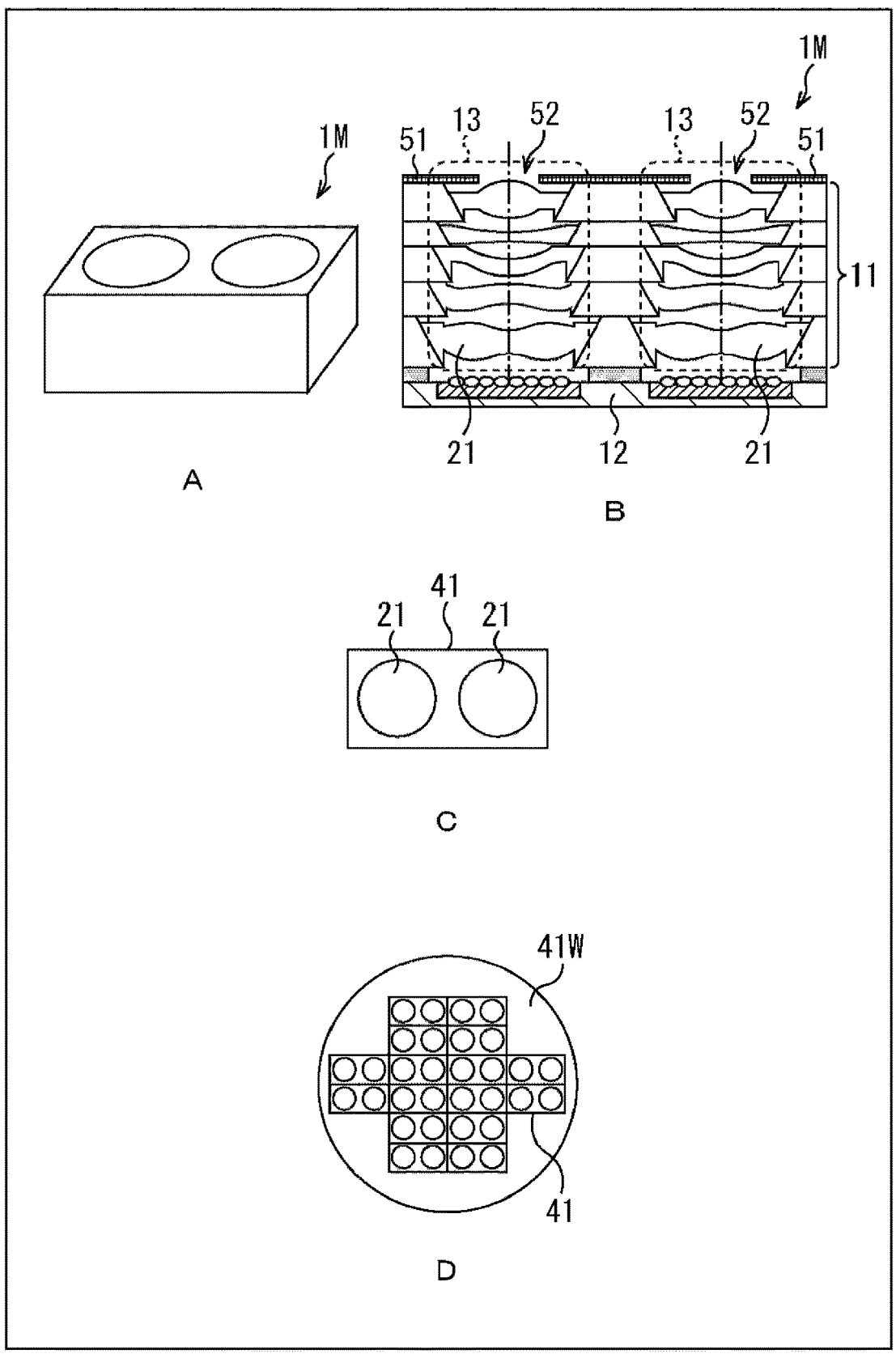
FIG. 80 is a block diagram illustrating a configuration example of an imaging apparatus as an electronic apparatus to which the present technique is applied.

A to D of FIG. 80 are diagrams illustrating a twelfth embodiment of a camera module which uses a stacked lens structure to which the present technique is applied.

A of FIG. 80 is a diagram illustrating an appearance of a camera module 1M as the twelfth embodiment of the camera module 1. B of FIG. 80 is a schematic cross-sectional view of the camera module 1M.

The camera module 1M includes two optical units 12 similar to the camera module 1B illustrated in A to H of FIG. 9. The camera module 1M is different from the camera module 1B of A to H of FIG. 9. Specifically, although the optical parameters of the two optical units 13 are different from each other in the camera module 1B according to the second embodiment, optical parameters of the two optical units 13 are the same as each other in the camera module 1M according to the twelfth embodiment. In other words, the two optical units 13 of the camera module 1M are the same, for example, in number of the lenses 21, diameter of the lenses 21, thickness of the lenses 21, surface shape of the lenses 21, material of the lenses 21, and distance between the two adjacent lenses 21 in the vertical direction.

C of FIG. 80 is a diagram illustrating a planar shape of a predetermined one of the substrates with lenses 41, which form the stacked lens structure 11 of the camera module 1M.

D of FIG. 80 is a plan view of a substrate with lenses 41W in a substrate state, for obtaining the substrate with lenses 41 illustrated in FIG. 80C.

Figure 81:
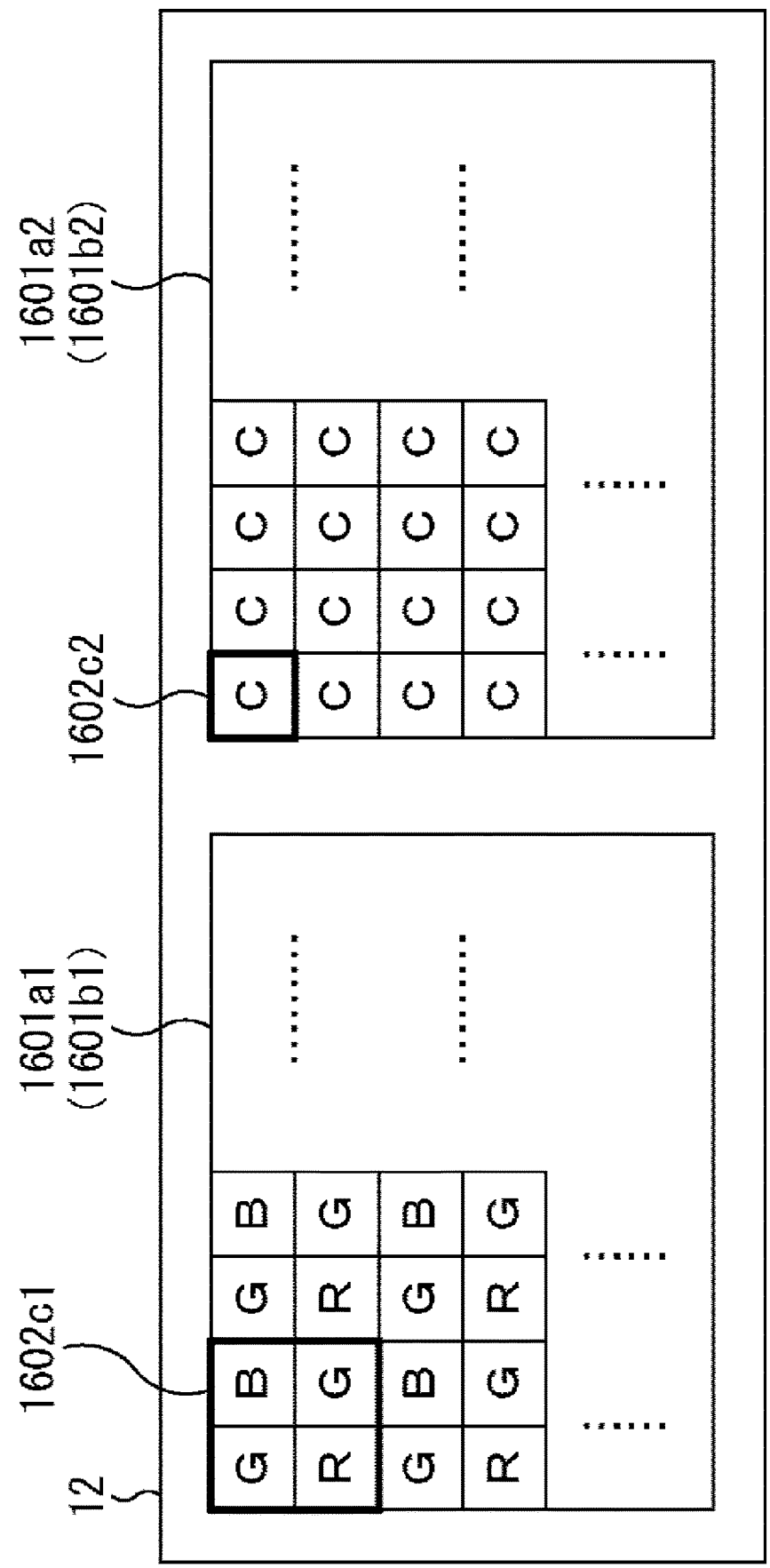
FIG. 81 is a diagram illustrating a structure of a light receiving element according to a twelfth embodiment.

FIG. 81 is a diagram illustrating a structure of the light receiving element 12 of the camera module 1M illustrated in A to D of FIG. 80.

The light receiving element 12 of the camera module 1M includes two light receiving areas 1601a1 and 1601a2. The light receiving areas 1601a1 and 1601a2 respectively include pixel arrays 1601b1 and 1601b2 in which the pixels for receiving light are arranged in an array form.

The pixel arrays 1601b1 and 1601b2 include repetition units 1602c1 and 1602c2 each made up of one or a plurality of pixels. More specifically, the pixel array 1601b1 is formed by arranging the repetition units 1602c1 in a plurality of array forms in both the vertical and horizontal directions, and the pixel array 1601b2 is formed by arranging the repetition units 1602c2 in a plurality of array forms in both the vertical and horizontal directions. The repetition units 1602c1 are each made up of four R, G, B, and G pixels, and the repetition units 1602c2 are each made up of one C pixel.

Thus, the camera module 1M includes a pair of sensor units that output color image signals, that is, a pair of the optical unit 13 and the pixel array 1601b1 including the R, G, and B pixels, and a pair of sensor units that output monochrome image signals, that is, a pair of the optical unit 13 and the pixel array 1601b2 including the C pixels.

As understood from Equation (1) below, which represents the luminance signal Y according to ITU-R BT.601-7 standard published by International Telecommunication Union for conversion of signals from R, G, and B pixels to a luminance signal and color-difference signals, among the R, G, and B pixels, the G pixels have a highest sensitivity to luminance, and the B pixels have a lowest sensitivity to luminance.

$$Y = 0.299R + 0.587G + 0.114B \qquad \text{Equation (1)}$$

Figure 82:
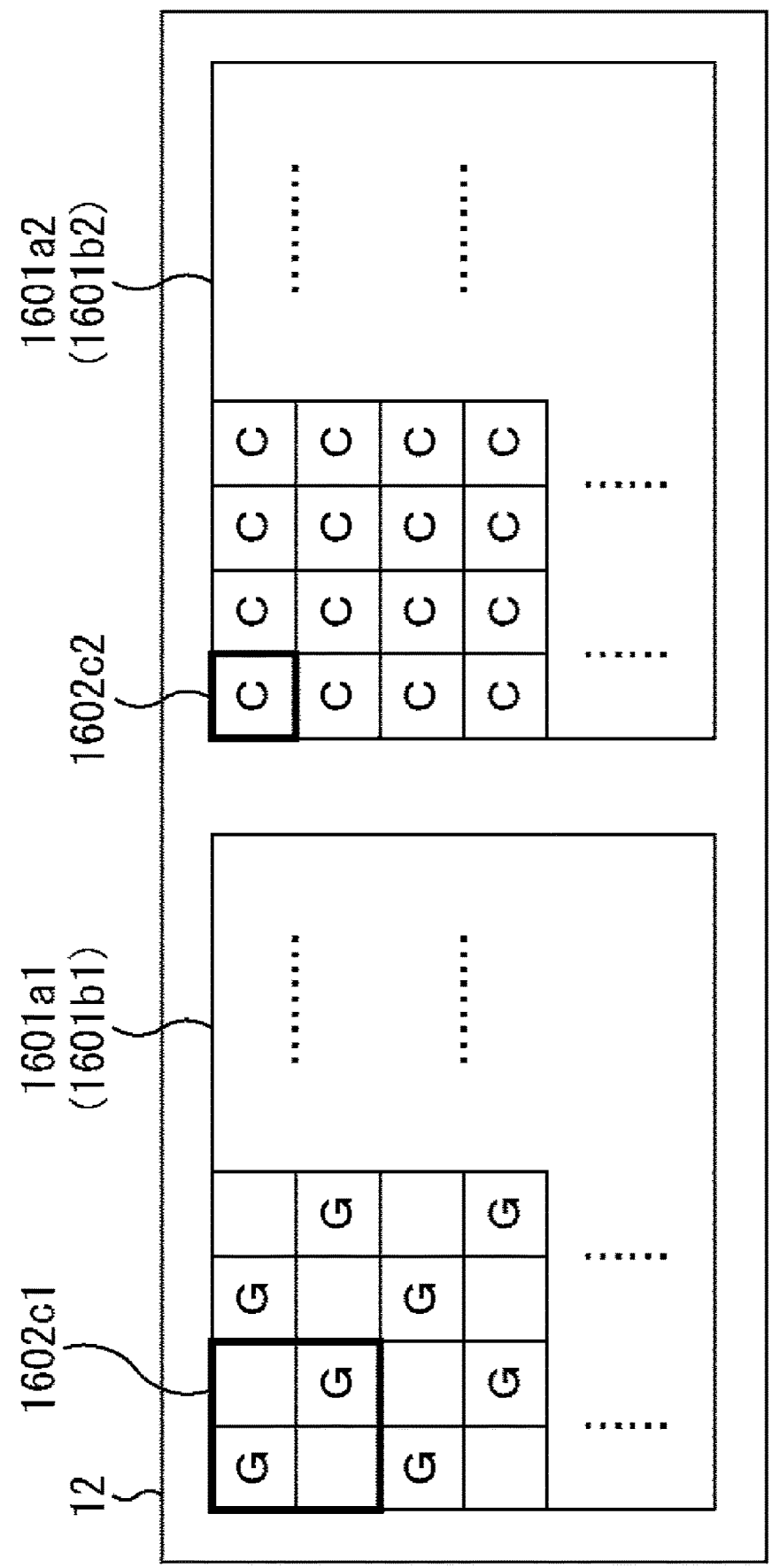
FIG. 82 is a diagram illustrating the structure of the light receiving element according to the twelfth embodiment.

Thus, for the sake of simplicity, on an assumption that only the G pixels obtain luminance information items at high sensitivity in the light receiving area 1601a1 illustrated in FIG. 81, when positions of pixels that obtain the luminance information items at the high sensitivity are specified, the pattern as illustrated in FIG. 82 is obtained.

FIG. 82 is a diagram illustrating the positions of the pixels that obtain the luminance information items at the high sensitivity in the light receiving element 12 illustrated in FIG. 81.

Based on the above-described assumption of the luminance information, the luminance information items are obtained at the high sensitivity only from the G pixels in the light receiving area 1601a1. In contrast, in the light receiving area 1601a2, luminance information items are obtained at high sensitivity from all the pixels forming the pixel array 1601b2, which are the C pixels that receive light in the entire wavelength region of visible light.

Figure 83:
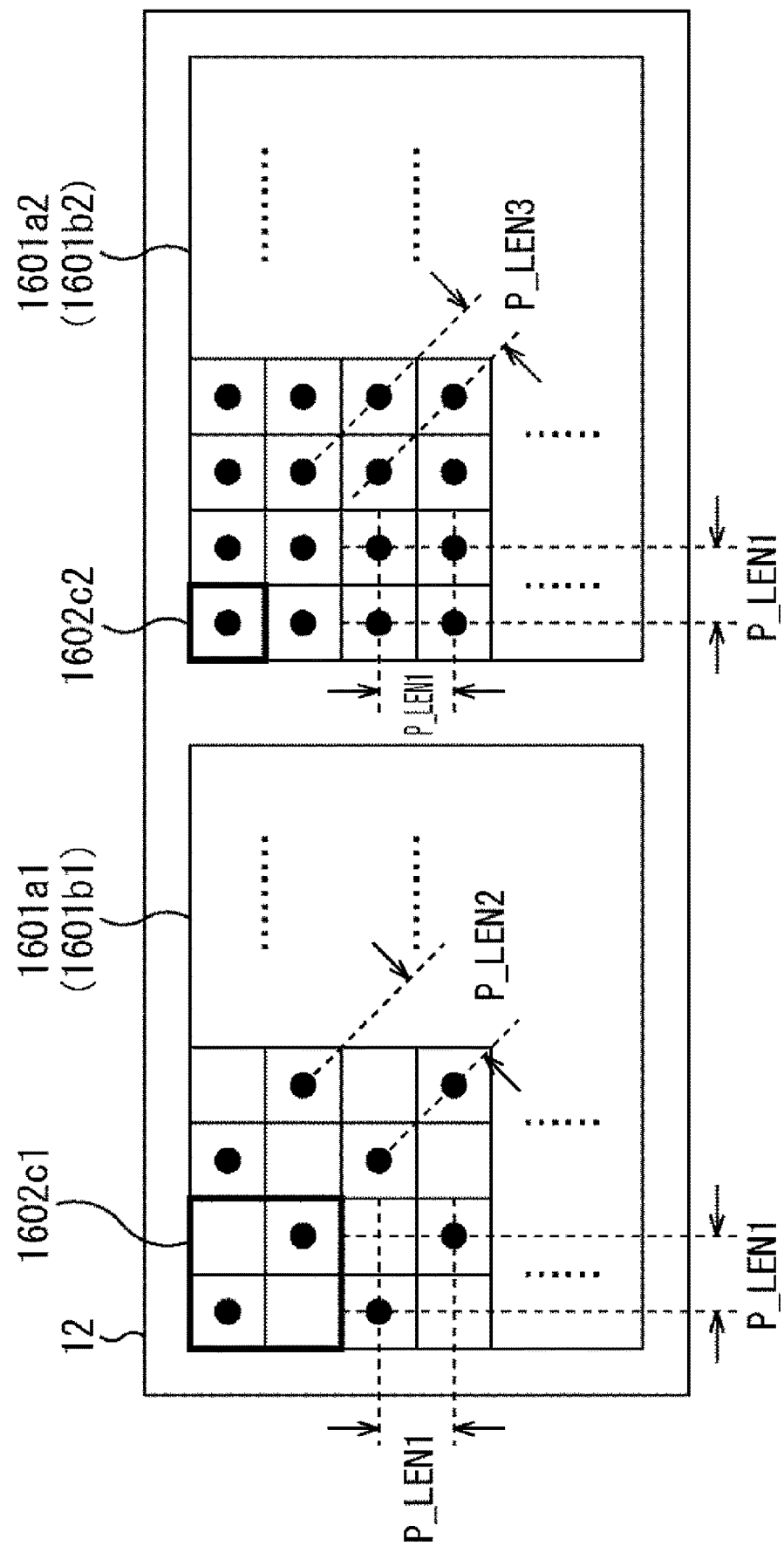
FIG. 83 is a diagram illustrating the structure of the light receiving element according to the twelfth embodiment.

FIG. 83 is a diagram illustrating an arrangement pitch of output points of the pixel signals from the pixels, that is, an arrangement pitch of centers of pixels that obtain luminance information items at high sensitivity (hereinafter, also referred to as high-luminance pixels) in the light receiving element 12 illustrated in FIG. 82.

As can be understood from comparison between the arrangement pitch of the high-luminance pixels in the light receiving area 1601a1 and that in the light receiving area 1601a2, a common arrangement pitch P_LEN1 is secured in each of the row and column directions.

However, in an oblique direction of 45° with respect to the row and column directions, an arrangement pitch P_LEN2 in the light receiving area 1601a1 and an arrangement pitch P_LEN3 in the light receiving area 1601a2 are different from each other. Specifically, a width of the arrangement pitch P_LEN3 in the light receiving area 1601a2 is ½ of the arrangement pitch P_LEN2 in the light receiving area 1601a1. In other words, in the oblique direction of 45° with respect to the row and column directions, an image to be obtained from the light receiving area 1601a2 have a resolution two times higher than that in the light receiving area 1601a1.

The binocular camera module 1M described with reference to FIGS. 80 to 83 include not only the light receiving area 1601a1 having a so-called Bayer array including the arrays of the R, G, B, and G pixels as the repetition units 1602c1, but also the light receiving area 1601a2 in which all the pixels forming the pixel array 1601b2 are C pixels.

Such a structure of the camera module 1M is capable of providing an effect of obtaining an image clearer than an image to be obtained only from the light receiving area 1601a1. For example, information items of variations in luminance in the respective pixels can be obtained from the light receiving area 1601a2. When luminance information items to be obtained from the light receiving area 1601a1 are complemented based on the information items of the variation, the effect of obtaining an image having a resolution higher than the image obtained only from the light receiving area 1601a1 can be provided. As described above, the resolution in the oblique direction is two times higher than that in the case where the pixel information items are obtained only from the light receiving area 1601a1. Thus, when the pixel information items from the light receiving area 1601a1 and the pixel information items from the light receiving area 1601a2 are combined with each other, double lossless zoom (image enlargement without image quality degradation) can be performed. Lossless zoom can be performed also by a method of using lenses corresponding to different imaging ranges. However, in that case, height of the camera module needs to be changed. The camera module 1M is capable of performing lossless zoom without changing the height of the camera module.

Further, signal levels of luminance signals to be obtained from the light receiving area 1601a2 that does not include the three types of the RGB color filters are approximately 1.7 times higher than signal levels of luminance signals to be obtained from the light receiving area 1601a1 including the color filters. Thus, when the pixel information items from the light receiving area 1601a1 and the pixel information items from the light receiving area 1601a2 are combined with each other, for example, by replacing luminance signals of the G pixels, which are obtained from the light receiving area 1601a1, with luminance signals of corresponding pixels, which are obtained from the light receiving area 1601a2, pixel signals having higher signal-to-noise ratio (SN ratio) can be generated and output. For example, there is a technique of imaging a plurality of images with a monocular color image sensor, and synthesizing image signals of those images, thereby increasing the SN ratio. However, such techniques take a long period for acquiring the plurality of images, and hence are not suited to imaging of moving objects or moving images. The camera module 1M is capable of performing imaging while synchronizing the light receiving area 1601a1 and the light receiving area 1601a2 with each other, and hence is capable of generating an image having high SN ratio within a short period. Thus, the camera module 1M is suited also to imaging of moving objects and moving images.

Still further, when the pixel information items from the light receiving area 1601a1 and the pixel information items from the light receiving area 1601a2 are combined with each other such that the pixel signals from the pixels in the light receiving area 1601a2 come to positions corresponding to intermediate positions between the pixels in the light receiving area 1601a1, it is possible to obtain a super-resolution moving image having the resolution two times higher than that of the image to be obtained only from the light receiving area 1601a1. For example, in a case of using the binocular camera module 1M having an image sensor with 20 mega pixels as many as those of a monocular color image sensor that has 20 mega pixels and images a moving image with a resolution of 8 mega pixels of 4Kx2K, when the pixel information items are complemented by shifting the positions of the pixels in the light receiving area 1601a2 by ½ pixels in each of the vertical and horizontal directions with respect to those in the light receiving area 1601a1 as described above, a super-resolution moving image with a resolution equivalent to 32 mega pixels of 8Kx4K can be obtained.

With use of the pixel information items obtained from each of the two light receiving area 1601a1 and light receiving area 1601a2 as described above, the binocular camera module 1M is capable of generating images for various purposes, such as an image enlarged without image quality degradation, an image having high SN ratio, and a super-resolution image. Which of the purposes is selected and which of the images therefor is generated are selected and determined, for example, by setting an operation mode of an imaging apparatus incorporating the camera module 1M.

<19. Thirteenth Embodiment of Camera Module>

Figure 84:
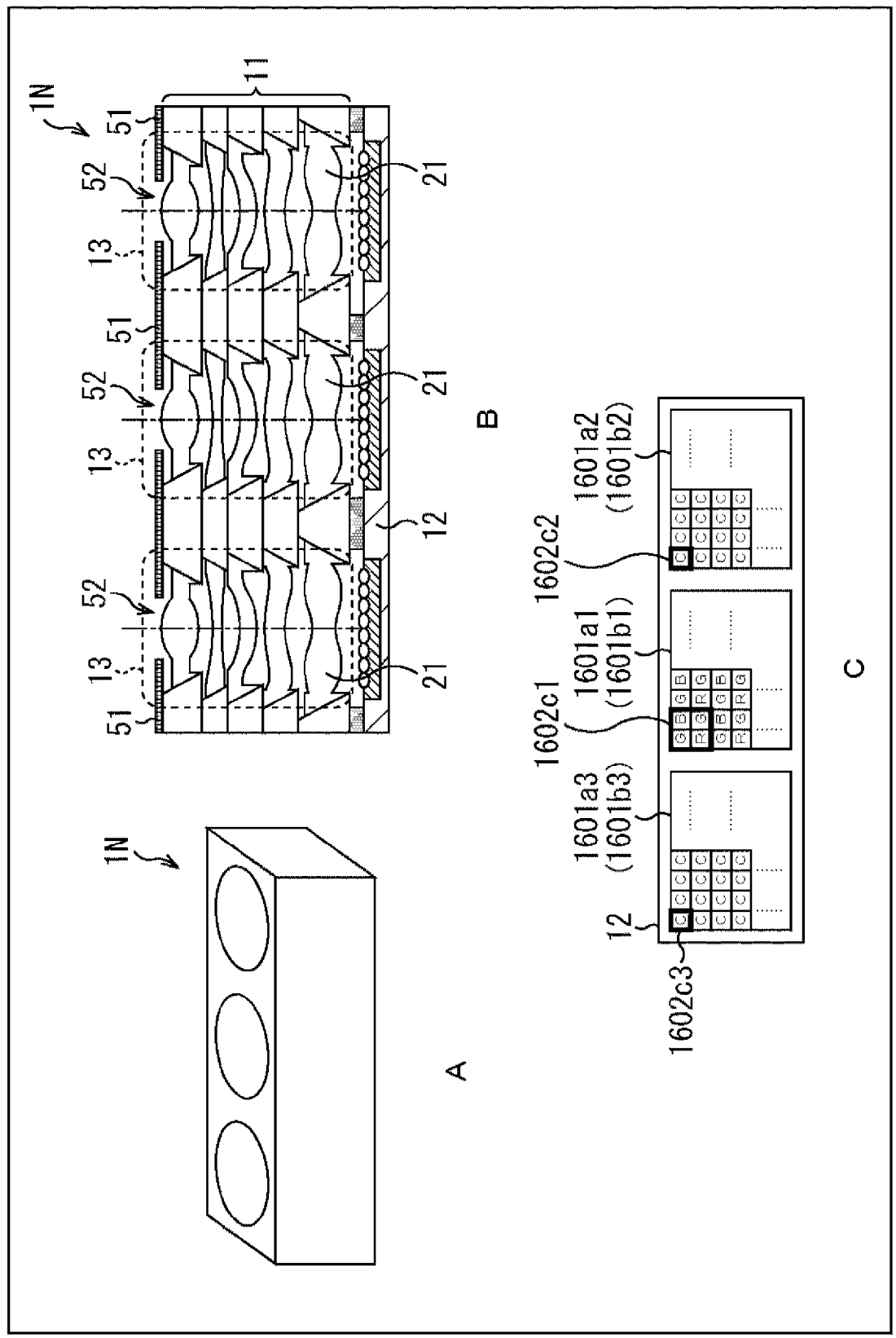
FIG. 84 is a diagram illustrating a thirteenth embodiment of a camera module which uses a stacked lens structure to which the present technique is applied.

A to C of FIG. 84 are diagrams illustrating a thirteenth embodiment of a camera module which uses a stacked lens structure to which the present technique is applied.

A of FIG. 84 is a schematic diagram illustrating an appearance of a camera module 1N as the thirteenth embodiment of the camera module 1. B of FIG. 84 is a schematic cross-sectional view of the camera module 1N.

As illustrated in B of FIG. 84, the camera module 1N includes three optical units 13 each having the same optical parameter.

C of FIG. 84 is a diagram illustrating a structure of the light receiving element 12 of the camera module 1N.

The light receiving element 12 of the camera module 1N includes three light receiving area 1601a1, 1601a2, and 1601a3 at positions corresponding to the three optical units 13 disposed thereabove. The light receiving areas 1601a1 to 1601a3 respectively include pixel arrays 1601b1, 1601b2, and 1601b3 in which the pixels are arranged in an array form.

The pixel arrays 1601b1 to 1601b3 include repetition units 1602c1, 1602c2, and 1602c3 each made up of one or a plurality of pixels. More specifically, the pixel array 1601b1 is formed by arranging the repetition units 1602c1 in a plurality of array forms in both the vertical and horizontal directions, the pixel array 1601b2 is formed by arranging the repetition units 1602c2 in a plurality of array forms in both the vertical and horizontal directions, and the pixel array 1601b3 is formed by arranging the repetition units 1602c3 in a plurality of array forms in both the vertical and horizontal directions. The repetition units 1602c1 are each made up of four R, G, B, and G pixels, and the repetition units 1602c2 and the repetition units 1602c3 are each made up of one C pixel.

Thus, the camera module 1N includes a pair of sensor units that output color image signals, that is, a pair of the optical unit 13 and the pixel array 1601b1 including the R, G, and B pixels, and two pairs of sensor units that output monochrome image signals, that is, a pair of the optical unit 13 and the pixel array 1601b2 including the C pixels, and a pair of the optical unit 13 and the pixel array 1601b3 including the C pixels.

Similar to the above-described binocular camera module 1M, such a structure of the camera module 1N is capable of providing the effect of obtaining the image clearer than the image to be obtained only from the light receiving area 1601a1. In other words, when the pixel information items from the light receiving area 1601a2 including the pixel array 1601b2 made up of the C pixels, and pixel information items from the light receiving area 1601a3 including the pixel array 1601b3 made up of the C pixels, such as the information items of variations in luminance in the respective pixels, are utilized such that the luminance information items to be obtained from the light receiving area 1601a1 having the Bayer array including the arrays of the R, G, B, and G pixels as the repetition units 1602c1 are complemented, it is possible to provide the effect of obtaining the image having the resolution higher than that of the image to be obtained only from the light receiving area 1601a1. As described above, the resolution in the oblique direction is two times higher than that of the monocular color image sensor. Thus, when the pixel information items from each of the light receiving areas 1601a1 to 1601a3 are combined with each other, the twice lossless zoom (image enlargement without image quality degradation) can be performed. The lossless zoom can be performed also by the method of using lenses corresponding to different imaging ranges. However, in that case, height of the camera module needs to be changed. The camera module 1N is capable of performing the lossless zoom without changing the height of the camera module.

Similar to the above-described binocular camera module 1M, the trinocular camera module 1N is capable of synchronizing the light receiving areas 1601a1 to 1601a3 with each other, and hence is capable of imaging a moving image and a moving object having high SN ratio. Further, when the pixel information items are complemented by shifting the positions of the pixels in the light receiving area 1601a2 and 1601a3 by ½ pixels in each of the vertical and horizontal directions with respect to those in the light receiving area 1601a1, a super-resolution moving image having a double resolution can be obtained.

Further, similar to the distance measuring apparatuses disclosed, for example, in Japanese Patent Application Laid-open No. 2008-286527 and International Publication No. WO2011/058876, with use of the pixel information items from each of the light receiving areas 1601a2 and 1601a3 each made up of the C pixels, the structure of the camera module 1N is capable of providing an effect of serving as a multi-ocular distance measuring apparatus and obtaining distance information.

The signal levels of the luminance signals to be obtained from the light receiving areas 1601a2 and 1601a3 each made up of the C pixels are approximately 1.7 times higher than those in the color image sensor. Thus, when the light receiving areas 1601a2 and 1601a3 are used to obtain distance information, it is possible to provide an effect of rapidly and accurately obtaining the distance information even in a photographing environment in which illuminance of a subject is low and hence luminance of the subject is low. When the distance information is used, for example, in an imaging apparatus incorporating the camera module 1N, it is possible to provide an effect of performing an autofocus operation rapidly and accurately.

Normally, an autofocus-dedicated sensor is used in autofocus mechanisms of single-lens reflex cameras, and a combination of a contrast-detection AF system and an imaging-surface phase-difference system in which phase-difference pixels are disposed in a part of the image sensor is used in autofocus mechanisms of, for example, compact digital cameras. The phase-difference pixels refer to pixels each having a light receiving area with a size, for example, half of that of a normal pixel, and hence the imaging-surface phase-difference system is disadvantageous in photographing of a subject with low illuminance. Further, the contrast-detection AF system has a disadvantage of taking a long focusing period, and the autofocus-dedicated sensor has a disadvantage of increasing an apparatus size.

In the camera module 1N, all the pixels in the two light receiving areas 1601a2 and 1601a3 that acquire the distance information are the normal pixels in which light receiving areas are not reduced. Further, imaging with the light receiving areas 1601a2 and 1601a3 for obtaining the distance information can be performed in synchronization with the imaging with the light receiving area 1601a1 capable of acquiring a color image. Thus, the camera module 1N is capable of compactifying an imaging apparatus incorporating the camera module 1N, and of rapidly performing the autofocus operation despite low illuminance.

In addition, the structure of the camera module 1N is capable of outputting a depth map that represents a distance with a color tone based on the distance information similar to the depth map disclosed, for example, in Japanese Patent Application Laid-open No. 2006-318060 and Japanese Patent Application Laid-open No. 2012-15642.

With use of the pixel information items obtained from each of the three light receiving areas 1601a1 to 1601a3 as described above, the trinocular camera module 1N is capable of generating the images for the various purposes, such as the image enlarged without image quality degradation, the image having high SN ratio, the super-resolution image, and the depth map. The trinocular camera module 1N is also capable of generating the distance information based on parallax between the light receiving areas 1601a2 and 1601a3. For which of the purposes the pixel information items to be obtained from each of the three light receiving areas 1601a1 to 1601a3 are used is selected and determined, for example, by setting an operation mode of the imaging apparatus incorporating the camera module 1N.

Figure 85:
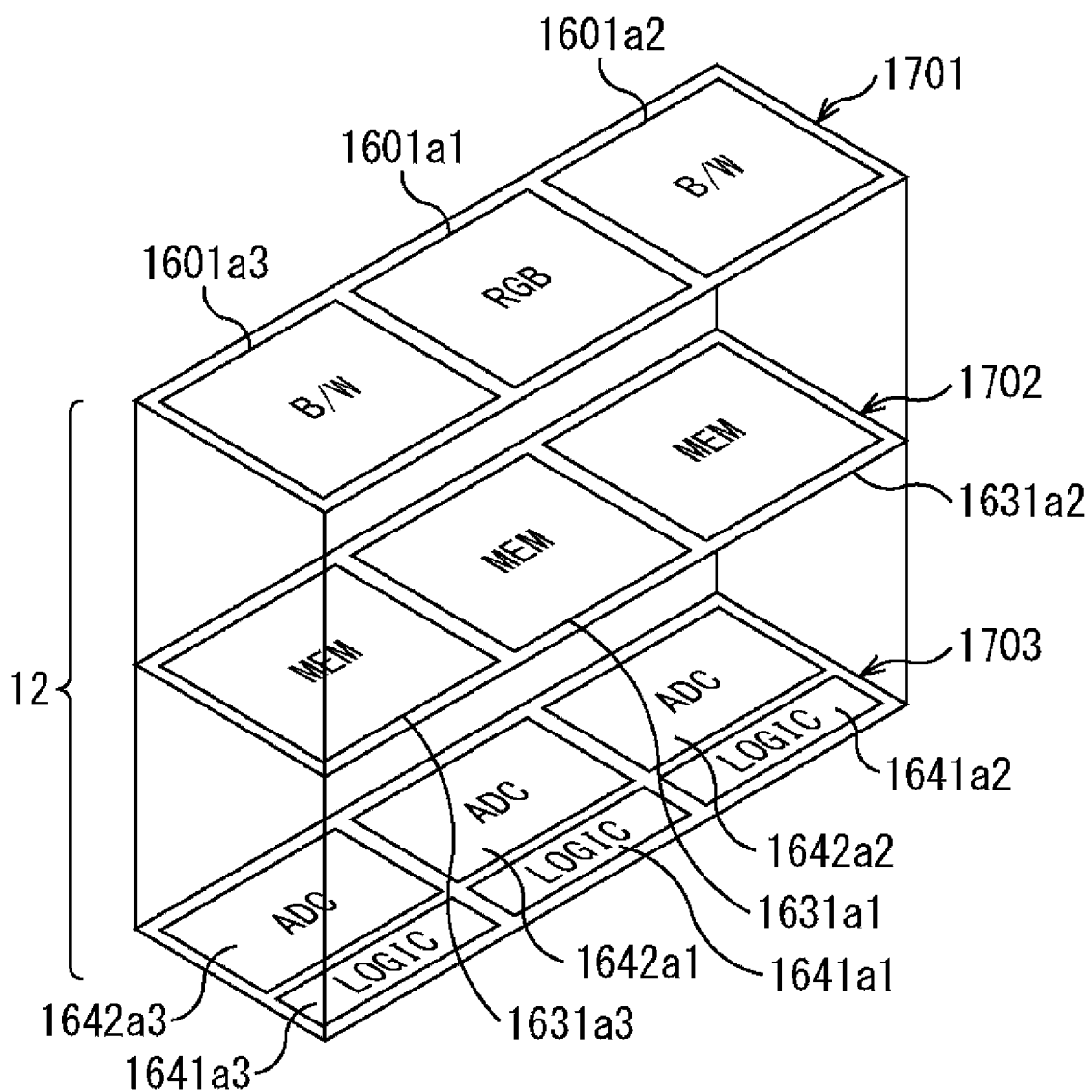
FIG. 85 is a diagram illustrating a configuration example of a substrate of a light receiving element according to the thirteenth embodiment.

FIG. 85 illustrates a configuration example of the light receiving element 12 to be used in the trinocular camera module 1N.

As illustrated in FIG. 85, the light receiving element 12 to be used in the trinocular camera module 1N may have a three-layer structure formed by stacking three semiconductor substrates 1701, 1702, and 1703.

Of the three semiconductor substrates 1701 to 1703, the first semiconductor substrate 1701 on the light incidence side includes the three light receiving areas 1601a1 to 1601a3 corresponding to the three optical units 13.

The middle second semiconductor substrate 1702 includes three memory areas 1631a1, 1631a2, and 1631a3 corresponding to the three light receiving areas 1601a1 to 1601a3. The memory areas 1631a1 to 1631a3 maintain pixel signals to be supplied via control areas 1642a1, 1642a2, and 1642a3 of the third semiconductor substrate 1703 for a predetermined period.

The third semiconductor substrate 1703 under the second semiconductor substrate 1702 includes logic areas 1641a1, 1641a2, and 1641a3 and the control areas 1642a1 to 1642a3 corresponding to the three light receiving areas 1601a1 to 1601a3. The control areas 1642a1 to 1642a3 are configured, for example, to perform readout control of reading out the pixel signals from the light receiving areas 1601a1 to 1601a3, to execute an AC conversion process of converting analog pixel signals to digital pixel signals, and to output the pixel signals to the memory areas 1631a1 to 1631a3. The logic areas 1641a1 to 1641a3 execute a predetermined signal process such as a gradation correction process on image data after the AD conversion.

The three semiconductor substrates 1701 to 1703 are electrically connected to each other, for example, with through-vias or by Cu—Cu bonding.

As described above, the light receiving element 12 may have the three-layer structure in which, correspondingly to the three light receiving areas 1601a1 to 1601a3, the memory areas 1631a1 to 1631a3, the logic areas 1641a1 to 1641a3, and the control areas 1642a1 to 1642a3 are disposed on the two semiconductor substrates 1702 and 1703.

Normally, when imaging is performed at high frame rate with the monocular color image sensor, an exposure period per frame decreases, and hence the SN ratio decreases. In contrast, in the camera module 1N, in the two light receiving areas 1601a2 and 1601a3, imaging operations are started at timings that are shifted to each other by a ½ exposure period. With this, a double exposure period can be secured at the same frame rate as that at the time of using the monocular color image sensor. When the luminance information items obtained from the color image signals from the light receiving area 1601a1 are alternately replaced with monochrome image signals (luminance information items) from each of the two light receiving areas 1601a2 and 1601a3, which are obtained by setting the double exposure period, an image having the high SN ratio can be output even at high frame rate.

Alternatively, when imaging is performed only with any one of the three light receiving areas 1601a1 to 1601a3, the three memory areas 1631a1 to 1631a3 can be used with respect to the one light receiving area 1601. Thus, a triple memory capacity is available. With this, at the time of imaging a super-slow moving image by setting a short exposure period, an imaging period can be triplicated. Further, the AD conversion process can be executed by using all analog/digital converters (ADCs) in the three control areas 1642a1 to 1642a3, and hence a processing speed can be almost triplicated.

Figure 86:
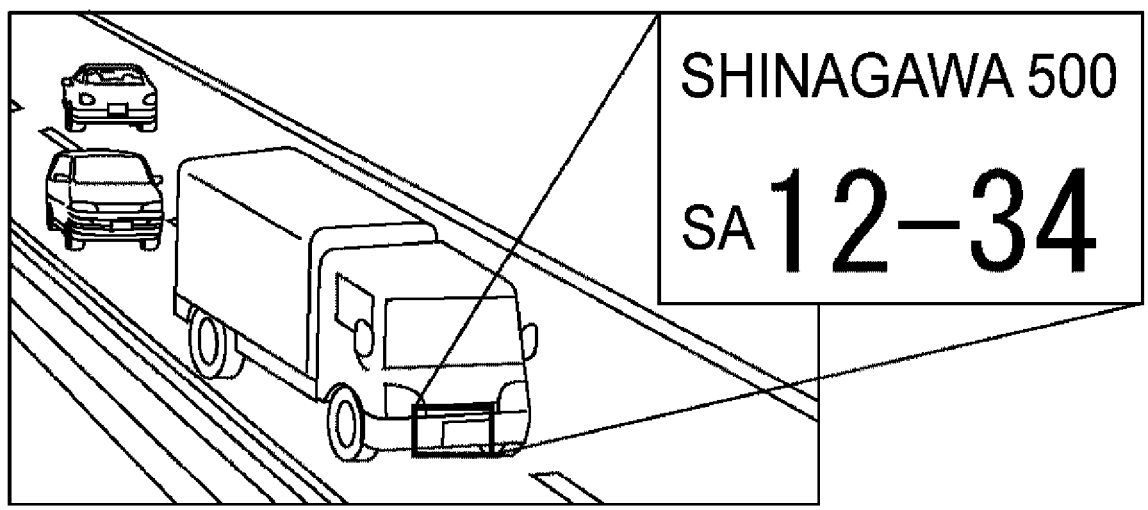
FIG. 86 is a diagram illustrating an example of a process by the light receiving element according to the thirteenth embodiment.

Further, in the light receiving element 12, the memory areas 1631a1 to 1631a3 correspond to the three light receiving areas 1601a1 to 1601a3. With this, as illustrated in FIG. 86, it is possible to execute a process of, for example, outputting only image signals corresponding to an area of the license plate in an entirety of an obtained image to a subsequent stage. In this way, an amount of data to be transmitted can be reduced, and hence a load at the time of transferring the data is suppressed. As a result, it is also possible to obtain advantages such as increase in transfer rate and less electric power consumption.

As described above, when the light receiving element 12 of the camera module 1N has the three-layer structure formed by stacking the three semiconductor substrates 1701 to 1703, images for a wider variety of purposes are obtained from the light receiving element 12.

<20. Fourteenth Embodiment of Camera Module>

Figure 87:
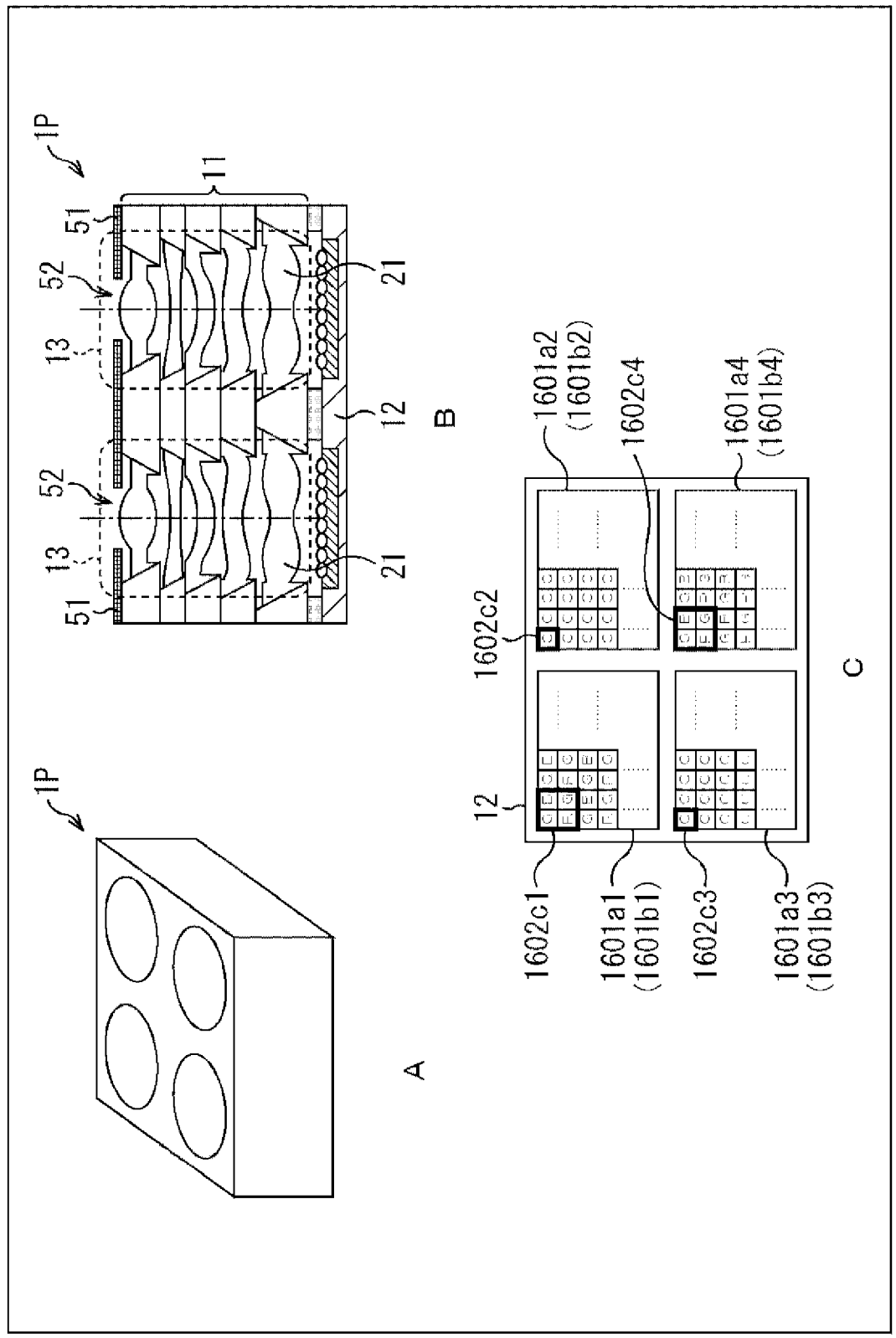
FIG. 87 is a diagram illustrating a fourteenth embodiment of a camera module which uses a stacked lens structure to which the present technique is applied.

A to C of FIG. 87 are diagrams illustrating a fourteenth embodiment of a camera module which uses a stacked lens structure to which the present technique is applied.

A of FIG. 87 is a diagram illustrating an appearance of a camera module 1P as the fourteenth embodiment of the camera module 1. B of FIG. 87 is a schematic cross-sectional view of the camera module 1P.

The camera module 1P includes four optical units 13 each having the same optical parameter.

C of FIG. 87 is a diagram illustrating a structure of the light receiving element 12 of the camera module 1P.

The light receiving element 12 of the camera module 1P includes four light receiving area 1601a1, 1601a2, 1601a3, and 1601a4 at positions corresponding to the four optical units 13 disposed thereabove. The light receiving areas 1601a1 to 1601a4 respectively include pixel arrays 1601b1, 1601b2, 1601b3, and 1601b4 in which the pixels that receive light are arranged in an array form.

The pixel arrays 1601b1 to 1601b4 include repetition units 1602c1 to 1602c4 each made up of one or a plurality of pixels. More specifically, the pixel array 1601b1 is formed by arranging the repetition units 1602c1 in a plurality of array forms in both the vertical and horizontal directions, and the pixel array 1601b2 is formed by arranging the repetition units 1602c2 in a plurality of array forms in both the vertical and horizontal directions. Further, the pixel array 1601b3 is formed by arranging the repetition units 1602c3 in a plurality of array forms in both the vertical and horizontal directions, and the pixel array 1601b4 is formed by arranging the repetition units 1602c4 in a plurality of array forms in both the vertical and horizontal directions. The repetition units 1602c1 and 1602c4 are each made up of four R, G, B, and G pixels, and the repetition units 1602c2 and 1602c3 are each made up of one C pixel.

Thus, the camera module 1P includes two pairs of sensor units that output color image signals, that is, a pair of the optical unit 13 and the pixel array 1601b1 including the R, G, and B pixels, and a pair of the optical unit 13 and the pixel array 1601b4 including the R, G, and B pixels. The camera module 1P also includes two pairs of sensor units that output monochrome image signals, that is, a pair of the optical unit 13 and the pixel array 1601b2 including the C pixels, and a pair of the optical unit 13 and the pixel array 1601b3 including the C pixels.

Similar to the above-described binocular camera module 1M, such a structure of the camera module 1P is capable of providing the effect of obtaining the image clearer than the image to be obtained only from the light receiving area 1601a1 or 1601a4. In other words, when the pixel information items from the light receiving area 1601a2 including the pixel array 1601b2 made up of the C pixels, and the pixel information items from the light receiving area 1601a3 including the pixel array 1601b3 made up of the C pixels, such as the information items of variations in luminance in the respective pixels, are utilized such that the luminance information items to be obtained from the light receiving area 1601a1 or 1601a4 having the Bayer array including the arrays of the R, G, B, and G pixels as the repetition unit 1602c1 or 1602c4 are complemented, it is possible to provide the effect of obtaining the image having the resolution higher than that of the image to be obtained only from the light receiving area 1601a1 or 1601a4. Further, the resolution in the oblique direction is two times higher than that of the monocular or multi-ocular color image sensor. Thus, when the pixel information items from each of the light receiving areas 1601a1 to 1601a4 are combined with each other, the double lossless zoom (image enlargement without image quality degradation) can be performed. The lossless zoom can be performed also by the method of using lenses corresponding to different imaging ranges. However, in that case, height of the camera module needs to be changed. The camera module 1P is capable of performing the lossless zoom without changing the height of the camera module.

In an area where imaging ranges of the two light receiving areas 1601a1 and 1601a4 that image a color image overlap with each other, the number of signals is doubled, and noise is increased by 1.4 times. Thus, the SN ratio of the pixel signals can be increased. In an area where imaging ranges of the two light receiving areas 1601a2 and 1601a3 that image a monochrome image additionally overlap with the overlapping area of the imaging ranges of the two light receiving areas 1601a1 and 1601a4, signal levels of luminance signals are approximately 1.7 times higher than those from the light receiving areas 1601a1 and 1601a4 that image a color image. Thus, the SN ratio can be further increased. When the pixel information items from each of the four light receiving areas 1601a1 to 1601a4 are combined with each other, the SN ratio is increased by approximately 2.7 times higher than that of an image to be obtained from a monocular color imaging sensor. The camera module 1P is capable of performing imaging while synchronizing the light receiving areas 1601a1 to 1601a4 with each other, and hence is capable of generating an image having high SN ratio within a short period. Thus, the camera module 1P is suited also to imaging of moving objects and moving images.

Further, similar to the distance measuring apparatuses disclosed, for example, in Japanese Patent Application Laid-open No. 2008-286527 and International Publication No. WO2011/058876, with use of the pixel information items from each of the light receiving areas 1601a2 and 1601a3 each made up of the C pixels, the structure of the camera module 1P is capable of providing the effect of serving as a multi-ocular distance measuring apparatus and obtaining distance information.

Further, when the light receiving areas 1601a2 and 1601a3 each made up of the C pixels having high luminance signal levels are used to obtain distance information, it is possible to provide the effect of rapidly and accurately obtaining the distance information even in the photographing environment in which illuminance of a subject is low and hence luminance of the subject is low. When the distance information is used, for example, in an imaging apparatus incorporating the camera module 1P, it is possible to provide the effect of performing an autofocus operation rapidly and accurately.

In the camera module 1P, all the pixels in the two light receiving areas 1601a2 and 1601a3 that acquire the distance information are not reduced in light receiving area as in the phase-difference pixels, but are the normal pixels. Further, imaging with the light receiving areas 1601a2 and 1601a3 from which the distance information is obtained can be performed in synchronization with imaging with the light receiving areas 1601a1 and 1601a4 capable of acquiring a color image. Thus, the camera module 1P is capable of compactifying an imaging apparatus incorporating the camera module 1P, and of rapidly performing the autofocus operation despite low illuminance.

In addition, the structure of the camera module 1P is capable of providing the effect of outputting a depth map that represents a distance with a color tone based on the distance information similar to the depth map disclosed, for example, in Japanese Patent Application Laid-open No. 2006-318060 and Japanese Patent Application Laid-open No. 2012-15642.

Further, when a method of driving the pixels in the camera module 1P is changed, an image having a wide dynamic range (high-dynamic-range image) can be obtained.

Figure 88:
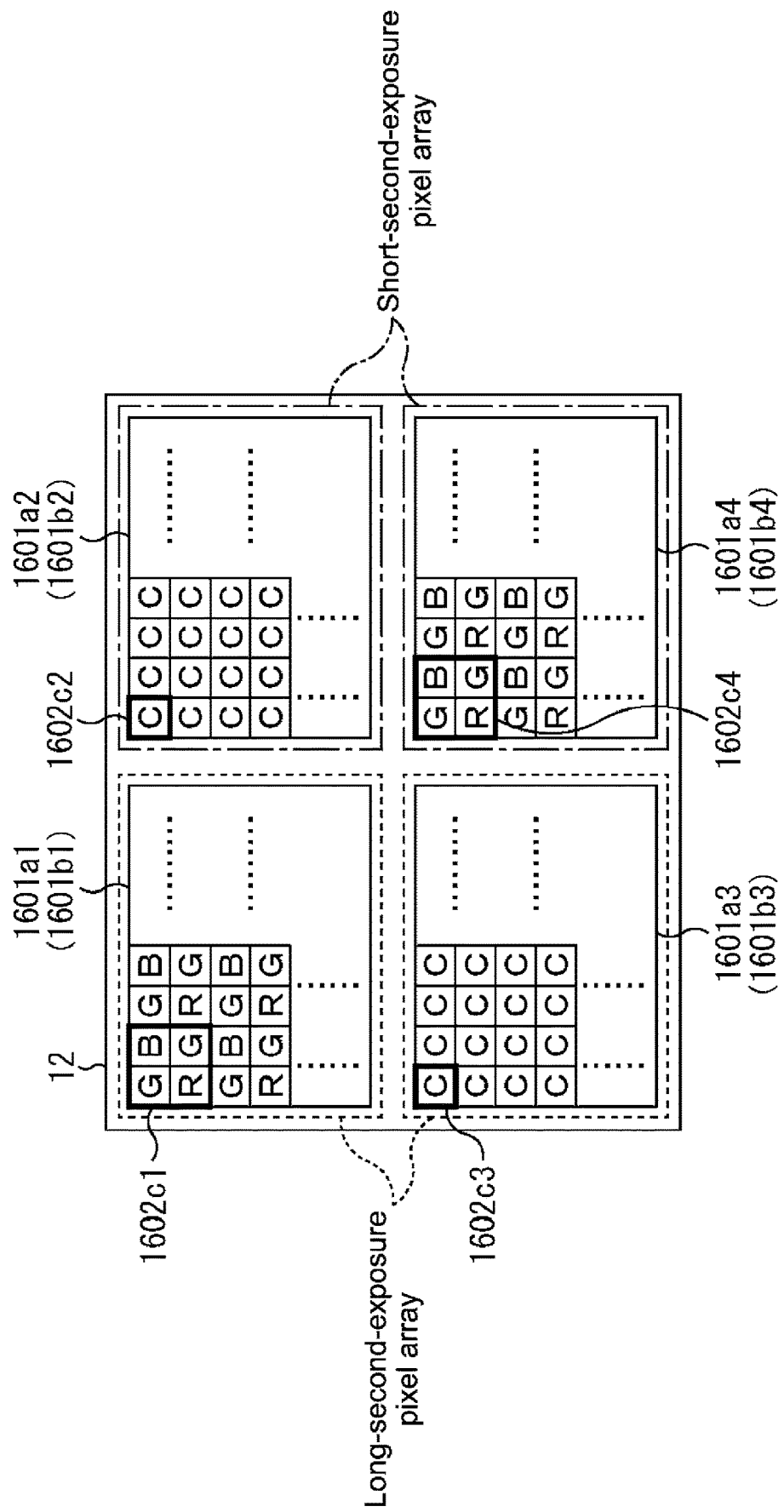
FIG. 88 is a diagram illustrating a method of driving a light receiving element according to the fourteenth embodiment.

FIG. 88 is a diagram illustrating the method of driving the pixels for obtaining the high-dynamic-range image.

In the camera module 1P, the light receiving area 1601a1 including the pixel array 1601b1 made up of the R, G, B, and G pixels, and the light receiving area 1601a3 including the pixel array 1601b3 made up of the C pixels photograph an image in a predetermined exposure period (hereinafter, referred to as first exposure period) under a state in which a subject has a given illuminance.

Meanwhile, the light receiving area 1601a2 including the pixel array 1601b2 made up of the C pixels, and the light receiving area 1601a4 including the pixel array 1601b4 made up of the R, G, B, and G pixels photograph an image in an exposure period shorter than the first exposure period (hereinafter, referred to as second exposure period) under the state in which the subject has the given illuminance. Note that, in the following description, the first exposure period is also referred to as a long-second exposure period, and the second exposure period is also referred to as a short-second exposure period.

For example, when an image of the subject having high illuminance is photographed in the long-second exposure period, photographing operations by pixels that photograph high luminance parts of the subject are performed under a state in which an appropriate operation limit (for example, saturation charge amount) of the pixels is exceeded. As a result, a gradation of image data to be obtained through the photographing may be lost, that is, so-called blown-out highlights may occur. Even in such cases, in the camera module 1P, it is possible to obtain, from the light receiving area 1601a2 and the light receiving area 1601a4, an image photographed in the short-second exposure period, that is, an image photographed within an appropriate operation range (for example, the saturation charge amount or less) of the pixels.

The camera module 1P is capable of providing an effect of obtaining a high-dynamic-range image by synthesizing the image photographed in the long-second exposure period and the image photographed in the short-second period as described above as in the methods of synthesizing pixel signals for extending a dynamic range, which are disclosed, for example, in Japanese Patent Application Laid-open No. H11-75118 and Japanese Patent Application Laid-open No. H11-27583.

Normally, as examples of methods of generating the high-dynamic-range image, there are methods that use, for example, a monocular color image sensor, in which the image photographed in the long-second exposure period and the image photographed in the short-second exposure period are acquired at different timings, and synthesized with each other, and in which imaging with long-second exposure pixel arrays and imaging with short-second exposure pixel arrays are performed independently of each other. The method of synthesizing the two images, that is, the image photographed in the long-second exposure period and the image photographed in the short-second exposure period with each other is not suited to photographing of moving objects or moving images. The method of using the long-second exposure pixel arrays and the short-second exposure pixel arrays causes degradation in resolution. The method of generating a high-dynamic-range image with the quadnocular camera module 1P does not cause degradation in resolution or decrease in frame rate. Thus, this method is suited also to photographing of moving objects and moving images.

With use of the pixel information items obtained from each of the four light receiving areas 1601a1 to 1601a4 as described above, the quadnocular camera module 1P is capable of generating the images for the various purposes, such as the image enlarged without image quality degradation, the image having the high SN ratio, the super-resolution image, the depth map, and the high-dynamic-range image. The quadnocular camera module 1P is also capable of generating the distance information based on parallax between the light receiving areas 1601a2 and 1601a3. For which of the purposes the pixel information items to be obtained from each of the four light receiving areas 1601a1 to 1601a4 are used is selected and determined, for example, by setting an operation mode of the imaging apparatus incorporating the camera module 1P.

Figure 89:
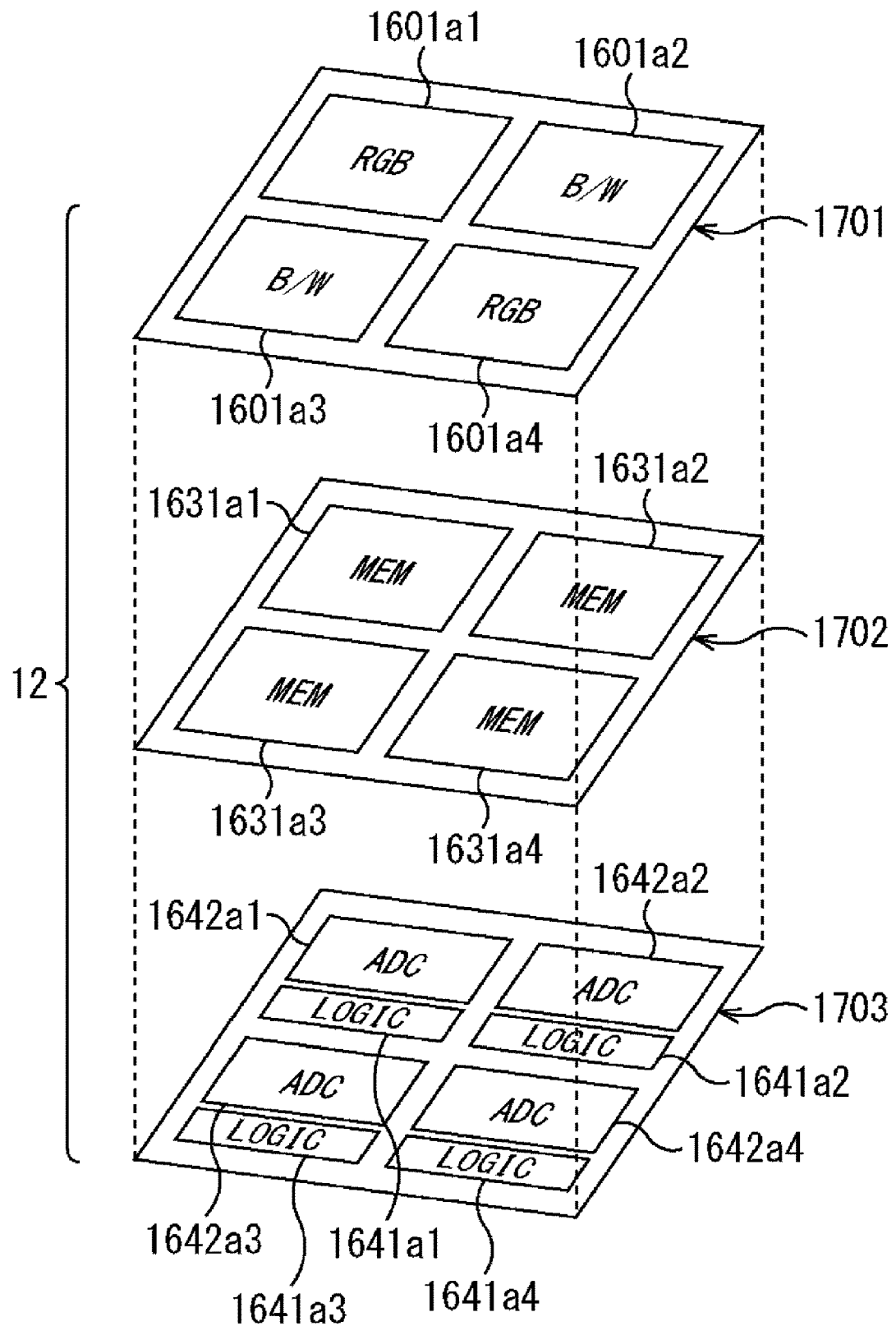
FIG. 89 is a diagram illustrating a configuration example of a substrate of the light receiving element according to the fourteenth embodiment.

FIG. 89 illustrates a configuration example of a substrate of the light receiving element 12 to be used in the quadnocular camera module 1P.

As illustrated in FIG. 89, the light receiving element 12 to be used in the quadnocular camera module 1P may have a three-layer structure formed by stacking the three semiconductor substrates 1701 to 1703.

Of the three semiconductor substrates 1701 to 1703, the first semiconductor substrate 1701 on the light incidence side includes the four light receiving areas 1601a1 to 1601a4 corresponding to the four optical units 13.

The middle second semiconductor substrate 1702 includes four memory areas 1631a1, 1631a2, 1631a3, and 1631a4 corresponding to the four light receiving areas 1601a1 to 1601a4. The third semiconductor substrate 1703 includes logic areas 1641a1, 1641a2, 1641a3, and 1641a4 and control areas 1642a1, 1642a2, 1642a3, and 1642a4 corresponding to the four light receiving areas 1601a1 to 1601a4.

Normally, when imaging is performed at high frame rate with the monocular color image sensor, an exposure period per frame decreases, and hence the SN ratio decreases. In contrast, in the camera module 1P, with use of the four light receiving areas 1601a1 to 1601a4, imaging operations are started at timings that are shifted to each other by a ¼ exposure period. With this, a quadruple exposure period can be secured at the same frame rate as that at the time of using the monocular color image sensor. When the luminance information items obtained from the color image signals from the light receiving area 1601a1 or 1601a4 are sequentially replaced with luminance information items from each of the four light receiving areas 1601a1 to 1601a4, which are obtained by setting the quadruple exposure period, an image having the high SN ratio can be output even at high frame rate.

Alternatively, when imaging is performed only with any one of the four light receiving areas 1601a1 to 1601a4, the four memory areas 1631a1 to 1631a4 can be used with respect to the one light receiving area 1601. Thus, a quadruple memory capacity is available. With this, at the time of imaging a super-slow moving image by setting a short exposure period, an imaging period can be quadrupled. Further, the AD conversion process can be executed by using all ADCs in the four control areas 1642a1 to 1642a4, and hence a processing speed can be almost quadrupled.

Further, in the light receiving element 12, the memory areas 1631a1 to 1631a4 correspond to the four light receiving areas 1601a1 to 1601a4. With this, as described with reference to FIG. 86, it is possible to execute the process of, for example, outputting only image signals corresponding to a desired area to a subsequent stage. In this way, an amount of data to be transmitted can be reduced, and hence a load at the time of transferring the data is suppressed. As a result, it is also possible to obtain the advantages such as increase in transfer rate and less electric power consumption.

As described above, when the light receiving element 12 of the camera module 1P has the three-layer structure formed by stacking the three semiconductor substrates 1701 to 1703, images for a wider variety of purposes are obtained from the light receiving element 12.

<21. Example of Stacked Lens Structure Including Deformable Lens>

The stacked lens structure 11 may include, instead of the lens 21 of at least one of the plurality of stacked substrates with lenses 41, a deformable lens 21V capable of changing the lens shape.

<Example of First Deformable Lens>

Figure 90:
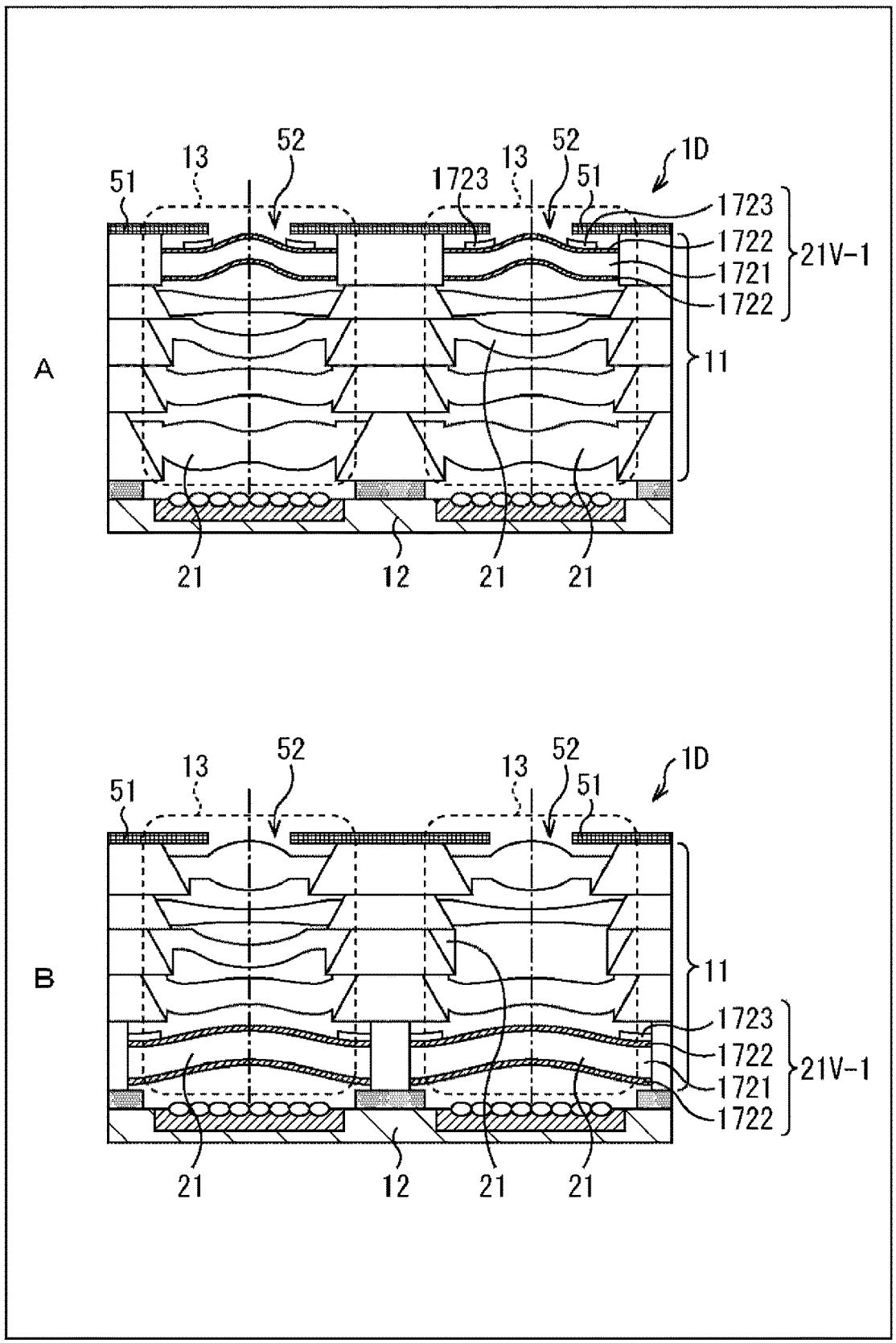
FIG. 90 is a schematic cross-sectional view of a camera module including a first deformable lens.

A and B of FIG. 90 are schematic cross-sectional views illustrating a state in which the lens 21 of one of the substrates with lenses 41 of the stacked lens structure 11 of the camera module 1D illustrated in A to D of FIG. 11 is replaced with a first deformable lens 21V-1.

A of FIG. 90 illustrates a configuration example in which the lens 21 of the substrate with lenses 41 as the top layer of the plurality of stacked substrates with lenses 41 is replaced with the first deformable lens 21V-1.

B of FIG. 90 illustrates a configuration example in which the lens 21 of the substrate with lenses 41 as the bottom layer of the plurality of stacked substrates with lenses 41 is replaced with the first deformable lens 21V-1.

The first deformable lens 21V-1 includes a lens member 1721 formed of a reversibly deformable material, cover members 1722 disposed in a sandwiching manner respectively on an upper surface and a lower surface of the lens member 1721, and a piezoelectric material 1723 disposed in contact with the cover member 1722 on the upper surface.

The lens member 1721 is formed, for example, of a soft polymer (Specification of US Patent Application Publication No. 2011/149409), a flexible polymer (Specification of US Patent Application Publication No. 2011/158617), working fluids such as a silicone oil (Japanese Patent Application Laid-open No. 2000-081504), and fluids such as the silicone oil, elastic rubber, jelly, and water (Japanese Patent Application Laid-open No. 2002-243918).

The cover members 1722 are made up, for example, of a cover glass formed of a flexible material (Specification of US Patent Application Publication No. 2011/149409), a bendable transparent cover (Specification of US Patent Application Publication No. 2011/158617), an elastic film formed of silicate glass (Japanese Patent Application Laid-open No. 2000-081504), and a flexible substrate formed of a synthetic resin or an organic material (Japanese Patent Application Laid-open No. 2002-243918).

In the first deformable lens 21V-1, when a voltage is applied to the piezoelectric material 1723, the lens member 1721 can be deformed. With this, a focal point can be varied.

In the examples illustrated in A and B of FIG. 90, the one of the substrates with lenses 41, which uses the first deformable lens 21V-1, is disposed as the top layer or the bottom layer of the plurality of substrates with lenses 41 forming the stacked lens structure 11. However, the one of the substrates with lenses 41 may be disposed as one of the middle layers between the top layer and the bottom layer. Further, the one of the substrates with lenses 41, which uses the first deformable lens 21V-1, may be provided in a plurality of numbers.

<Example of Second Deformable Lens>

Figure 91:
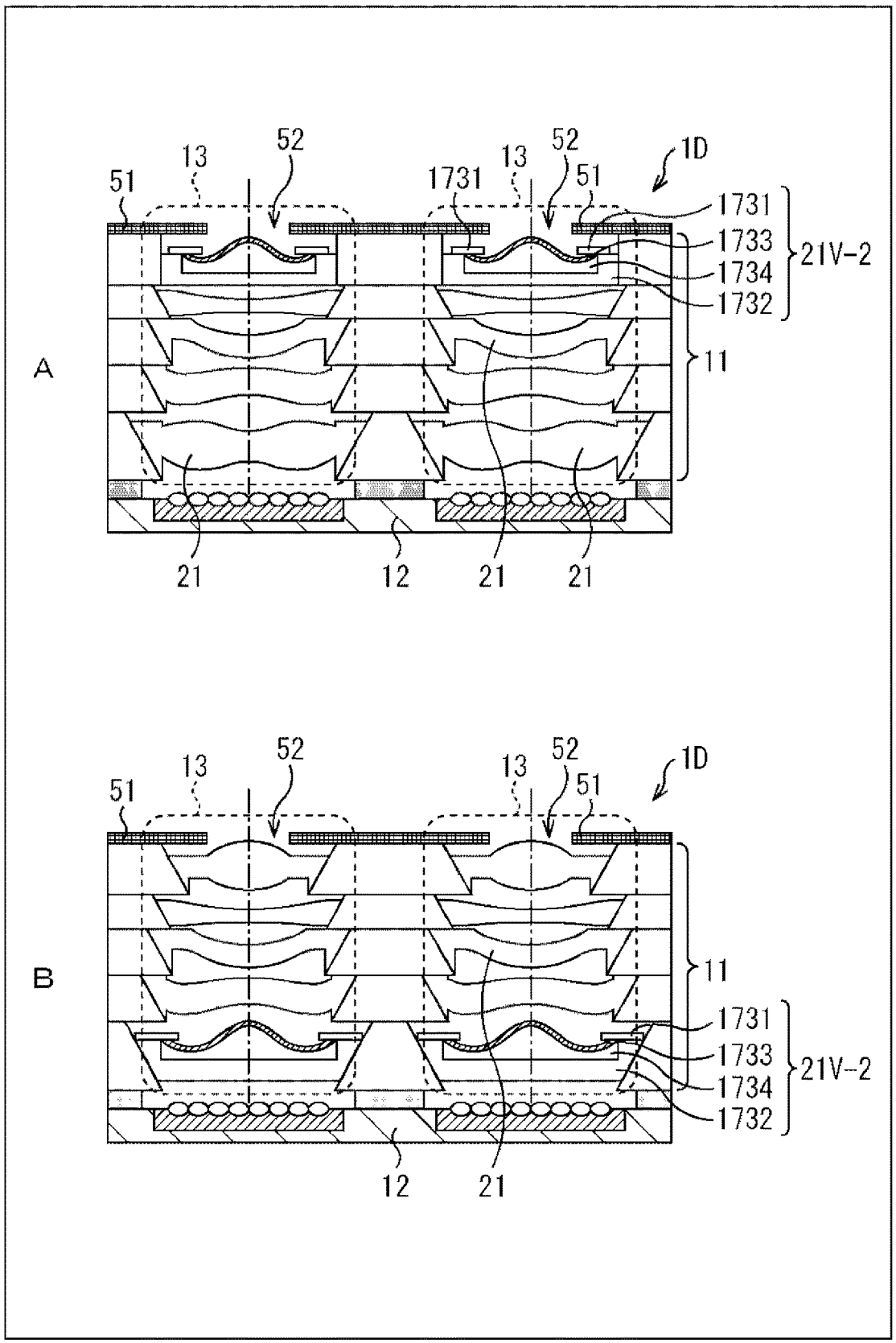
FIG. 91 is a schematic cross-sectional view of a camera module including a second deformable lens.

A and B of FIG. 91 are schematic cross-sectional views illustrating a state in which the lens 21 of one of the substrates with lenses 41 of the stacked lens structure 11 of the camera module 1D illustrated in A to D of FIG. 11 is replaced with a second deformable lens 21V-2.

A of FIG. 91 illustrates a configuration example in which the lens 21 of the substrate with lenses 41 as the top layer of the plurality of stacked substrates with lenses 41 is replaced with the second deformable lens 21V-2.

B of FIG. 91 illustrates a configuration example in which the lens 21 of the substrate with lenses 41 as the bottom layer of the plurality of stacked substrates with lenses 41 is replaced with the second deformable lens 21V-2.

The second deformable lens 21V-2 includes a pressure applying portion 1731, a light transmitting substrate 1732 including a recess portion, a light transmitting film 1733 disposed over the recess portion of the substrate 1732, and a fluid 1734 sealed between the film 1733 and the recess portion of the substrate 1732.

The film 1733 is formed, for example, of polydimethylsiloxane, polymethylmethacrylate, polyterephthalate ethylene, polycarbonate, parylene, an epoxy resin, a photosensitive polymer, silicone, silicon, silicon dioxide, silicon nitride, silicon carbide, polycrystalline silicon, titanium nitride, diamond-like carbon, indium tin oxide, aluminum, copper, nickel, and a piezoelectric material.

As examples of the fluid 1734, there are propylene carbonate, water, a refractive-index liquid, an optical oil, an ionic liquid, and gases such as air, nitrogen, and helium.

In the second deformable lens 21V-2, when the pressure applying portion 1731 presses a vicinity of an outer periphery of the film 1733, a central portion of the film 1733 swells. By controlling a pressing force of the pressure applying portion 1731, the fluid 1734 corresponding to the swelling part can be deformed. With this, a focal point can be varied.

The structure of the second deformable lens 21V-2 is disclosed, for example, in Specification of US Patent Application Publication No. 2012/170920.

In the examples illustrated in A and B of FIG. 91, the one of the substrates with lenses 41, which uses the second deformable lens 21V-2, is disposed as the top layer or the bottom layer of the plurality of substrates with lenses 41 forming the stacked lens structure 11. However, the one of the substrates with lenses 41 may be disposed as one of the middle layers between the top layer and the bottom layer. Further, the one of the substrates with lenses 41, which uses the second deformable lens 21V-2, may be provided in a plurality of numbers.

<Example of Third Deformable Lens>

Figure 92:
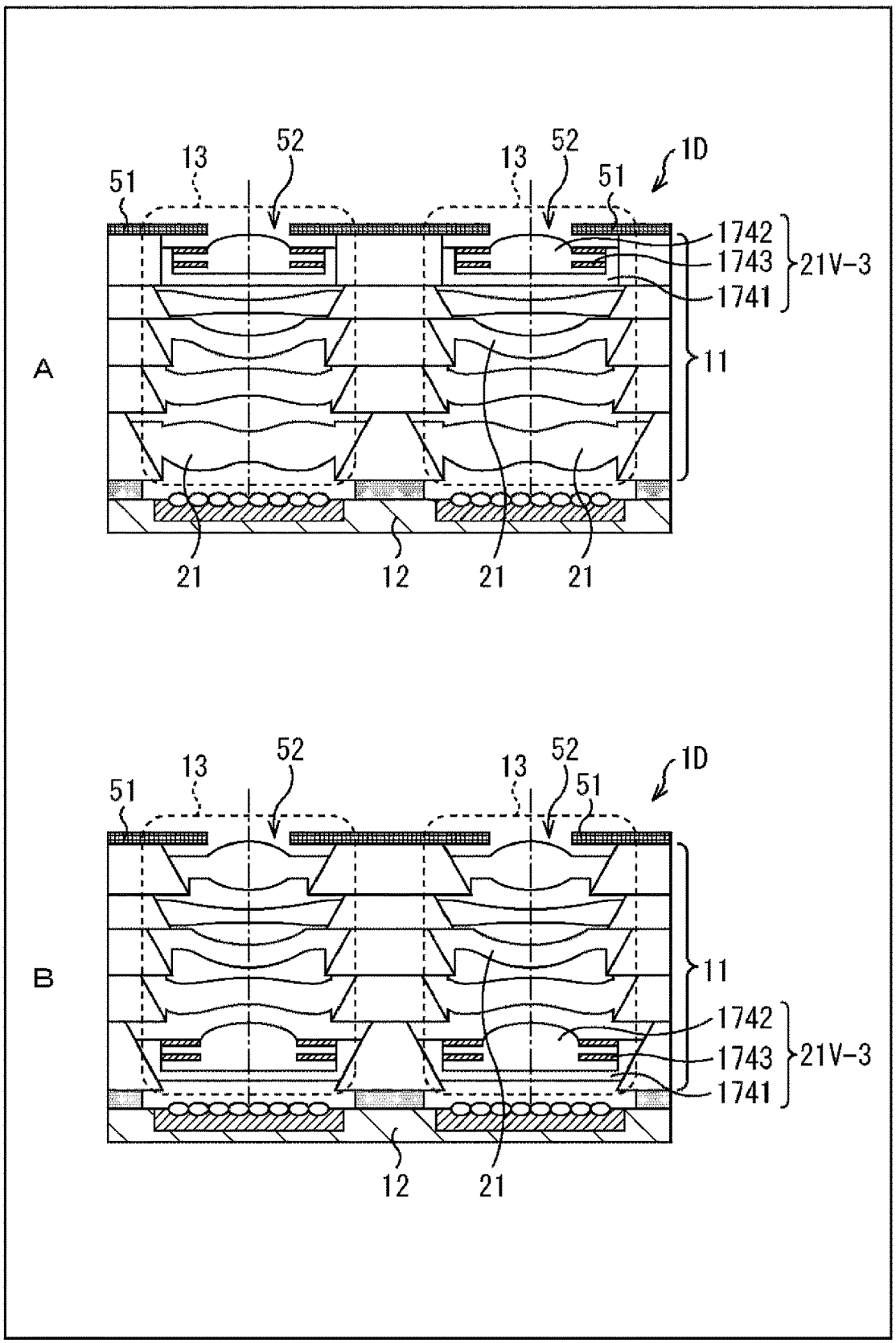
FIG. 92 is a schematic cross-sectional view of a camera module including a third deformable lens.

A and B of FIG. 92 are schematic cross-sectional views illustrating a state in which the lens 21 of one of the substrates with lenses 41 of the stacked lens structure 11 of the camera module 1D illustrated in A to D of FIG. 11 is replaced with a third deformable lens 21V-3.

A of FIG. 92 illustrates a configuration example in which the lens 21 of the substrate with lenses 41 as the top layer of the plurality of stacked substrates with lenses 41 is replaced with the third deformable lens 21V-3.

B of FIG. 92 illustrates a configuration example in which the lens 21 of the substrate with lenses 41 as the bottom layer of the plurality of stacked substrates with lenses 41 is replaced with the third deformable lens 21V-3.

The third deformable lens 21V-3 includes a light transmitting substrate 1741 including a recess portion, a light transmitting electroactive material 1742 disposed over the recess portion of the substrate 1741, and an electrode 1743.

In the third deformable lens 21V-3, when the electrode 1743 applies a voltage to the electroactive material 1742, a central portion of the electroactive material 1742 swells. By controlling magnitude of the voltage to be applied, the central portion of the electroactive material 1742 can be deformed. With this, a focal point can be varied.

The structure of the third deformable lens 21V-3 is disclosed, for example, in Japanese Translation of PCT International Application No. 2011-530715.

In the examples illustrated in A and B of FIG. 92, the one of the substrates with lenses 41, which uses the third deformable lens 21V-3, is disposed as the top layer or the bottom layer of the plurality of substrates with lenses 41 forming the stacked lens structure 11. However, the one of the substrates with lenses 41 may be disposed as one of the middle layers between the top layer and the bottom layer. Further, the one of the substrates with lenses 41, which uses the third deformable lens 21V-3, may be provided in a plurality of numbers.

<Example of Fourth Deformable Lens>

Figure 93:
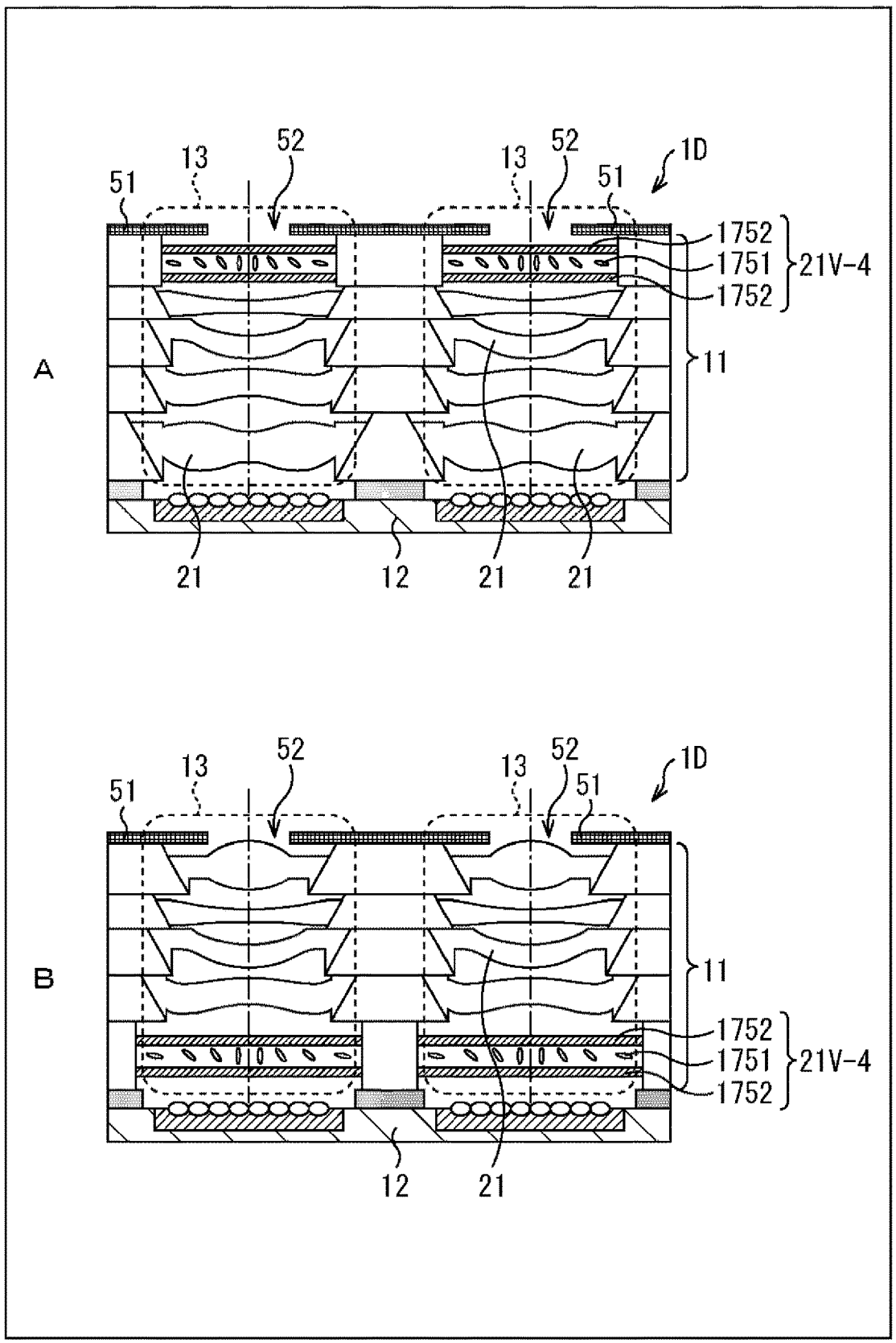
FIG. 93 is a schematic cross-sectional view of a camera module including a fourth deformable lens.

A and B of FIG. 93 are schematic cross-sectional views illustrating a state in which the lens 21 of one of the substrates with lenses 41 of the stacked lens structure 11 of the camera module 1D illustrated in A to D of FIG. 11 is replaced with a fourth deformable lens 21V-4.

A of FIG. 93 illustrates a configuration example in which the lens 21 of the substrate with lenses 41 as the top layer of the plurality of stacked substrates with lenses 41 is replaced with the fourth deformable lens 21V-4.

B of FIG. 93 illustrates a configuration example in which the lens 21 of the substrate with lenses 41 as the bottom layer of the plurality of stacked substrates with lenses 41 is replaced with the fourth deformable lens 21V-4.

The fourth deformable lens 21V-4 includes a liquid crystal material 1751, and two electrodes 1752 sandwiching the liquid crystal material 1751 from above and below.

In the fourth deformable lens 21V-4, when the two electrodes 1752 apply a predetermined voltage to the liquid crystal material 1751, an orientation of the liquid crystal material 1751 is changed. With this, a refractive index of light to transmit through the liquid crystal material 1751 is changed. By controlling magnitude of the voltage to be applied to the liquid crystal material 1751 so as to change the refractive index of the light, a focal point can be varied.

The structure of the fourth deformable lens 21V-4 is disclosed, for example, in Specification of US Patent Application Publication No. 2014/0036183.

In the examples illustrated in A and B of FIG. 93, the one of the substrates with lenses 41, which uses the fourth deformable lens 21V-4, is disposed as the top layer or the bottom layer of the plurality of substrates with lenses 41 forming the stacked lens structure 11. However, the one of the substrates with lenses 41 may be disposed as one of the middle layers between the top layer and the bottom layer. Further, the one of the substrates with lenses 41, which uses the fourth deformable lens 21V-4, may be provided in a plurality of numbers.

<22. Fifteenth Embodiment of Camera Module>

Among the camera modules according to the first embodiment to the fourteenth embodiment described above, the camera modules 1J and 1L according to the tenth embodiment and the eleventh embodiment each include the focus adjustment mechanism.

In the structure of the camera module 1J according to the tenth embodiment illustrated in FIG. 36, a focal distance is adjusted by moving the lens barrel 74 accommodating the stacked lens structure 11 in the axial direction of the shaft 331 with the drive motor.

Further, in the structure of the camera module 1L according to the eleventh embodiment illustrated in FIG. 37, a focal distance is adjusted by moving the lens barrel 74 accommodating the stacked lens structure 11 in the optical axis direction with the piezoelectric element 351.

In the following, other configurations of the camera module including the focus adjustment mechanism are described. The camera modules according to the embodiments of the present disclosure, which include the focus adjustment mechanisms, may have a configuration of any of the camera modules according to the tenth embodiment and the eleventh embodiment, and of any of camera modules according to a fifteenth embodiment, a sixteenth embodiment, a seventeenth embodiment, an eighteenth embodiment, a nineteenth embodiment, a twentieth embodiment, a twenty-first embodiment, a twenty-second embodiment, a twenty-third embodiment, a twenty-fourth embodiment, a twenty-fifth embodiment, and a twenty-sixth embodiment described below.

Note that, in the drawings of the camera modules according to the fifteenth embodiment to the twenty-sixth embodiment described below, parts corresponding to the parts of the camera modules according to the above-described embodiments are denoted by the same reference symbols to omit redundant description as appropriate.

Figure 94:
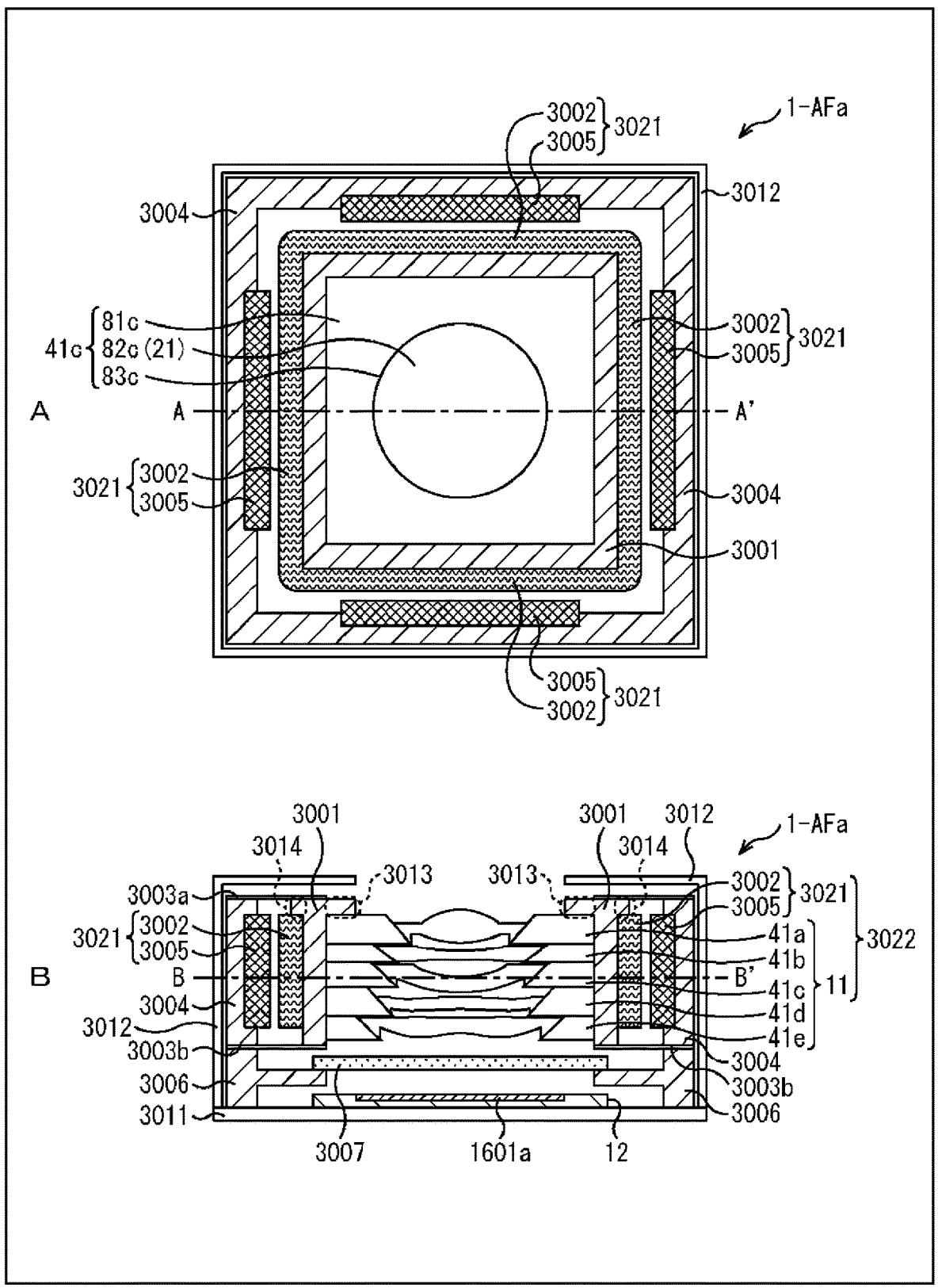
FIG. 94 is a diagram illustrating a fifteenth embodiment of a camera module which uses a stacked lens structure to which the present technique is applied.

A and B of FIG. 94 are diagrams illustrating the fifteenth embodiment of a camera module which uses a stacked lens structure to which the present technique is applied.

A of FIG. 94 is a plan view of a camera module 1-AFa as the fifteenth embodiment of the camera module 1, and B of FIG. 94 is a cross-sectional view of the camera module 1-AFa.

A of FIG. 94 is a plan view taken along the line B-B' in the cross-sectional view of B of FIG. 94, and B of FIG. 94 is a cross-sectional view taken along the line A-A' in the plan view of A of FIG. 94.

In the camera module 1-AFa illustrated in A and B of FIG. 94, the stacked lens structure 11 is accommodated in a lens barrel (lens holder) 3001. The lens barrel 3001 is formed of a resin material or a metal material. The stacked lens structure 11 formed by stacking the plurality of substrates with lenses 41 in the optical axis direction is fixed by bonding to an inner peripheral side of the lens barrel 3001. An autofocus (AF) coil 3002 is fixed by bonding to an outer peripheral side of the lens barrel 3001.

As illustrated in B of FIG. 94, the lens barrel 3001 includes, in an upper surface thereof farthest from the light receiving element 12, a first projection portion 3013 projecting to the inner peripheral side, and a second projection portion 3014 projecting to the outer peripheral side, and has substantially T-shapes in cross section. At the time of fixing the stacked lens structure 11 by bonding to the lens barrel 3001, the stacked lens structure 11 is aligned in a manner of being brought into contact with the first projection portion 3013 on the inner peripheral side, and then fixed thereto by bonding. Similarly, at the time of fixing the AF coil 3002 by bonding to the lens barrel 3001, the AF coil 3002 is aligned in a manner of being brought into contact with the second projection portion 3014 on the outer peripheral side, and then fixed thereto by bonding. The AF coil 3002 is helically wound around an outer periphery of the lens barrel 3001.

The lens barrel 3001 is connected to a first fixed support portion 3004 disposed on an outside thereof with suspensions 3003a and 3003b, and hence is movable in the optical axis direction integrally with the stacked lens structure 11 and the AF coil 3002.

The first fixed support portion 3004 fixes the suspension 3003a on an upper surface thereof, and fixes the suspension 3003b on a lower surface thereof, and is fixed to a second fixed support portion 3006 through intermediation of the suspension 3003b. The suspensions 3003a and 3003b are fixed, for example, as follows. One of both horizontal ends thereof is fixed to the lens barrel 3001 with an adhesive and the like, and then another is fixed to the first fixed support portion 3004 with an adhesive and the like.

The first fixed support portion 3004 has a hollow quadrangular shape, and includes AF permanent magnets, that is, AF magnets 3005 that are fixed at positions on respective side walls on four sides on an inner peripheral side of the first fixed support portion 3004 so as to face the AF coil 3002. The AF coil 3002 and the AF magnets 3005 serve as electromagnetic AF drive units 3021. When a current flows through the AF coil 3002, the stacked lens structure 11 is moved in the optical axis direction. With this, the distance between the stacked lens structure 11 and the light receiving element 12 is adjusted. An AF module 3022 that adjusts a focal distance of light converged by the optical unit 13 of the stacked lens structure 11 includes at least the stacked lens structure 11 and the AF drive units 3021.

A substrate 3011 allows the second fixed support portion 3006 to be fixed thereto by bonding, and to allow the stacked lens structure 11 to be indirectly fixed thereto through intermediation of the suspension 3003b and the first fixed support portion 3004 that are fixed to the second fixed support portion 3006. Further, the substrate 3011 allows also a cover member 3012, which covers outer sides of the first fixed support portion 3004 and the second fixed support portion 3006, to be fixed thereto. As a countermeasure against noise, the cover member 3012 is made up of, for example, a conductive metal material.

On the substrate 3011, the light receiving element 12 including a light receiving area 1601a is placed at a position where the incident light converged by the lenses 21 of the plurality of substrates with lenses 41 forming the stacked lens structure 11 is received. The light receiving element 12 receives the incident light converged by the lenses 21 of the plurality of substrates with lenses 41 forming the stacked lens structure 11, to perform photoelectric conversion of the incident light, and to output pixel signals of pixels. The pixel signals of the pixels, which are generated by the light receiving element 12, are output from the external output terminals of the light receiving element 12 to an external circuit board directly or via the substrate 3011. In a case where the pixels signals are output to the external circuit board via the substrate 3011, a wiring circuit that transmits the pixel signals of the pixels is provided on the substrate 3011.

The second fixed support portion 3006 allows an IR cut filter 3007, which is disposed between the light receiving element 12 and the plurality of substrates with lenses 41 forming the stacked lens structure 11, to be fixed thereto. The IR cut filter 3007 filters the incident light that has transmitted through the lenses 21 of the substrates with lenses 41 of the stacked lens structure 11 so as to block infrared light and to allow only rays with wavelengths corresponding to R, G, and B to transmit therethrough. Note that, the IR cut filter 3007 may be disposed on a top surface of the light receiving element 12.

Similar to the upper surface of the lens barrel 3001, an upper surface of the cover member 3012 is opened in a circular shape or a rectangular shape so as not to block the light incident on the lens 21 of the substrate with lenses 41a as the top layer of the stacked lens structure 11.

Cover glasses may be provided above the substrate with lenses 41a as the top layer of the stacked lens structure 11 and above the light receiving element 12.

The camera module 1-AFa configured as described above is capable of providing an effect or an advantage that, when an image is photographed with the light receiving element 12, an autofocus operation is performed by changing the distance between the stacked lens structure 11 and the light receiving element 12 with the AF drive units 3021.

Further, when the stacked lens structure 11 is not employed as a stacked lens configuration formed by stacking a plurality of lenses in the optical axis direction, a step of loading the substrates with lenses one by one needs to be performed as many as the lenses of the camera module.

In contrast, when the stacked lens structure 11 is employed as the stacked lens configuration formed by stacking a plurality of lenses in the optical axis direction, assembling of the stacked lenses and the lens barrel is completed only by single loading of the stacked lens structure 11 formed by integrating the plurality of substrates with lenses 41 with each other in the optical axis direction into the lens barrel 3001.

Thus, the camera module 1-AFa also provides an effect and an advantage of assembling the module more easily than in the case of loading the substrates with lenses 41 one by one, and an effect and an advantage of suppressing variation in center position of the lenses 21 of the plurality of substrates with lenses 41 owing to variation in the loading process to be smaller than that in the case of loading the substrates with lenses 41 one by one.

Further, the stacked lens structure 11 and the AF coil 3002 are assembled to the lens barrel 3001 only by being aligned in a manner of being brought into contact with the first projection portion 3013 and the second projection portion 3014 that project in a direction perpendicular to the optical axis direction. Thus, the module is easily assembled.

Note that, the first projection portion 3013 and the second projection portion 3014 of B of FIG. 94, which are provided in the upper surface of the lens barrel 3001 such that the stacked lens structure 11 and the AF coil 3002 are upwardly brought into contact with them in B of FIG. 94, may be provided in a lower surface of the lens barrel 3001 such that the stacked lens structure 11 and the AF coil 3002 are downwardly brought into contact with them in B of FIG. 94.

<23. Sixteenth Embodiment of Camera Module>

Figure 95:
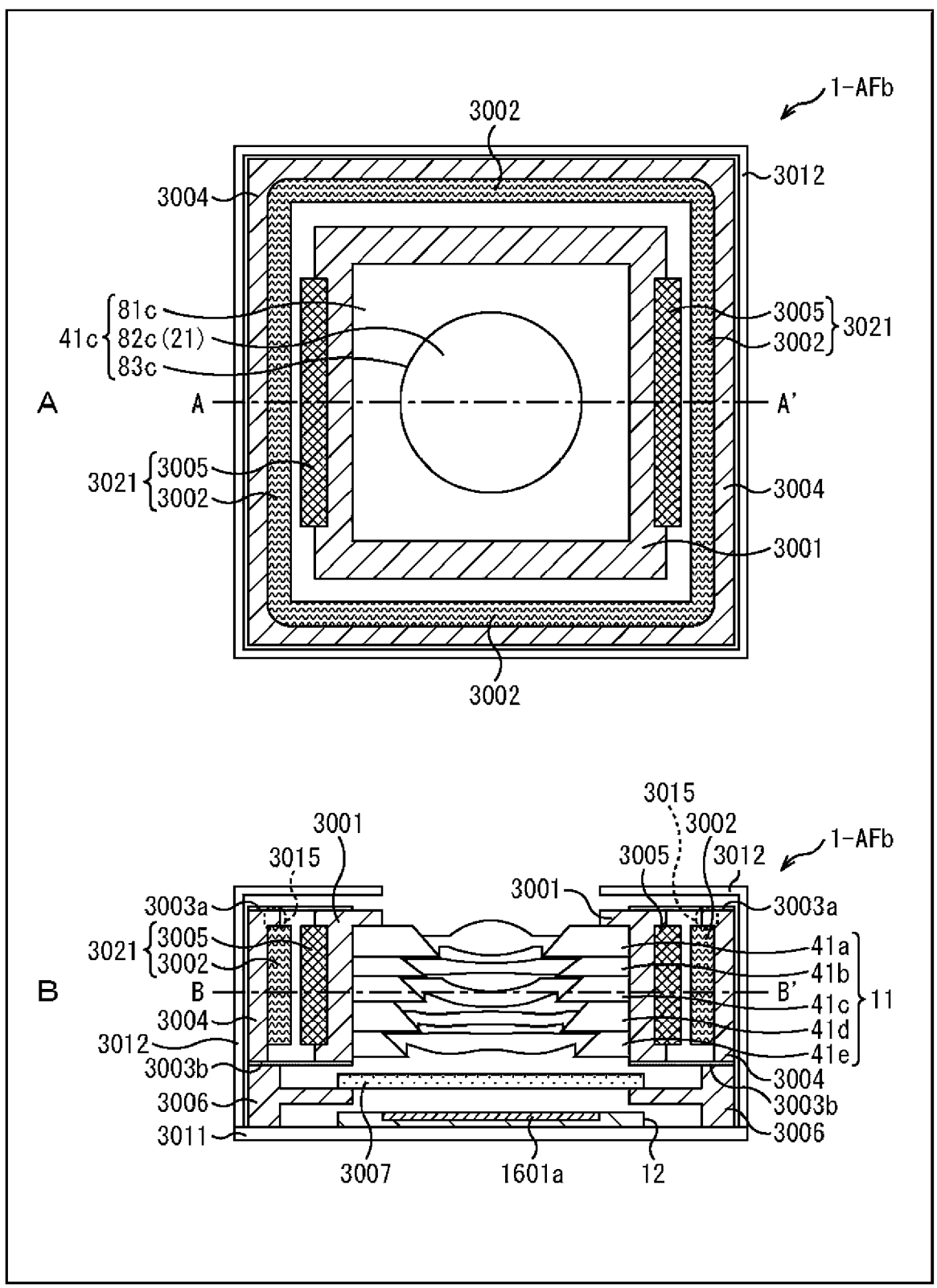
FIG. 95 is a diagram illustrating a sixteenth embodiment of a camera module which uses a stacked lens structure to which the present technique is applied.

A and B of FIG. 95 are diagrams illustrating the sixteenth embodiment of a camera module which uses a stacked lens structure to which the present technique is applied.

A of FIG. 95 is a plan view of a camera module 1-AFb as the sixteenth embodiment of the camera module 1, and B of FIG. 95 is a cross-sectional view of the camera module 1-AFb.

A of FIG. 95 is a plan view taken along the line B-B' in the cross-sectional view of B of FIG. 95, and B of FIG. 95 is a cross-sectional view taken along the line A-A' in the plan view of A of FIG. 95.

In A and B of FIG. 95, parts common to those of the camera module 1-AFa according to the fifteenth embodiment illustrated in A and B of FIG. 94 are denoted by the same reference symbols to omit redundant description as appropriate, and different parts are mainly described. Also in the seventeenth embodiment to the twenty-sixth embodiment illustrated in A and B of FIG. 96 and subsequent drawings, redundant description of the already described parts are similarly omitted as appropriate.

Similar to the camera module 1-AFa illustrated in A and B of FIG. 94, the camera module 1-AFb illustrated in A and B of FIG. 95 includes the AF coil 3002 and the AF magnets 3005 that serve as the AF drive units 3021, that is, a focus adjustment mechanism that adjusts the distance between the stacked lens structure 11 and the light receiving element 12.

The camera module 1-AFb of A and B of FIG. 95 is different from the camera module 1-AFa of A and B of FIG. 94 in that the AF coil 3002 and the AF magnets 3005 that serve as the AF drive units 3021 are attached to positions reverse to those in the camera module 1-AFa.

Specifically, in the camera module 1-AFa illustrated in A and B of FIG. 94, the AF coil 3002 is fixed by bonding to the outer peripheral side of the lens barrel 3001, and the AF magnets 3005 are fixed by bonding to the inner peripheral side of the first fixed support portion 3004; in contrast, in the camera module 1-AFb of A and B of FIG. 95, the AF magnets 3005 are fixed by bonding to the outer peripheral side of the lens barrel 3001, and the AF coil 3002 is fixed by bonding to the inner peripheral side of the first fixed support portion 3004.

The first fixed support portion 3004 includes, in the upper surface thereof farthest from the light receiving element 12, a projection portion 3015 projecting to the inner peripheral side, and has substantially L-shapes in cross section. At the time of fixing the AF coil 3002 by bonding to the first fixed support portion 3004, the AF coil 3002 is aligned in a manner of being brought into contact with the projection portion 3015 on the inner peripheral side, and then fixed thereto by bonding.

Further, the camera module 1-AFb is different from the camera module 1-AFa also in number of the AF magnets 3005 to be attached.

Specifically, in the camera module 1-AFa illustrated in A and B of FIG. 94, the AF magnets 3005 are attached respectively to the four inner peripheral surfaces of the hollow-quadrangular first fixed support portion 3004, and hence the camera module 1-AFa includes the four AF magnets 3005 in total; in contrast, in the camera module 1-AFb of A and B of FIG. 95, the AF magnets 3005 are attached to opposite two of the four outer peripheral surfaces of the lens barrel 3001, and hence the camera module 1-AFb includes two AF magnets 3005 in total.

Note that, the number of the AF magnets 3005 to be attached may either be two or four. In other words, the camera module 1-AFa of A and B of FIG. 94 may include the two AF magnets 3005 at the facing positions, and the camera module 1-AFb of A and B of FIG. 95 may include the four AF magnets 3005.

The camera module 1-AFb configured as described above provides the same effect or the same advantage as that of the camera module 1-AFa of A and B of FIG. 94.

Specifically, the camera module 1-AFb is capable of providing the effect or the advantage that, when an image is photographed with the light receiving element 12, an autofocus operation is performed by changing the distance between the stacked lens structure 11 and the light receiving element 12 with the AF drive units 3021.

Further, when the stacked lens structure 11 is not employed as the stacked lens configuration formed by stacking a plurality of lenses in the optical axis direction, the step of loading the substrates with lenses one by one needs to be performed as many as the lenses of the camera module.

In contrast, when the stacked lens structure 11 is employed as the stacked lens configuration formed by stacking a plurality of lenses in the optical axis direction, assembling of the stacked lenses and the lens barrel is completed only by the single loading of the stacked lens structure 11 formed by integrating the plurality of substrates with lenses 41 with each other in the optical axis direction into the lens barrel 3001.

Thus, the camera module 1-AFb also provides the effect and the advantage of assembling the module more easily than in the case of loading the substrates with lenses 41 one by one, and the effect and the advantage of suppressing the variation in center position of the lenses 21 owing to the variation in the loading process to be smaller than that in the case of loading the substrates with lenses 41 one by one.

Further, the stacked lens structure 11 is assembled to the lens barrel 3001 only by being aligned in a manner of being brought into contact with the first projection portion 3013 projecting in the inner peripheral direction perpendicular to the optical axis direction. The AF coil 3002 is assembled to the first fixed support portion 3004 only by being aligned in a manner of being brought into contact with the projection portion 3015 projecting in the inner peripheral direction perpendicular to the optical axis direction. With this, the stacked lens structure 11 and the AF drive units 3021 are easily aligned with each other, and hence the module is easily assembled.

Note that, the projection portion 3015 of B of FIG. 95, which is provided in the upper surface of the first fixed support portion 3004 such that the AF coil 3002 is upwardly brought into contact with them in B of FIG. 95, may be provided in the lower surface of the first fixed support portion 3004 such that the AF coil 3002 is downwardly brought into contact with them in B of FIG. 95.

<24. Seventeenth Embodiment of Camera Module>

Figure 96:
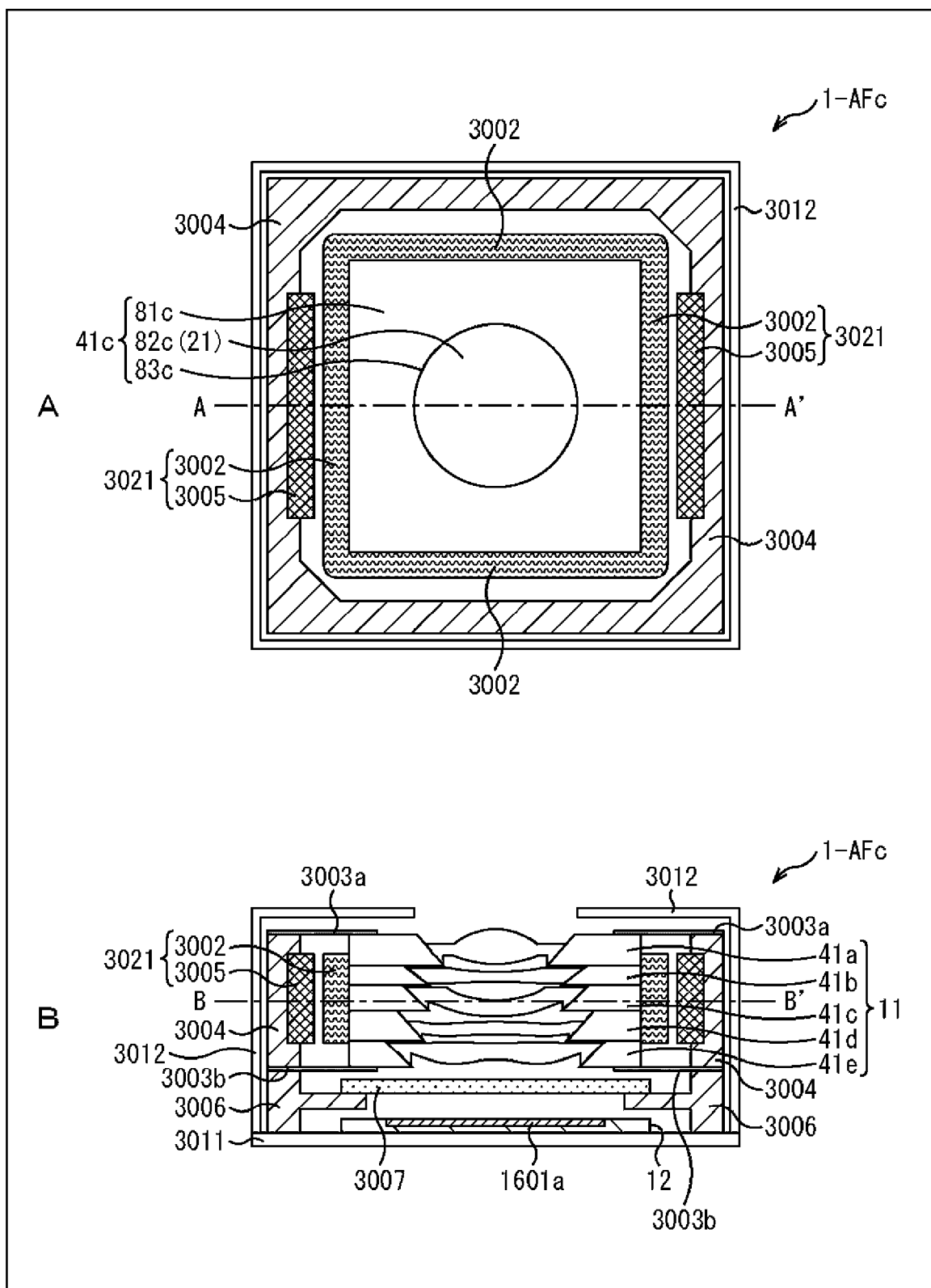
FIG. 96 is a diagram illustrating a seventeenth embodiment of a camera module which uses a stacked lens structure to which the present technique is applied.

A and B of FIG. 96 are diagrams illustrating the seventeenth embodiment of a camera module which uses a stacked lens structure to which the present technique is applied.

A of FIG. 96 is a plan view of a camera module 1-AFc as the seventeenth embodiment of the camera module 1, and B of FIG. 96 is a cross-sectional view of the camera module 1-AFc.

A of FIG. 96 is a plan view taken along the line B-B' in the cross-sectional view of B of FIG. 96, and B of FIG. 96 is a cross-sectional view taken along the line A-A' in the plan view of A of FIG. 96.

The camera module 1-AFc of A and B of FIG. 96 is different from the camera module 1-AFa of A and B of FIG. 94 in that the lens barrel 3001 that accommodates the stacked lens structure 11 is omitted.

Specifically, in the camera module 1-AFc of A and B of FIG. 96, the lens barrel 3001 is omitted, and the AF coil 3002 and the suspensions 3003a and 3003b are fixed by bonding directly to some of the substrates with lenses 41 forming the stacked lens structure 11. The AF coil 3002 is helically wound around an outer periphery of some of the substrates with lenses 41 forming the stacked lens structure 11.

As a result of omitting the lens barrel 3001, it is possible to provide an effect or an advantage that a size of the camera module 1-AFc is reduced to be smaller than those of the camera module 1-AFa and the camera module 1-AFb that use the lens barrel 3001. Further, as a result of omitting the lens barrel 3001, it is also possible to provide an effect or an advantage that manufacturing cost of the camera module 1-AFc is reduced to be lower than those of the camera module 1-AFa and the camera module 1-AFb.

Similar to the camera module 1-AFa of A and B of FIG. 94, the camera module 1-AFc is capable of proving the effect or the advantage of performing an autofocus operation. Further, the stacked lens structure 11 to be used includes the plurality of substrates with lenses 41 integrated with each other in the optical axis direction. Thus, the camera module 1-AFc also provides the effects and the advantages of facilitating assembling of the module, and of suppressing the variation in center position of the lenses 21 of the plurality of substrates with lenses 41.

Figure 97:
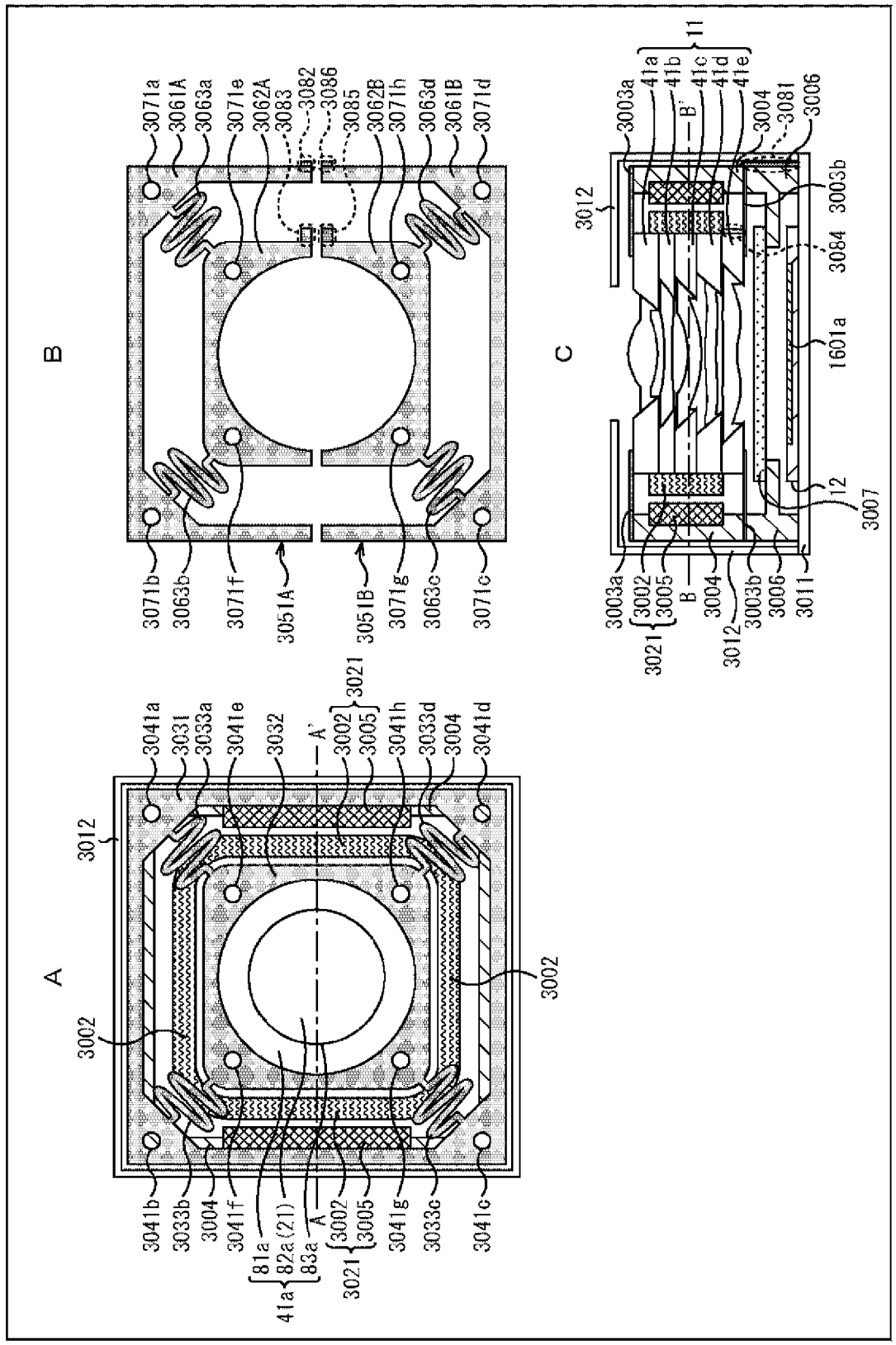
FIG. 97 is a diagram illustrating planar shapes of suspensions of the camera module according to the seventeenth embodiment.

Next, with reference to A to C of FIG. 97, planar shapes of the suspensions 3003a and 3003b are described by way of an example of the camera module 1-AFc according to the seventeenth embodiment.

A of FIG. 97 is a plan view in which the camera module 1-AFc of A and B of FIG. 96 is viewed (downward) from the suspension 3003a toward the light receiving element 12, and B of FIG. 97 is a plan view of only the suspension 3003b.

C of FIG. 97 is a cross-sectional view of the camera module 1-AFc, for illustrating a path of the current to flow through the AF coil 3002.

As illustrated in A of FIG. 97, the suspension 3003a includes a first fixed plate 3031 to be fixed by bonding to the first fixed support portion 3004, a second fixed plate 3032 to be fixed by bonding to the substrate with lenses 41a as the top layer of the stacked lens structure 11, and connection springs 3033a, 3033b, 3033c, and 3033d that connect the first fixed plate 3031 and the second fixed plate 3032 to each other at four corners.

The first fixed plate 3031 is provided with positioning holes 3041a, 3041b, 3041c, and 3041d that allow the first fixed plate 3031 to be positioned at the time of being fixed by bonding to the first fixed support portion 3004.

The second fixed plate 3032 is provided with positioning holes 3041e, 3041f, 3041g, and 3041h that allow the second fixed plate 3032 to be positioned at the time of being fixed by bonding to the substrate with lenses 41a as the top layer of the stacked lens structure 11.

Meanwhile, as illustrated in B of FIG. 97, the suspension 3003b includes two separate fixed plates 3051A and 3051B formed by bisection along the segment that extends through a center of the optical axis and connects the two AF magnets 3005 to each other. Note that, the two separate fixed plates 3051A and 3051B may be bisected in a direction orthogonal to the segment that connects the two AF magnets 3005 to each other.

The separate fixed plate 3051A includes a first fixed plate 3061A to be fixed by bonding to the first fixed support portion 3004, a second fixed plate 3062A to be fixed by bonding to a substrate with lenses 41e as the bottom layer of the stacked lens structure 11, and connection springs 3063a and 3063b that connect the first fixed plate 3061A and the second fixed plate 3062A to each other.

The first fixed plate 3061A is provided with positioning holes 3071a and 3071b that allow the first fixed plate 3061A to be positioned at the time of being fixed by bonding to the first fixed support portion 3004.

The second fixed plate 3062A is provided with positioning holes 3071e and 3071f that allow the second fixed plate 3062A to be positioned at the time of being fixed by bonding to the substrate with lenses 41e as the bottom layer of the stacked lens structure 11.

Meanwhile, the separate fixed plate 3051B includes a first fixed plate 3061B to be fixed by bonding to the first fixed support portion 3004, a second fixed plate 3062B to be fixed by bonding to the substrate with lenses 41e as the bottom layer of the stacked lens structure 11, and connection springs 3063c and 3063d that connect the first fixed plate 3061B and the second fixed plate 3062B to each other.

The first fixed plate 3061B is provided with positioning holes 3071c and 3071d that allow the first fixed plate 3031 to be positioned at the time of being fixed by bonding to the first fixed support portion 3004.

The second fixed plate 3062B is provided with positioning holes 3071g and 3071h that allow the second fixed plate 3062B to be positioned at the time of being fixed by bonding to the substrate with lenses 41e as the bottom layer of the stacked lens structure 11.

The suspensions 3003a and 3003b are manufactured, for example, by molding a plate of metals such as Cu and Al, and themselves function as electric wires that allow a current to flow therethrough.

The current to flow through the AF coil 3002 flows through, for example, an outer peripheral portion 3081 of the second fixed support portion 3006 illustrated in C of FIG. 97, and reaches a connecting point 3082 of the first fixed plate 3061A illustrated in B of FIG. 97. Then, the current flows from the connecting point 3082 of the first fixed plate 3061A to the second fixed plate 3062A via the connection spring 3063a, and then flows from a connecting point 3083 to the AF coil 3002 via an outer peripheral portion 3084 of the stacked lens structure 11, which is illustrated in C of FIG. 97.

Next, the current flows through the AF coil 3002, and reaches a connecting point 3085 of the second fixed plate 3062B via the outer peripheral portion 3084 of the stacked lens structure 11, which is illustrated in C of FIG. 97. Then, the current flows from the connecting point 3085 of the second fixed plate 3062B to the first fixed plate 3061B via the connection spring 3063d, and from a connecting point 3086 to the substrate 3011 via the outer peripheral portion 3081 of the second fixed support portion 3006, which is illustrated in C of FIG. 97.

Next, a bonding fixation mechanism of the suspension 3003b is described by way of an example of the positioning hole 3071d of the first fixed plate 3061B.

Figure 98:
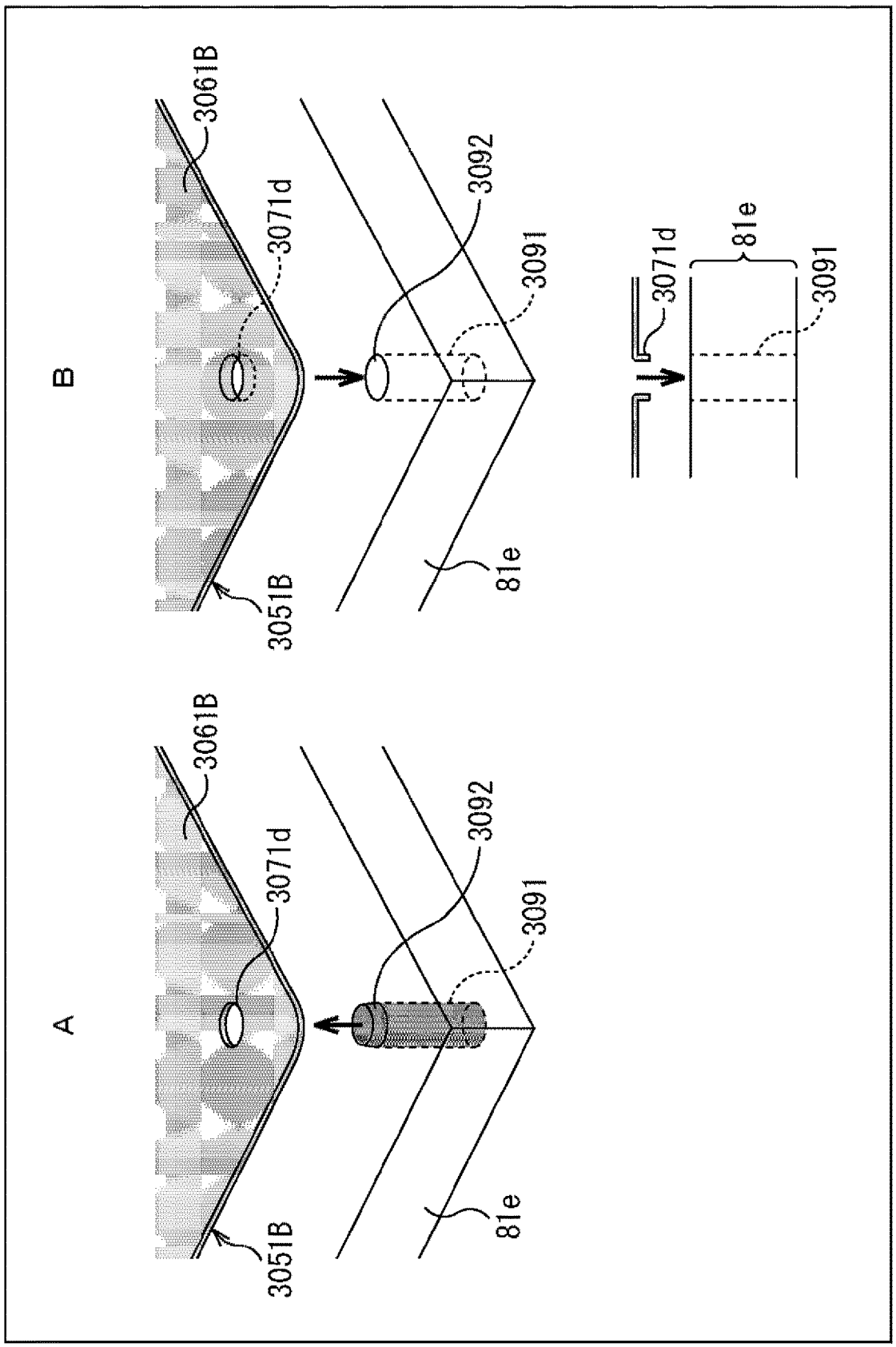
FIG. 98 is a diagram illustrating a method of positioning the suspension.

A of FIG. 98 is a perspective view of the positioning hole 3071d of the first fixed plate 3061B, and the support substrate 81e of the substrate with lenses 41e to be fixed by bonding into the positioning hole 3071d.

As illustrated in A of FIG. 98, the positioning hole 3071d is a through-hole.

Meanwhile, a through-hole 3091 is formed at a position on the support substrate 81e forming the substrate with lenses 41e, the position corresponding to the positioning hole 3071d. In the through-hole 3091, a protrusion portion 3092 formed of the same material as that of the lens resin portion 82 is formed such that the protrusion portion 3092 is bonded by being fitted into the positioning hole 3071d of the first fixed plate 3061B. With this, accurate positioning and fixation can be performed.

Note that, the protrusion portion 3092 need not necessarily be formed of the same material as that of the lens resin portion 82, and may be formed, for example, by etching the support substrate 81e.

Alternatively, the protrusion portion 3092 need not necessarily be provided on the support substrate 81e side, and, as illustrated in B of FIG. 98, the positioning hole 3071d of the first fixed plate 3061B may be processed into a protruding shape such that the first fixed plate 3061B is bonded by being fitted into the through-hole 3091 of the support substrate 81e. Also in this case, accurate positioning and fixation can be performed.

Such a bonding fixation mechanism is applicable to the positioning holes 3041a to 3041h of the suspension 3003a, and the positioning holes 3071a to 3071h of the suspension 3003b.

With this, accuracy in positioning and fixing the stacked lens structure 11 can be increased, and the stacked lens structure 11 can be moved in desired directions. As a result, an effect and an advantage of increasing autofocus accuracy can be obtained. The same effect and the same advantage can be obtained also in the other embodiments in which the suspensions 3003a and 3003b are used.

<25. Modifications of Seventeenth Embodiment of Camera Module>

Figure 99:
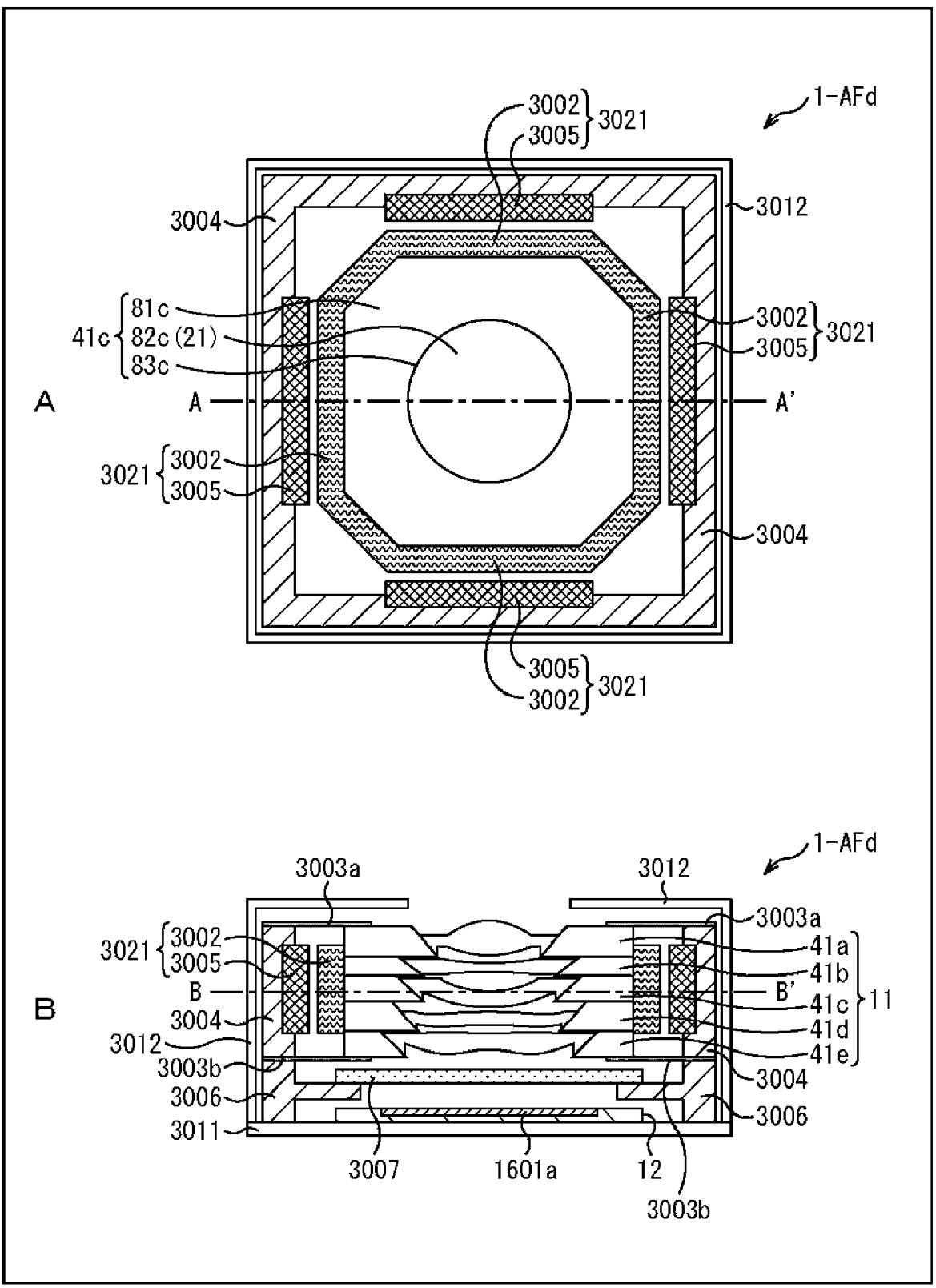
FIG. 99 is a diagram illustrating a first modification of the seventeenth embodiment of the camera module.

A and B of FIG. 99 are diagrams illustrating a first modification of the seventeenth embodiment of a camera module which uses a stacked lens structure to which the present technique is applied.

A of FIG. 99 is a plan view of a camera module 1-AFd as the first modification of the seventeenth embodiment, and B of FIG. 99 is a cross-sectional view of the camera module 1-AFd according to the first modification of the seventeenth embodiment.

A of FIG. 99 is a plan view taken along the line B-B' in the cross-sectional view of B of FIG. 99, and B of FIG. 99 is a cross-sectional view taken along the line A-A' in the plan view of A of FIG. 99.

The camera module 1-AFd according to the first modification of the seventeenth embodiment of A and B of FIG. 99 is different from the camera module 1-AFc according to the seventeenth embodiment illustrated in A and B of FIG. 96 in that, as is clear from comparison between the plan views of A of FIG. 99 and A of FIG. 96, angular portions at the four corners of the substrates with lenses 41 forming the stacked lens structure 11 are removed to be straight, and the substrates with lenses 41 each have a substantially octagonal shape in plan view.

Figure 100:
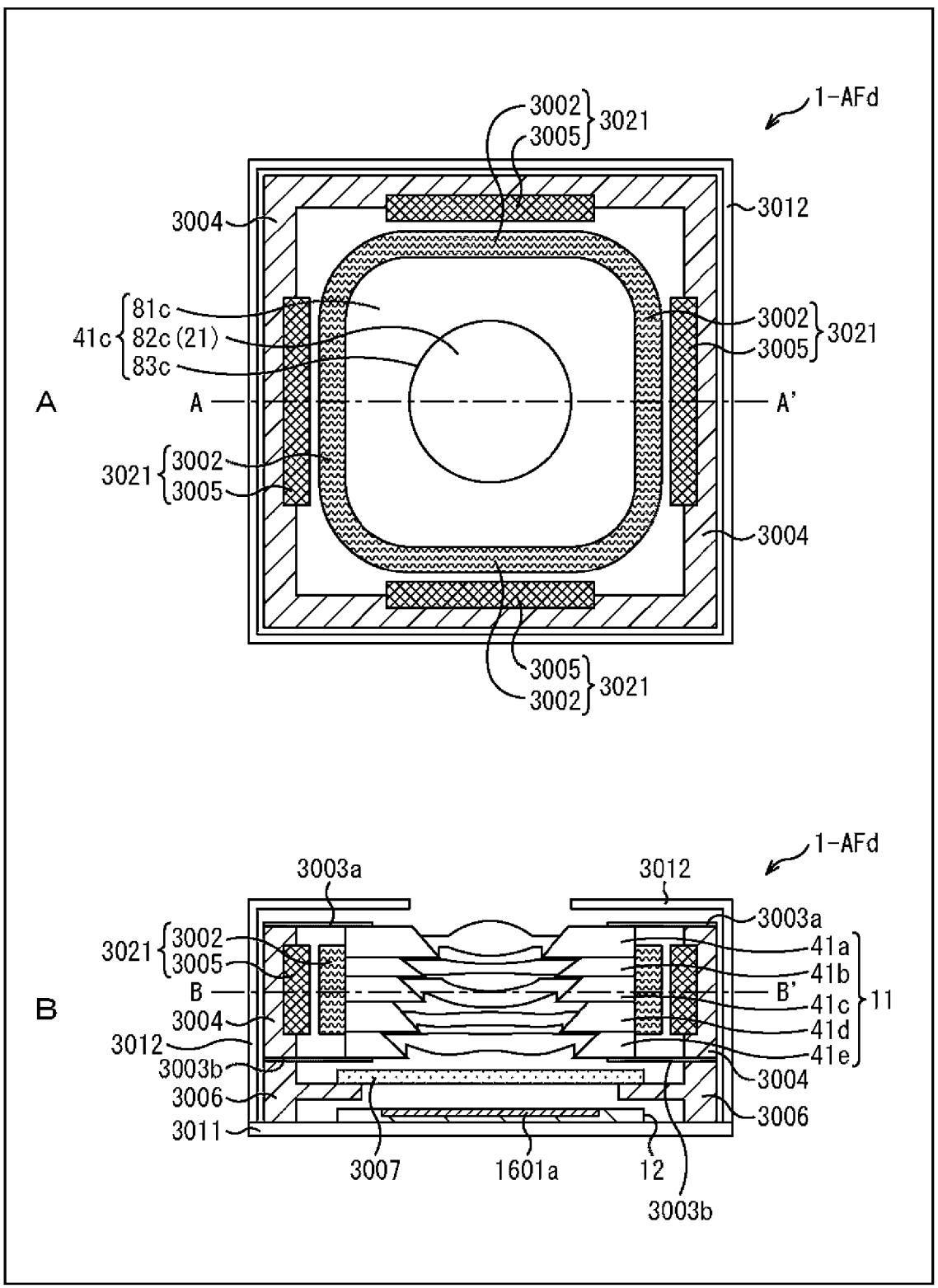
FIG. 100 is a diagram illustrating a second modification of the seventeenth embodiment of the camera module.

A and B of FIG. 100 are diagrams illustrating a second modification of the seventeenth embodiment of a camera module which uses a stacked lens structure to which the present technique is applied.

A of FIG. 100 is a plan view of the camera module 1-AFd as the second modification of the seventeenth embodiment, and B of FIG. 100 is a cross-sectional view of the camera module 1-AFd according to the second modification of the seventeenth embodiment.

A of FIG. 100 is a plan view taken along the line B-B' in the cross-sectional view of B of FIG. 100, and B of FIG. 100 is a cross-sectional view taken along the line A-A' in the plan view of A of FIG. 100.

The camera module 1-AFd according to the second modification of the seventeenth embodiment of A and B of FIG. 100 is different from the camera module 1-AFc according to the seventeenth embodiment illustrated in A and B of FIG. 96 in that, as is clear from comparison between the plan views of A of FIG. 100 and A of FIG. 96, the angular portions at the four corners of the substrates with lenses 41 forming the stacked lens structure 11 are removed to be rounded, and the substrates with lenses 41 each have a rounded substantially-quadrangular shape in plan view.

Figure 101:
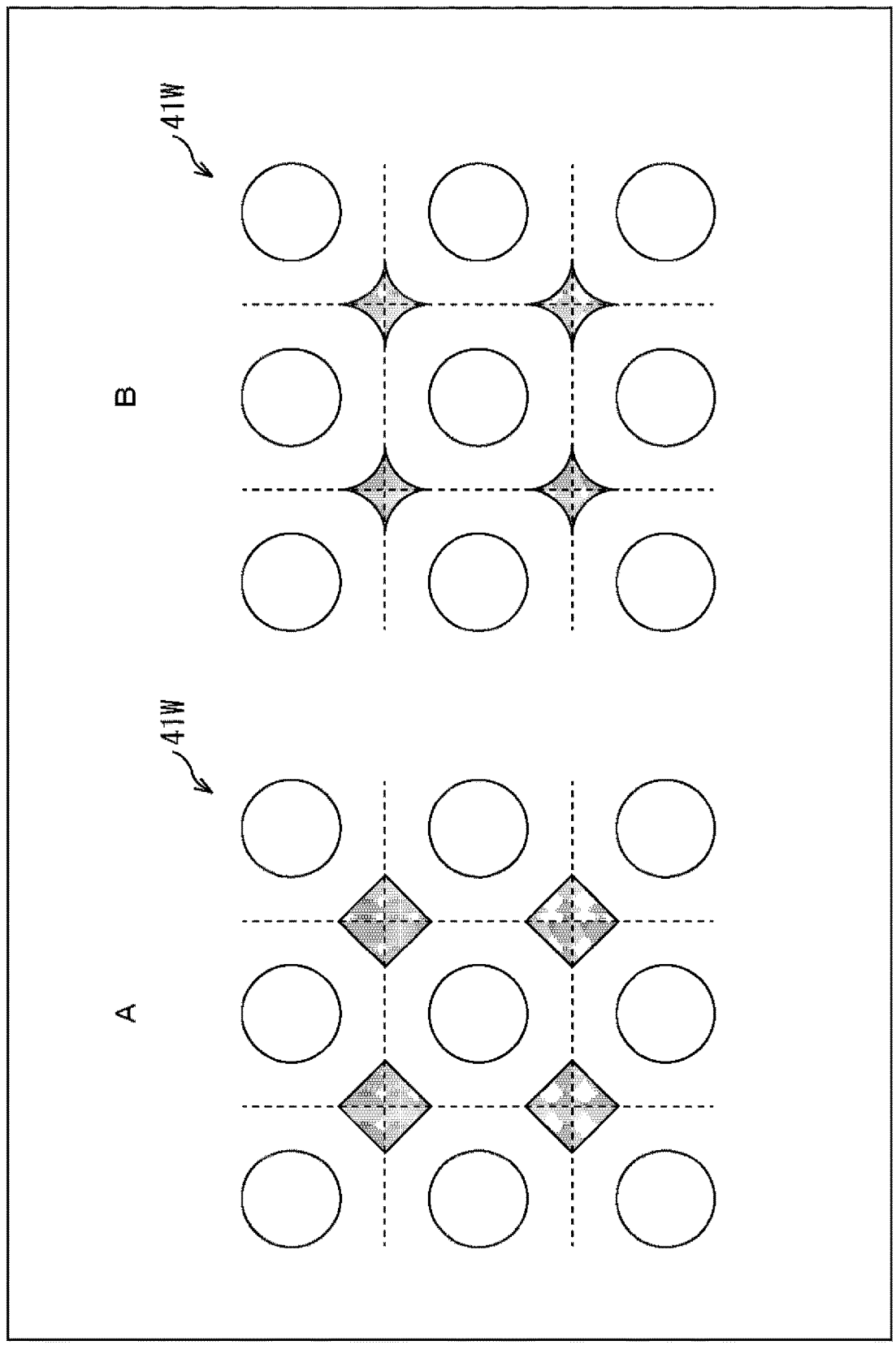
FIG. 101 is a diagram illustrating methods of processing substrates with lenses according to a first modification and a second modification of the seventeenth embodiment.

As illustrated in A and B of FIG. 101, the substrates with lenses 41 each having the planar shapes of the first modification and the second modification can be manufactured by removing intersecting parts of dicing lines of the substrates with lenses 41W in the substrate state, which are indicated by the broken lines, to be straight or rounded, for example, by etching. The gray areas in A and B of FIG. 101 correspond to the areas to be removed, for example, by etching.

According to the first modification and the second modification of the seventeenth embodiment, the angular portions at the four corners of the substrates with lenses 41 of the stacked lens structure 11, around which the AF coil 3002 is wound, each have an obtuse angle. With this, it is possible to provide an effect or an advantage that the coil to be attached is prevented from being damaged and causing defects.

Further, it is also possible to reduce an entire length of the AF coil 3002 while maintaining lengths of effective parts that face the AF magnets 3005. Thus, weight of the camera module can be reduced, and impedance of the coil can be reduced while maintaining an AF driving force. As a result, it is also possible to provide an effect or an advantage of reducing driving electric power.

In addition, the angular portions of the substrates with lenses 41W in the substrate state are removed before the substrates with lenses 41W are formed into pieces. With this, it is also possible to provide an effect or an advantage of preventing chipping at the time of or after forming the substrates with lenses 41 (support substrates 81) into pieces by dicing.

<26. Eighteenth Embodiment of Camera Module>

Figure 102:
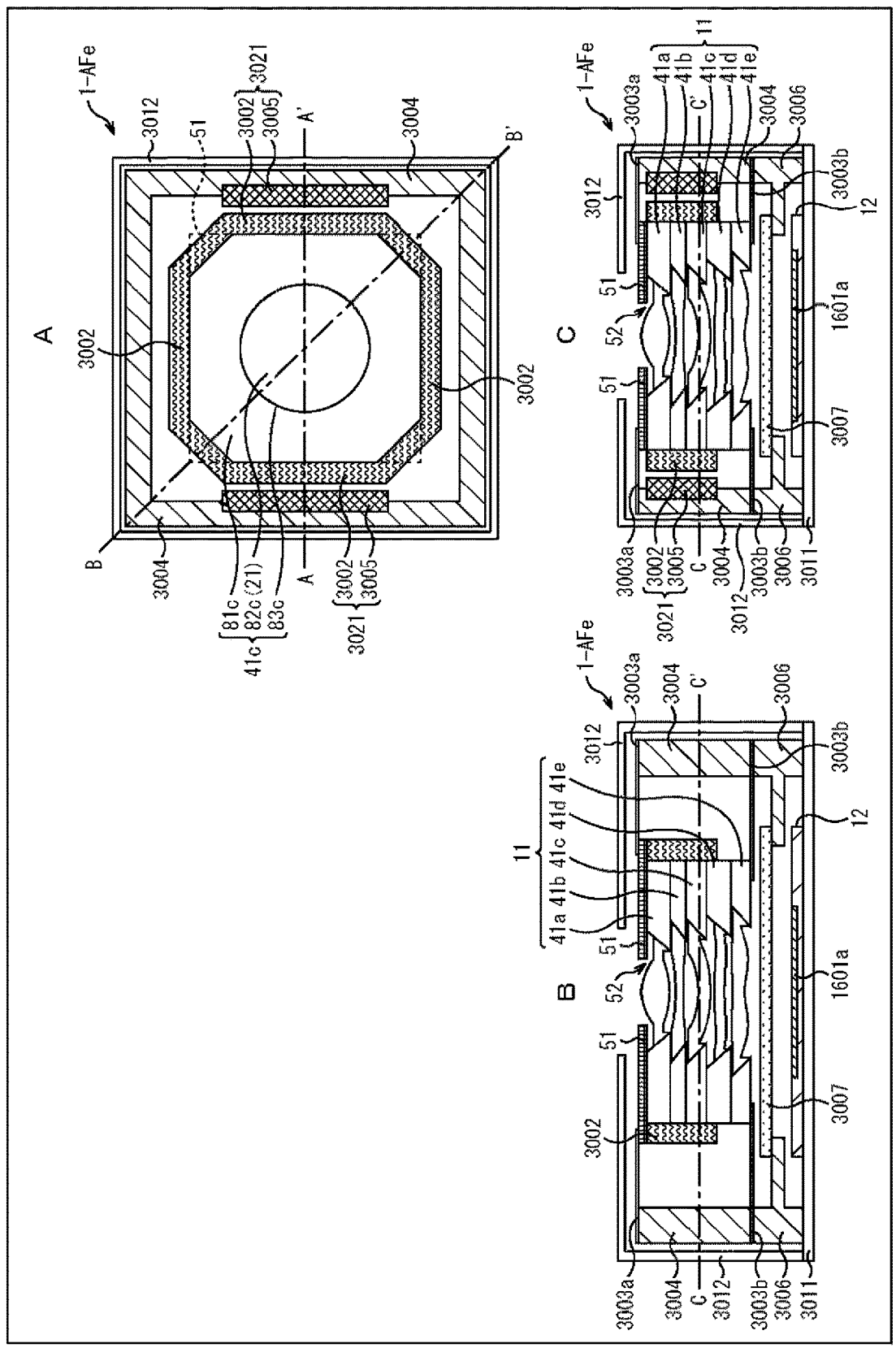
FIG. 102 is a diagram illustrating an eighteenth embodiment of a camera module which uses a stacked lens structure to which the present technique is applied.

A to C of FIG. 102 are diagrams illustrating the eighteenth embodiment of a camera module which uses a stacked lens structure to which the present technique is applied.

A of FIG. 102 is a plan view of a camera module 1-AFe as the eighteenth embodiment of the camera module 1, and B and C of FIG. 102 are cross-sectional views of the camera module 1-AFe.

A of FIG. 102 is a plan view taken along the line C-C' in the cross-sectional views of B and C of FIG. 102, B of FIG. 102 is a cross-sectional view taken along the line B-B' in the plan view of A of FIG. 102, and C of FIG. 102 is a cross-sectional view taken along the line A-A' in the plan view of A of FIG. 102.

The camera module 1-AFe of A to C of FIG. 102 is different from the camera module 1-AFa of A and B of FIG. 94 in that the lens barrel 3001 that accommodates the stacked lens structure 11 is omitted, and that the diaphragm plate 51 is provided on the upper surface of the substrate with lenses 41a as the top layer of the stacked lens structure 11. The diaphragm plate 51 is provided with the opening 52.

Further, the camera module 1-AFe of A to C of FIG. 102 is different from the camera module 1-AFa of A and B of FIG. 94 also in that, similar to the camera module 1-AFd according to the first modification of the seventeenth embodiment illustrated in A and B of FIG. 99, the angular portions at the four corners of the substrates with lenses 41 forming the stacked lens structure 11 are removed to be straight, and the substrates with lenses 41 each have a substantially octagonal shape in plan view.

Note that, the substrates with lenses 41 each have a substantially octagonal shape in plan view, but in contrast, as indicated by the broken line in A of FIG. 102, the diaphragm plate 51 has a quadrangular shape with angular portions at four corners thereof in plan view. The diaphragm plate 51 has a shape including angular portions projecting at the four corners to the outer peripheral side with respect to the substrates with lenses 41.

At the time of fixing the AF coil 3002 by bonding to the stacked lens structure 11, the AF coil 3002 is aligned in a manner of being brought into contact with the diaphragm plate 51 having the projecting angular portions at the four corners, and then fixed thereto by bonding.

Similar to the camera module 1-AFa of A and B of FIG. 94, the camera module 1-AFe configured as described above is capable of proving the effect or the advantage of performing an autofocus operation. Further, the stacked lens structure 11 to be used includes the plurality of substrates with lenses 41 integrated with each other in the optical axis direction. Thus, the camera module 1-AFe also provides the effects and the advantages of facilitating assembling of the module, and of suppressing the variation in center position of the lenses 21 of the plurality of substrates with lenses 41.

The angular portions at the four corners of the substrates with lenses 41 of the stacked lens structure 11, around which the AF coil 3002 is wound, each have an obtuse angle. With this, it is possible to provide the effect or the advantage that the coil to be attached is prevented from being damaged and causing defects.

In addition, the angular portions of the substrates with lenses 41W in the substrate state are removed before the substrates with lenses 41W are formed into pieces. With this, it is also possible to provide the effect or the advantage of preventing chipping at the time of or after forming the substrates with lenses 41 (support substrates 81) into pieces by dicing.

Further, the AF coil 3002 is assembled only by being aligned in a manner of being brought into contact with the diaphragm plate 51 having the shape including the angular portions projecting at the four corners to the outer peripheral side with respect to the substrates with lenses 41. With this, an effect and an advantage of facilitating alignment of the AF coil 3002 and assembling of the module are provided.

Note that, instead of the diaphragm plate 51 of the camera module 1-AFe illustrated in A to C of FIG. 102, the cover glass 1501 and the light blocking film 1502 illustrated in FIG. 55 may be employed. Further, if the function of an optical diaphragm is unnecessary, only the cover glass 1501 may be provided as a target with which the AF coil 3002 is brought into contact.

<27. Nineteenth Embodiment of Camera Module>

Figure 103:
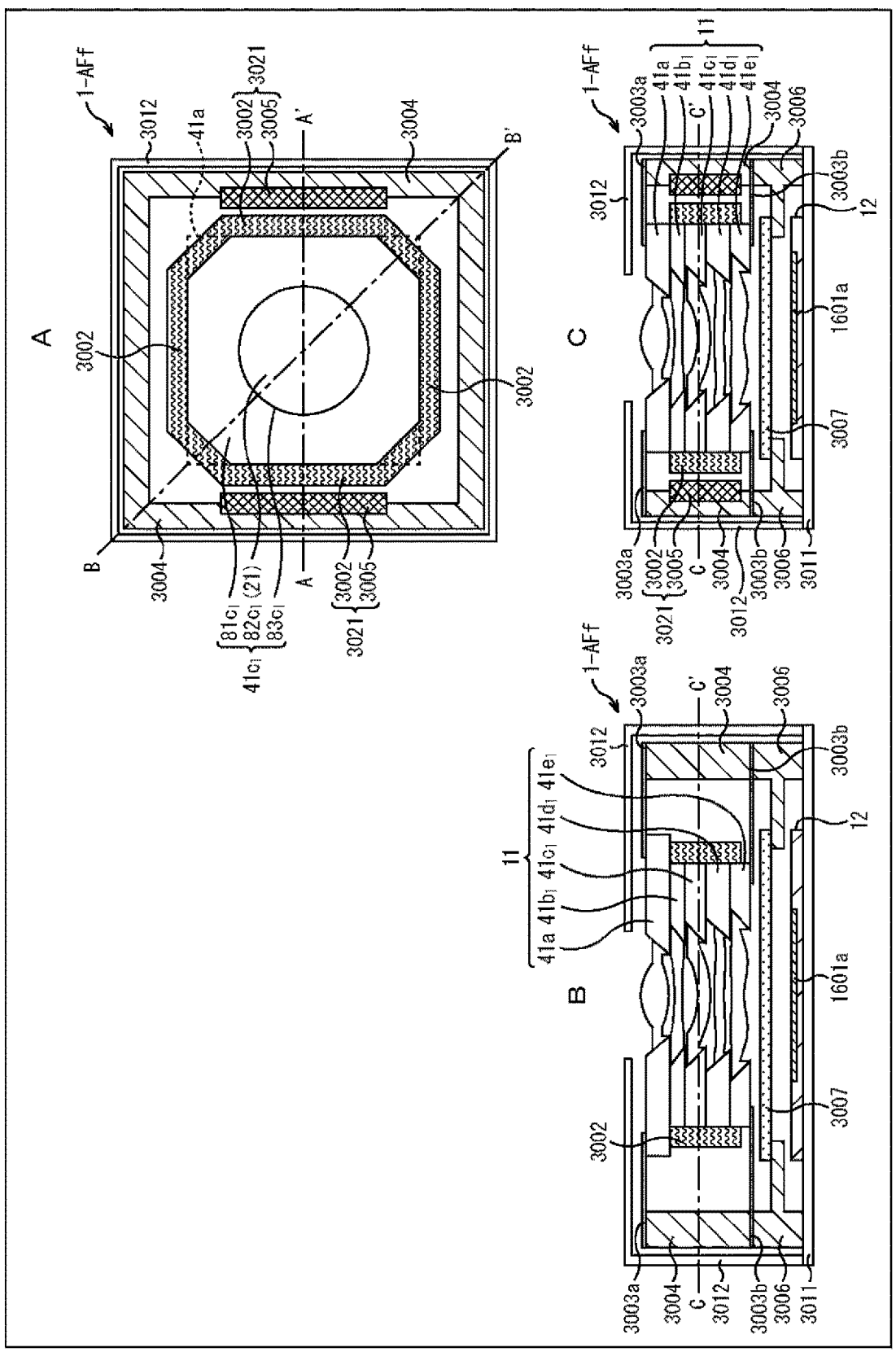
FIG. 103 is a diagram illustrating a nineteenth embodiment of a camera module which uses a stacked lens structure to which the present technique is applied.

A to C of FIG. 103 are diagrams illustrating the nineteenth embodiment of a camera module which uses a stacked lens structure to which the present technique is applied.

A of FIG. 103 is a plan view of a camera module 1-AFf as the nineteenth embodiment of the camera module 1, and B and C of FIG. 103 are cross-sectional views of the camera module 1-AFf.

A of FIG. 103 is a plan view taken along the line C-C' in the cross-sectional views of B and C of FIG. 103, B of FIG. 103 is a cross-sectional view taken along the line B-B' in the plan view of A of FIG. 103, and C of FIG. 103 is a cross-sectional view taken along the line A-A' in the plan view of A of FIG. 103.

As can be understood from comparison of the camera module 1-AFf of A to C of FIG. 103 to the camera module 1-AFe according to the eighteenth embodiment illustrated in A to C of FIG. 102, the diaphragm plate 51 is omitted from the camera module 1-AFf.

Further, the substrates with lenses 41b to 41e other than the substrate with lenses 41a as the top layer of the stacked lens structure 11 of the camera module 1-AFe of A to C of FIG. 102 are replaced with substrates with lenses $41b_1$, $41c_1$, $41d_1$, and $41e_1$.

Specifically, the stacked lens structure 11 of the camera module 1-AFf according to the nineteenth embodiment of A to C of FIG. 103 includes the substrate with lenses 41a as the top layer and the substrates with lenses $41b_1$ to $41e_1$. As indicated by the broken line in A of FIG. 103, the substrate with lenses 41a as the top layer has a quadrangular shape with angular portions at four corners thereof in plan view. In contrast, the substrates with lenses $41b_1$ to $41e_1$ each have an octagonal shape without angular portions at four corners thereof in plan view. As a result, the substrate with lenses 41a as the top layer has a shape including the angular portions projecting at the four corners to the outer peripheral side with respect to the substrates with lenses $41b_1$ to $41e_1$.

At the time of fixing the AF coil 3002 by bonding to the stacked lens structure 11, the AF coil 3002 is aligned in a manner of being brought into contact with the substrate with lenses 41a as the top layer, which has the projecting angular portions at the four corners, and then fixed thereto by bonding.

Similar to the camera module 1-AFa of A and B of FIG. 94, the camera module 1-AFf configured as described above is capable of proving the effect or the advantage of performing an autofocus operation. Further, the stacked lens structure 11 to be used includes the plurality of substrates with lenses 41 integrated with each other in the optical axis direction. Thus, the camera module 1-AFf also provides the effects and the advantages of facilitating assembling of the module, and of suppressing the variation in center position of the lenses 21 of the plurality of substrates with lenses 41.

The angular portions at the four corners of each of the substrates with lenses $41b_1$ to $41e_1$ of the stacked lens structure 11, around which the AF coil 3002 is wound, each have an obtuse angle. With this, it is possible to provide the effect or the advantage that the coil to be attached is prevented from being damaged and causing defects.

In addition, the angular portions of the substrates with lenses 41W in the substrate state are removed before the substrates with lenses 41W are formed into pieces. With this, it is also possible to provide the effect or the advantage of preventing chipping at the time of or after forming the substrates with lenses $41b_1$ to $41e_1$ (support substrates $81b_1$, $81c_1$, $81d_1$, and $81e_1$) into pieces by dicing.

Further, the AF coil 3002 is assembled only by being aligned in a manner of being brought into contact with the substrate with lenses 41a having the shape including the angular portions projecting at the four corners to the outer peripheral side with respect to the substrates with lenses $41b_1$ to $41e_1$. With this, the effect and the advantage of facilitating alignment of the AF coil 3002 and assembling of the module are provided.

<28. Twentieth Embodiment of Camera Module>

Figure 104:
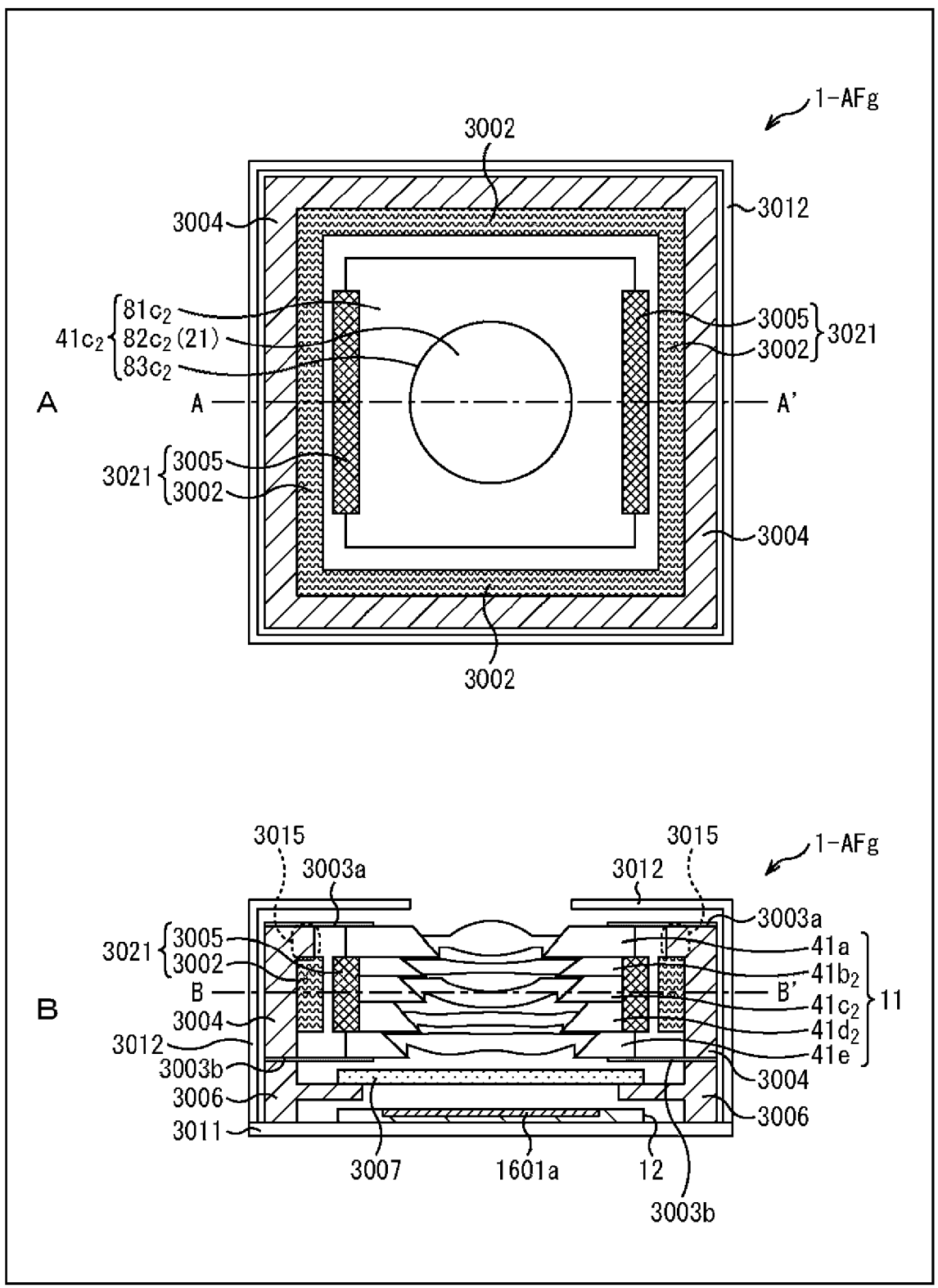
FIG. 104 is a diagram illustrating a twentieth embodiment of a camera module which uses a stacked lens structure to which the present technique is applied.

A and B of FIG. 104 are diagrams illustrating the twentieth embodiment of a camera module which uses a stacked lens structure to which the present technique is applied.

A of FIG. 104 is a plan view of a camera module 1-AFg as the twentieth embodiment of the camera module 1, and B of FIG. 104 is a cross-sectional view of the camera module 1-AFg.

A of FIG. 104 is a plan view taken along the line B-B' in the cross-sectional view of B of FIG. 104, and B of FIG. 104 is a cross-sectional view taken along the line A-A' in the plan view of A of FIG. 104.

In a structure of the camera module 1-AFg illustrated in A and B of FIG. 104, the lens barrel 3001 that accommodates the stacked lens structure 11 is omitted, the AF magnets 3005 are fixed by bonding to an outer peripheral side of the stacked lens structure 11, and the AF coil 3002 is fixed by bonding to the inner peripheral side of the first fixed support portion 3004.

In other words, in the camera module 1-AFg of A and B of FIG. 104, similar to the camera module 1-AFb according to the fifteenth embodiment illustrated in A and B of FIG. 95, the AF coil 3002 and the AF magnets 3005 that serve as the AF drive units 3021 are attached to the positions reverse to those in the camera module 1-AFa of A and B of FIG. 94.

Further, the stacked lens structure 11 of the camera module 1-AFg includes the substrate with lenses 41a, substrates with lenses $41b_2$, $41c_2$, and $41d_2$, and the substrate with lenses 41e. In plan view, the substrates with lenses $41b_2$ to $41d_2$ as the middle layers each have a shape recessed at attachment parts for the AF magnets 3005 with respect to the substrates with lenses 41a and 41e as the top layer and the bottom layer. With this, parts of the AF magnets 3005 are embedded in the plurality of substrates with lenses 41 forming the stacked lens structure 11.

Figure 105:
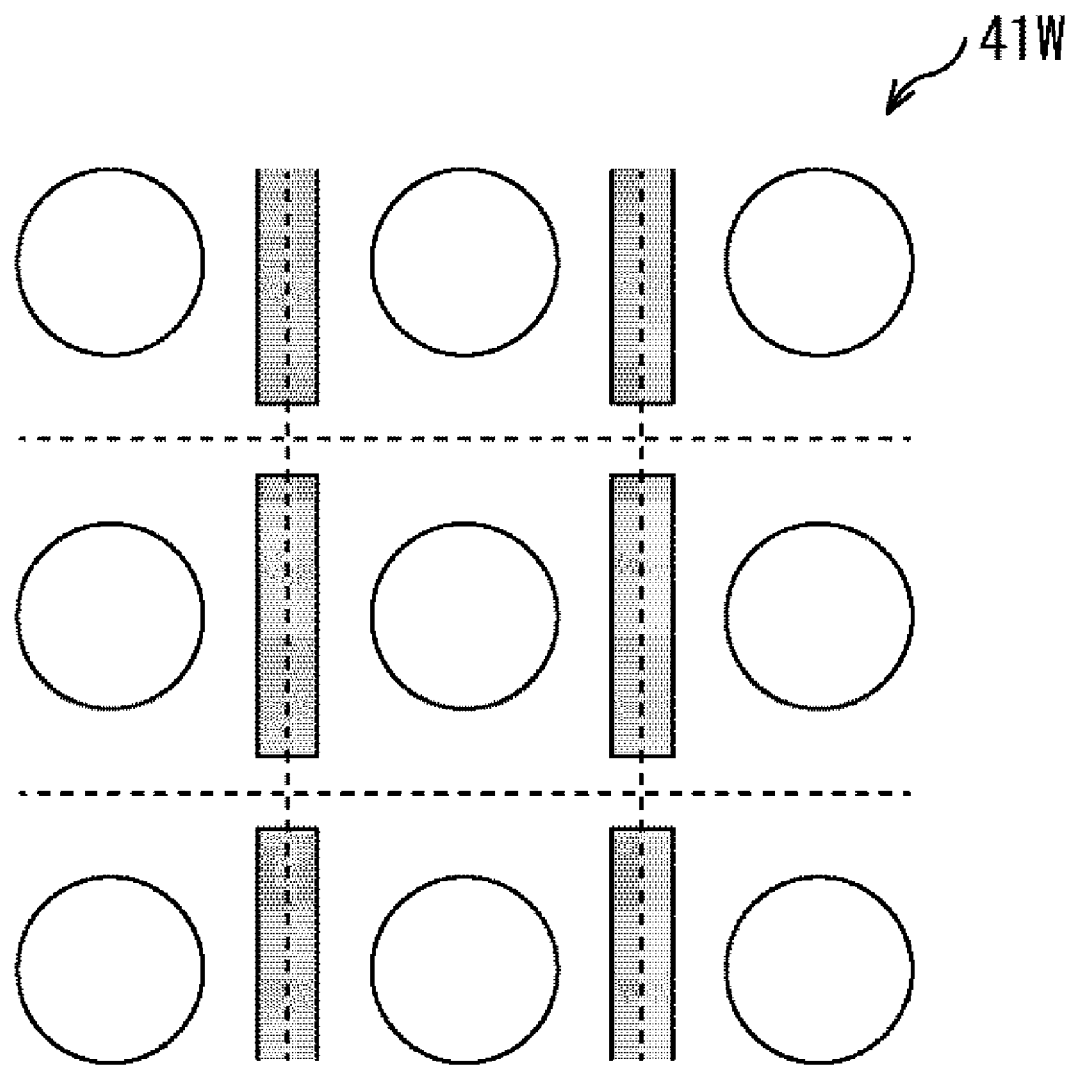
FIG. 105 is a diagram illustrating a method of processing a substrate with lenses according to the twentieth embodiment.

As illustrated in FIG. 105, the substrates with lenses 41 such as the substrates with lenses $41b_2$ to $41d_2$ as the middle layers can be manufactured by removing parts of boundary parts of dicing lines of the substrates with lenses 41W in the substrate state, for example, by etching, the dicing lines being indicated by the broken lines. The gray areas in FIG. 105 correspond to the areas to be removed, for example, by etching.

Similar to the camera module 1-AFb of A and B of FIG. 95, the camera module 1-AFg configured as described above is capable of proving the effect or the advantage of performing an autofocus operation. Further, the stacked lens structure 11 to be used includes the plurality of substrates with lenses 41 integrated with each other in the optical axis direction. Thus, the camera module 1-AFg also provides the effects and the advantages of facilitating assembling of the module, and of suppressing the variation in center position of the lenses 21 of the plurality of substrates with lenses 41.

Further, the AF magnets 3005 are assembled only by being aligned in a manner of being brought into contact with the recessed parts that are formed by forming the substrates with lenses 41a and 41e as the top layer and the bottom layer and the substrates with lenses $41b_2$ to $41d_2$ as the middle layers into shapes different from each other in plan view. Meanwhile, the AF coil 3002 is assembled to the first fixed support portion 3004 only by being aligned in a manner of being brought into contact with the projection portion 3015 projecting in the inner peripheral direction perpendicular to the optical axis direction. With this, the AF coil 3002 and the AF magnets 3005 are easily aligned with each other, and hence the module is easily assembled.

In addition, in the camera module 1-AFg, at least the parts of the AF magnets 3005 are embedded on the lens 21 side of the plurality of substrates with lenses 41 forming the stacked lens structure 11, which contributes to downsizing and weight reduction of the camera module.

Note that, instead of embedding the parts of the AF magnets 3005 in the substrates with lenses 41 as in the camera module 1-AFg of A and B of FIG. 104, the AF magnets 3005 may be entirely embedded over width directions thereof so as to be flush with outer peripheral surfaces of the substrates with lenses 41.

<29. Twenty-First Embodiment of Camera Module>

Figure 106:
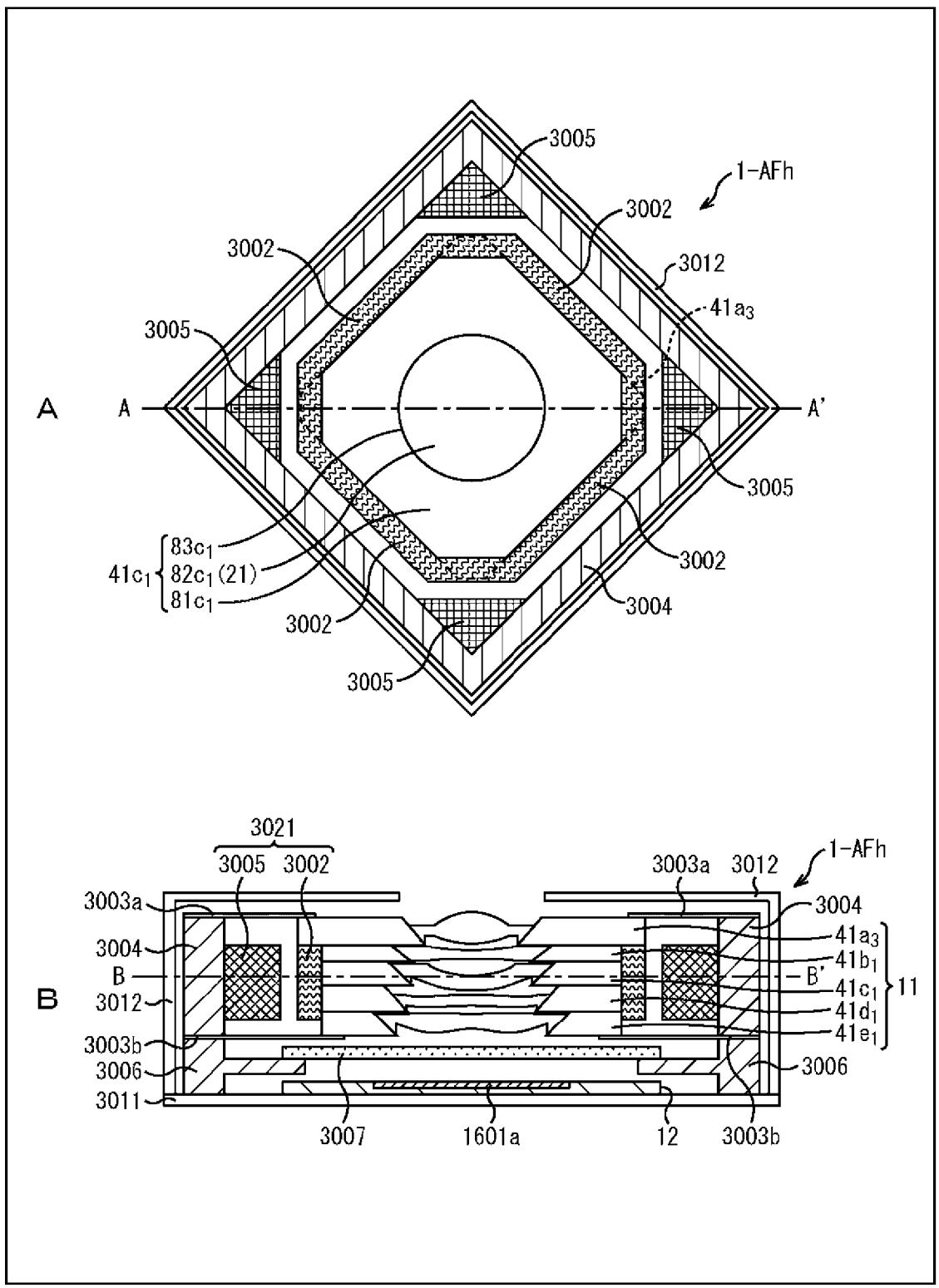
FIG. 106 is a diagram illustrating a twenty-first embodiment of a camera module which uses a stacked lens structure to which the present technique is applied.

A and B of FIG. 106 are diagrams illustrating the twenty-first embodiment of a camera module which uses a stacked lens structure to which the present technique is applied.

A of FIG. 106 is a plan view of a camera module 1-AFh as the twenty-first embodiment of the camera module 1, and B of FIG. 106 is a cross-sectional view of the camera module 1-AFh.

A of FIG. 106 is a plan view taken along the line B-B' in the cross-sectional view of B of FIG. 106, and B of FIG. 106 is a cross-sectional view taken along the line A-A' in the plan view of A of FIG. 106.

As can be understood from comparison to the camera module 1-AFf according to the nineteenth embodiment illustrated in A to C of FIG. 103, in the camera module 1-AFh illustrated in A and B of FIG. 106, the AF magnets 3005 are attached to different positions.

Specifically, in the camera module 1-AFf illustrated in A to C of FIG. 103, the AF magnets 3005 are disposed at flat surface parts of the quadrangular first fixed support portion 3004 in plan view; in contrast, in the camera module 1-AFh of A and B of FIG. 106, the AF magnets 3005 are disposed at angular parts at four corners of the quadrangular first fixed support portion 3004. In other words, the AF magnets 3005 are disposed at positions facing the four corners of the substantially quadrangular substrates with lenses 41.

Note that, as can be understood from comparison with the substrate with lenses 41a of the camera module 1-AFf of A to C of FIG. 103, in order that the AF magnets 3005 are disposed at the angular parts at the four corners of the first fixed support portion 3004, as indicated by the broken line in A of FIG. 106, angular parts at four corners of a substrate with lenses $41a_3$ as the top layer are also slightly removed. The substrates with lenses $41b_1$ to $41e_1$ are the same as those of the camera module 1-AFf of A to C of FIG. 103.

Further, with regard to the number of the AF magnets 3005 attached to the first fixed support portion 3004, in the camera module 1-AFf illustrated in A to C of FIG. 103, the two AF magnets 3005 are attached to the opposite two of the four sides of the quadrangular first fixed support portion 3004; in contrast, in the camera module 1-AFh of A and B of FIG. 106, the four AF magnets 3005 are attached to the angular parts at the four corners of the first fixed support portion 3004.

Other configuration features of the camera module 1-AFh of A and B of FIG. 106 are the same as those of the camera module 1-AFf illustrated in A to C of FIG. 103.

Similar to the camera module 1-AFf of A to C of FIG. 103, the camera module 1-AFh configured as described above is capable of proving the effect or the advantage of performing an autofocus operation. Further, the stacked lens structure 11 to be used includes the plurality of substrates with lenses 41 integrated with each other in the optical axis direction. Thus, the camera module 1-AFh also provides the effects and the advantages of facilitating assembling of the module, and of suppressing the variation in center position of the lenses 21 of the plurality of substrates with lenses 41.

The angular portions at the four corners of the substrates with lenses $41b_1$ to $41e_1$ of the stacked lens structure 11, around which the AF coil 3002 is wound, each have an obtuse angle. With this, it is possible to provide the effect or the advantage that the coil to be attached is prevented from being damaged and causing defects.

In addition, the angular portions of the substrates with lenses 41W in the substrate state are removed before the substrates with lenses 41W are formed into pieces. With this, it is also possible to provide the effect or the advantage of preventing chipping at the time of or after forming the substrates with lenses 41 (support substrates 81) into pieces by dicing.

Further, the AF coil 3002 is assembled only by being aligned in a manner of being brought into contact with the substrate with lenses $41a_3$ having the shape including the angular portions projecting at the four corners to the outer peripheral side with respect to the substrates with lenses $41b_1$ to $41e_1$. With this, the effect and the advantage of facilitating alignment of the AF coil 3002 and assembling of the module are provided.

<30. Twenty-Second Embodiment of Camera Module>

Figure 107:
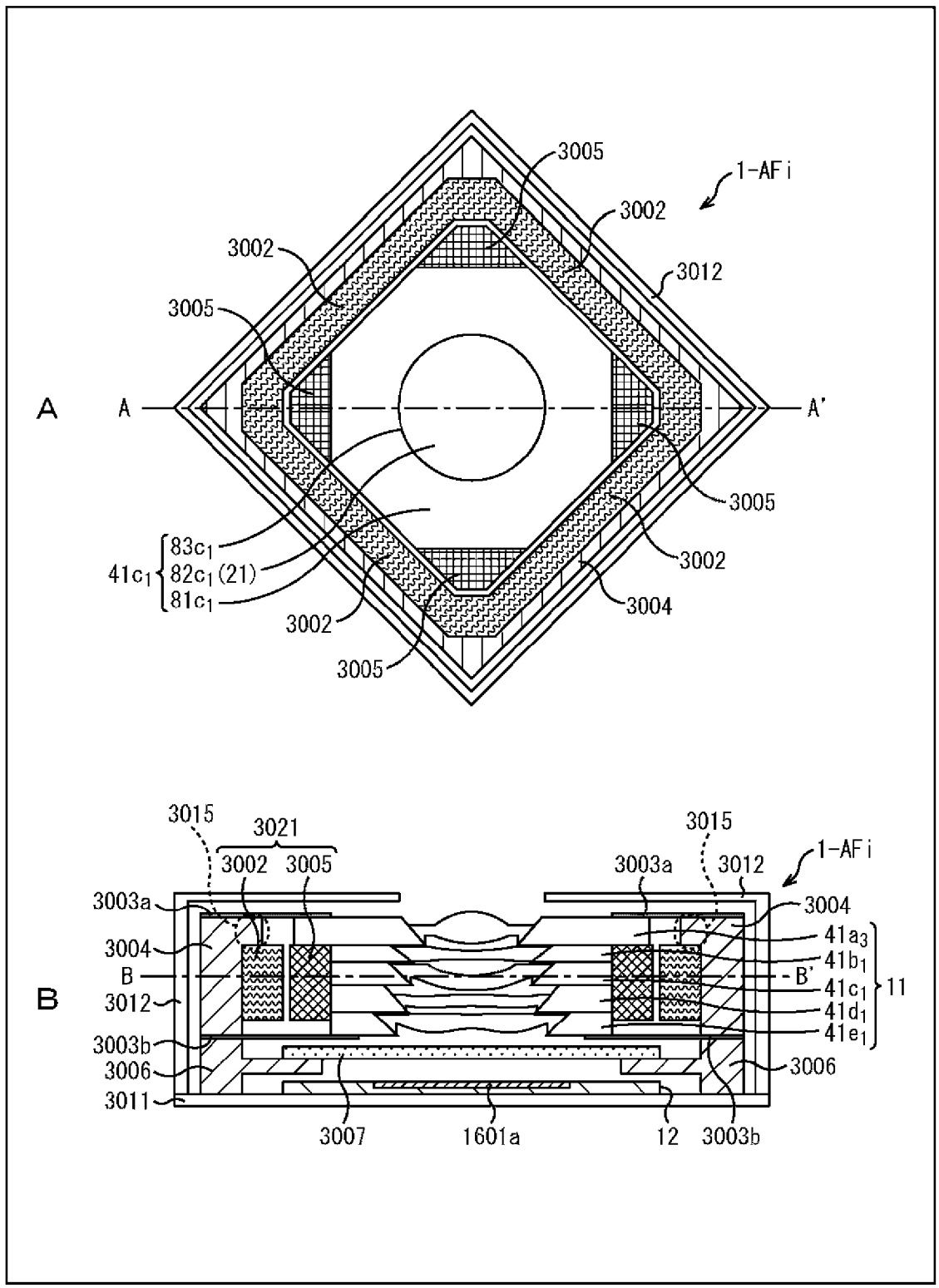
FIG. 107 is a diagram illustrating a twenty-second embodiment of a camera module which uses a stacked lens structure to which the present technique is applied.

A and B of FIG. 107 are diagrams illustrating the twenty-second embodiment of a camera module which uses a stacked lens structure to which the present technique is applied.

A of FIG. 107 is a plan view of a camera module 1-AFi as the twenty-second embodiment of the camera module 1, and B of FIG. 107 is a cross-sectional view of the camera module 1-AFi.

A of FIG. 107 is a plan view taken along the line B-B' in the cross-sectional view of B of FIG. 107, and B of FIG. 107 is a cross-sectional view taken along the line A-A' in the plan view of A of FIG. 107.

In the camera module 1-AFi illustrated in A and B of FIG. 107, the AF coil 3002 and the AF magnets 3005 that serve as the AF drive units 3021 are attached to positions reverse to those in the camera module 1-AFh according to the twenty-first embodiment illustrated in A and B of FIG. 106.

Specifically, in the camera module 1-AFh illustrated in A and B of FIG. 106, the AF coil 3002 is fixed by bonding to the outer peripheral side of the stacked lens structure 11, and the AF magnets 3005 are fixed by bonding to the inner peripheral side of the first fixed support portion 3004; in contrast, in the camera module 1-AFi of A and B of FIG. 107, the AF magnets 3005 are fixed by bonding to the outer peripheral side of the stacked lens structure 11, and the AF coil 3002 is fixed by bonding to the inner peripheral side of the first fixed support portion 3004.

The first fixed support portion 3004 includes, in the upper surface thereof farthest from the light receiving element 12, the projection portion 3015 projecting to the inner peripheral side, and has the substantially L-shapes in cross section. At the time of fixing the AF coil 3002 by bonding to the first fixed support portion 3004, the AF coil 3002 is aligned in a manner of being brought into contact with the projection portion 3015 on the inner peripheral side, and then fixed thereto by bonding.

The AF magnets 3005 are disposed at the angular parts at the four corners of the four substrates with lenses $41b_1$ to $41e_1$ forming the stacked lens structure 11. The AF magnets 3005 are aligned in a manner of being brought into contact with the substrate with lenses $41a_3$ as the top layer, which has the projecting angular portions at the four corners, and then fixed thereto by bonding.

Other configuration features of the camera module 1-AFi of A and B of FIG. 107 are the same as those of the camera module 1-AFh illustrated in A and B of FIG. 106.

Similar to the camera module 1-AFh of A and B of FIG. 106, the camera module 1-AFi configured as described above is capable of proving the effect or the advantage of performing an autofocus operation. Further, the stacked lens structure 11 to be used includes the plurality of substrates with lenses 41 integrated with each other in the optical axis direction. Thus, the camera module 1-AFi also provides the effects and the advantages of facilitating assembling of the module, and of suppressing the variation in center position of the lenses 21 of the plurality of substrates with lenses 41.

The angular portions at the four corners of the substrates with lenses $41b_1$ to $41e_1$ of the stacked lens structure 11 each have an obtuse angle. Thus, when the angular portions of the substrates with lenses 41W in the substrate state are removed before the substrates with lenses 41W are formed into pieces, it is also possible to provide the effect or the advantage of preventing chipping at the time of or after forming the substrates with lenses $41b_1$ to $41e_1$ (support substrates $81b_1$ to $81e_1$) into pieces by dicing.

Further, the AF coil 3002 is assembled to the first fixed support portion 3004 only by being aligned in a manner of being brought into contact with the projection portion 3015 projecting in the inner peripheral direction perpendicular to the optical axis direction. With this, the effect and the advantage of facilitating alignment of the AF coil 3002 and assembling of the module are provided.

In addition, in the camera module 1-AFi, at least the parts of the AF magnets 3005 are embedded in the substrates with lenses $41b_1$ to $41e_1$ forming the stacked lens structure 11, which contributes to downsizing and weight reduction of the camera module.

<31. Twenty-Third Embodiment of Camera Module>

Figure 108:
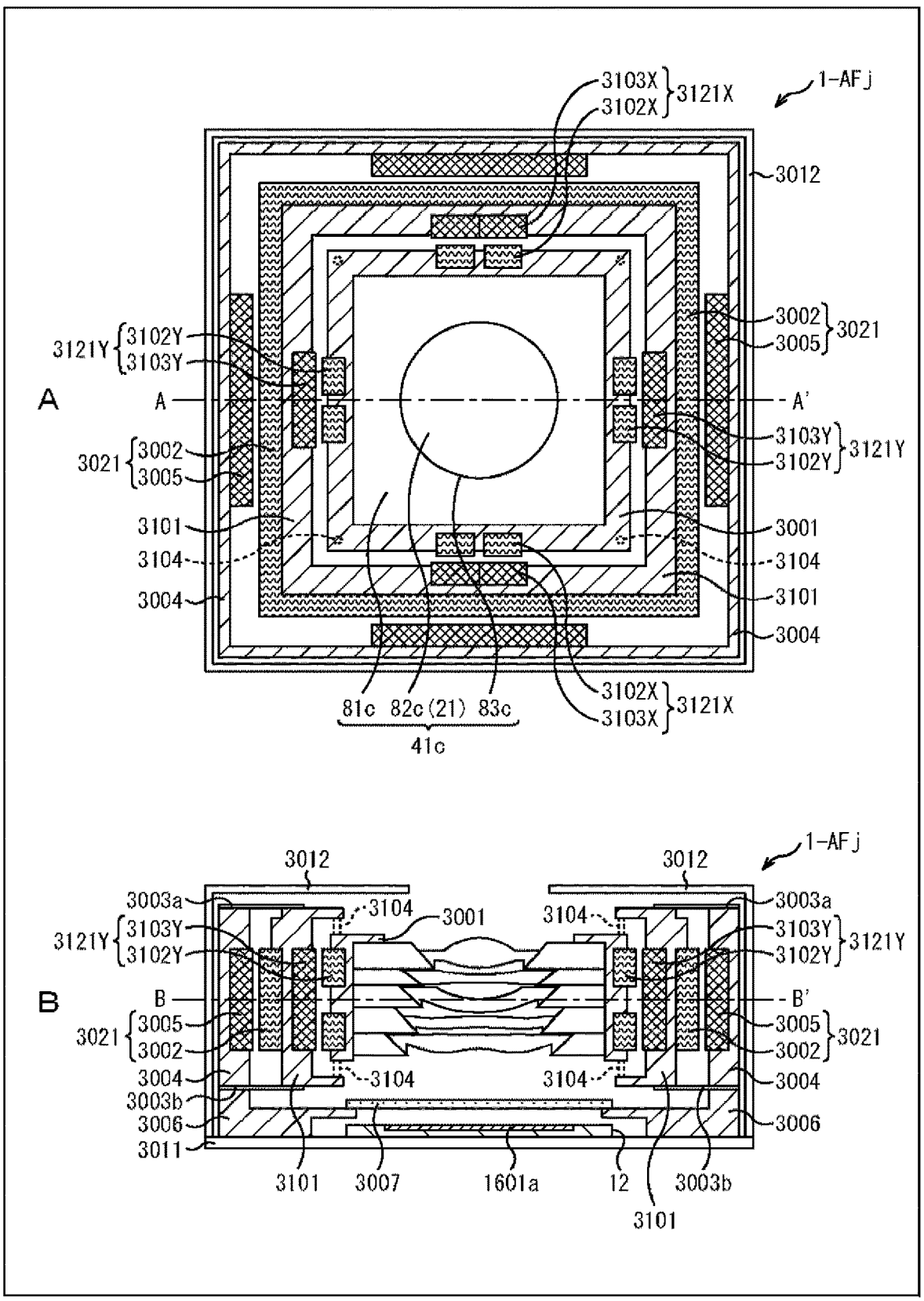
FIG. 108 is a diagram illustrating a twenty-third embodiment of a camera module which uses a stacked lens structure to which the present technique is applied.

A and B of FIG. 108 are diagrams illustrating the twenty-third embodiment of a camera module which uses a stacked lens structure to which the present technique is applied.

A of FIG. 108 is a plan view of a camera module 1-AFj as the twenty-third embodiment of the camera module 1, and B of FIG. 108 is a cross-sectional view of the camera module 1-AFj.

A of FIG. 108 is a plan view taken along the line B-B' in the cross-sectional view of B of FIG. 108, and B of FIG. 108 is a cross-sectional view taken along the line A-A' in the plan view of A of FIG. 108.

The camera module 1-AFj illustrated in A and B of FIG. 108 is obtained by adding an optical image stabilizer (OIS) mechanism to the camera module 1-AFa according to the fifteenth embodiment illustrated in A and B of FIG. 94.

As can be understood from comparison with the camera module 1-AFa illustrated in A and B of FIG. 94, in the camera module 1-AFj of A and B of FIG. 108, the AF coil 3002 is fixed by bonding not to the lens barrel 3001 but to an outer peripheral side of an additionally-provided movable support portion 3101. OIS magnets 3103 as permanent magnets for the OIS are fixed by bonding to an inner peripheral side of the movable support portion 3101.

The movable support portion 3101 has a hollow quadrangular shape surrounding the lens barrel 3001 accommodating the stacked lens structure 11, an upper surface fixed to the first fixed support portion 3004 through intermediation of the suspension 3003*a*, and a lower surface fixed to the first fixed support portion 3004 through intermediation of the suspension 3003*b*.

Further, the movable support portion 3101 is connected to the lens barrel 3001 through intermediation of OIS suspensions 3104 at four corners of the quadrangular lens barrel 3001 as viewed from above, the OIS suspensions 3104 each being made up of a circular-columnar elastic metal member. On the outer peripheral surfaces of the lens barrel 3001, OIS coils 3102 are fixed by bonding at position facing the OIS suspensions 3104.

OIS coils 3102X fixed by bonding to predetermined opposite two sides of the four outer peripheral sides of the quadrangular lens barrel 3001 as viewed from above, and OIS magnets 3103X facing the OIS coils 3102X serve as X-axis OIS drive units 3121X. When a current is caused to flow through the OIS coils 3102X, the stacked lens structure 11 is moved in an X-axis direction. OIS coils 3102Y fixed by bonding to other opposite two sides, and OIS magnets 3103Y facing the OIS coils 3102Y serve as Y-axis OIS drive units 3121Y. When a current is caused to flow through the OIS coils 3102Y, the stacked lens structure 11 is moved in a Y-axis direction.

In the optical axis direction, the stacked lens structure 11 is driven similar to that of the camera module 1-AFa illustrated in A and B of FIG. 94. In other words, when a current flows through the AF coil 3002 in the AF drive units 3021 made up of the AF coil 3002 and the AF magnets 3005, the distance between the stacked lens structure 11 and the light receiving element 12 is adjusted.

The camera module 1-AFj configured as described above includes the optical image stabilizer mechanism, and hence is capable of providing, in addition to the effect or the advantage to be provided by the camera module 1-AFa illustrated in A and B of FIG. 94, an effect or an advantage of performing an image stabilizing operation.

Note that, in the camera module 1-AFj of A and B of FIG. 108, the OIS coils 3102 are fixed by bonding to the outer peripheral surfaces of the lens barrel 3001, and the OIS magnets 3103 are fixed by bonding to the inner peripheral side of the movable support portion 3101; however, similar to the above-described positional relationships between the AF coil 3002 and the AF magnets 3005, the OIS coils 3102 and the OIS magnets 3103 may have a reverse positional relationship.

<32. Twenty-Fourth Embodiment of Camera Module>

Figure 109:
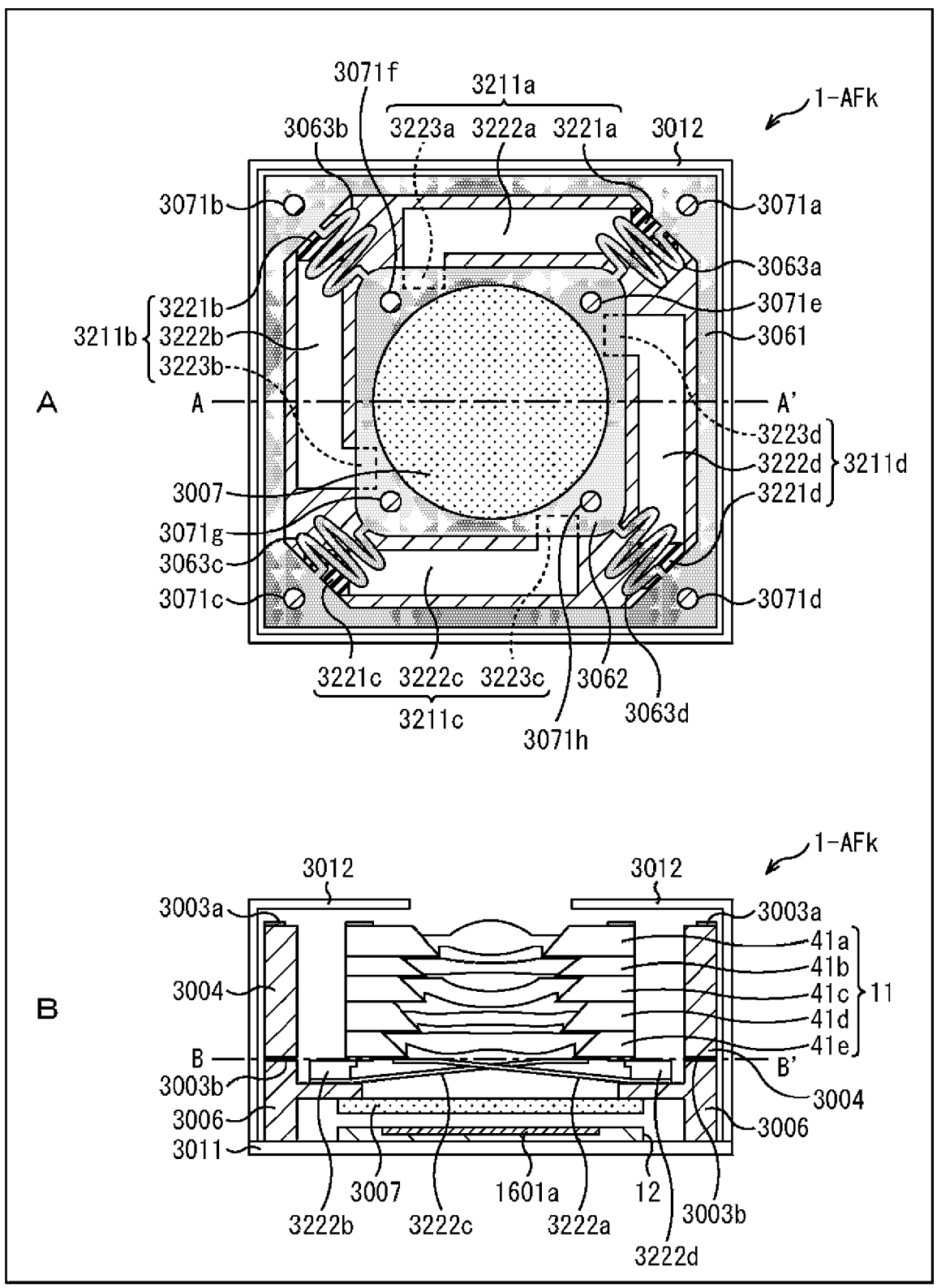
FIG. 109 is a diagram illustrating a twenty-fourth embodiment of a camera module which uses a stacked lens structure to which the present technique is applied.

A and B of FIG. 109 are diagrams illustrating the twenty-fourth embodiment of a camera module which uses a stacked lens structure to which the present technique is applied.

A of FIG. 109 is a plan view of a camera module 1-AFk as the twenty-fourth embodiment of the camera module 1, and B of FIG. 109 is a cross-sectional view of the camera module 1-AFk.

A of FIG. 109 is a plan view in which the camera module 1-AFk illustrated in A and B of FIG. 109 is viewed (downward) from the lower suspension 3003*b* toward the light receiving element 12, and B of FIG. 109 is a cross-sectional view taken along the line A-A' in the plan view of A of FIG. 109.

The camera module 1-AFk illustrated in A and B of FIG. 109 is obtained by replacing the electromagnetic AF drive units 3021 that perform the AF operation in the camera module 1-AFc illustrated in A and B of FIG. 96, which does not include the lens barrel 3001, with an actuator that uses a piezoelectric member.

More specifically, in the camera module 1-AFk of A and B of FIG. 109, the AF coil 3002 and the AF magnets 3005, which are provided in the camera module 1-AFc of A and B of FIG. 96 so as to serve as the electromagnetic AF drive units 3021, are omitted. Instead, there are provided four piezoelectric drive units 3211*a*, 3211*b*, 3211*c*, and 3211*d* that use piezoelectric elements.

The camera module 1-AFk does not include the AF coil 3002, and hence a current need not be caused to flow therethrough. Thus, similar to the upper suspension 3003*a*, the lower suspension 3003*b* is made up of a single plate. Specifically, as illustrated in A of FIG. 109, the suspension 3003*b* includes a first fixed plate 3061 to be fixed by bonding to the first fixed support portion 3004, a second fixed plate 3062 to be fixed by bonding to the substrate with lenses 41*e* as the bottom layer of the stacked lens structure 11, and the connection springs 3063*a* to 3063*d* that connect the first fixed plate 3061 and the second fixed plate 3062 to each other at four corners.

The piezoelectric drive units 3211*a* to 3211*d* are connected one by one to respective sides of the second fixed plate 3062 having a substantially quadrangular shape in plan view.

The piezoelectric drive unit 3211*a* includes a piezoelectric fixed portion 3221*a* to be fixed to the second fixed support portion 3006, a piezoelectric movable portion 3222*a* to be deformed by voltage application, and a piezoelectric fixed portion 3223*a* to be fixed to the second fixed plate 3062.

The piezoelectric movable portion 3222*a* has a sandwich structure including two electrodes (counter electrodes) and a piezoelectric member sandwiched therebetween. When a predetermined voltage is applied to the two electrodes, the plate-like piezoelectric movable portion 3222*a* is warped in the upper and lower directions. With this, the stacked lens structure 11 is moved in the optical axis direction.

The piezoelectric drive unit 3211*b* similarly includes a piezoelectric fixed portion 3221*b*, a piezoelectric movable portion 3222*b*, and a piezoelectric fixed portion 3223*b*. The same is true of the piezoelectric drive units 3211*c* and 3211*d*.

When the four piezoelectric drive units 3211*a* to 3211*d* are symmetrically disposed as illustrated in A and B of FIG. 109, a driving force is increased, and forces in directions other than the optical axis direction can be reduced.

Similar to the camera module 1-AFa of A and B of FIG. 94, the camera module 1-AFk configured as described above is capable of proving the effect or the advantage of performing an autofocus operation. Further, the stacked lens structure 11 to be used includes the plurality of substrates with lenses 41 integrated with each other in the optical axis direction. Thus, the camera module 1-AFk also provides the effects and the advantages of facilitating assembling of the module, and of suppressing the variation in center position of the lenses 21 of the plurality of substrates with lenses 41. In addition, the lens barrel 3001 is unnecessary, and hence the camera module can be reduced in size and weight.

Note that, the piezoelectric drive units 3211*a* to 3211*d* may have any structure including plate-like piezoelectric members such as a bimetal, a shape memory alloy, and the polymer actuator disclosed in Japanese Patent Application Laid-open No. 2013-200366, which are deformed by voltage application to move an object.

<33. Twenty-Fifth Embodiment of Camera Module>

Figure 110:
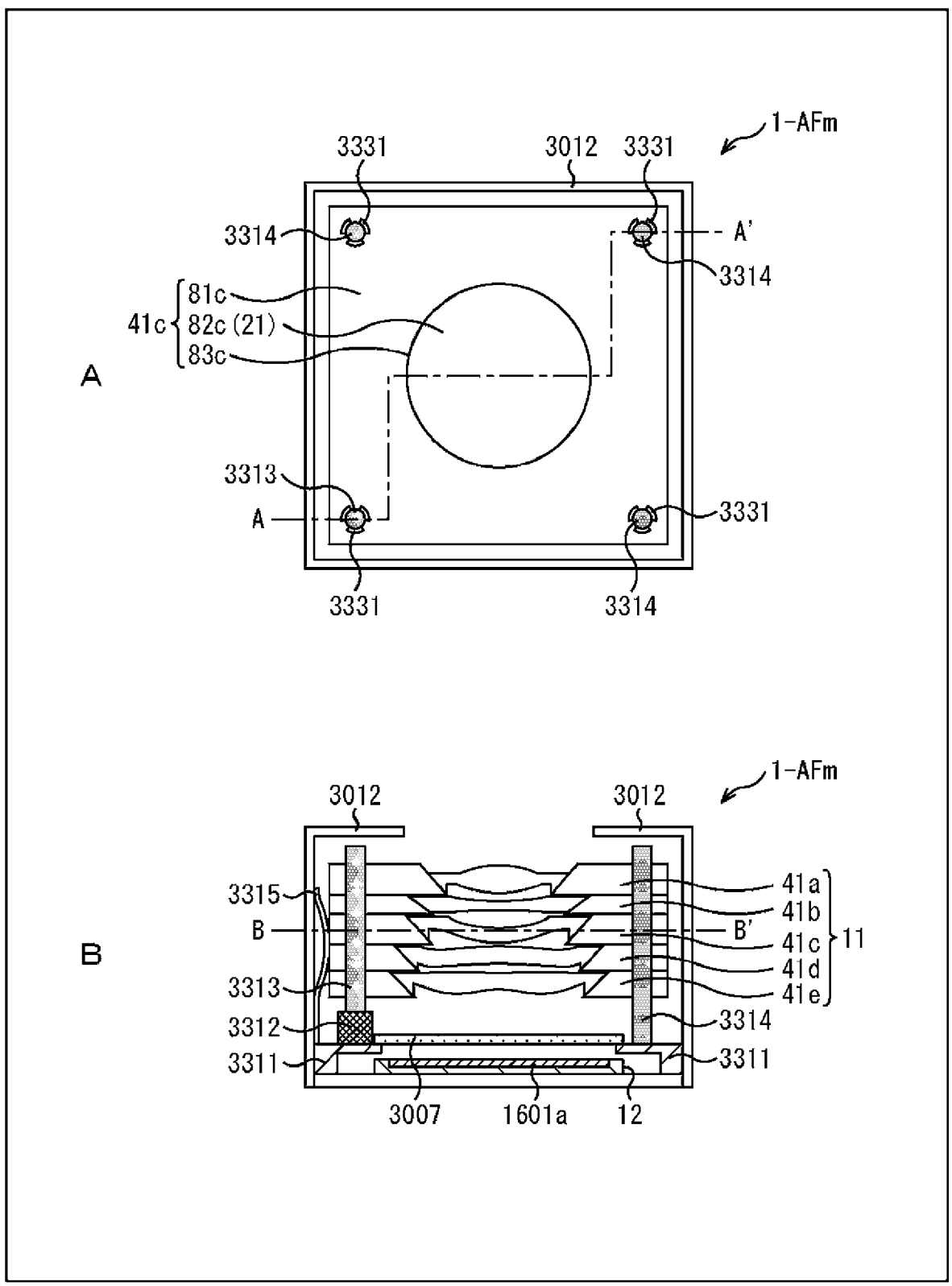
FIG. 110 is a diagram illustrating a twenty-fifth embodiment of a camera module which uses a stacked lens structure to which the present technique is applied.

A and B of FIG. 110 are diagrams illustrating the twenty-fifth embodiment of a camera module which uses a stacked lens structure to which the present technique is applied.

A of FIG. 110 is a plan view of a camera module 1-AFm as the twenty-fifth embodiment of the camera module 1, and B of FIG. 110 is a cross-sectional view of the camera module 1-AFm.

A of FIG. 110 is a plan view taken along the line B-B' in the cross-sectional view of B of FIG. 110, and B of FIG. 110 is a cross-sectional view taken along the line A-A' in the plan view of A of FIG. 110.

The camera module 1-AFm illustrated in A and B of FIG. 110 is obtained by replacing the electromagnetic AF drive units 3021 that perform the AF operation of the camera module 1-AFc according to the seventeenth embodiment illustrated in A and B of FIG. 96 with an ultrasonic linear actuator.

More specifically, in the camera module 1-AFm of A and B of FIG. 110, the AF coil 3002 and the AF magnets 3005, which are provided in the camera module 1-AFc of A and B of FIG. 96 so as to serve as the electromagnetic AF drive units 3021, are omitted. Instead, there are provided a piezoelectric element 3312 having a driven member 3313 coupled thereto, and three guide members 3314. The piezoelectric element 3312 and the three guide members 3314 are fixed to a fixed support portion 3311.

The driven member 3313 and the three guide members 3314 are inserted through holes 3331 that are formed near the four corners of the plurality of substrates with lenses 41 (specifically, support substrates 81 thereof) forming the stacked lens structure 11. The driven member 3313 and the three guide members 3314 are each made up, for example, of a metal material or a resin material having a circular-columnar shape.

When a predetermined voltage is applied, the piezoelectric element 3312 causes the driven member 3313 to periodically stretch and contract at different stretching and contraction speeds. A shape of an inner wall of each of the holes 3331 formed near the four corners of the plurality of substrates with lenses 41 (specifically, support substrates 81 thereof), and shapes of outer walls of the driven member 3313 and the guide members 3314 are designed such that optimum friction force is generated. In other words, those shapes are designed such that high friction force is generated when a driving capability of the piezoelectric element 3312 is high, and that low friction force is generated when the driving capability of the piezoelectric element 3312 is low.

Specifically, in a shape employed in the example of A and B of FIG. 110, as illustrated in A of FIG. 110, three grooves are formed in the inner wall of each of the holes 3331 such that a part of each of the holes 3331 is brought into contact with the driven member 3313 or the guide member 3314, thereby generating a desired friction force. The holes 3331 can be formed collectively with the through-hole 83 by, for example, wet-etching. With this, the holes 3331 can be formed to have the same shape and an accurate positional relationship. Thus, an effect or a function of increasing accuracy in driving the stacked lens structure 11 is obtained.

When the piezoelectric element 3312 drives the driven member 3313 at low speed, the stacked lens structure 11 follows the movement of the driven member 3313 by static friction force. When the piezoelectric element 3312 drives the driven member 3313 at high speed, a sum of inertia and the static friction force of the stacked lens structure 11 is larger than a driving force to be imparted from the piezoelectric element 3312 to the driven member 3313, and hence the stacked lens structure 11 is not moved. By alternately repeating slow stretching drive and fast contraction drive, the stacked lens structure 11 is moved upward or downward in the optical axis direction.

The three guide members 3314 are fixed directly to the fixed support portion 3311 so as to guide the stacked lens structure 11 in a moving direction thereof, that is, to allow the stacked lens structure 11 to follow the movement of the driven member 3313. A pressure spring 3315 presses the stacked lens structure 11 against the driven member 3313 so as to generate appropriate friction force, thereby efficiently transmitting the driving force.

Similar to the camera module 1-AFa of A and B of FIG. 94, the camera module 1-AFm configured as described above is capable of proving the effect or the advantage of performing an autofocus operation. Further, the stacked lens structure 11 to be used includes the plurality of substrates with lenses 41 integrated with each other in the optical axis direction. Thus, the camera module 1-AFm also provides the effects and the advantages of facilitating assembling of the module, and of suppressing the variation in center position of the lenses 21 of the plurality of substrates with lenses 41. In addition, the lens barrel 3001 is unnecessary, and hence the camera module can be reduced in size and weight.

The ultrasonic linear actuator, which is employed in the twenty-fifth embodiment, is capable of providing an effect or an advantage of reducing the size of the camera module 1 as a whole to be smaller than that in a case of attaching ultrasonic actuators of other types to an outside of the stacked lens structure 11.

<34. Twenty-Sixth Embodiment of Camera Module>

Figure 111:
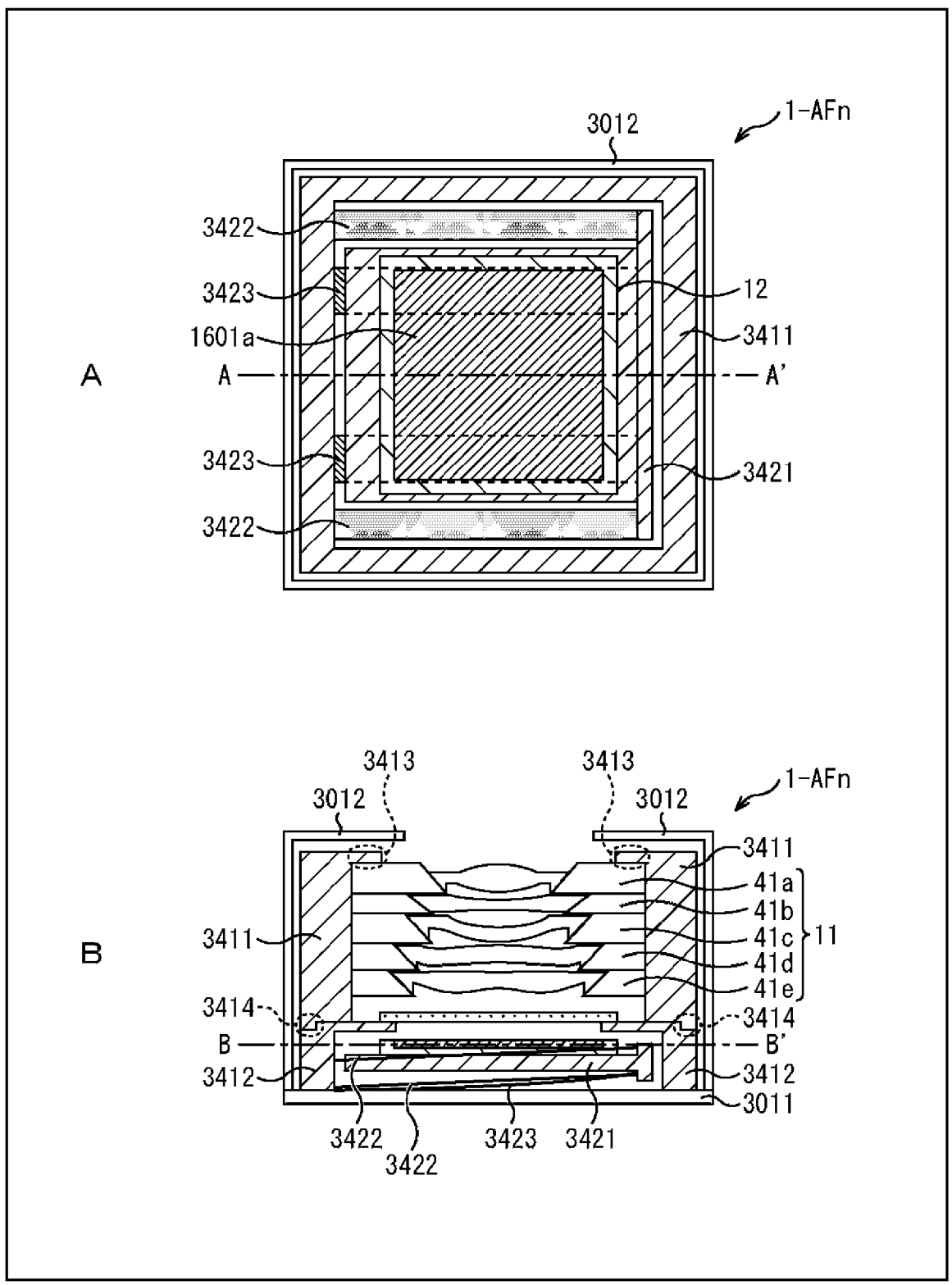
FIG. 111 is a diagram illustrating a twenty-sixth embodiment of a camera module which uses a stacked lens structure to which the present technique is applied.

A and B of FIG. 111 are diagrams illustrating the twenty-sixth embodiment of a camera module which uses a stacked lens structure to which the present technique is applied.

A of FIG. 111 is a plan view of a camera module 1-AFn as the twenty-sixth embodiment of the camera module 1, and B of FIG. 111 is a cross-sectional view of the camera module 1-AFn.

A of FIG. 111 is a plan view in which the camera module 1-AFn illustrated in A and B of FIG. 111 is viewed (downward) from the line B-B' in the cross-sectional view of B of FIG. 11 toward the light receiving element 12, and B of FIG. 111 is a cross-sectional view taken along the line A-A' in the plan view of A of FIG. 111.

In all of the configurations of the camera modules 1-AFa to 1-AFm according to the fifteenth embodiment to the twenty-fifth embodiment described hereinabove, the stacked lens structure 11 is moved in the optical axis direction. In contrast, in the configuration of the camera module 1-AFn illustrated in A and B of FIG. 111, the stacked lens structure 11 is fixed, and the light receiving element 12 is moved in the optical axis direction.

The stacked lens structure 11 is accommodated in a lens barrel 3411. The lens barrel 3411 is fixed in position with respect to the substrate 3011 by being connected directly to a second fixed support portion 3412.

The light receiving element 12 is placed on a light receiving element holder 3421, and the light receiving element holder 3421 is coupled to the second fixed support portion 3412 with a plurality of parallel links 3422. With this, the light receiving element 12 can be moved substantially parallel to the optical axis direction.

A piezoelectric actuator 3423 has the sandwich structure including two electrodes (counter electrodes) and a piezoelectric member sandwiched therebetween. When a predetermined voltage is applied to the two electrodes, the plate-like piezoelectric actuator 3423 is warped in the upper and lower directions. With this, the light receiving element 12 placed on the light receiving element holder 3421 is moved in the optical axis direction. In this way, the distance between the stacked lens structure 11 and the light receiving element 12 can be adjusted.

As the piezoelectric actuator 3423, there may be employed any other structure including plate-like piezoelectric members such as a bimetal, a shape memory alloy, and the polymer actuator disclosed in Japanese Patent Application Laid-open No. 2013-200366, which are deformed by voltage application to move an object.

Note that, as long as the focus adjustment mechanism (autofocus mechanism) moves the light receiving element 12 in the optical axis direction of the stacked lens structure 11, the camera module 1 may include devices other than the piezoelectric actuator. For example, the ultrasonic linear actuator, which is illustrated in A and B of FIG. 110, may be attached to the light receiving element 12 such that the light receiving element 12 is moved in the optical axis direction of the stacked lens structure 11. As another example, the electromagnetic AF drive units 3021 illustrated in A and B of FIG. 94 may be attached to the light receiving element 12 such that the light receiving element 12 is moved in the optical axis direction of the stacked lens structure 11. As still another example, a support member to be moved with use of an electromagnetic drive mechanism that uses a coil and magnets may be attached to the light receiving element 12 such that the light receiving element 12 is moved in the optical axis direction of the stacked lens structure 11 through intermediation of the support member.

As illustrated in B of FIG. 111, the lens barrel 3411 includes, in an upper surface thereof farthest from the light receiving element 12, a projection portion 3413 projecting to the inner peripheral side, and has substantially L-shapes in cross section. At the time of fixing the stacked lens structure 11 by bonding to the lens barrel 3411, the stacked lens structure 11 is aligned in a manner of being brought into contact with the projection portion 3413, and then fixed thereto by bonding. With this, the stacked lens structure 11 and the lens barrel 3411 can be assembled in accurate positional relationship.

Further, as illustrated in B of FIG. 111, the lens barrel 3411 includes a connecting portion 3414 obtained by forming a part to be connected to the second fixed support portion 3412 into a predetermined projection-recess shape. With this, the lens barrel 3411 can be aligned and fixed with high accuracy.

Similar to the camera module 1-AFa of A and B of FIG. 94, the camera module 1-AFn configured as described above is capable of proving the effect or the advantage of performing an autofocus operation. Further, the stacked lens structure 11 including the plurality of substrates with lenses 41 integrated with each other in the optical axis direction is aligned in a simple manner of being brought into contact with the projection portion 3413 of the lens barrel 3411. Thus, the camera module 1-AFn also provides the effects and the advantages of facilitating assembling of the module, and of suppressing the variation in center position of the lenses 21 of the plurality of substrates with lenses 41. In addition, the lens barrel 3001 is unnecessary, and hence the camera module can be reduced in size and weight.

Lastly, by way of an example of the camera module 1-AFn illustrated in A and B of FIG. 111, a structure example of a multi-ocular camera module is described with reference to A and B of FIG. 112.

Figure 112:
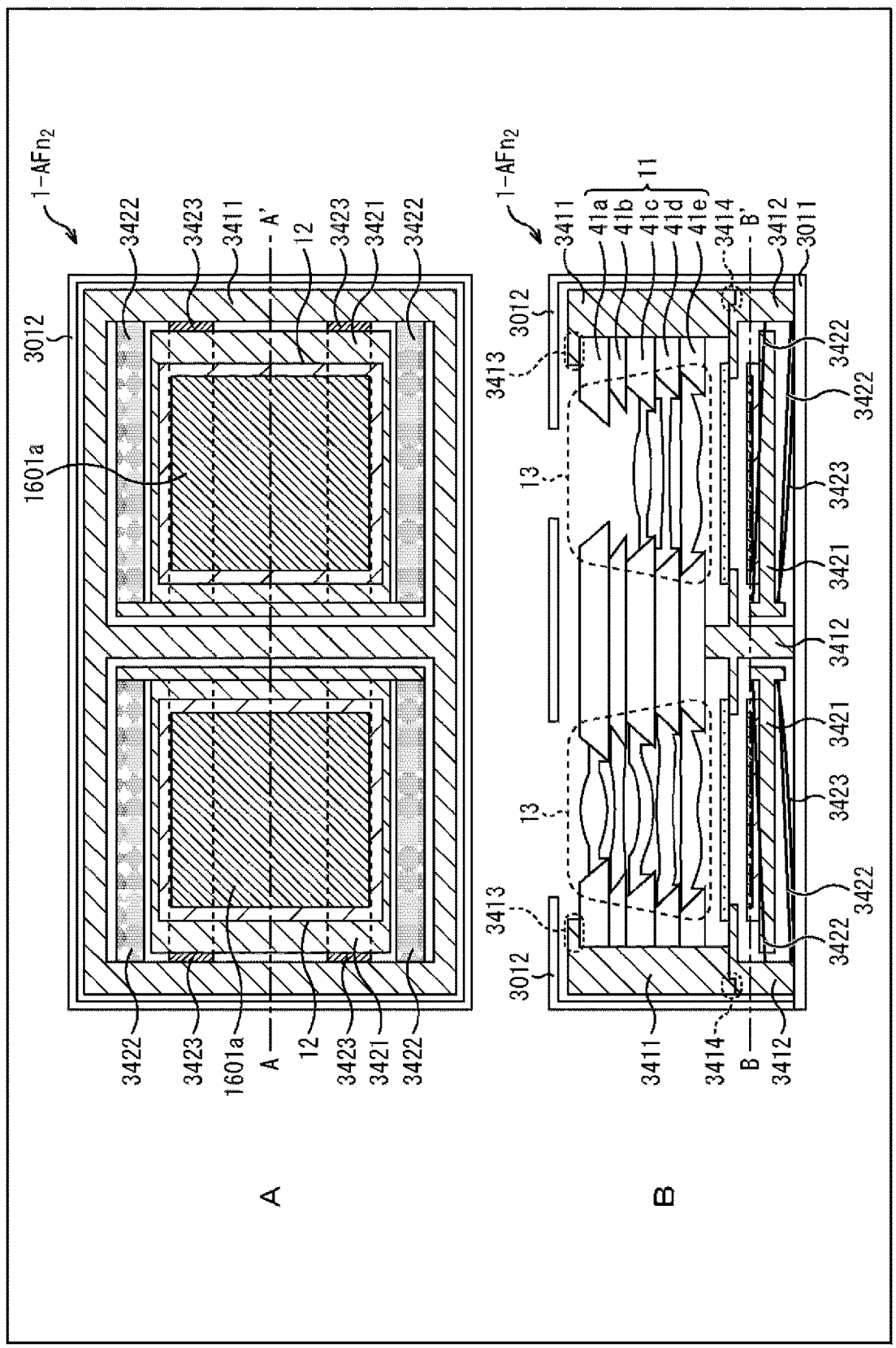
FIG. 112 is a diagram illustrating an example of a case where the camera module according to the twenty-sixth embodiment is applied to a multi-ocular camera module.

A of FIG. 112 is a plan view taken along the line B-B' in the cross-sectional view of B of FIG. 112, and B of FIG. 112 is a cross-sectional view taken along the line A-A' in the plan view of A of FIG. 112.

In the stacked lens structure 11 of a camera module 1-AFn$_2$ illustrated in A and B of FIG. 112, the two optical units 13 are coupled to each other with the support substrates 81. Further, in the camera module 1-AFn$_2$, the IR cut filter 3007 and the light receiving element 12 are provided below each of the two optical units 13. The two light receiving elements 12 are placed respectively on the light receiving element holders 3421 therefor, and the light receiving element holders 3421 are each coupled to the second fixed support portion 3412 with the plurality of parallel links 3422. With this, the light receiving elements 12 can be moved substantially parallel to the optical axis direction independently of each other.

Similar to the camera module 1B according to the second embodiment described with reference to A to H of FIG. 9, the two optical units 13 formed in the stacked lens structure 11 have different optical parameters. The two optical units 13 may include the optical unit 13 having a short focal distance for photographing a close-range view and the optical unit 13 having a long focal distance for photographing a distant view.

When the stacked lens structure 11 includes two or more optical units 13, the plurality of optical units 13 forming the stacked lens structure 11 are formed into pieces under a state of being coupled to each other with the support substrates 81. Thus, the optical units 13 can be manufactured by a wafer process in an accurate positional relationship in the X-Y axis directions orthogonal to the optical axis.

Further, at the time of fixing the stacked lens structure 11 by bonding to the lens barrel 3411, the stacked lens structure 11 is aligned in a manner of being brought into contact with the projection portion 3413, and then fixed thereto by bonding. With this, the stacked lens structure 11 and the lens barrel 3411 can be assembled in accurate positional relationship also in the optical axis direction, and hence it is possible to provide an effect or an advantage of omitting special optical-axis alignment.

In addition, the light receiving elements 12 are disposed independently of each other so as to be driven separately in the optical axis direction. Thus, it is possible to provide an effect or an advantage that, even when the optical units 13 having different back focal distances are used in combination, focusing is accurately performed.

Note that, as a matter of course, similar to the configuration described with reference to A and B of FIG. 112, which is obtained by applying the camera module 1-AFn illustrated in A and B of FIG. 111 to a multi-ocular camera module, the camera modules 1-AFa to 1-AFm according to the fifteenth embodiment to the twenty-fifth embodiment described hereinabove may employ the configuration of the multi-ocular camera module.

When the camera modules 1-AFa to 1-AFm according to the fifteenth embodiment to the twenty-fifth embodiment employ the configuration of the multi-ocular camera module, as illustrated in A and B of FIG. 112, the light receiving elements 12 corresponding respectively to the optical units 13 may be disposed separately on the substrate 3011. Alternatively, as illustrated, for example, in FIG. 13, the light receiving areas 1601a (FIG. 65) of the light receiving element 12 made up of a single substrate may be disposed to correspond respectively to the optical units 13.

Figure 113:
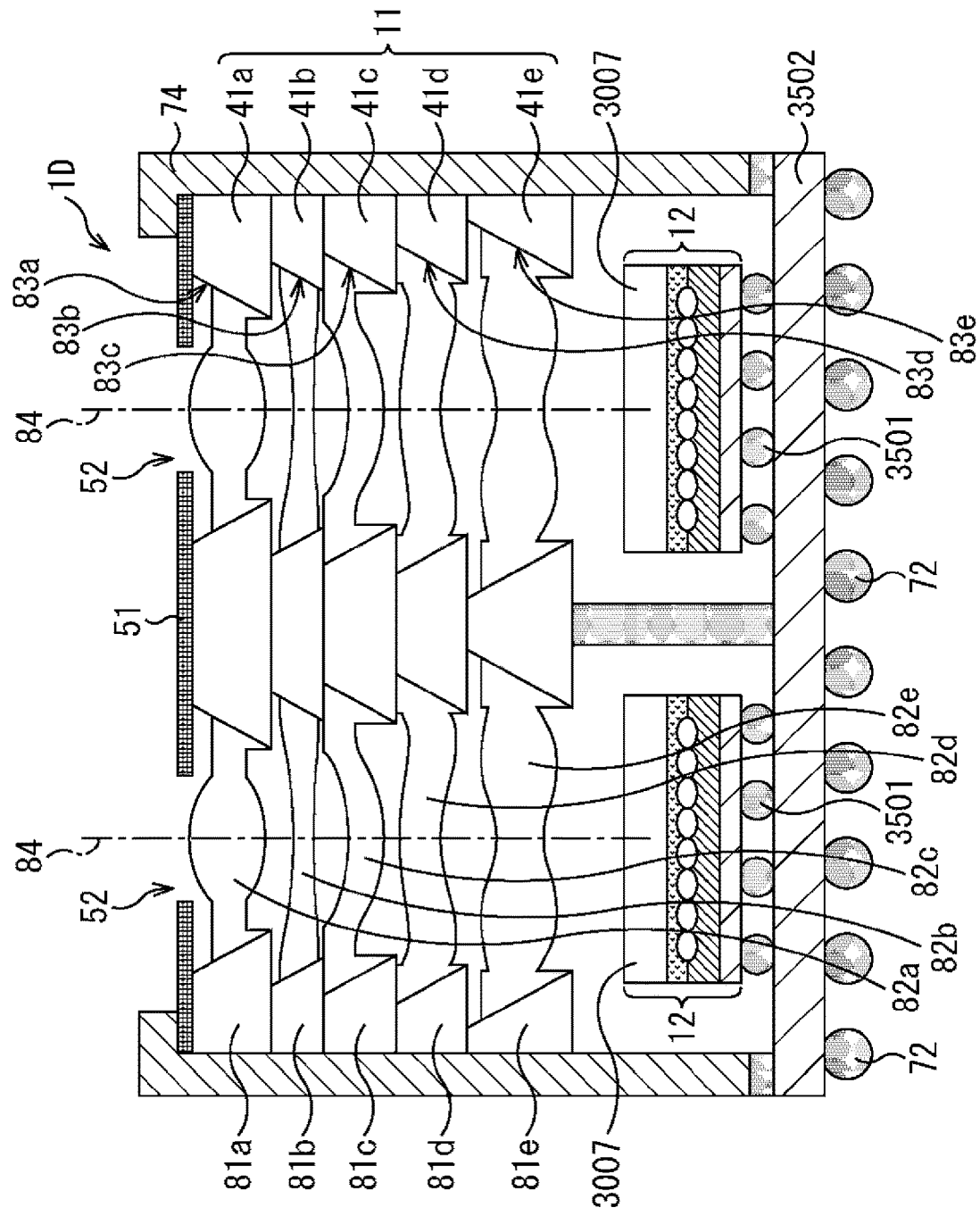
FIG. 113 is a cross-sectional view illustrating a modification of the camera module according to the fourth embodiment.

Reversely, the configuration in which the light receiving elements 12 corresponding to the optical units 13 are separately disposed as illustrated in FIG. 113 may be applicable to the configurations of the camera modules 1A to 1P mainly described above in the first embodiment to the fourteenth embodiment, in which the light receiving areas 1601a of the light receiving element 12 made up of a single substrate are disposed to correspond respectively to the optical units 13.

FIG. 113 is a cross-sectional view in which the configuration of the multi-ocular camera module 1D illustrated in FIGS. 11 and 13 is changed such that the light receiving elements 12 are separately disposed correspondingly to the optical units 13.

The pixel signals generated by the light receiving elements 12 separately disposed correspondingly to the optical units 13 are output from the external terminals 72 via relay terminals 3501 and a relay board 3502.

<35. Outline of Stacked Lens Structure>

Figure 114:
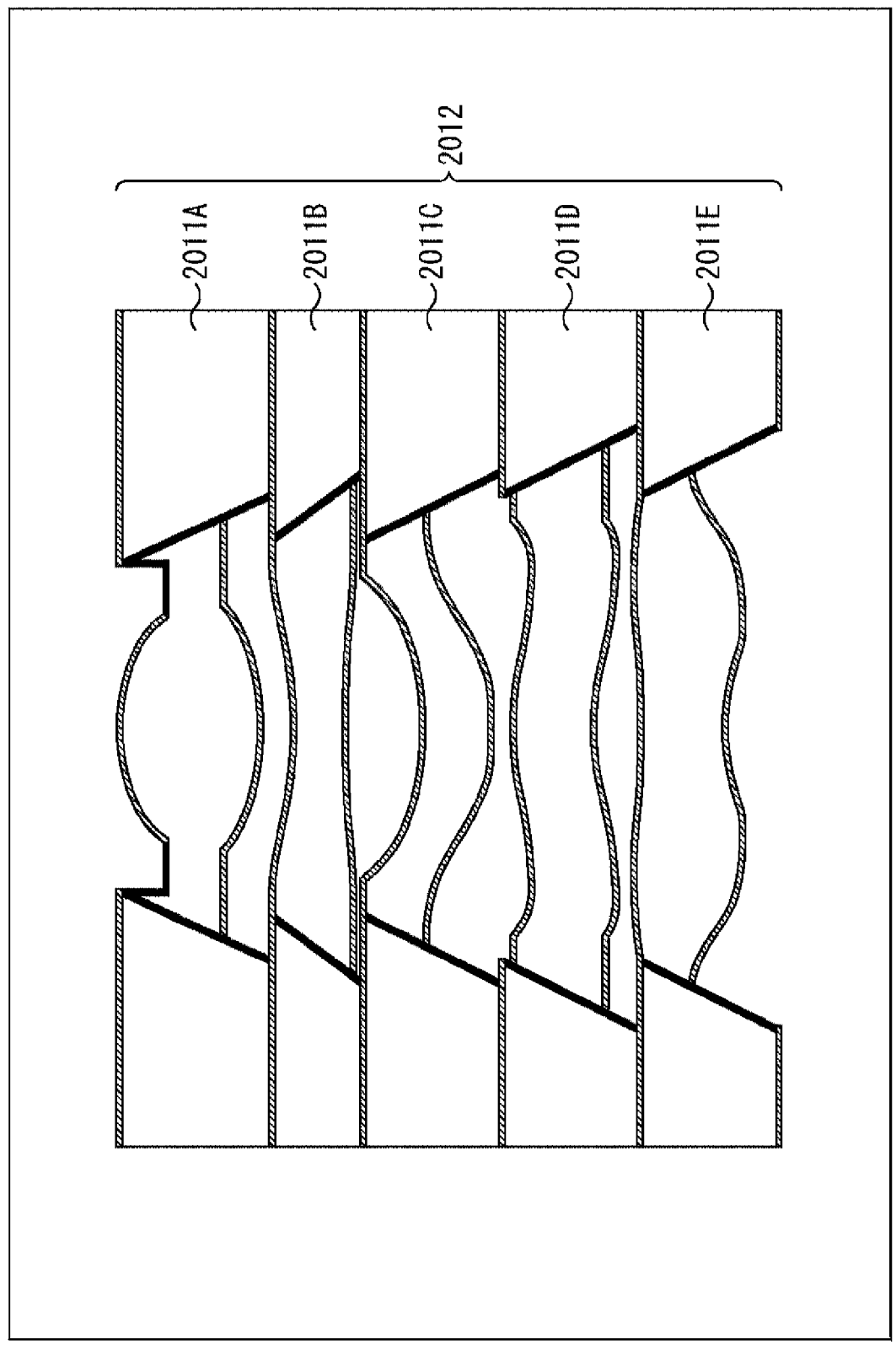
FIG. 114 is a cross-sectional view illustrating a main configuration example of a stacked lens structure.

FIG. 114 is a schematic cross-sectional view illustrating an example of the main configuration of the stacked lens structure. A stacked lens structure 2012 illustrated in FIG. 114 corresponds to the stacked lens structure 11 described above in the other embodiments. In other words, the stacked lens structure 2012 is a device similar to the stacked lens structure 11, and the above description of the stacked lens structure 11 is basically applicable also to the stacked lens structure 2012. For example, the stacked lens structure 2012 is disposed above the light receiving element 12, and utilized as a component of the camera module 1. The incident light into the light receiving element 12 (such as light from a subject) transmits through the stacked lens structure 2012 from top to bottom in FIG. 114.

As illustrated in FIG. 114, the stacked lens structure 2012 includes substrates with lenses 2011A, 2011B, 2011C, 2011D, and 2011E stacked on each other. The substrates with lenses 2011A to 2011E correspond respectively to the substrates with lenses 41a to 41e described above in the other embodiments. In the following description, unless it is necessary to make distinctions between the substrates with lenses 2011A to 2011E, the substrates with lenses 2011A to 2011E are collectively referred to as a substrate with lenses 2011. In other words, the substrate with lenses 2011 is a device similar to the substrate with lenses 41, and the above description of the substrate with lenses 41 is basically applicable to the substrate with lenses 2011.

Figure 115:
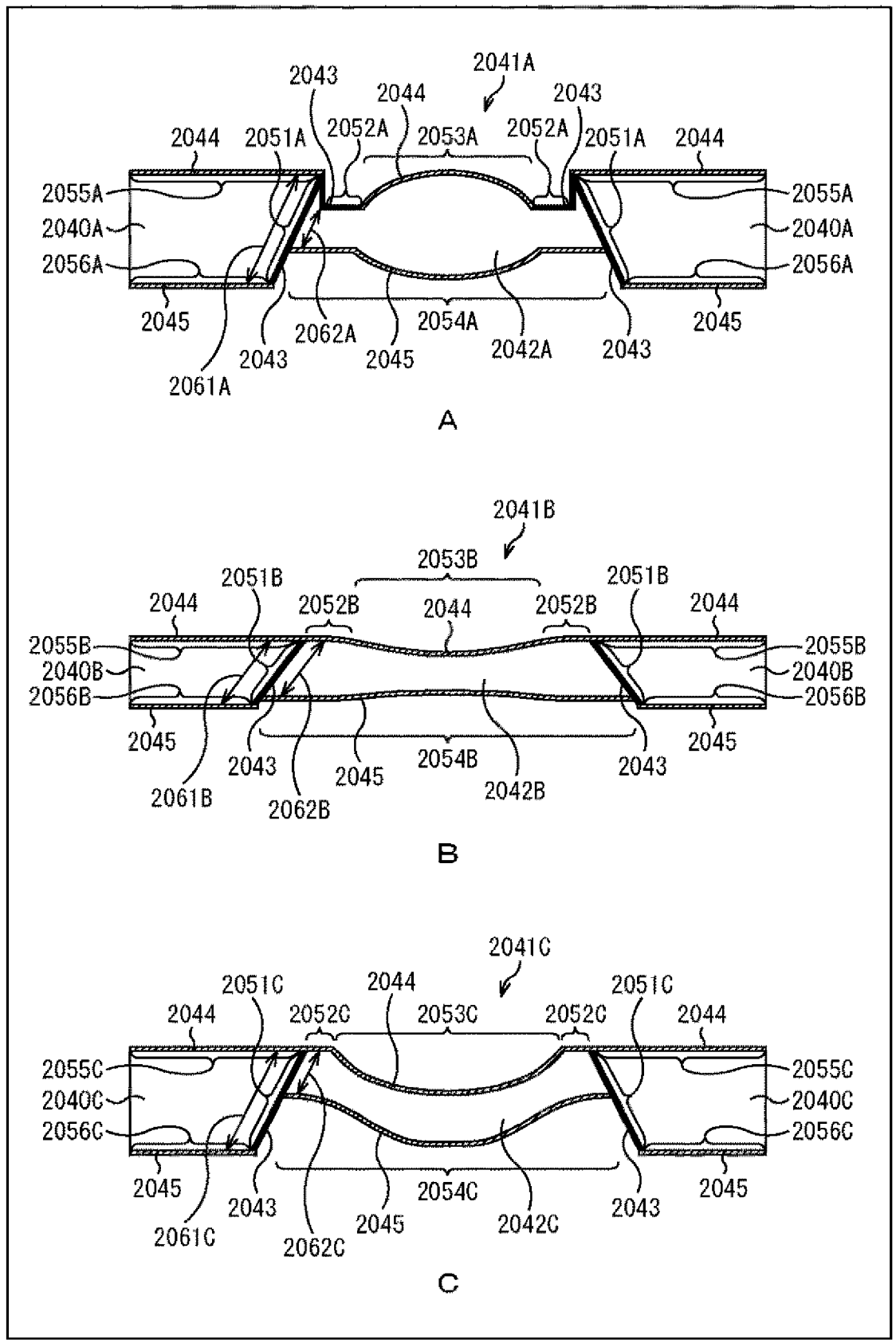
FIG. 115 is a cross-sectional view illustrating main configuration examples of substrates with lenses.
Figure 116:
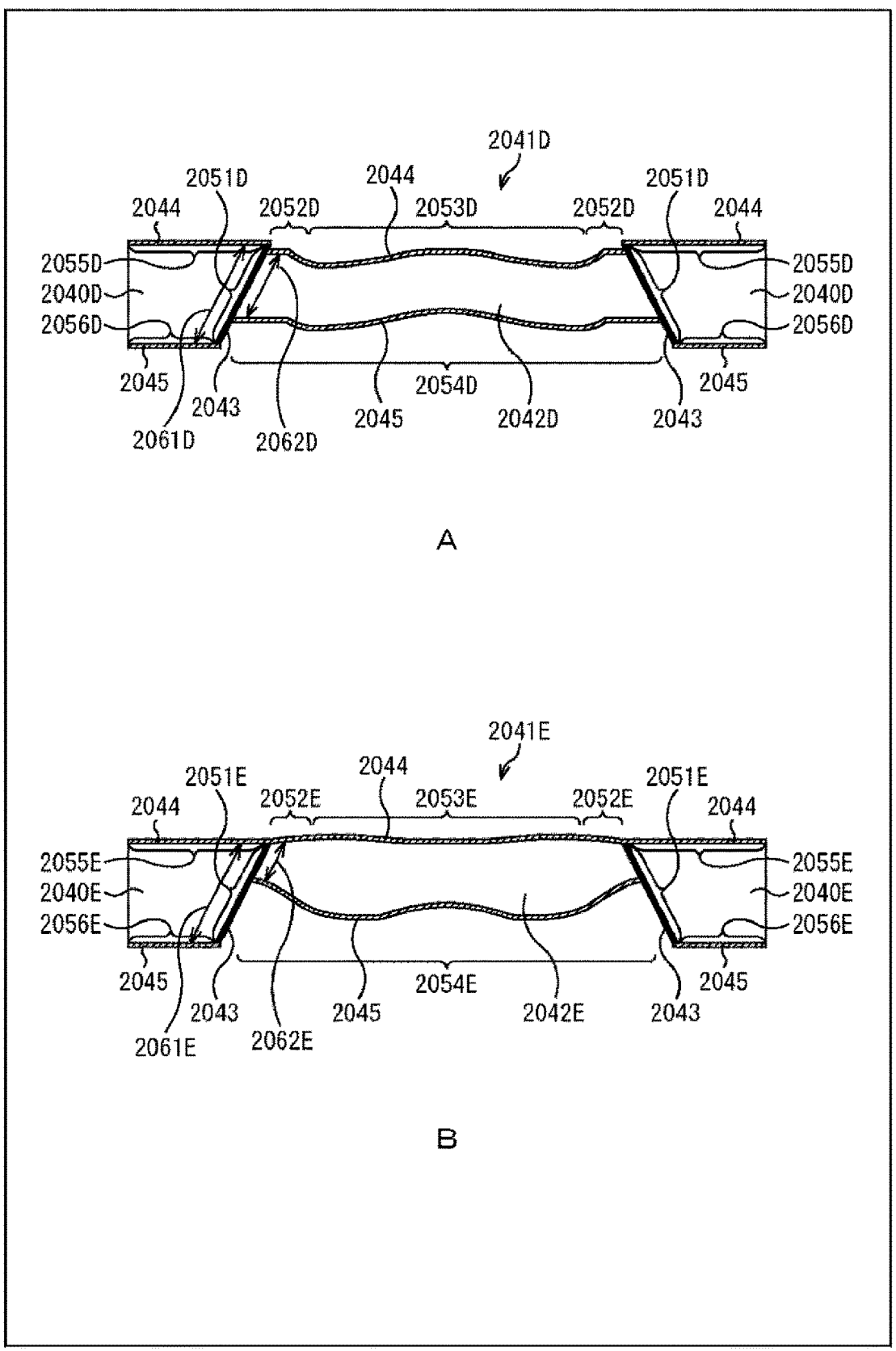
FIG. 116 is a cross-sectional view illustrating main configuration examples of substrates with lenses.

A light blocking film is formed on a side wall of a through-hole of each of the substrates with lenses 2011 of the stacked lens structure 2012 of FIG. 114. FIGS. 115 and 116 illustrate a more detailed configuration of the substrates with lenses 2011.

<Configuration of Substrate with Lenses 2011A>

A of FIG. 115 is a schematic cross-sectional view illustrating a main configuration example of the substrate with lenses 2011A. As illustrated in A of FIG. 115, the substrate with lenses 2011A includes a support substrate 2040A and a lens resin portion 2042A. The support substrate 2040A corresponds to the support substrate 81a described above in the other embodiments. The lens resin portion 2042A corresponds to the lens resin portion 82a described above in the other embodiments. The support substrate 2040A is provided with a through-hole 2041A. On an inner side of the through-hole 2041A, the lens resin portion 2042A is formed in contact with a side wall 2051A of the through-hole 2041A.

The side wall 2051A of the through-hole 2041A is formed into a tapered shape expanding from the light incidence side (upper side in A of FIG. 115) toward a light exit side (lower side in A of FIG. 115). A light blocking film 2043 is formed on the side wall 2051A. The light blocking film 2043 is a thin film formed of a material having light absorbing properties, light blocking properties, and light-reflection suppression properties. A film thickness of the light blocking film 2043 is set, for example, to approximately 1 μm, but may be arbitrarily set. The light blocking film 2043 is formed, for example, of a black material. This black material is a pigment such as carbon black and titanium black, but may be arbitrarily selected. Further, the light blocking film 2043 may be a metal film formed of an arbitrary metal such as tungsten (W) and chromium (Cr). In addition, the light blocking film 2043 may be a chemical vapor deposition (CVD) film formed by CVD, such as a carbon nanotube film formed by CVD, or may be formed by stacking a plurality of materials.

The light blocking film 2043 may be formed by an arbitrary method. For example, when the black materials such as the black pigment are used as a material of the light blocking film 2043, the light blocking film 2043 may be formed by spin coating or spray coating. In addition, lithography including patterning and removal may be performed as appropriate. Alternatively, the light blocking film 2043 may be formed by ink jetting. Still alternatively, when the metals such as tungsten (W) and chromium (Cr) are used as the material of the light blocking film 2043, the light blocking film 2043 may be formed by physical vapor deposition (PVD), and then a surface thereof may be subjected to a polishing process. Yet alternatively, when, for example, the carbon nanotube is used as the material of the light blocking film 2043, the light blocking film 2043 may be formed by CVD, and then the surface thereof may be subjected to the polishing process.

When such a light blocking film 2043 is formed on the side wall 2051A of the through-hole 2041A, light can be suppressed from being reflected on or transmitted through the side wall 2051A. As a result, occurrence of ghost or flare can be suppressed. In other words, image quality degradation by the substrate with lenses 2011A (stacked lens structure 2012) can be suppressed.

Further, an adhesive additive that increases a contact strength between the side wall 2051A and the lens resin portion 2042A may be added to the light blocking film 2043. A material of the adhesive additive is arbitrarily selected in accordance, for example, with a material (specifically, properties thereof) of the lens resin portion 2042A. When the lens resin portion 2042A is formed, for example, of a hydrophilic material (such as material containing a large number of OH groups), the hydrophilic material may be used also as that of the adhesive additive to be added. Alternatively, when the lens resin portion 2042A is formed, for example, of a hydrophobic material, the hydrophobic material may be used also as that of the adhesive additive to be added. Specifically, a silane coupling agent may be used as the adhesive additive.

In this way, when the adhesive additive is added to the material of the light blocking film 2043, the contact strength between the side wall 2051A and the lens resin portion 2042A can be increased. With this, holding stability for the lens resin portion 2042A can be increased, and hence sufficient stability can be achieved even when a contact area between the side wall 2051A and the lens resin portion 2042A is small. In other words, a "width of a part at which the side wall 2051A (light blocking film 2043) and the lens resin portion 2042A are in contact with each other" indicated by a double-headed arrow 2062A can be set narrower (smaller) than a "length of the side wall 2051A (width of the light blocking film 2043)" indicated by a double-headed arrow 2061A. Thus, a thickness of the lens resin portion 2042A can be suppressed from increasing, thereby being, for example, reduced to be smaller than a thickness of the support substrate 2040A. With this, at the time of stacking the substrates with lenses 2011, the substrates with lenses 2011 can be attached together without intermediation of, for example, spacer substrates. As a result, problems such as worsening of optical axis misalignment (resolution degradation) and worsening of flare can be suppressed, and hence image quality degradation can be suppressed.

Note that, as described above, the material of the adhesive additive may be selected in accordance with the material of the lens resin portion 2042A, and hence the contact strength with respect to the lens resin portion 2042A can be increased even when the lens resin portion 2042A is formed of a wider variety of materials. Thus, selection of materials of the support substrate 2040A can be suppressed from being limited by the material of the lens resin portion 2042A.

Further, as illustrated in A of FIG. 115, as for the substrate with lenses 2011A stacked on the most light incidence side, the light blocking film 2043 may be formed on a light incidence side surface (surface on the upper side in A of FIG. 115) 2052A of the support portion 92 of the lens resin portion 2042A. This light blocking film 2043 functions as a diaphragm.

Still further, an upper surface layer 2044 may be formed on a light incidence side surface 2053A of the lens portion 91 of the lens resin portion 2042A. This upper surface layer 2044 corresponds to the upper surface layer 122 described above in the other embodiments. This upper surface layer 2044 is formed, for example, as an anti-reflection film.

Yet further, a lower surface layer 2045 may be formed on a light exit side surface (surface on the lower side in A of FIG. 115) 2054A of the lens resin portion 2042A. This lower surface layer 2045 corresponds to the lower surface layer 123 described above in the other embodiments. This lower surface layer 2045 is formed, for example, as an anti-reflection film.

Yet further, the upper surface layer 2044 may be formed on a light incidence side surface 2055A of the support substrate 2040A. Yet further, the lower surface layer 2045 may be formed on a light exit side surface 2056A of the support substrate 2040A.

<Configuration of Substrate with Lenses 2011B>

B of FIG. 115 is a schematic cross-sectional view illustrating a main configuration example of the substrate with lenses 2011B. The configuration of the substrate with lenses 2011B is basically the same as that of the substrate with lenses 2011A. As illustrated in B of FIG. 115, the substrate with lenses 2011B includes a support substrate 2040B and a lens resin portion 2042B. The support substrate 2040B corresponds to the support substrate 81*b* described above in the other embodiments. The lens resin portion 2042B corresponds to the lens resin portion 82*b* described above in the other embodiments. The support substrate 2040B is provided with a through-hole 2041B. On an inner side of the through-hole 2041B, the lens resin portion 2042B is formed in contact with a side wall 2051B of the through-hole 2041B.

The side wall 2051B of the through-hole 2041B is formed into a tapered shape expanding from the light incidence side toward the light exit side. The light blocking film 2043 is formed on the side wall 2051B. With this, as in the case of the substrate with lenses 2011A, image quality degradation by the substrate with lenses 2011B (stacked lens structure 2012) can be suppressed.

Further, as in the case of the substrate with lenses 2011A, the adhesive additive that increases a contact strength between the side wall 2051B and the lens resin portion 2042B, such as the silane coupling agent, may be added to the material of the light blocking film 2043. With this, as in the case of the substrate with lenses 2011A, sufficient stability can be achieved even when a contact area between the side wall 2051B and the lens resin portion 2042B is small. In other words, a "width of a part at which the side wall 2051B (light blocking film 2043) and the lens resin portion 2042B are in contact with each other" indicated by a double-headed arrow 2062B can be set narrower (smaller) than a "length of the side wall 2051B (width of the light blocking film 2043)" indicated by a double-headed arrow 2061B. Thus, a thickness of the lens resin portion 2042B can be suppressed from increasing, thereby being, for example, reduced to be smaller than a thickness of the support substrate 2040B. With this, in the stacked lens structure 2012, the problems such as worsening of optical axis misalignment (resolution degradation) and worsening of flare can be suppressed, and hence image quality degradation can be suppressed.

Still further, as in the case of the substrate with lenses 2011A, the material of the adhesive additive may be selected in accordance with a material of the lens resin portion 2042B, and hence the contact strength with respect to the lens resin portion 2042B can be increased even when the lens resin portion 2042B is formed of a wider variety of materials. Thus, selection of materials of the support substrate 2040B can be suppressed from being limited by the material of the lens resin portion 2042B.

Yet further, as illustrated in B of FIG. 115, the upper surface layer 2044 may be formed on a light incidence side surface 2052B of the support portion 92 of the lens resin portion 2042B, on a light incidence side surface 2053B of the lens portion 91 of the lens resin portion 2042B, and on a light incidence side surface 2055B of the support substrate 2040B.

Yet further, the lower surface layer 2045 may be formed on a light exit side surface 2054B of the lens resin portion 2042B, and on a light exit side surface 2056B of the support substrate 2040B.

<Configuration of Substrate with Lenses 2011C>

C of FIG. 115 is a schematic cross-sectional view illustrating a main configuration example of the substrate with lenses 2011C. The configuration of the substrate with lenses 2011C is basically the same as that of the substrate with lenses 2011A. As illustrated in C of FIG. 115, the substrate with lenses 2011C includes a support substrate 2040C and a lens resin portion 2042C. The support substrate 2040C corresponds to the support substrate 81*c* described above in the other embodiments. The lens resin portion 2042C corresponds to the lens resin portion 82*c* described above in the other embodiments. The support substrate 2040C is provided with a through-hole 2041C. On an inner side of the through-hole 2041C, the lens resin portion 2042C is formed in contact with a side wall 2051C of the through-hole 2041C.

The side wall 2051C of the through-hole 2041C is formed into a tapered shape expanding from the light incidence side toward the light exit side. The light blocking film 2043 is formed on the side wall 2051C. With this, as in the case of the substrate with lenses 2011A, image quality degradation by the substrate with lenses 2011C (stacked lens structure 2012) can be suppressed.

Further, as in the case of the substrate with lenses 2011A, the adhesive additive that increases a contact strength between the side wall 2051C and the lens resin portion 2042C, such as the silane coupling agent, may be added to the material of the light blocking film 2043. With this, as in the case of the substrate with lenses 2011A, sufficient stability can be achieved even when a contact area between the side wall 2051C and the lens resin portion 2042C is small. In other words, a "width of a part at which the side wall 2051C (light blocking film 2043) and the lens resin portion 2042C are in contact with each other" indicated by a double-headed arrow 2062C can be set narrower (smaller) than a "length of the side wall 2051C (width of the light blocking film 2043)" indicated by a double-headed arrow 2061C. Thus, a thickness of the lens resin portion 2042C can be suppressed from increasing, thereby being, for example, reduced to be smaller than a thickness of the support substrate 2040C. With this, in the stacked lens structure 2012, the problems such as worsening of optical axis misalignment (resolution degradation) and worsening of flare can be suppressed, and hence image quality degradation can be suppressed.

Still further, as in the case of the substrate with lenses 2011A, the material of the adhesive additive may be selected in accordance with a material of the lens resin portion 2042C, and hence the contact strength with respect to the lens resin portion 2042C can be increased even when the lens resin portion 2042C is formed of a wider variety of materials. Thus, selection of materials of the support substrate 2040C can be suppressed from being limited by the material of the lens resin portion 2042C.

Yet further, as illustrated in C of FIG. 115, the upper surface layer 2044 may be formed on a light incidence side surface 2052C of the support portion 92 of the lens resin portion 2042C, on a light incidence side surface 2053C of the lens portion 91 of the lens resin portion 2042C, and on a light incidence side surface 2055C of the support substrate 2040C.

Yet further, the lower surface layer 2045 may be formed on a light exit side surface 2054C of the lens resin portion 2042C, and on a light exit side surface 2056C of the support substrate 2040C.

<Configuration of Substrate with Lenses 2011D>

A of FIG. 116 is a schematic cross-sectional view illustrating a main configuration example of the substrate with lenses 2011D. The configuration of the substrate with lenses 2011D is basically the same as that of the substrate with lenses 2011A. As illustrated in A of FIG. 116, the substrate with lenses 2011D includes a support substrate 2040D and a lens resin portion 2042D. The support substrate 2040D corresponds to the support substrate 81d described above in the other embodiments. The lens resin portion 2042D corresponds to the lens resin portion 82d described above in the other embodiments. The support substrate 2040D is provided with a through-hole 2041D. On an inner side of the through-hole 2041D, the lens resin portion 2042D is formed in contact with a side wall 2051D of the through-hole 2041D.

The side wall 2051D of the through-hole 2041D is formed into a tapered shape expanding from the light incidence side toward the light exit side. The light blocking film 2043 is formed on the side wall 2051D. With this, as in the case of the substrate with lenses 2011A, image quality degradation by the substrate with lenses 2011D (stacked lens structure 2012) can be suppressed.

Further, as in the case of the substrate with lenses 2011A, the adhesive additive that increases a contact strength between the side wall 2051D and the lens resin portion 2042D, such as the silane coupling agent, may be added to the material of the light blocking film 2043. With this, as in the case of the substrate with lenses 2011A, sufficient stability can be achieved even when a contact area between the side wall 2051D and the lens resin portion 2042D is small. In other words, a "width of a part at which the side wall 2051D (light blocking film 2043) and the lens resin portion 2042D are in contact with each other" indicated by a double-headed arrow 2062D can be set narrower (smaller) than a "length of the side wall 2051D (width of the light blocking film 2043)" indicated by a double-headed arrow 2061D. Thus, a thickness of the lens resin portion 2042D can be suppressed from increasing, thereby being, for example, reduced to be smaller than a thickness of the support substrate 2040D. With this, in the stacked lens structure 2012, the problems such as worsening of optical axis misalignment (resolution degradation) and worsening of flare can be suppressed, and hence image quality degradation can be suppressed.

Still further, as in the case of the substrate with lenses 2011A, the material of the adhesive additive may be selected in accordance with a material of the lens resin portion 2042D, and hence the contact strength with respect to the lens resin portion 2042D can be increased even when the lens resin portion 2042D is formed of a wider variety of materials. Thus, selection of materials of the support substrate 2040D can be suppressed from being limited by the material of the lens resin portion 2042D.

Yet further, as illustrated in A of FIG. 116, the upper surface layer 2044 may be formed on a light incidence side surface 2052D of the support portion 92 of the lens resin portion 2042D, on a light incidence side surface 2053D of the lens portion 91 of the lens resin portion 2042D, and on a light incidence side surface 2055D of the support substrate 2040D.

Yet further, the lower surface layer 2045 may be formed on a light exit side surface 2054D of the lens resin portion 2042D, and on a light exit side surface 2056D of the support substrate 2040D.

<Configuration of Substrate with Lenses 2011E>

B of FIG. 116 is a schematic cross-sectional view illustrating a main configuration example of the substrate with lenses 2011E. The configuration of the substrate with lenses 2011E is basically the same as that of the substrate with lenses 2011A. As illustrated in B of FIG. 116, the substrate with lenses 2011E includes a support substrate 2040E and a lens resin portion 2042E. The support substrate 2040E corresponds to the support substrate 81e described above in the other embodiments. The lens resin portion 2042E corresponds to the lens resin portion 82e described above in the other embodiments. The support substrate 2040E is provided with a through-hole 2041E. On an inner side of the through-hole 2041E, the lens resin portion 2042E is formed in contact with a side wall 2051E of the through-hole 2041E.

The side wall 2051E of the through-hole 2041E is formed into a tapered shape expanding from the light incidence side toward the light exit side. The light blocking film 2043 is formed on the side wall 2051E. With this, as in the case of the substrate with lenses 2011A, image quality degradation by the substrate with lenses 2011E (stacked lens structure 2012) can be suppressed.

Further, as in the case of the substrate with lenses 2011A, the adhesive additive that increases a contact strength between the side wall 2051E and the lens resin portion 2042E, such as the silane coupling agent, may be added to the material of the light blocking film 2043. With this, as in the case of the substrate with lenses 2011A, sufficient stability can be achieved even when a contact area between the side wall 2051E and the lens resin portion 2042E is small. In other words, a "width of a part at which the side wall 2051E (light blocking film 2043) and the lens resin portion 2042E are in contact with each other" indicated by a double-headed arrow 2062E can be set narrower (smaller) than a "length of the side wall 2051E (width of the light blocking film 2043)" indicated by a double-headed arrow 2061E. Thus, a thickness of the lens resin portion 2042E can be suppressed from increasing, thereby being, for example, reduced to be smaller than a thickness of the support substrate 2040E. With this, in the stacked lens structure 2012, the problems such as worsening of optical axis misalignment (resolution degradation) and worsening of flare can be suppressed, and hence image quality degradation can be suppressed.

Still further, as in the case of the substrate with lenses 2011A, the material of the adhesive additive may be selected in accordance with a material of the lens resin portion 2042E, and hence the contact strength with respect to the lens resin portion 2042E can be increased even when the lens resin portion 2042E is formed of a wider variety of materials. Thus, selection of materials of the support substrate 2040E can be suppressed from being limited by the material of the lens resin portion 2042E.

Yet further, as illustrated in B of FIG. 116, the upper surface layer 2044 may be formed on a light incidence side surface 2052E of the support portion 92 of the lens resin portion 2042E, on a light incidence side surface 2053E of the lens portion 91 of the lens resin portion 2042E, and on a light incidence side surface 2055E of the support substrate 2040E.

Yet further, the lower surface layer 2045 may be formed on a light exit side surface 2054E of the lens resin portion 2042E, and on a light exit side surface 2056E of the support substrate 2040E.

In the following description, unless it is necessary to make distinctions between the support substrates 2040A to 2040E, the support substrates 2040A to 2040E are collectively referred to as a support substrate 2040. Further, unless it is necessary to make distinctions between the through-holes 2041A to 2041E, the through-holes 2041A to 2041E are collectively referred to as a through-hole 2041. Still further, unless it is necessary to make distinctions between the lens resin portions 2042A to 2042E, the lens resin portions 2042A to 2042E are collectively referred to as a lens resin portion 2042. Yet further, unless it is necessary to make distinctions between the side walls 2051A to 2051E, the side walls 2051A to 2051E are collectively referred to as a side wall 2051. Yet further, unless it is necessary to make distinctions between the light incidence side surfaces 2052A to 2052E, the light incidence side surfaces 2052A to 2052E are collectively referred to as a light incidence side surface 2052. Yet further, unless it is necessary to make distinctions between the light incidence side surfaces 2053A to 2053E, the light incidence side surfaces 2053A to 2053E are collectively referred to as a light incidence side surface 2053. Yet further, unless it is necessary to make distinctions between the light exit side surfaces 2054A to 2054E, the light exit side surfaces 2054A to 2054E are collectively referred to as a light exit side surface 2054. Yet further, unless it is necessary to make distinctions between the light incidence side surfaces 2055A to 2055E, the light incidence side surfaces 2055A to 2055E are collectively referred to as a light incidence side surface 2055. Yet further, unless it is necessary to make distinctions between the light exit side surfaces 2056A to 2056E, the light exit side surfaces 2056A to 2056E are collectively referred to as a light exit side surface 2056. Yet further, unless it is necessary to make distinctions between the double-headed arrows 2061A to 2061E, the double-headed arrows 2061A to 2061E are collectively referred to as a double-headed arrow 2061. Yet further, unless it is necessary to make distinctions between the double-headed arrows 2062A to 2062E, the double-headed arrows 2062A to 2062E are collectively referred to as a double-headed arrow 2062.

<Configuration of Stacked Lens Structure>

By stacking and attaching together the substrates with lenses 2011A to 2011E configured as described above, the stacked lens structure 2012 of FIG. 114 is formed. The substrates with lenses 2011 may be attached together by an arbitrary method. For example, the substrates with lenses 2011 may be attached together by plasma bonding, or the substrates with lenses 2011 may be attached together with an adhesive.

With use of the substrates with lenses 2011 having the configurations as illustrated in FIGS. 115 and 116, the stacked lens structure 2012 is capable of providing the same effects as those of the above-described substrates with lenses 2011.

For example, the stacked lens structure 2012 is capable of suppressing, for example, occurrence of light reflection in the through-hole 2041. Thus, occurrence of ghost or flare can be sufficiently suppressed, and image quality degradation can be suppressed. Further, for example, the stacked lens structure 2012 is capable of increasing the holding stability for the lens resin portion 2042. In addition, the substrates with lenses can be attached together without intermediation of, for example, spacer substrates. With this, the problems such as worsening of optical axis misalignment (resolution degradation) and worsening of flare can be suppressed, and hence image quality degradation can be suppressed. In addition, the support substrate 2040 and the lens resin portion 2042 may be formed of a wider variety of materials.

Note that, the number of the substrates with lenses 2011 (number of layers) forming the stacked lens structure 2012 is arbitrarily set. Further, all of the substrates with lenses 2011 forming the stacked lens structure 2012 need not necessarily have the configurations as described with reference to FIGS. 115 and 116. In other words, a plurality of substrates with lenses stacked to form a stacked lens structure may include a substrate with lenses that is provided with a through-hole having a side wall with a light blocking film formed thereon, and that includes a lens resin portion formed in the through-hole of the substrate.

<36. Example of Shape of Side Wall>

Further, the holding stability for the lens resin portion 2042 can be increased, and hence the side wall 2051 of the substrate with lenses 2011 (stacked lens structure 2012) may be formed into shapes other than the above-described tapered shape.

Figure 117:
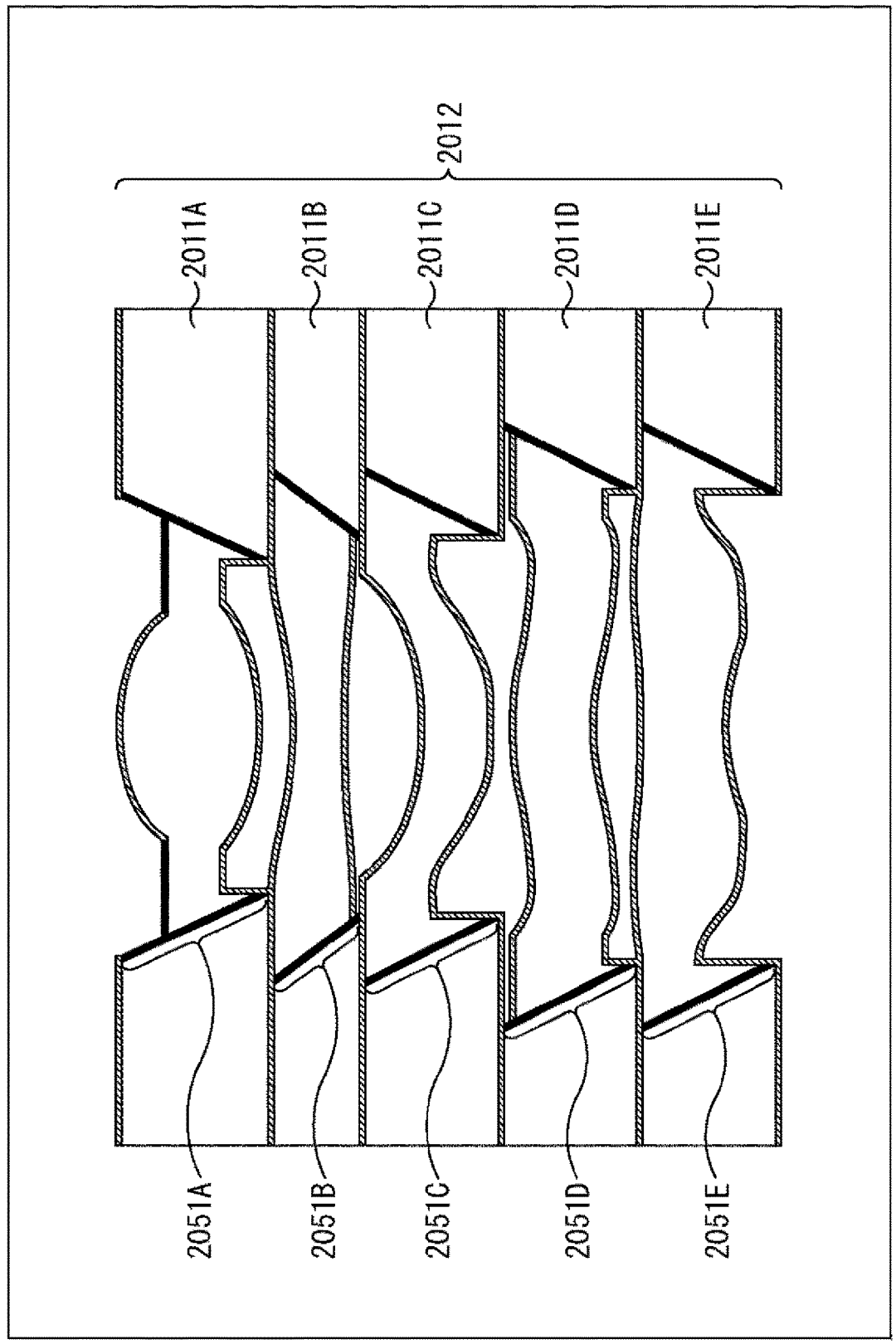
FIG. 117 is a cross-sectional view illustrating a main configuration example of a stacked lens structure.
Figure 118:
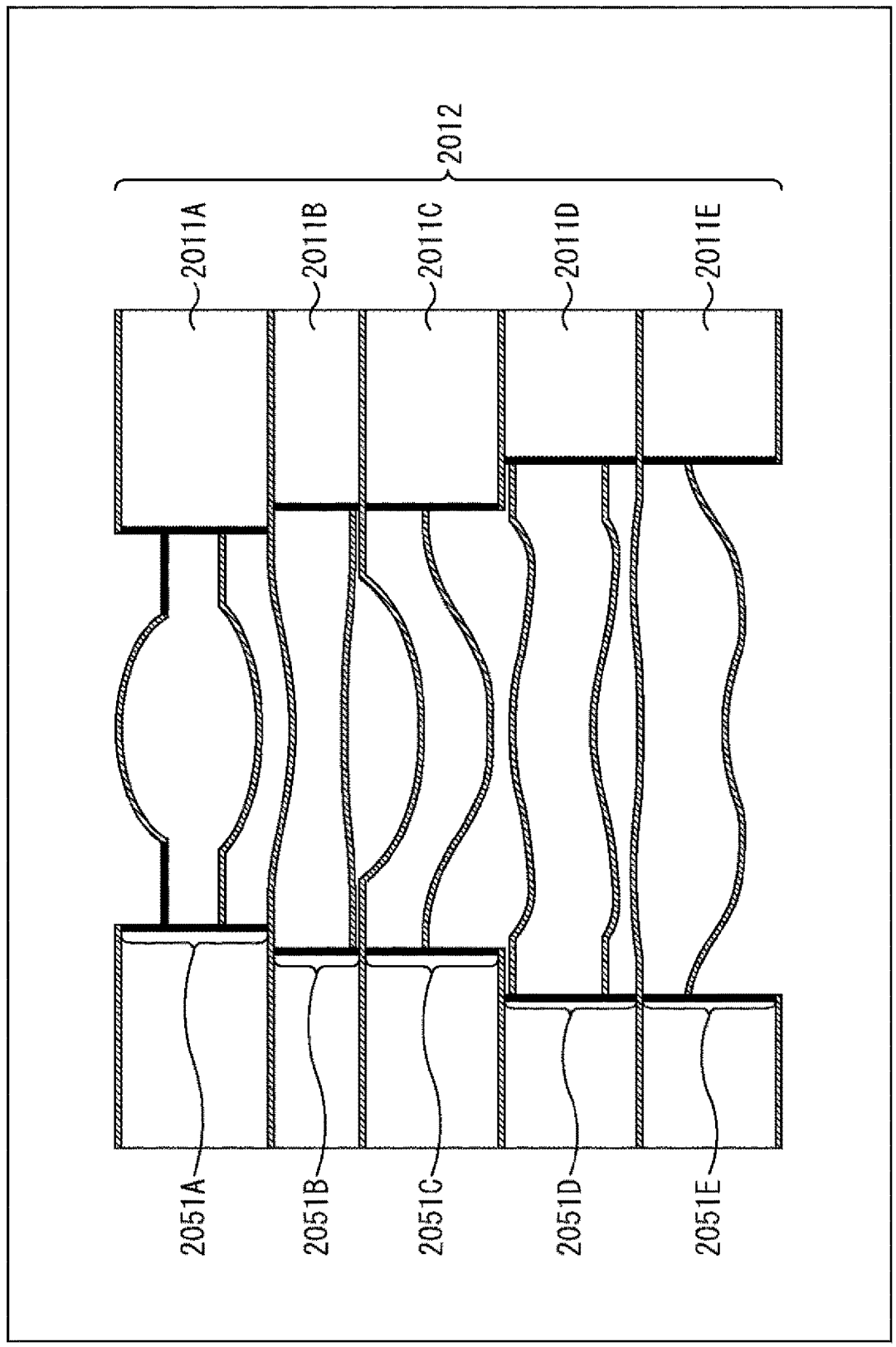
FIG. 118 is a cross-sectional view illustrating a main configuration example of a stacked lens structure.

For example, as illustrated in FIG. 117, the side wall 2051 of the through-hole 2041 of each of the substrates with lenses 2011 may be formed into an inversely tapered shape expanding from the light exit side toward the light incidence side. Alternatively, for example, as illustrated in FIG. 118, the side wall 2051 of the through-hole 2041 of each of the substrates with lenses 2011 may be formed into a perpendicular shape being perpendicular from the light exit side up to the light incidence side.

Figure 119:
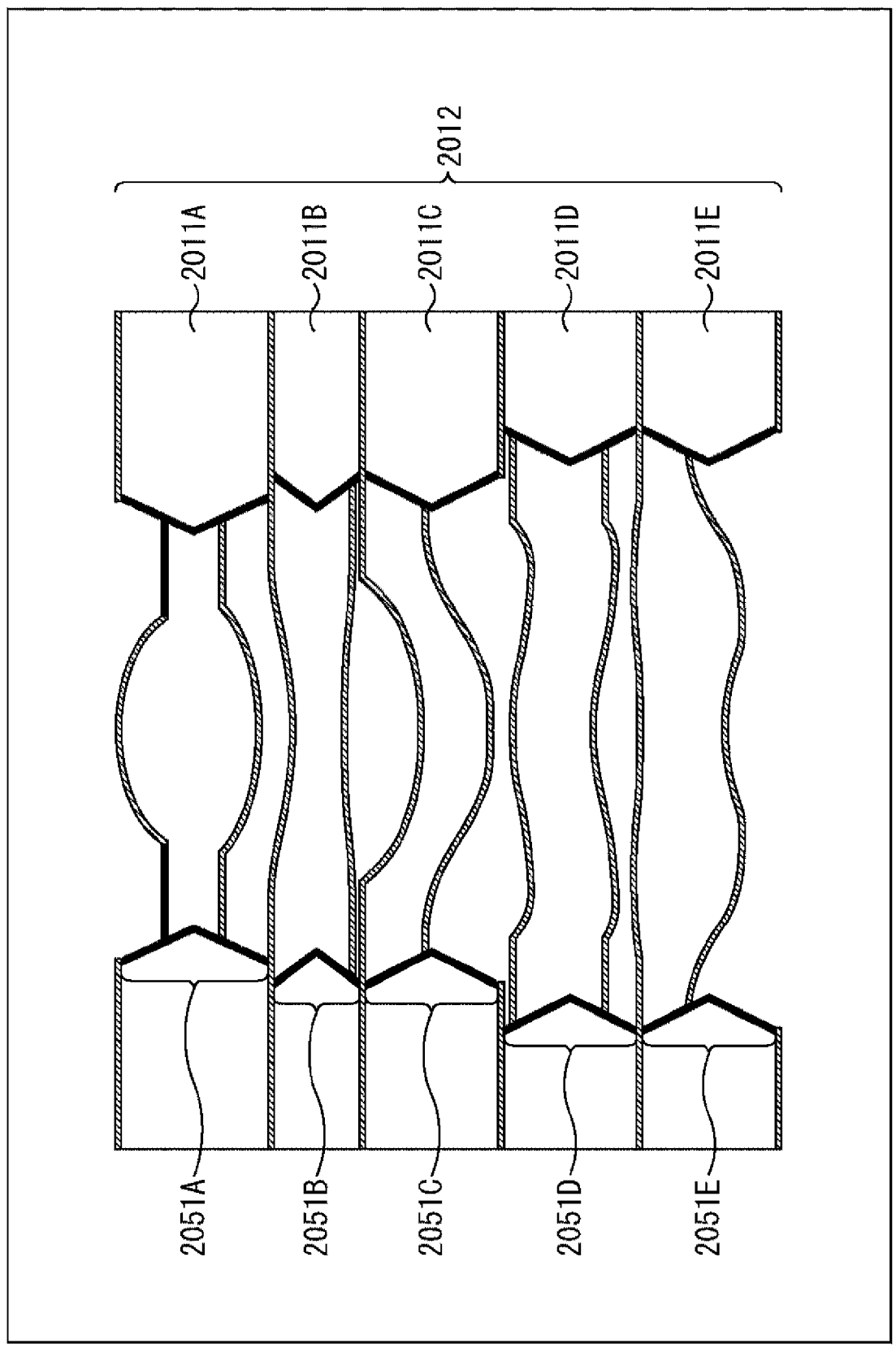
FIG. 119 is a cross-sectional view illustrating a main configuration example of a stacked lens structure.

Still alternatively, for example, as illustrated in FIG. 119, the side wall 2051 of the through-hole 2041 of each of the substrates with lenses 2011 may be formed into a bidirectionally tapered shape expanding from a central portion of the through-hole 2041 toward both the light exit side and the light incidence side. When the side wall 2051 is formed into such a bidirectional tapered shape, the light blocking film 2043 can be more easily formed. Further, in this case, a part of the side wall 2051, which is in contact with the lens resin portion 2042, has a protruding shape, and hence the holding stability for the lens resin portion 2042 can be increased. Further, in this case, the through-hole 2041 is formed by etching from both the surfaces of the support substrate 2040, and hence a period of the etching process can be reduced to be smaller than those in cases where the side wall 2051 has other shapes.

Figure 120:
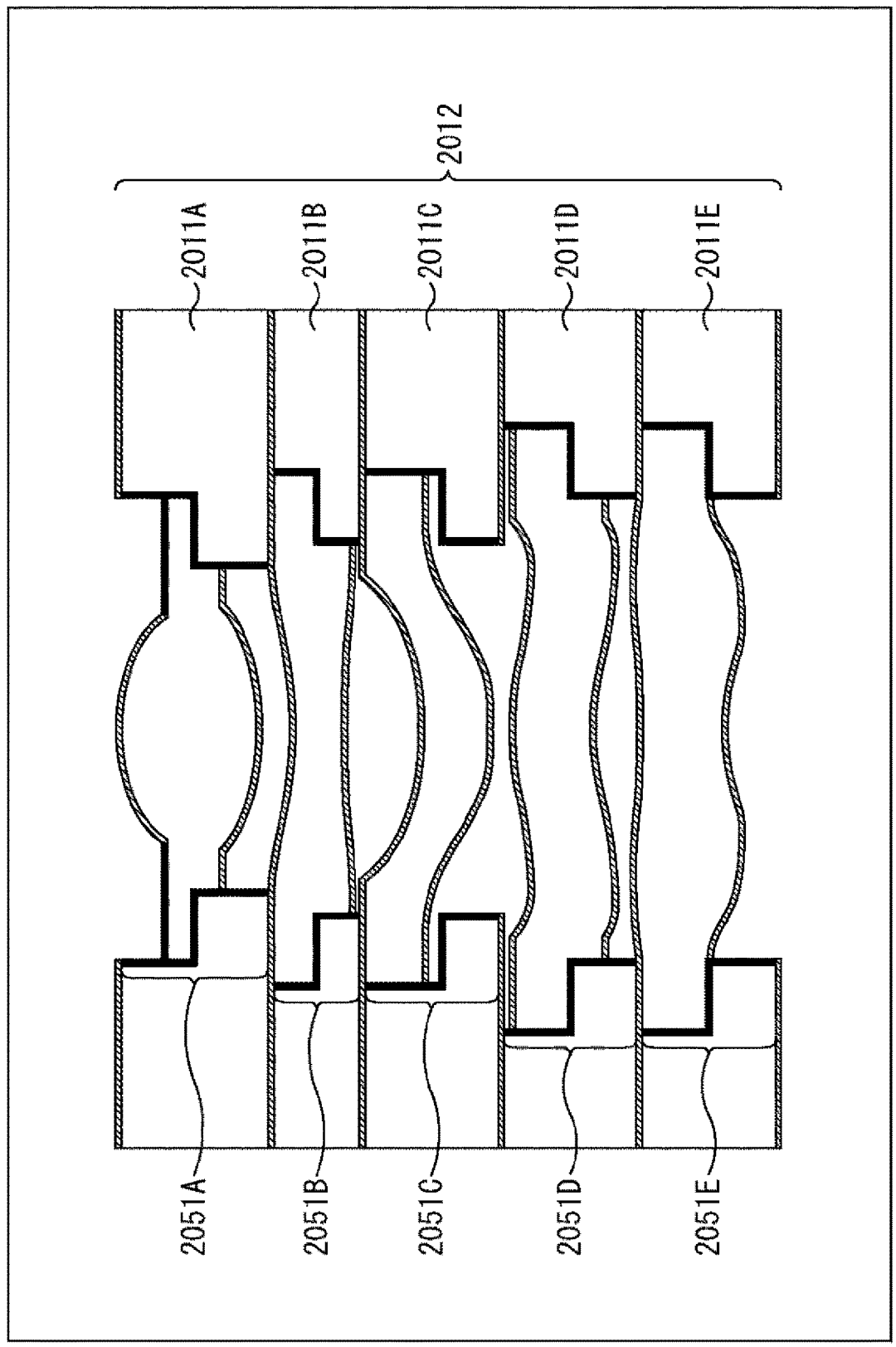

Yet alternatively, for example, as illustrated in FIG. 120, the side wall 2051 of the through-hole 2041 of each of the substrates with lenses 2011 may be formed into a stepped shape having a step formed in the through-hole 2041.

Figure 121:
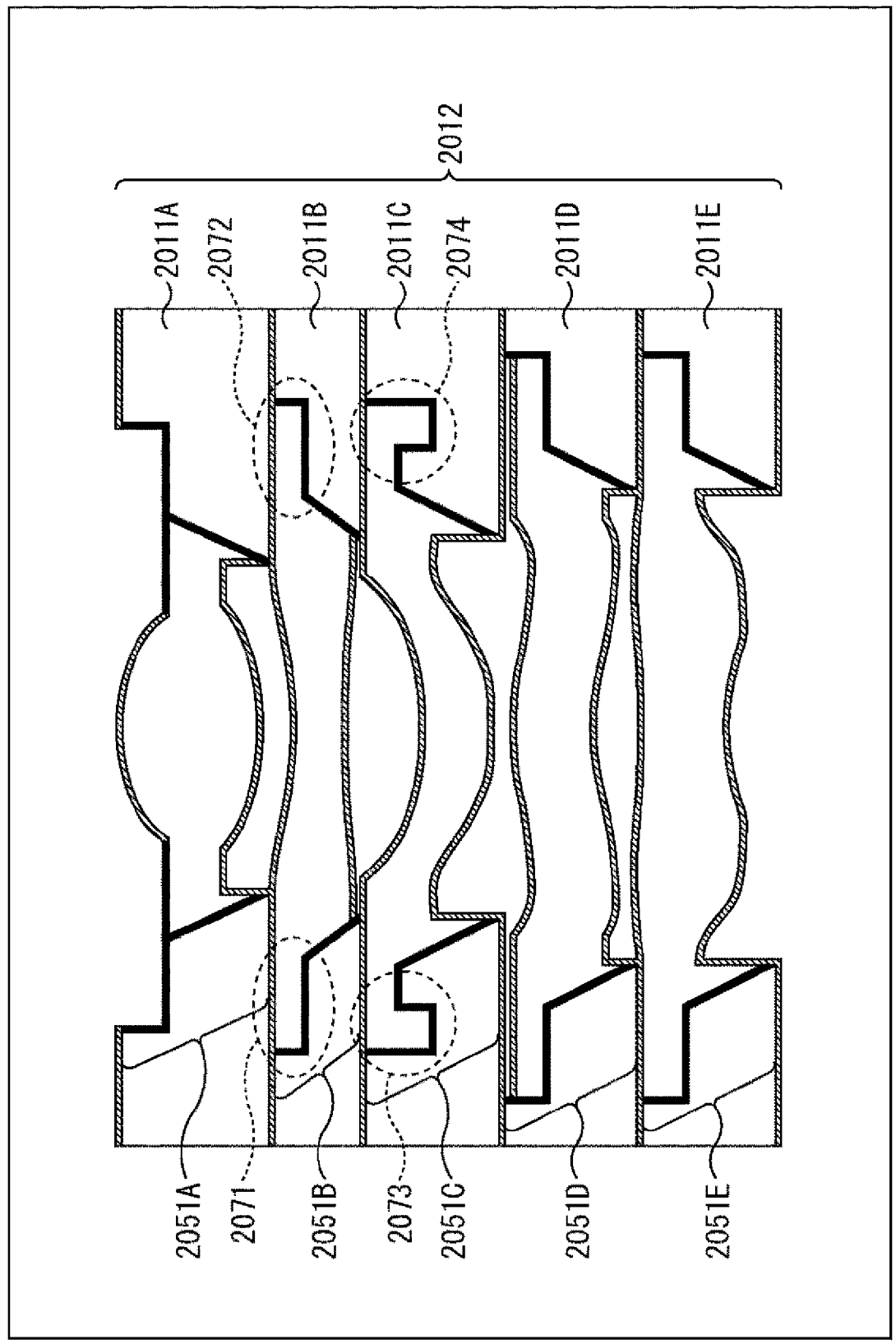

As a matter of course, the side wall 2051 may formed into an arbitrary shape, and not limited to those examples. Specifically, as indicated by dotted circles 2071, 2072, 2073, and 2074 in FIG. 121, relief spaces for surplus of the material (resin) of the lens resin portion 2042, which is formed at the time of molding the lens resin portion 2042, may be formed in the side wall 2051. Those spaces may be formed into an arbitrary shape. Further, those spaces may be formed in all of the substrates with lenses 2011 forming the stacked lens structure 2012, or may be formed in some of the substrates with lenses 2011.

A method of forming the light blocking film 2043 (and material thereof) may be selected in accordance with such shapes of the side wall 2051. For example, when the side wall 2051 has the perpendicular shape, it may be difficult to apply a resist by spin coating or spray coating, and hence CVD may be employed.

Further, for example, the stacked lens structure 2012 may include substrates with lenses 2011 that are different from each other in shape of the side walls 2051. In other words, all of the shapes of the side walls 2051 of the substrates with lenses 2011 of the stacked lens structure 2012 need not necessarily be the same as each other. Specifically, the substrates with lenses 2011 having the tapered side walls 2051 and the substrates with lenses 2011 having the inversely-tapered side walls 2051 may be stacked.

<37. Example of Application to Electronic Apparatuses>

The above-described camera module 1 may be used in a form of being incorporated into an imaging apparatus an electronic apparatus that uses a solid-state imaging apparatus in an image capturing unit (photoelectric conversion unit), such as a digital still camera and a video camera, a mobile terminal apparatus that has an imaging function, and a copying machine that uses the solid-state imaging apparatus in an image reading unit.

Figure 122:
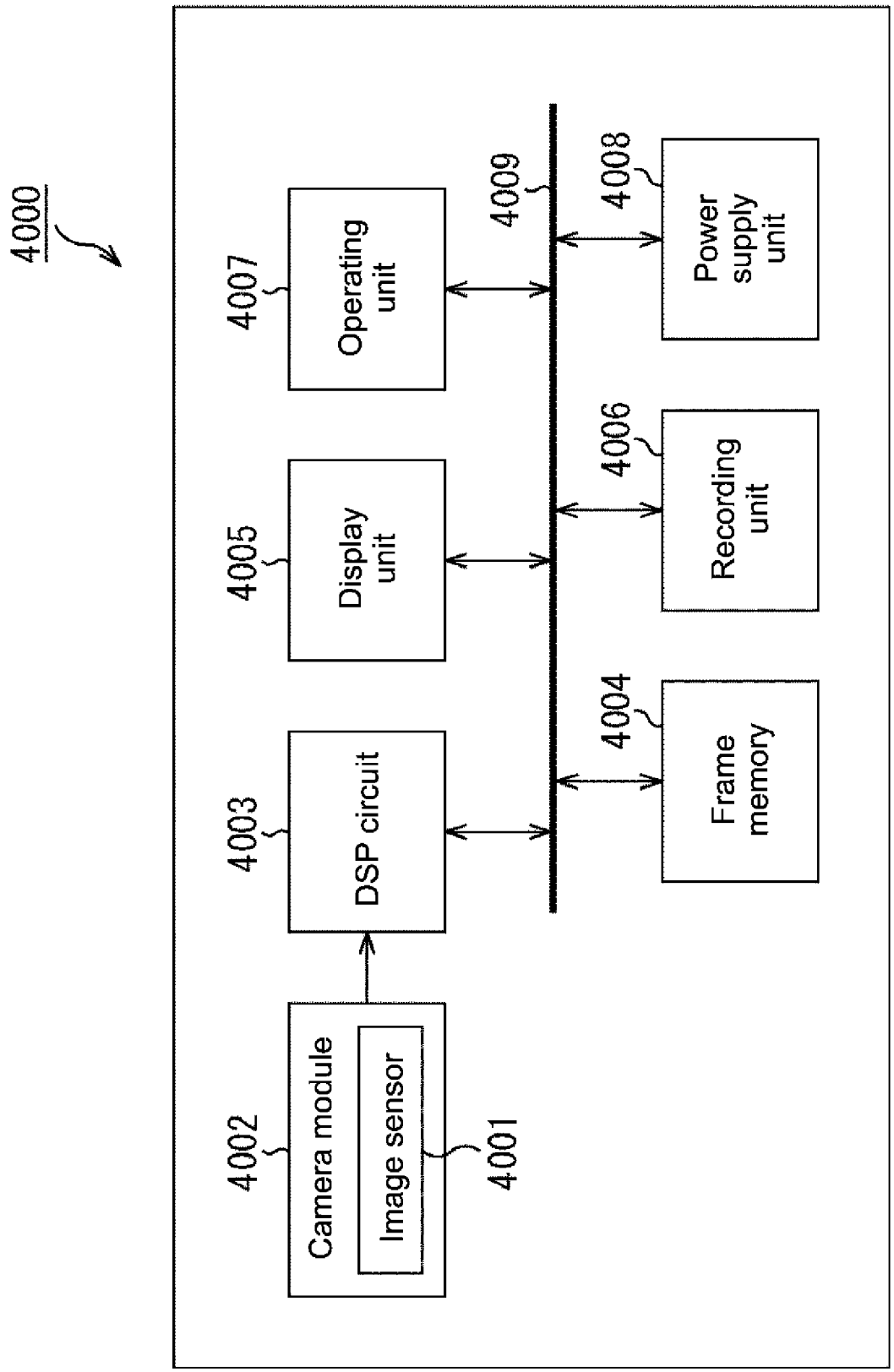

FIG. 122 is a block diagram illustrating a configuration example of an imaging apparatus as an electronic apparatus to which the present technique is applied.

An imaging apparatus 4000 illustrated in FIG. 122 includes a camera module 4002 and a digital signal processor (DSP) circuit 4003 as a camera signal processing circuit. Further, the imaging apparatus 4000 also includes a frame memory 4004, a display unit 4005, a recording unit 4006, an operating unit 4007, and a power supply unit 4008. The DSP circuit 4003, the frame memory 4004, the display unit 4005, the recording unit 4006, the operating unit 4007, the power supply unit 4008 are connected to each other via a bus line 4009.

An image sensor 4001 in the camera module 4002 captures incident light (image light) from a subject, convert an amount of the incident light formed into an image on an imaging surface to electrical signals in pixel units, and output the electrical signals as pixel signals. The above-described camera module 1 is employed as the camera module 4002, and the image sensor 4001 corresponds to the above-described light receiving element 12.

The display unit 4005 is a panel-type display apparatus such as a liquid crystal panel or an organic electro-luminescence (EL) panel, and displays a moving image or a still image imaged by the image sensor 4001. The recording unit 4006 records the moving image or the still image imaged by the image sensor 4001 on a recording medium such as a hard disk or a semiconductor memory.

The operating unit 4007 issues an operation instruction on various functions of the imaging apparatus 4000 in response to an operation by a user. The power supply unit 4008 that supplies various types of power as operation power as appropriate to the DSP circuit 4003, the frame memory 4004, the display unit 4005, the recording unit 4006, and the operating unit 4007.

As described above, when the camera module 1 according to the first embodiment to the twenty-sixth embodiment, to which the stacked lens structure 11 formed by positioning and bonding (stacking) the substrates with lenses 41 with high accuracy is mounted, is used as the camera module 4002, it is possible to increase image quality and to achieve downsizing. Thus, when the camera module is incorporated in the imaging apparatus 4000 such as a video camera, a digital still camera, and a mobile apparatus such as a mobile phone, it is possible to achieve downsizing of semiconductor packages in the imaging apparatus 4000 and to increase image quality of an image to be imaged with the imaging apparatus 4000.

<38. Example of Application for Internal Information Acquisition System>

The technique according to the present disclosure (the present technique) may be applied to various products. For example, the technique according to the present disclosure may be applied to an internal information acquisition system for a patient, which uses an endoscopic capsule.

Figure 123:
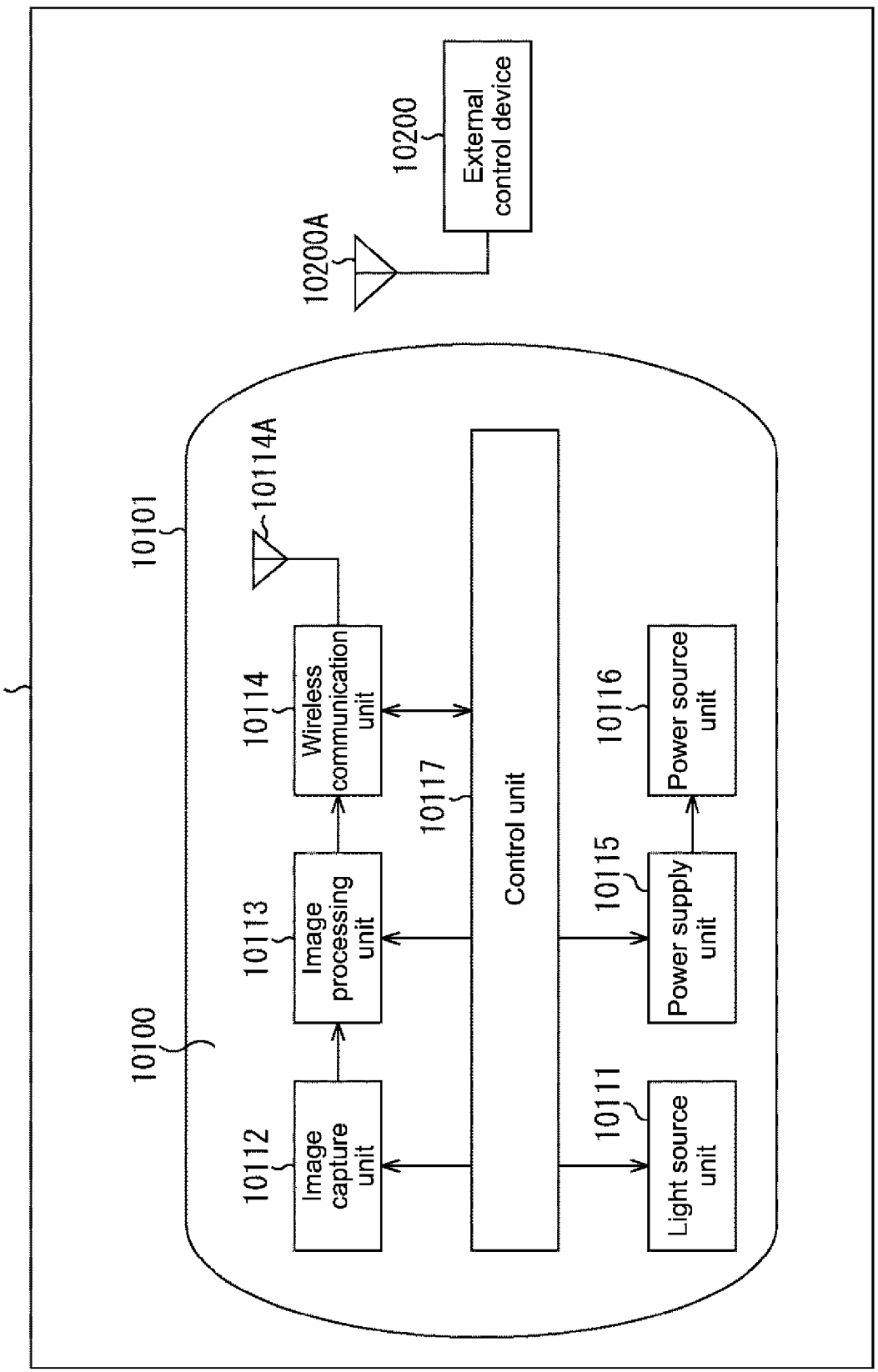

FIG. 123 is a block diagram illustrating an example of a schematic configuration of an internal information acquisition system for a patient, which uses an endoscopic capsule, to which the technique according to the present disclosure (the present technique) may be applied.

An internal information acquisition system 10001 includes an endoscopic capsule 10100 and an external control device 10200.

The endoscopic capsule 10100 is swallowed by a patient in an examination. The endoscopic capsule 10100 has an image capture function and a wireless communication function. The endoscopic capsule 10100 moves through the interior of organs such as the stomach and the intestines by peristaltic movement or the like until being excreted naturally from the patient, while also successively capturing images (hereinafter also called internal images) of the interior of the relevant organs at predetermined intervals, and successively wirelessly transmitting information about the internal images to the external control device 10200 outside the body.

The external control device 10200 centrally controls the operation of the internal information acquisition system 10001. Further, the external control device 10200 receives information about the internal images transmitted from the endoscopic capsule 10100. Based on the received information about the internal images, the external control device 10200 generates image data for displaying the internal images on a display device (not illustrated).

In this way, with the internal information acquisition system 10001, images depicting the patient's internal conditions can be obtained continually from the time the endoscopic capsule 10100 is swallowed to the time the endoscopic capsule 10100 is excreted.

The configurations and functions of the endoscopic capsule 10100 and the external control device 10200 will be described in further detail.

The endoscopic capsule 10100 includes a capsule-shaped housing 10101, and includes a light source unit 10111, an image capture unit 10112, an image processing unit 10113, a wireless communication unit 10114, a power supply unit 10115, a power source unit 10116, and a control unit 10117 built in the capsule-shaped housing 10101.

The light source unit 10111 includes a light source such as a light-emitting diode (LED), for example, and irradiates the imaging field of the image capture unit 10112 with light.

The image capture unit 10112 includes an image sensor, and an optical system made up of multiple lenses provided in front of the image sensor. Reflected light (hereinafter called observation light) from the light used to irradiate a body tissue which is the object of observation is condensed by the optical system and incident on the image sensor. The image sensor of the image capture unit 10112 receives and photoelectrically converts the observation light to thereby generate an image signal corresponding to the observation light. The image signal generated by the image capture unit 10112 is provided to the image processing unit 10113.

The image processing unit 10113 includes a processor such as a central processing unit (CPU) or a graphics processing unit (GPU), and performs various types of signal processing on the image signal generated by the image capture unit 10112. The image processing unit 10113 provides the image signal subjected to the signal processing to the wireless communication unit 10114 as raw data.

The wireless communication unit 10114 performs predetermined processing such as modulation processing on the image signal that was subjected to the signal processing by the image processing unit 10113, and transmits the image signal to the external control device 10200 via an antenna 10114A. In addition, the wireless communication unit 10114 receives, from the external control device 10200 via the antenna 10114A, a control signal related to driving control of the endoscopic capsule 10100. The wireless communication unit 10114 provides the control signal received from the external control device 10200 to the control unit 10117.

The power supply unit 10115 includes, for example, an antenna coil for receiving power, a power regeneration circuit for regenerating power from a current produced in the antenna coil, and a voltage step-up circuit. In the power supply unit 10115, the principle of what is called contactless or wireless charging is used to generate power.

The power source unit 10116 includes a secondary battery, and stores power generated by the power supply unit 10115. FIG. 123 omits arrows or the like indicating the recipients of power from the power source unit 10116 for brevity, but power stored in the power source unit 10116 is supplied to the light source unit 10111, the image capture unit 10112, the image processing unit 10113, the wireless communication unit 10114, and the control unit 10117, and may be used to drive these components.

The control unit 10117 includes a processor such as a CPU. The control unit 10117 appropriately controls the driving of the light source unit 10111, the image capture unit 10112, the image processing unit 10113, the wireless communication unit 10114, and the power supply unit 10115 in accordance with a control signal transmitted from the external control device 10200.

The external control device 10200 may be a processor such as a CPU or GPU, or a device such as a microcontroller or a control board on which a processor and a storage element such as memory are mounted. The external control device 10200 controls the operation of the endoscopic capsule 10100 by transmitting a control signal to the control unit 10117 of the endoscopic capsule 10100 via an antenna 10200A. In the endoscopic capsule 10100, for example, a light irradiation condition under which the light source unit 10111 irradiates a target of observation with light may be changed by a control signal from the external control device 10200. In addition, an image capture condition (such as the frame rate and the exposure level in the image capture unit 10112, for example) may be changed by a control signal from the external control device 10200. In addition, the content of processing in the image processing unit 10113 and a condition (such as the transmission interval and the number of images to transmit, for example) under which the wireless communication unit 10114 transmits the image signal may be changed by a control signal from the external control device 10200.

In addition, the external control device 10200 performs various types of image processing on the image signal transmitted from the endoscopic capsule 10100, and generates image data for displaying a captured internal image on a display device. For the image processing, various known signal processing, such as a development process (demosaicing process), an image quality-improving process (such as a band enhancement process, a super-resolution process, a noise reduction (NR) process, and/or a shake correction process), and/or an enlargement process (electronic zoom process), may be performed. The external control device 10200 controls the driving of a display device (not illustrated), and causes the display device to display a captured internal image on the basis of the generated image data. Alternatively, the external control device 10200 may also cause a recording device (not illustrated) to record the generated image data, or cause a printing device (not illustrated) to make a printout of the generated image data.

The above describes an example of the internal information acquisition system to which the technique according to the present disclosure may be applied. The technique according to the present disclosure may be applied to the image capture unit 10112 of the above-mentioned configuration. Specifically, the camera module 1 of the first to twenty-sixth embodiments may be applied to the image capture unit 10112. The image capture unit 10112, to which the technique according to the present disclosure is applied, is effective for downsizing the endoscopic capsule 10100 and reducing the burden on patients as a result. Further, a clearer image of a surgery site may be obtained and examination is thus performed with a higher degree of accuracy while downsizing the endoscopic capsule 10100.

<39. Example of Application for Endoscopy Surgery System>

The technique according to the present disclosure (the present technique) may be applied to various products. For example, the technique according to the present disclosure may be applied to an endoscopy surgery system.

Figure 124:
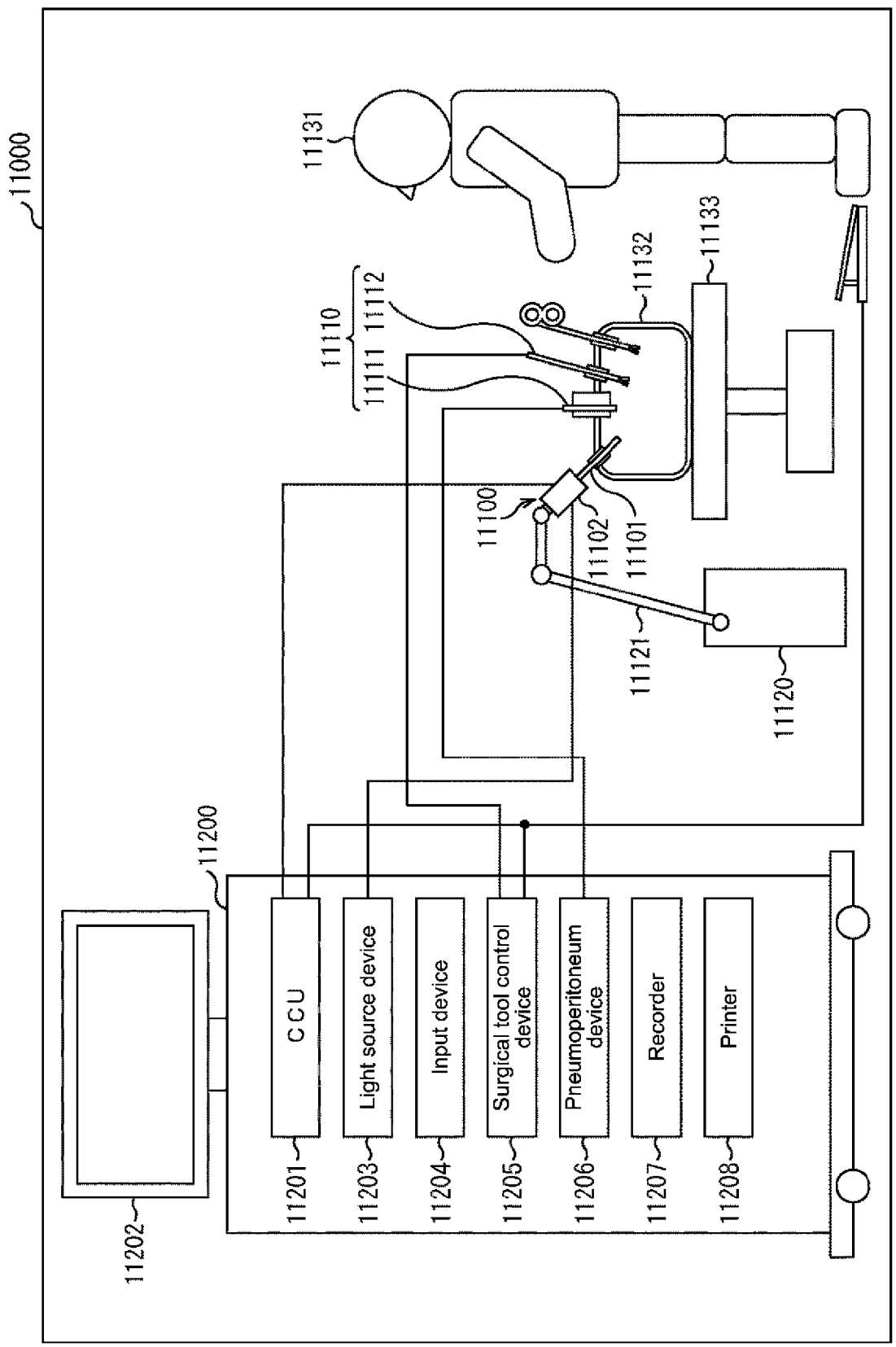

FIG. 124 is a diagram illustrating an example of a schematic configuration of an endoscopy surgery system, to which the technique according to the present disclosure (the present technique) may be applied.

FIG. 124 illustrates that a surgeon (doctor) 11131 performs surgery on a patient 11132 on a patient bed 11133 by using an endoscopy surgery system 11000. As illustrated in the figure, the endoscopy surgery system 11000 includes an endoscope 11100, other surgical instruments 11110 such as a pneumoperitoneum tube 11111 and an energy surgical tool 11112, a support arm device 11120 that supports the endoscope 11100, and a cart 11200 including various kinds of built-in endoscopy-surgical devices.

The endoscope 11100 includes a lens tube 11101 and a camera head 11102, part of the lens tube 11101 from the tip having a predetermined length being inserted in the body cavity of the patient 11132, the camera head 11102 being connected to the base of the lens tube 11101. The figure illustrates the endoscope 11100 including the rigid lens tube 11101, i.e., a so-called rigid endoscope, for example. Alternatively, the endoscope 11100 may be a so-called flexible endoscope including a flexible lens tube.

The lens tube 11101 has an opening at the tip, an objective lens being fitted in the opening. A light source device 11203 is connected to the endoscope 11100. The light source device 11203 generates light, a light guide extending in the lens tube 11101 guides the light to the tip of the lens tube, the light passes through the objective lens, and an object of observation in the body cavity of the patient 11132 is irradiated with the light. Note that the endoscope 11100 may be a direct-viewing endoscope, an oblique-viewing endoscope, or a side-viewing endoscope.

The camera head 11102 includes an optical system and an image sensor inside.

Reflected light (observation light) from the object of observation is condensed on the image sensor by the optical system. The image sensor photoelectrically converts the observation light to thereby generate an electric signal corresponding to the observation light, i.e., an image signal corresponding to an observation image. The image signal, as raw data, is transmitted to a camera control unit (CCU) 11201.

The CCU 11201 includes a central processing unit (CPU), a graphics processing unit (GPU), or the like, and centrally controls the operation of the endoscope 11100 and a display device 11202. Further, the CCU 11201 receives the image signal from the camera head 11102, and performs various types of image processing, e.g., a development process (demosaicing process) and the like, on the image signal. An image is to be displayed on the basis of the image signal.

Controlled by the CCU 11201, the display device 11202 displays an image on the basis of the image signal subjected to the image processing by the CCU 11201.

The light source device 11203 includes a light source such as a light emitting diode (LED), for example, and supplies light to the endoscope 11100, a surgery site or the like being irradiated with the light when its image is captured.

An input device 11204 is an input interface for the endoscopy surgery system 11000.

A user may input various kinds of information and instructions in the endoscopy surgery system 11000 via the input device 11204. For example, a user inputs instructions to change image capture conditions (kind of irradiation light, magnifying power, focal length, and the like) of the endoscope 11100, and other instructions.

A surgical tool control device 11205 controls the driving of the energy surgical tool 11112 that cauterizes a tissue, incises a tissue, seals a blood vessel, or the like. A pneumoperitoneum device 11206 feeds gas into the body cavity via the pneumoperitoneum tube 11111 in order to swell up the body cavity of the patient 11132 for the purpose of securing the imaging field of the endoscope 11100 and securing the workspace for a surgeon. A recorder 11207 is a device capable of recording various kinds of surgical information. A printer 11208 is a device capable of printing the various kinds of surgical information in various kinds of formats such as a text, an image, and a graph.

Note that the light source device 11203, which supplies irradiation light to the endoscope 11100 when an image of a surgery site is captured, may include an LED, a laser light source, or a white light source including a combination of them, for example. Where the white light source includes a combination of RGB laser light sources, the light source device 11203 may adjust the white balance of a captured image since the output intensity and the output timing of each color (each wavelength) may be controlled with a high degree of accuracy. Further, in this case, by irradiating an object of observation with laser lights from the respective RGB laser light sources in time-division and by controlling the driving of the image sensor of the camera head 11102 in synchronization with the irradiation timings, images respectively corresponding to RGB may be captured in time-division. According to this method, the image sensor without color filters may obtain color images.

Further, the driving of the light source device 11203 may be controlled to change the intensity of output light at predetermined time intervals. By controlling the driving of the image sensor of the camera head 11102 in synchronization with the timings of changing the intensity of the light to thereby obtain images in time-division and by combining the images, high-dynamic-range images without so-called black-clipping and white-clipping may be generated.

Further, the light source device 11203 may be configured to be capable of supplying light having a predetermined wavelength band corresponding to special light imaging. An example of the special light imaging is so-called narrow band imaging, which makes use of the fact that absorption of light by a body tissue depends on the wavelength of light. In the narrow band imaging, a body tissue is irradiated with light having a narrower band than the band of irradiation light (i.e., white light) in the normal imaging, and thereby a high-contrast image of a predetermined tissue such as a blood vessel of a mucous membrane surface is captured. Another possible example of the special light imaging is fluorescence imaging, in which a body tissue is irradiated with excitation light, fluorescence is thereby generated, and a fluorescence image is obtained. In the fluorescence imaging, a body tissue is irradiated with excitation light, and fluorescence from the body tissue is imaged (auto-fluorescence imaging). For another possible example, a reagent such as indocyanine green (ICG) is locally injected into a body tissue and, in addition, the body tissue is irradiated with excitation light corresponding to the fluorescence wavelength of the reagent to thereby obtain a fluorescence image. The light source device 11203 may be configured to be capable of supplying narrow band light and/or excitation light corresponding to the special light imaging.

Figure 125:
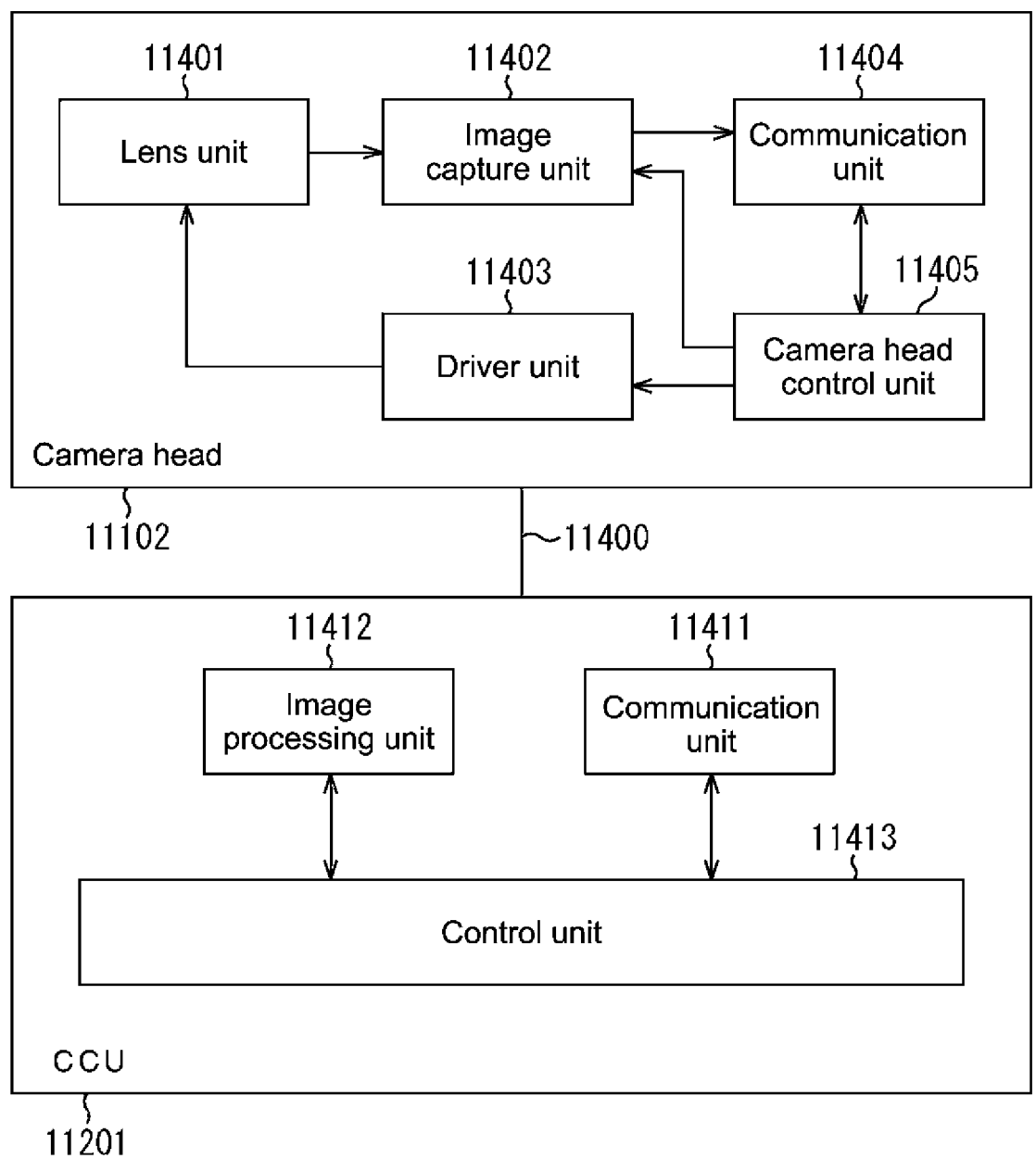

FIG. 125 is a block diagram illustrating an example of a functional configuration of the camera head 11102 and the CCU 11201 of FIG. 124.

The camera head 11102 includes a lens unit 11401, an image capture unit 11402, a driver unit 11403, a communication unit 11404, and a camera head control unit 11405. The CCU 11201 includes a communication unit 11411, an image processing unit 11412, and a control unit 11413. The camera head 11102 is connected to the CCU 11201 via a transmission cable 11400, which enables bidirectional communication.

The lens unit 11401 is an optical system provided at a portion of the camera head 11102, to which the lens tube 11101 is connected. Observation light is introduced from the tip of the lens tube 1110, is guided to the camera head 11102, and enters the lens unit 11401. The lens unit 11401 includes a plurality of lenses including a zoom lens and a focus lens in combination.

The image capture unit 11402 includes an image sensor/image sensors. The image capture unit 11402 may include one (i.e., single) image sensor or a plurality of (i.e., multiple) image sensors. Where the image capture unit 11402 includes multiple image sensors, for example, the respective image sensors may generate image signals corresponding to RGB, and a color image may be obtained by combining the RGB image signals. Alternatively, the image capture unit 11402 may include a pair of image sensors for obtaining right-eye and left-eye image signals corresponding to 3D (Dimensional) display. Thanks to the 3D display, the surgeon 11131 is capable of grasping the depth of a biological tissue at a surgery site more accurately. Note that, where the image capture unit 11402 includes multiple image sensors, a plurality of series of lens units 11401 may be provided corresponding to the image sensors, respectively.

Further, the image capture unit 11402 is not necessarily provided in the camera head 11102. For example, the image capture unit 11402 may be provided immediately after the objective lens in the lens tube 11101.

The driver unit 11403 includes an actuator. Controlled by the camera head control unit 11405, the driver unit 11403 causes the zoom lens and the focus lens of the lens unit 11401 to move for a predetermined distance along the optical axis. As a result, the magnifying power and the focus of an image captured by the image capture unit 11402 may be adjusted appropriately.

The communication unit 11404 includes a communication device for transmitting/receiving various kinds of information to/from the CCU 11201. The communication unit 11404 transmits the image signal obtained from the image capture unit 11402 to the CCU 11201 via the transmission cable 11400 as raw data.

Further, the communication unit 11404 receives a control signal related to driving control of the camera head 11102 from the CCU 11201, and supplies the control signal to the camera head control unit 11405. For example, the control signal includes information about image capture conditions, which includes information for specifying the frame rate of a captured image, information for specifying the exposure level when capturing an image, information for specifying the magnifying power and the focus of a captured image, and/or the like.

Note that the above-mentioned image capture conditions such as the frame rate, the exposure level, the magnifying power, and the focus may be specified appropriately by a user, or may be set automatically on the basis of the obtained image signal by the control unit 11413 of the CCU 11201. In the latter case, it is expected that the endoscope 11100 has the so-called AE (Auto Exposure) function, AF (Auto Focus) function, and AWB (Auto White Balance) function.

The camera head control unit 11405 controls the driving of the camera head 11102 on the basis of the control signal received from the CCU 11201 via the communication unit 11404.

The communication unit 11411 includes a communication device for transmitting/receiving various kinds of information to/from the camera head 11102. The communication unit 11411 receives the image signal transmitted from the camera head 11102 via the transmission cable 11400.

Further, the communication unit 11411 transmits the control signal related to driving control of the camera head 11102 to the camera head 11102. The image signal and the control signal may be transmitted via the electric communication, the optical communication, or the like.

The image processing unit 11412 performs various types of image processing on the image signal transmitted from the camera head 11102 as raw data.

The control unit 11413 performs various types of control on capturing an image of a surgery site or the like by the endoscope 11100 and control on displaying the captured image obtained by capturing the surgery site or the like. For example, the control unit 11413 generates a control signal related to driving control of the camera head 11102.

Further, the control unit 11413 causes the display device 11202 to display a captured image of the surgery site or the like on the basis of the image signal subjected to the image processing by the image processing unit 11412. At this time, the control unit 11413 may recognize various kinds of objects in the captured image by making use of various kinds of image recognition techniques. For example, by detecting the edge shape, the color, and the like of an object in the captured image, the control unit 11413 is capable of recognizing a surgical instrument such as forceps, a certain biological site, bleeding, mist generated when using the energy surgical tool 11112, and the like. When the control unit 11413 causes the display device 11202 to display a captured image, the control unit 11413 may display various kinds of surgery assistance information superimposed on the image of the surgery site by making use of the result of the recognition. By displaying the surgery assistance information superimposed on the image, which is presented to the surgeon 11131, it is possible to reduce the burden on the surgeon 11131 and it is possible for the surgeon 11131 to reliably carry on the surgery.

The transmission cable 11400, which connects the camera head 11102 and the CCU 11201, is an electric signal cable that supports electric signal communication, an optical fiber that supports optical communication, or a composite cable of them.

Here, in the illustrated example, wired communication is performed via the transmission cable 11400. Alternatively, communication between the camera head 11102 and the CCU 11201 may be performed wirelessly.

The above describes an example of the endoscopy surgery system to which the technique according to the present disclosure may be applied. The technique according to the present disclosure may be applied to the lens unit 11401 and the image capture unit 11402 of the camera head 11102 of the above-mentioned configuration. Specifically, the camera module 1 of the first to twenty-sixth embodiments may be applied to the lens unit 11401 and the image capture unit 11402. Where the technique according to the present disclosure is applied to the lens unit 11401 and the image capture unit 11402, the camera head 11102 is downsized and, in addition, a clearer image of a surgery site may be obtained.

Note that although the above describes the endoscopy surgery system for an example, the technique according to the present disclosure may be applied to another system, e.g., a microscope surgery system or the like.

<40. Example of Application for Movable Object>

The technique according to the present disclosure (the present technique) may be applied to various products. For example, the technique according to the present disclosure may be realized as a device mounted on any kind of movable objects such as a car, an electric car, a hybrid electric car, a motorcycle, a bicycle, a personal mobility, an aircraft, a drone, a ship, and a robot.

Figure 126:
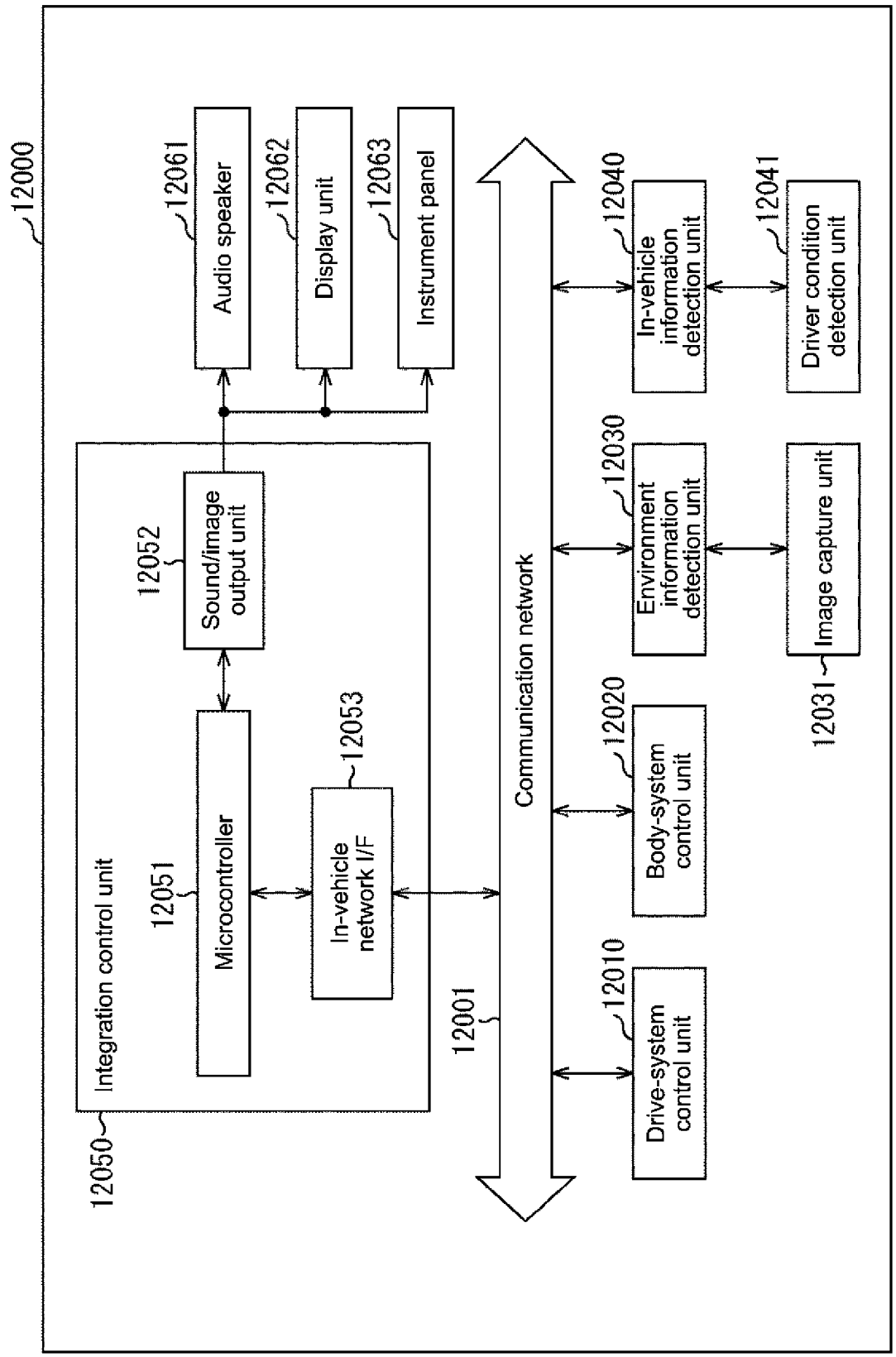

FIG. 126 is a block diagram illustrating an example of a schematic configuration of a vehicle control system, which is an example of a movable object control system to which the technique according to the present disclosure is applied.

A vehicle control system 12000 includes a plurality of electronic control units connected to each other via a communication network 12001. In the example of FIG. 126, the vehicle control system 12000 includes a drive-system control unit 12010, a body-system control unit 12020, an environment information detection unit 12030, an in-vehicle information detection unit 12040, and an integration control unit 12050. Further, as the functional configuration of the integration control unit 12050, a microcontroller 12051, a sound/image output unit 12052, and an in-vehicle network interface (I/F) 12053 are illustrated.

The drive-system control unit 12010 executes various kinds of programs to thereby control the operations of the devices related to the drive system of the vehicle. For example, the drive-system control unit 12010 functions as a control device that controls driving force generation devices such as an internal-combustion engine and a driving motor for generating a driving force of the vehicle, a driving force transmission mechanism for transmitting the driving force to wheels, a steering mechanism that adjusts the steering angle of the vehicle, a brake device that generates a braking force of the vehicle, and the like.

The body-system control unit 12020 executes various kinds of programs to thereby control the operations of the various kinds devices equipped in a vehicle body. For example, the body-system control unit 12020 functions as a control device that controls a keyless entry system, a smart key system, a power window device, or various lamps such as head lamps, back lamps, brake lamps, side-turn lamps, and fog lamps. In this case, an electric wave transmitted from a mobile device in place of a key or signals from various switches may be input in the body-system control unit 12020. The body-system control unit 12020 receives the input electric wave or signal, and controls a door lock device, the power window device, the lamps, and the like of the vehicle.

The environment information detection unit 12030 detects information outside the vehicle including the vehicle control system 12000. For example, an image capture unit 12031 is connected to the environment information detection unit 12030. The environment information detection unit 12030 causes the image capture unit 12031 to capture an environment image and receives the captured image. The environment information detection unit 12030 may perform an object detection process of detecting a man, a vehicle, an obstacle, a sign, a signage on a road, or the like on the basis of the received image, or may perform a distance detection process on the basis of the received image.

The image capture unit 12031 is an optical sensor that receives light and outputs an electric signal corresponding to the amount of the received light. The image capture unit 12031 may output the electric signal as an image or may output as distance measurement information. Further, the light that the image capture unit 12031 receives may be visible light or invisible light such as infrared light.

The in-vehicle information detection unit 12040 detects in-vehicle information. For example, a driver condition detection unit 12041 that detects the condition of a driver is connected to the in-vehicle information detection unit 12040. For example, the driver condition detection unit 12041 may include a camera that captures an image of a driver. The in-vehicle information detection unit 12040 may calculate the fatigue level or the concentration level of the driver on the basis of the detected information input from the driver condition detection unit 12041, and may determine whether the driver is sleeping.

The microcontroller 12051 may calculate the control target value of the driving force generation device, the steering mechanism, or the brake device on the basis of the in-vehicle/environment information obtained by the environment information detection unit 12030 or the in-vehicle information detection unit 12040, and may output a control command to the drive-system control unit 12010. For example, the microcontroller 12051 may perform coordinated control for the purpose of realizing the Advanced Driver Assistance System (ADAS) function including avoiding a vehicle collision, lowering impacts of a vehicle collision, follow-up driving based on a distance between vehicles, constant speed driving, vehicle collision warning, a vehicle's lane departure warning, or the like.

Further, by controlling the driving force generation device, the steering mechanism, the brake device, or the like on the basis of information about the environment around the vehicle obtained by the environment information detection unit 12030 or the in-vehicle information detection unit 12040, the microcontroller 12051 may perform coordinated control for the purpose of realizing self-driving, i.e., autonomous driving without the need of drivers' operations, and the like.

Further, the microcontroller 12051 may output a control command to the body-system control unit 12020 on the basis of environment information obtained by the environment information detection unit 12030. For example, the microcontroller 12051 may perform coordinated control including controlling the head lamps on the basis of the location of a leading vehicle or an oncoming vehicle detected by the environment information detection unit 12030 and changing high beams to low beams, for example, for the purpose of anti-glare.

The sound/image output unit 12052 transmits at least one of a sound output signal and an image output signal to an output device, which is capable of notifying a passenger of the vehicle or a person outside the vehicle of information visually or auditorily. In the example of FIG. 126, an audio speaker 12061, a display unit 12062, and an instrument panel 12063 are illustrated as examples of the output devices. For example, the display unit 12062 may include at least one of an on-board display and a head-up display.

Figure 127:
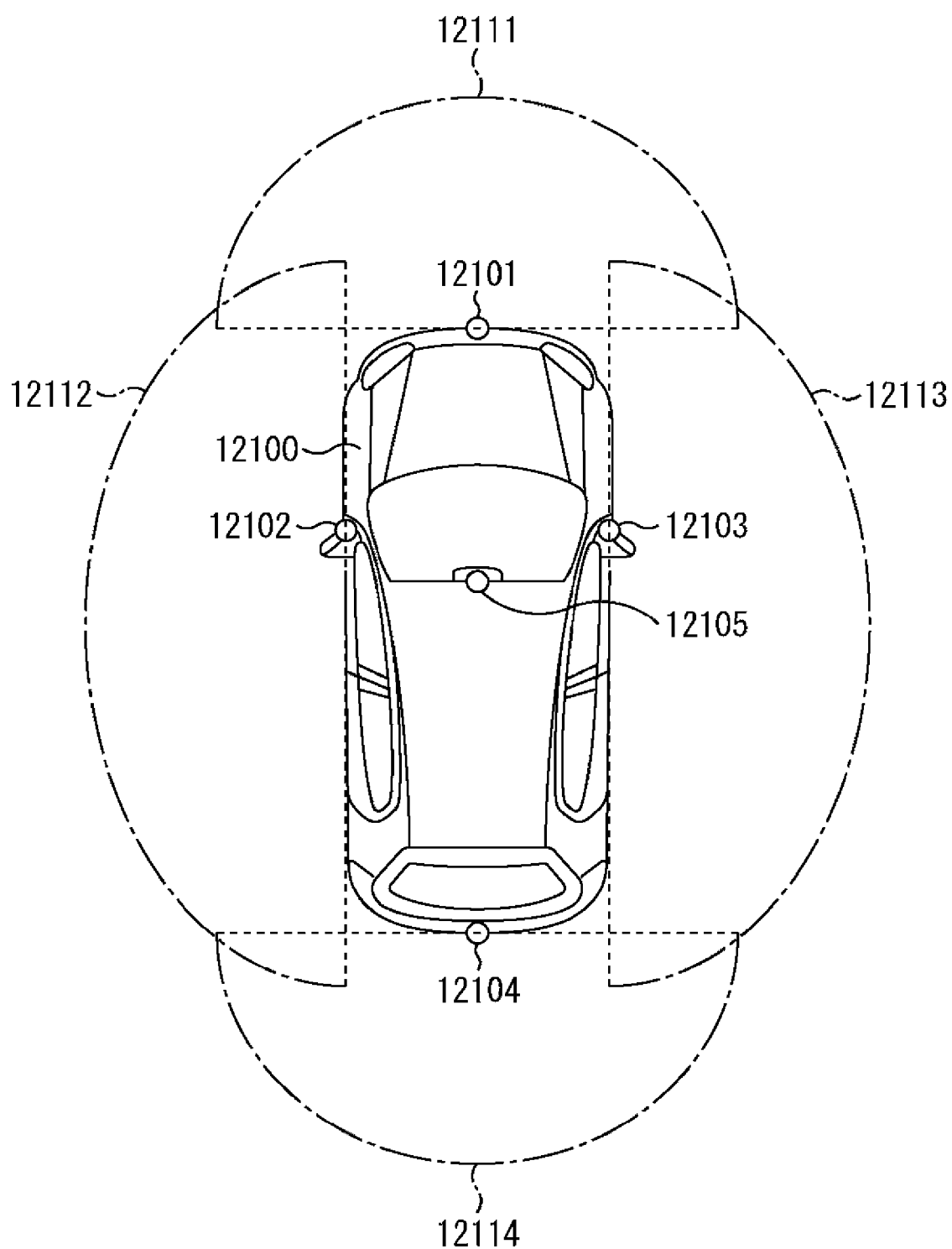

FIG. 127 is a diagram illustrating examples of mounting positions of the image capture units 12031.

In FIG. 127, a vehicle 12100 includes, as the image capture units 12031, image capture units 12101, 12102, 12103, 12104, and 12105.

For example, the image capture units 12101, 12102, 12103, 12104, and 12105 are provided at positions such as the front nose, the side-view mirrors, the rear bumper or the rear door, and an upper part of the windshield in the cabin of the vehicle 12100. Each of the image capture unit 12101 on the front nose and the image capture unit 12105 on the upper part of the windshield in the cabin mainly obtains an image of the front of the vehicle 12100. Each of the image capture units 12102 and 12103 on the side-view mirrors mainly obtains an image of a side of the vehicle 12100. The image capture unit 12104 on the rear bumper or the rear door mainly obtains an image of the rear of the vehicle 12100. The images of the front obtained by the image capture units 12101 and 12105 are mainly used to detect a leading vehicle, or detect a pedestrian, an obstacle, a traffic light, a traffic sign, a lane, or the like.

Note that FIG. 127 illustrates examples of image-capturing ranges of the image capture units 12101 to 12104. The image-capturing range 12111 illustrates the image-capturing range of the image capture unit 12101 on the front nose, the image-capturing ranges 12112 and 12113 illustrate the image-capturing ranges of the image capture units 12102 and 12103 on the side-view mirrors, respectively, and the image-capturing range 12114 illustrates the image-capturing range of the image capture unit 12104 on the rear bumper or the rear door. For example, by overlaying the image data captured by the image capture units 12101 to 12104 each other, a plane image of the vehicle 12100 viewed from above is obtained.

At least one of the image capture units 12101 to 12104 may have a function of obtaining distance information. For example, at least one of the image capture units 12101 to 12104 may be a stereo camera including a plurality of image sensors or an image sensor including pixels for phase difference detection.

For example, by obtaining the distance between the vehicle 12100 and each 3D (three-dimensional) object in the image-capturing ranges 12111 to 12114 and the temporal change (relative speed to the vehicle 12100) of the distance on the basis of the distance information obtained from the image capture units 12101 to 12104, the microcontroller 12051 may extract, as a leading vehicle, a 3D object which is especially the closest 3D object driving on the track on which the vehicle 12100 is driving at a predetermined speed (for example, 0 km/h or more) in the direction substantially the same as the driving direction of the vehicle 12100. Further, by presetting a distance between the vehicle 12100 and a leading vehicle to be secured, the microcontroller 12051 may perform autobrake control (including follow-up stop control), automatic acceleration control (including follow-up start-driving control), and the like. In this way, it is possible to perform coordinated control for the purpose of realizing self-driving, i.e., autonomous driving without the need of drivers' operations, and the like.

For example, the microcontroller 12051 may sort 3D object data of 3D objects into motorcycles, standard-size vehicles, large-size vehicles, pedestrians, and the other 3D objects such as utility poles on the basis of the distance information obtained from the image capture units 12101 to 12104, extract data, and use the data to automatically avoid obstacles. For example, the microcontroller 12051 sorts obstacles around the vehicle 12100 into obstacles that a driver of the vehicle 12100 can see and obstacles that it is difficult for the driver to see. Then the microcontroller 12051 determines a collision risk, which indicates a hazard level of a collision with each obstacle. When the collision risk is a preset value or more and when there is a possibility of a collision occurrence, the microcontroller 12051 may perform driving assistance to avoid a collision, in which the microcontroller 12051 outputs warning to the driver via the audio speaker 12061 or the display unit 12062, or mandatorily reduces the speed or performs collision-avoidance steering via the drive-system control unit 12010.

At least one of the image capture units 12101 to 12104 may be an infrared camera that detects infrared light. For example, the microcontroller 12051 may determine whether images captured by the image capture units 12101 to 12104 include a pedestrian or not to thereby recognize a pedestrian. The method of recognizing a pedestrian includes, for example, the step of extracting characteristic points in the images captured by the image capture units 12101 to 12104 being infrared cameras, and the step of performing the pattern matching process with respect to a series of characteristic points indicating an outline of an object to thereby determine whether the object is a pedestrian or not. Where the microcontroller 12051 determines that the images captured by the image capture units 12101 to 12104 include a pedestrian and recognizes the pedestrian, the sound/image output unit 12052 controls the display unit 12062 to display a rectangular contour superimposed on the recognized pedestrian to emphasize the pedestrian. Further, the sound/image output unit 12052 may control the display unit 12062 to display an icon or the like indicating a pedestrian at a desired position.

The above describes an example of the vehicle control system to which the technique according to the present disclosure may be applied. The technique according to the present disclosure may be applied to the image capture unit 12031 of the above-mentioned configuration. Specifically, the camera module 1 of the first to twenty-sixth embodiments may be applied to the image capture unit 12031. The image capture unit 12031, to which the technique according to the present disclosure is applied, is effective for downsizing the image capture unit 12031, obtaining a clearer captured image, and obtaining distance information. Further, by making use of obtained captured images and distance information, it is possible to reduce fatigue of a driver and improve safety of the driver and the vehicle.

Further, the present technique is not limited to application to a camera module that detects a distribution of incident light intensity of visible light to photograph the distribution as an image. However, the present technique can be applied to a camera module that photographs a distribution of incident intensity of infrared light, X-ray, or particles as an image and an overall camera module (physical quantity detection device) such as a finger print detection sensor that detects a distribution of other physical quantities such as pressure or electrostatic capacitance to photograph the distribution as an image in a broader sense of meaning.

The embodiment of the present technique is not limited to the above-described embodiments but various changes can be made without departing from the spirit of the present technique.

For example, an embodiment in which all or parts of the plurality of embodiments described above are combined may be employed.

Note that the advantages described in the present specification are examples only and other advantages other than those described in the present specification may be provided.

Note that the present technique can also have the following configurations.

(1)

An AF module, including:

a stacked lens structure including a plurality of substrates with lenses, the plurality of substrates with lenses being respectively provided with through-holes in which lenses are disposed, and being stacked and bonded to each other by direct bonding; and a first drive unit configured to adjust a distance between the stacked lens structure and a light receiving element.

(2)

The AF module according to Item (1), in which the first drive unit includes an AF coil and an AF magnet, the AF coil is integrated with the stacked lens structure, and the first drive unit is configured to move the stacked lens structure in an optical axis direction to adjust the distance between the stacked lens structure and the light receiving element.

(3)

The AF module according to Item (2), in which the AF coil is integrated with the stacked lens structure by being bonded to the stacked lens structure.

(4)

The AF module according to Item (2) or (3), in which the AF coil is wound around an outer periphery of the stacked lens structure, and the plurality of substrates with lenses forming the stacked lens structure each have a substantially octagonal shape in plan view.

(5)

The AF module according to Item (2) or (3), in which the AF coil is wound around an outer periphery of the stacked lens structure, and the plurality of substrates with lenses forming the stacked lens structure each have a rounded substantially-quadrangular shape in plan view.

(6)

The AF module according to any one of Items (2) to (5), further including a lens barrel configured to accommodate the stacked lens structure, in which the AF coil is integrated with the stacked lens structure by being bonded to the lens barrel.

(7)

The AF module according to Item (6), in which the lens barrel includes a first projection portion projecting to an inner peripheral side of the lens barrel, and the stacked lens structure is configured to be aligned in a manner of being brought into contact with the first projection portion.

(8)

The AF module according to Item (7), in which the lens barrel further includes a second projection portion projecting to an outer peripheral side of the lens barrel, and the AF coil is configured to be aligned in a manner of being brought into contact with the second projection portion.

(9)

The AF module according to any one of Items (2) to (5), further including one of a diaphragm plate and a cover glass that are provided on an upper surface of one substrate with lenses of the plurality of substrates with lenses as a top layer of the stacked lens structure, in which the AF coil is configured to be aligned in a manner of being brought into contact with the one of the diaphragm plate and the cover glass.

(10)

The AF module according to any one of Items (2) to (5), in which one substrate with lenses of the plurality of substrates with lenses, which is a top layer of the stacked lens structure, is formed to be larger in plan view than other substrates with lenses of the plurality of substrates with lenses, and the AF coil is configured to be aligned in a manner of being brought into contact with the one substrate with lenses which is the top layer.

(11)

The AF module according to Item (2), in which the plurality of substrates with lenses each have a substantially quadrangular shape in plan view, and the AF magnet includes AF magnets that are disposed at positions facing four corners of the plurality of substrates with lenses each having the substantially quadrangular shape in plan view.

(12)

The AF module according to Item (1), in which the first drive unit includes an AF coil and an AF magnet, the AF magnet is integrated with the stacked lens structure, and the first drive unit is configured to move the stacked lens structure in an optical axis direction to adjust the distance between the stacked lens structure and the light receiving element.

(13)

The AF module according to Item (12), further including a lens barrel configured to accommodate the stacked lens structure, in which the AF magnet is integrated with the stacked lens structure by being bonded to the lens barrel.

(14)

The AF module according to Item (12), in which the AF magnet is integrated with the stacked lens structure by being bonded to the stacked lens structure.

(15)

The AF module according to Item (14), in which a part of the AF magnet is embedded in the plurality of substrates with lenses forming the stacked lens structure.

(16)

The AF module according to Item (12), in which the plurality of substrates with lenses each have a substantially quadrangular shape in plan view, and the AF magnet includes AF magnets that are disposed at four corners of the plurality of substrates with lenses each having the substantially quadrangular shape in plan view.

(17)

The AF module according to any one of Items (1) to (16), further including a second drive unit configured to move the stacked lens structure in a direction orthogonal to the optical axis direction.

(18)

The AF module according to Item (1), in which the first drive unit is configured to move the light receiving element in an optical axis direction to adjust the distance between the stacked lens structure and the light receiving element.

(19)

A camera module, including:

a stacked lens structure including a plurality of substrates with lenses, the plurality of substrates with lenses being respectively provided with through-holes in which lenses are disposed, and being stacked and bonded to each other by direct bonding; a light receiving element configured to receive incident light converged by the lenses; and a drive unit configured to adjust a distance between the stacked lens structure and the light receiving element.

(20)

An electronic apparatus including a camera module, the camera module including, a stacked lens structure including a plurality of substrates with lenses, the plurality of substrates with lenses being respectively provided with through-holes in which lenses are disposed, and being stacked and bonded to each other by direct bonding, a light receiving element configured to receive incident light converged by the lenses, and a drive unit configured to adjust a distance between the stacked lens structure and the light receiving element.

(21)

A camera module including a stacked lens structure including a plurality of lens substrates, the plurality of lens substrates including a first lens substrate including a first lens that is disposed at an inner side of a through-hole formed in the first lens substrate, and a second lens substrate including a second lens that is disposed at an inner side of a through-hole formed in the second lens substrate, wherein the first lens substrate is directly bonded to the second lens substrate. The camera module may further include an electromagnetic drive unit configured to adjust a distance between the stacked lens structure and a light-receiving element.

(22)

The camera module according to (21), wherein the electromagnetic drive unit includes an autofocus (AF) coil and an AF magnet, the stacked lens structure includes the AF coil, and the electromagnetic drive unit is configured to adjust the distance between the stacked lens structure and the light-receiving element by moving the stacked lens structure in an optical axis direction.

(23)

The camera module according to (22), wherein the AF coil is bonded to the stacked lens structure.

(24)

The camera module according to any one of (22) to (23), wherein the AF coil is wound around an outer periphery of the stacked lens structure, and each of the plurality of lens substrates forming the stacked lens structure have a substantially octagonal shape in a plan view.

(25)

The camera module according to any one of (22) to (23), wherein the AF coil is wound around an outer periphery of the stacked lens structure, and each of the plurality of lens substrates forming the stacked lens structure have a rounded substantially-quadrangular shape in a plan view.

(26)

The camera module according to any one of (22) to (25), further comprising a lens barrel configured to house the stacked lens structure, wherein the AF coil is bonded to the lens barrel.

(27)

The camera module according to (26), wherein the lens barrel includes a first projection portion projecting to an inner peripheral side of the lens barrel, and the stacked lens structure is configured to be brought into contact with the first projection portion.

(28)

The camera module according to (27), wherein the lens barrel further includes a second projection portion projecting to an outer peripheral side of the lens barrel, and the AF coil is configured to be brought into contact with the second projection portion.

(29)

The camera module according to any one of (22) to (25), further comprising one of a diaphragm plate and a cover glass provided at an upper surface of an uppermost lens substrate of the plurality of lens substrates of the stacked lens structure, wherein the AF coil is configured to be brought into contact with the one of the diaphragm plate and the cover glass.

(30)

The camera module according to any one of (22) to (25), wherein an uppermost lens substrate of the plurality of lens substrates of the stacked lens structure is larger in a plan view than other lens substrates of the plurality of substrates, and the AF coil is configured to be brought into contact with the uppermost lens substrate.

(31)

The camera module according to (22), wherein each of the plurality of lens substrates have a substantially quadrangular shape in a plan view, and the AF magnet includes magnets disposed at positions facing four corners of the plurality of lens substrates each having the substantially quadrangular shape in the plan view.

(32)

The camera module according to (1), wherein the electromagnetic drive unit includes an autofocus (AF) coil and an AF magnet, the stacked lens structure includes the AF magnet, and the electromagnetic drive unit is configured to adjust the distance between the stacked lens structure and the light-receiving element by moving the stacked lens structure in an optical axis direction.

(33)

The camera module according to (32), further comprising a lens barrel configured to house the stacked lens structure, wherein the AF magnet is bonded to the lens barrel.

(34)

The camera module according to (32), wherein the AF magnet is bonded to the stacked lens structure.

(35)

The camera module according to (34), wherein a portion of the AF magnet is disposed in the plurality of lens substrates forming the stacked lens structure.

(36)

The camera module according to (32), wherein each of the plurality of lens substrates have a substantially quadrangular shape in a plan view, and the AF magnet includes AF magnets that are disposed at four corners of the plurality of lens substrates each having the substantially quadrangular shape in the plan view.

(37)

The camera module according to any one of (21) to (36), further comprising a second electromechanical drive unit configured to move the stacked lens structure in a direction orthogonal to an optical axis direction.

(38)

The camera module according to (21), wherein the electromechanical drive unit is configured to adjust the distance between the stacked lens structure and the light receiving-element by moving the light-receiving element in an optical axis direction.

(39)

An electronic apparatus including a camera module, the camera module including a stacked lens structure including a plurality of lens substrates, the plurality of lens substrates including a first lens substrate including a first lens that is disposed at an inner side of a through-hole formed in the first lens substrate, and a second lens substrate including a second lens that is disposed at an inner side of a through-hole formed in the second lens substrate, wherein the first lens substrate is directly bonded to the second lens substrate; and an electromagnetic drive unit configured to adjust a distance between the stacked lens structure and a light-receiving element.

(40)

A camera module, including a stacked lens structure including a plurality of lens substrates, the plurality of lens substrates including a first lens substrate including a first lens that is disposed at an inner side of a through-hole formed in the first lens substrate, and a second lens substrate including a second lens that is disposed at an inner side of a through-hole formed in the second lens substrate, wherein the first lens substrate is directly bonded to the second lens substrate, and an actuator configured to adjust a distance between the stacked lens structure and a light-receiving element.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

1 Camera module
11 Stacked lens structure
12 Light receiving element
13 Optical unit
21 Lens
21V Deformable lens
41 (41a to 41g) Substrate with lenses
43 Sensor substrate
51 Diaphragm plate
52 Opening
81 Support substrate
82 Lens resin portion
83 Through-hole
121 Light blocking film
122 Upper surface layer
123 Lower surface layer
141 Etching mask
142 Protective film
1501 Cover glass
1502 Light blocking film
1503 Opening
1511, 1512 Substrate
1531 Substrate with lenses
1542 Metal film
1551 First region
1552 Second region
1561W Highly-doped substrate
1631a1 to 1631a3 Memory area
1641a1 to 1641a4 Logic area
1642a1 to 1642a4 Control area
1701 First semiconductor substrate
1702 Second semiconductor substrate
1703 Third semiconductor substrate
2011 Substrate with lenses
2012 Stacked lens structure
2040 Support substrate
2041 Through-hole
2042 Lens resin portion
2043 Light blocking film
2044 Upper surface layer
2045 Lower surface layer
3001 Lens barrel
3002 AF coil
3003a, 3003b Suspension
3005 AF magnet
3013 First projection portion
3014 Second projection portion
3021 AF drive unit
3022 AF module
3121X X-axis OIS drive unit
3121Y Y-axis OIS drive unit
3211a to 3211d Piezoelectric drive unit
3313 Driven member
3312 Piezoelectric element
3314 Guide member
3315 Pressure spring
3411 Lens barrel
3422 Parallel link
3423 Piezoelectric actuator
4000 Imaging apparatus
4001 Image sensor
4002 Camera module

What is claimed is:

1. A camera module, comprising:
a stacked lens structure including a plurality of lens substrates, the plurality of lens substrates including:
a first lens substrate including a first lens that is disposed at an inner side of a through-hole formed in the first lens substrate, and
a second lens substrate including a second lens that is disposed at an inner side of a through-hole formed in the second lens substrate, wherein the first lens substrate is directly bonded to the second lens substrate;
an electromagnetic drive unit configured to adjust a distance between the stacked lens structure and a light-receiving element; and
one of a diaphragm plate and a cover glass provided at an upper surface of an uppermost lens substrate of the plurality of lens substrates of the stacked lens structure,
wherein the electromagnetic drive unit includes an autofocus (AF) coil and an AF magnet,
wherein the stacked lens structure includes the AF coil, and
wherein the electromagnetic drive unit is configured to adjust the distance between the stacked lens structure and the light-receiving element by moving the stacked lens structure in an optical axis direction, and
wherein the AF coil is configured to be brought into contact with the one of the diaphragm plate and the cover glass.

2. The camera module according to claim 1, wherein the AF coil is bonded to the stacked lens structure.

3. The camera module according to claim 1, wherein the AF coil is wound around an outer periphery of the stacked lens structure, and
each of the plurality of lens substrates forming the stacked lens structure have a substantially octagonal shape in a plan view.

4. The camera module according to claim 1, wherein the AF coil is wound around an outer periphery of the stacked lens structure, and
each of the plurality of lens substrates forming the stacked lens structure have a rounded substantially-quadrangular shape in a plan view.

5. A camera module, comprising:
a stacked lens structure including a plurality of lens substrates, the plurality of lens substrates including:
a first lens substrate including a first lens that is disposed at an inner side of a through-hole formed in the first lens substrate, and
a second lens substrate including a second lens that is disposed at an inner side of a through-hole formed in the second lens substrate, wherein the first lens substrate is directly bonded to the second lens substrate; and
an electromagnetic drive unit configured to adjust a distance between the stacked lens structure and a light-receiving element,
wherein the electromagnetic drive unit includes an autofocus (AF) coil and an AF magnet,
wherein the stacked lens structure includes the AF coil,
wherein the electromagnetic drive unit is configured to adjust the distance between the stacked lens structure and the light-receiving element by moving the stacked lens structure in an optical axis direction, wherein an uppermost lens substrate of the plurality of lens substrates of the stacked lens structure is larger in a plan view than other lens substrates of the plurality of lens substrates, and wherein the AF coil is configured to be brought into contact with the uppermost lens substrate.

6. A camera module, comprising:

a stacked lens structure including a plurality of lens substrates, the plurality of lens substrates including:
- a first lens substrate including a first lens that is disposed at an inner side of a through-hole formed in the first lens substrate, and
- a second lens substrate including a second lens that is disposed at an inner side of a through-hole formed in the second lens substrate, wherein the first lens substrate is directly bonded to the second lens substrate; and an electromagnetic drive unit configured to adjust a distance between the stacked lens structure and a light-receiving element, wherein the electromagnetic drive unit includes an autofocus (AF) coil and an AF magnet, wherein the stacked lens structure includes the AF magnet, wherein the electromagnetic drive unit is configured to adjust the distance between the stacked lens structure and the light-receiving element by moving the stacked lens structure in an optical axis direction, wherein the AF magnet is bonded to the stacked lens structure, and wherein a portion of the AF magnet is disposed in the plurality of lens substrates forming the stacked lens structure.

7. The camera module according to claim 1, further comprising a second electromechanical drive unit configured to move the stacked lens structure in a direction orthogonal to an optical axis direction.

8. The camera module according to claim 1, wherein an uppermost lens substrate of the plurality of lens substrates of the stacked lens structure is larger in a plan view than other lens substrates of the plurality of lens substrates, and wherein the AF coil is configured to be brought into contact with the uppermost lens substrate.

9. The camera module according to claim 5, further comprising a second electromechanical drive unit configured to move the stacked lens structure in a direction orthogonal to an optical axis direction.

10. The camera module according to claim 6, further comprising a second electromechanical drive unit configured to move the stacked lens structure in a direction orthogonal to an optical axis direction.

* * * * *